US012786607B2

(12) United States Patent
Li et al.

(10) Patent No.: US 12,786,607 B2
(45) Date of Patent: Nov. 3, 2026

(54) WEARABLE DEVICE

(71) Applicant: HUAWEI TECHNOLOGIES CO., LTD., Shenzhen (CN)

(72) Inventors: Kelin Li, Xi'an (CN); Wei Zheng, Xi'an (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 197 days.

(21) Appl. No.: 18/720,554

(22) PCT Filed: Dec. 26, 2022

(86) PCT No.: PCT/CN2022/141942
§ 371 (c)(1),
(2) Date: Jun. 14, 2024

(87) PCT Pub. No.: WO2023/125414
PCT Pub. Date: Jul. 6, 2023

(65) Prior Publication Data

US 2025/0063283 A1 Feb. 20, 2025

(30) Foreign Application Priority Data

Dec. 31, 2021 (CN) ......................... 202111677026.6

(51) Int. Cl.
*H04R 1/02* (2006.01)
*H04R 1/10* (2006.01)
(Continued)

(52) U.S. Cl.
CPC ........... *H04R 1/028* (2013.01); *H04R 1/1025* (2013.01); *H04R 1/1041* (2013.01); *H05K 5/061* (2013.01);
(Continued)

(58) Field of Classification Search
CPC .... H04R 1/028; H04R 1/1025; H04R 1/1041; H04R 2420/07; H04R 2499/11; H05K 5/061
(Continued)

(56) References Cited

U.S. PATENT DOCUMENTS

2020/0107099 A1* 4/2020 McIntosh ............. H04R 1/1016
2020/0107102 A1 4/2020 Sang et al.

FOREIGN PATENT DOCUMENTS

CN 205921717 U 2/2017
CN 208402075 U 1/2019
(Continued)

*Primary Examiner* — Ammar T Hamid

(57) ABSTRACT

A wearable device includes an earphone and a host. The earphone includes an earphone magnet, and the host includes a first part provided with a first accommodation groove and a second part provided with a third accommodation groove. When the host is closed, the first accommodation groove and the third accommodation groove enclose an accommodation space, the earphone is accommodated in the accommodation space, and the earphone magnet is magnetically attached to a first host attachment magnet of the first part. When the host is opened, the earphone can be attached in the first accommodation groove and move with the first part. When the earphone is accommodated in the first accommodation groove, a small part of the earphone is located in the first accommodation groove, and a large part of the earphone is located outside the first accommodation groove.

19 Claims, 77 Drawing Sheets

(51) Int. Cl.
*H04R 1/1025* (2026.01)
*H05K 5/06* (2006.01)

(52) U.S. Cl.
CPC ...... *H04R 2420/07* (2013.01); *H04R 2499/11* (2013.01)

(58) Field of Classification Search
USPC .................................................... 381/87, 334
See application file for complete search history.

(56) References Cited

FOREIGN PATENT DOCUMENTS

| | | | | | |
|---|---|---|---|---|---|
| CN | 109892756 | A | * | 6/2019 | ........... A44C 5/0007 |
| CN | 209045415 | U | | 6/2019 | |
| CN | 110417089 | A | | 11/2019 | |
| CN | 110602584 | A | | 12/2019 | |
| CN | 210005872 | U | | 1/2020 | |
| CN | 211047182 | U | | 7/2020 | |
| CN | 112486250 | A | | 3/2021 | |
| CN | 212784816 | U | | 3/2021 | |
| CN | 113015051 | A | | 6/2021 | |
| CN | 213694059 | U | * | 7/2021 | |
| CN | 113303569 | A | * | 8/2021 | ......... A44C 5/00115 |
| CN | 113329300 | A | | 8/2021 | |
| CN | 213849087 | U | | 8/2021 | |
| CN | 215072924 | U | | 12/2021 | |
| EP | 3473130 | B1 | | 4/2019 | |
| KR | 102312161 | B1 | | 10/2021 | |

* cited by examiner

Direction A

Direction A

WEARABLE DEVICE

CROSS-REFERENCE TO RELATED APPLICATIONS

This application is a national stage of International Application No. PCT/CN2022/141942 filed on Dec. 26, 2022, which claims priority to Chinese Patent Application No. 202111677026.6 filed on Dec. 31, 2021. Both of the aforementioned applications are incorporated herein by reference in their entireties.

TECHNICAL FIELD

This application relates to the field of electronic devices, and in particular, to a wearable device.

BACKGROUND

Wearable products such as a smartwatch and a smart band and wireless earphones have been widely used by users. In a routine scenario, a user often wears both a wearable product and a wireless earphone. The user further needs to carry an earphone case, to accommodate the wireless earphone. This requires the user to carry more devices, which is unfavorable to user experience.

SUMMARY

An embodiment of this application provides a wearable device, so that a wireless earphone can be directly accommodated in a wearable product, and product forms of the wireless earphone and the wearable product are integrated, to reduce devices that need to be carried by a user. This improves user experience.

The wearable device in this embodiment of this application includes an earphone and a host. The earphone has an earphone magnet. The host includes a first part and a second part. The first part can rotate relative to the second part and be opened relative to the second part, so that the host is opened; or the first part and the second part can be closed, so that the host is closed. The first part has a first accommodation groove. The second part has a third accommodation groove. When the host is closed, the first accommodation groove and the third accommodation groove enclose an accommodation space. The first part has a first host attachment magnet. When the host is closed, the earphone is accommodated in the accommodation space, and the earphone magnet is magnetically attached to the first host attachment magnet. When the first part is opened relative to the second part, the earphone can be attached in the first accommodation groove and move with the first part. When the earphone is accommodated in the first accommodation groove, a maximum distance between a part that is of the earphone and that is located in the first accommodation groove and a plane on which an opening of the first accommodation groove is located is a first distance, and a maximum distance between a part that is of the earphone and that is located outside the first accommodation groove and the plane on which the opening of the first accommodation groove is located is a second distance. The first distance is less than the second distance.

In this solution, a host that can be opened and closed is designed, so that a wireless earphone can be accommodated in the host, and product forms of the wireless earphone and a wearable product are integrated, to reduce devices that need to be carried by a user. This improves user experience.

In addition, when the host is opened, the earphone can be attached to the first part, and a large part of the earphone may be exposed outside the first part, so that the user can take and place the earphone conveniently.

In an implementation, the first host attachment magnet is a Halbach array, and the earphone magnet is a single magnet or a Halbach array. A magnetic attraction force of the first part of the host on the earphone can be enhanced by making the first host attachment magnet into the Halbach array, so that when the user places the earphone in the first part, the earphone can be accurately attached to the first part without precise alignment.

In an implementation, the first host attachment magnet is a Halbach array, the first host attachment magnet includes two single magnets that are connected, and magnetic field directions of the two single magnets are different. The earphone magnet includes one single magnet, and the single magnet is a Halbach array having two different magnetic field directions. Based on the magnet design, the magnetic attraction force of the first part of the host on the earphone can be greatly enhanced, so that when the user places the earphone in the first part, the earphone can be accurately attached to the first part without precise alignment.

In an implementation, the second part has a second host attachment magnet. When the earphone is accommodated in the accommodation space, the earphone magnet is magnetically attached to both the first host attachment magnet and the second host attachment magnet, and a magnetic force between the earphone magnet and the first host attachment magnet is greater than a magnetic force between the earphone magnet and the second host attachment magnet. Based on the magnet design, the earphone can be attached to the first part when the host is opened. In addition, if the earphone is located on the second part when the host is opened, the earphone can be reliably placed on the second part due to a magnetic attraction force of the second part on the earphone, and the earphone is not easily dropped even if the host is turned over.

In an implementation, a groove is provided on a circumferential edge of the first part, the first part has a sealing member, several protrusions are provided on a surface of the sealing member, the several protrusions are spaced in pairs, the sealing member is fastened in the groove of the first part, the several protrusions of the sealing member are all connected to a bottom surface of the groove of the first part, a side that is of the sealing member and that is far away from the protrusions of the sealing member is exposed outside the groove of the first part, and when the host is closed, a part that is of the sealing member and that is exposed outside the groove of the first part is in contact with the second part, to seal a gap between the first part and the second part; or a groove is provided on a circumferential edge of the second part, the second part has a sealing member, several protrusions are provided on a surface of the sealing member, the several protrusions are spaced in pairs, the sealing member is fastened in the groove of the second part, the several protrusions of the sealing member are all connected to a bottom surface of the groove of the second part, a side that is of the sealing member and that is far away from the protrusions of the sealing member is exposed outside the groove of the second part, and when the host is closed, a part that is of the sealing member and that is exposed outside the groove of the second part is in contact with the first part, to seal a gap between the first part and the second part. In the solution, the gap between the two parts of the host can be sealed, to ensure that an inside of the host and the earphone accommodated in the host are not easily eroded by foreign matter.

In an implementation, the second part has a first charging spring and a second charging spring. The earphone is in a centrosymmetric shape. The earphone includes a first electrode and a second electrode. Both the first electrode and the second electrode are located on an outer side of the earphone and are of ring-shaped structures that surround a center line of the earphone. The first electrode and the second electrode are spaced from each other. When the earphone is located in the second part, the first electrode is in contact with the first charging spring, and the second electrode is in contact with the second charging spring. The host includes a charging circuit. The charging circuit is configured to charge the earphone by using the first charging spring and the second charging spring. In this solution, when the earphone is placed in the second part at a random rotation angle, the earphone can be charged by using the host.

In an implementation, the second part has a foreign matter detection spring. The host includes a processor. The processor is configured to: control, based on an abnormal charging signal of the charging circuit, the charging circuit to be turned off, and control, based on a normal charging signal of the charging circuit, the charging circuit to work. After the foreign matter detection spring and at least one of the first charging spring and the second charging spring are in contact with foreign matter, the charging circuit generates the abnormal charging signal; otherwise, the charging circuit generates the normal charging signal. In this solution, when determining that the foreign matter enters the second part, the host can stop charging the earphone, to avoid causing an abnormality and ensure product safety and reliability.

In an implementation form, the first part or the second part has a temperature detection module. The host includes the processor. The processor is configured to: when determining, based on a detection result of the temperature detection module, that a detected temperature is greater than or equal to a threshold, control the charging circuit to be turned off. The processor is further configured to: when determining, based on the detection result of the temperature detection module, that the detected temperature is less than the threshold, control the charging circuit to work. In this solution, when determining that a temperature of the host is excessively high, the host can stop charging the earphone, to avoid causing an abnormality and ensure product safety and reliability.

In an implementation, the second part has a status detection magnet, the first part has a first magnetic field sensor, and the first magnetic field sensor is configured to detect a magnetic flux of the status detection magnet. The host includes the processor. The processor is configured to determine, based on a detection signal of the first magnetic field sensor, whether the host is in an open state or a closed state. In this solution, the open state/the closed state of the host can be detected, so that corresponding functions of the host and the earphone can be implemented, to ensure user experience.

In an implementation, the first part or the second part has a second magnetic field sensor, and the second magnetic field sensor is configured to detect a magnetic flux of the earphone magnet. The host includes the processor. The processor is configured to determine, based on a detection signal of the second magnetic field sensor of the first part, whether the earphone is located in the first accommodation groove; or the processor is configured to determine, based on a detection signal of the second magnetic field sensor of the second part, whether the earphone is located in the third accommodation groove. In this solution, the host can detect a position status of the earphone in the host, so that corresponding functions of the host and the earphone are implemented, to ensure user experience.

In an implementation, the second part has the status detection magnet. The earphone has a third magnetic field sensor, and the third magnetic field sensor is configured to detect the magnetic flux of the status detection magnet. The earphone has a controller, and the controller is configured to determine, based on a detection signal of the third magnetic field sensor, whether the earphone is located in the third accommodation groove. In this solution, the earphone can detect the position status of the earphone in the host, so that corresponding functions of the earphone are implemented, to ensure user experience.

In an implementation, the host includes a rotating shaft assembly, and the rotating shaft assembly includes a shaft sleeve, a driven member, an elastic member, and a first shaft. The shaft sleeve has an inner cavity, and an outer side of the shaft sleeve is fixedly connected to the first part. The driven member has a shaft matching surface and a through hole, and the through hole of the driven member penetrates the shaft matching surface. The driven member is located in the inner cavity, and the driven member can slide along a surface of the inner cavity but cannot rotate relative to the shaft sleeve. The elastic member is located in the inner cavity, and presses against a surface that is of the driven member and that is far away from the shaft matching surface. One part of the first shaft is located in the inner cavity and is rotatably connected to the shaft sleeve; the part that is of the first shaft and that is located in the inner cavity passes through the through hole of the driven member, and fits with the shaft matching surface of the driven member to form a cam mechanism; and the other part of the first shaft is located outside the inner cavity and is fixedly connected to the second part. The first part can rotate relative to the second part by using the rotating shaft assembly. In a process in which the host is switched from the closed state to the open state, a rotation stroke of the first part sequentially includes a first stroke segment, a second stroke segment, and a third stroke segment. In the first stroke segment, the driven member can move along the first shaft under driving of an elastic force of the elastic member, and the driven member can rotate around the first shaft under a joint action of the cam mechanism and the elastic member, to drive the shaft sleeve to rotate around the first shaft, so that the shaft sleeve drives the first part to rotate relative to the second part. In the second stroke segment, the first part can rotate relative to the second part under driving of an external force, to drive the shaft sleeve and the driven member to rotate around the first shaft. In the third stroke segment, the driven member can move along the first shaft under driving of the elastic force of the elastic member, and the driven member can rotate around the first shaft under the joint action of the cam mechanism and the elastic member, to drive the shaft sleeve to rotate around the first shaft, so that the shaft sleeve drives the first part to rotate relative to the second part. In this solution, based on a structure design of the rotating shaft assembly, the first part has different motion features in each stroke segment. This can create special hand feeling for the user and greatly improve user experience.

In an implementation, the shaft matching surface includes a first slope, a plane, and a second slope that are sequentially connected. The first slope and the plane form an obtuse angle. The plane and the second slope form an obtuse angle. The first slope, the plane, and the second slope form a two-step ladder. In the first stroke segment, the first slope is in sliding contact with the part that is of the first shaft and that is located in the inner cavity. In the second stroke segment, the plane is in sliding contact with the part that is of the first shaft and that is located in the inner cavity. In the third stroke segment, the second slope is in sliding contact with the part that is of the first shaft and that is located in the inner cavity. In this solution, a three-segment stroke design of the first part can be reliably implemented by designing a cam matching surface.

In an implementation, the rotating shaft assembly includes the shaft sleeve, a second shaft, and a flexible circuit board. The shaft sleeve has the inner cavity. A channel is formed on the second shaft in an axial direction of the second shaft. One part of the second shaft is located in the inner cavity and is rotatably connected to the shaft sleeve, and the other part of the second shaft is located outside the inner cavity. The flexible circuit board includes a first electrical connection end, a mounting part, and a second connection end. The mounting part is located between the first electrical connection end and the second electrical connection end, and the mounting part includes a wound part and a laminated part that are connected to each other. When the flexible circuit board is mounted on the second shaft, both the first electrical connection end and the second electrical connection end are located outside the inner cavity, the wound part is wound around a part that is of the second shaft and that is located in the inner cavity, the laminated part is in a folded state, and at least one part of the laminated part is accommodated in the channel of the second shaft. The first part has a first host circuit board assembly, and the first host circuit board assembly is electrically connected to the first electrical connection end. The second part has a second host circuit board assembly, and the second host circuit board assembly is electrically connected to the second electrical connection end. The first part is fixedly connected to the outer side of the shaft sleeve, the second part is fixedly connected to a part that is of the second shaft and that is located outside the inner cavity, and the first part can rotate relative to the second part by using the rotating shaft assembly. In this solution, based on a structure design of the rotating shaft assembly, the two parts of the host can implement electrical connection and communication by using the rotating shaft assembly. This ensures normal operation of the host.

In an implementation, the first host circuit board assembly includes a circuit board, and the circuit board has a grounding point and a feeding point. The first part includes a first host housing, the first host housing is fixedly connected to the outer side of the shaft sleeve, and the first host circuit board assembly is fastened to a side that is of the first host housing and that is far away from the shaft sleeve. The first host housing is electrically connected to both the grounding point and the feeding point, and the first host housing is used as an antenna of the host. In this solution, based on a proper structure design, an antenna function of the host is implemented by using the first host housing.

In an implementation, the shaft assembly includes a shaft contact member. The shaft contact member is fastened in the shaft sleeve, and is in sliding contact with the part that is of the second shaft and that is located in the inner cavity. The second part includes a third host housing, the third host housing is fixedly connected to the part that is of the second shaft and that is located outside the inner cavity, and the third host housing is used as an antenna of the host. In this solution, based on a proper structure design, an antenna system is constructed by using the first host housing, the rotating shaft assembly, and the third host housing, to implement an antenna function of the host.

In an implementation, when the host is closed, there is a gap between the first host housing and the third host housing, and the first host housing and the second host housing are coupled. In this solution, a feeding path in a coupling manner is designed, so that different communication requirements of the host in the open state and the closed state can be met, and antenna performance of the host in different states can be ensured.

In an implementation, the first part is one of a cover of the host and a body of the host, and the second part is the other of the cover and the body. The host includes an open button, and the open button includes a cap, an elastic member, and a touch-sensitive spring. A part of the cap is located in the second part, and the other part of the cap is located outside the second part. The cap is movably connected to the second part. The cap has a bump located in the second part. The elastic member is mounted in the second part to provide a rebound force for the cap. The touch-sensitive spring is located in the second part, and the touch-sensitive spring is spaced opposite to the bump of the cap. When the host is closed, the cap and the first part form a buckle connection, to latch the first part and the second part. When being pressed, the cap can move into the second part, so that the buckle connection is released, and the bump of the cap presses the touch-sensitive spring. In this solution, the open button having the foregoing structure is designed, so that the host can be opened and closed.

In an implementation, the earphone and the first accommodation groove match in shape, and/or the earphone and the third accommodation groove match in shape. An internal space of the host can be fully utilized to accommodate the earphone by matching the earphone with an internal shape of the host, to ensure a compact structure and a beautiful appearance of the host.

In an implementation, the earphone includes an earplug, the first electrode, an earphone front housing, the second electrode, and an earphone rear housing. The first electrode is located between the earplug and the earphone front housing. The earphone front housing is connected to the first electrode and the second electrode. The second electrode is connected to the earphone front housing and the earphone rear housing. When the earphone is accommodated in the first accommodation groove or the third accommodation groove, the earplug faces the rotating shaft assembly, and the earphone rear housing is far away from the rotating shaft assembly. The earphone is placed in the host in the foregoing posture, so that the user can quickly wear the earphone after taking out the earphone from the host. This meets an ergonomic requirement.

In an implementation, the host includes a smartwatch. In this solution, a wireless earphone can be directly accommodated in the smartwatch, and product forms of the wireless earphone and the smartwatch are integrated, to reduce devices that need to be carried by the user. This improves user experience.

BRIEF DESCRIPTION OF DRAWINGS

FIG. 120 is a schematic diagram of a B-B sectional structure of the earphone rear-housing assembly in FIG. 113;

FIG. 121 is a schematic diagram of a sectional structure of a first earphone;

FIG. 122 is a schematic diagram of a partially enlarged structure at a position A in FIG. 121;

FIG. 123 is a schematic diagram of a structure of another first earphone;

FIG. 124 is a schematic diagram of a structure of another first earphone;

FIG. 125 is a schematic diagram of a structure of an electronic assembly in a first earphone;

FIG. 126 is a schematic diagram of a structure of an electronic assembly in a first earphone;

FIG. 127 is a schematic diagram of a sectional structure of a first earphone;

FIG. 128 is a schematic diagram of a partially enlarged structure at a position A in FIG. 127;

FIG. 129 is a schematic diagram of a partially enlarged structure at a position B in FIG. 127;

FIG. 130 is a schematic diagram of a matching relationship between a first host attachment magnet in a host and an earphone magnet in a first earphone;

FIG. 131 is a schematic diagram of a magnet design of a first host attachment magnet and an earphone magnet;

Figure 132:
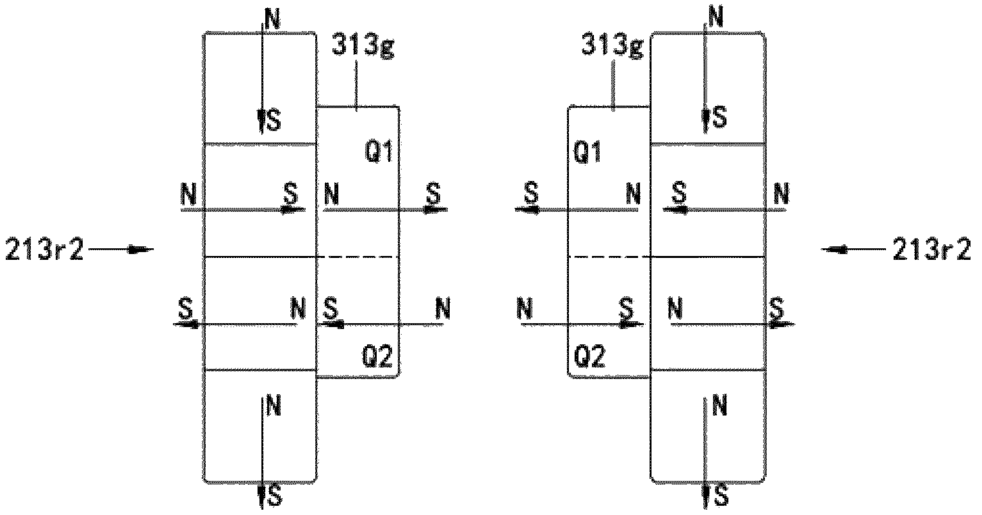
Figure 133:
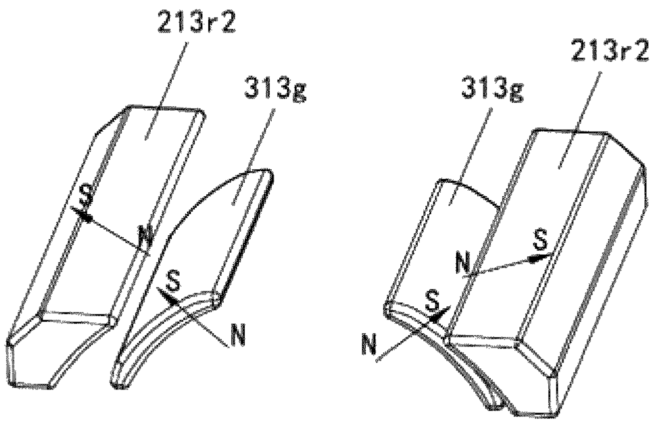
Figure 134:
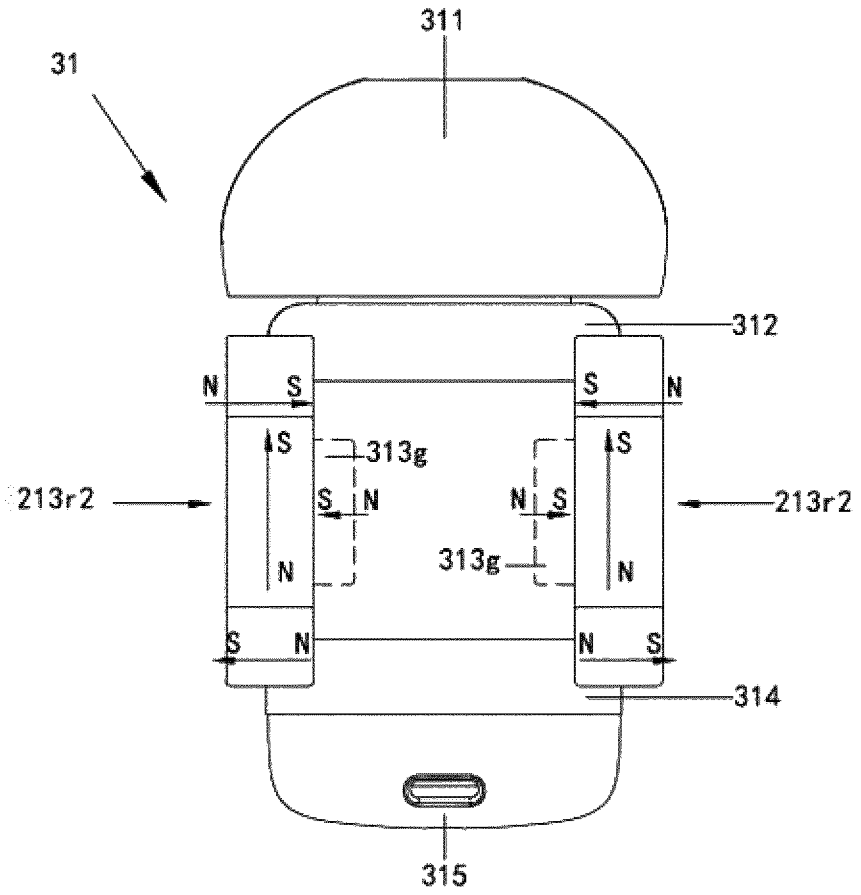
Figure 135:
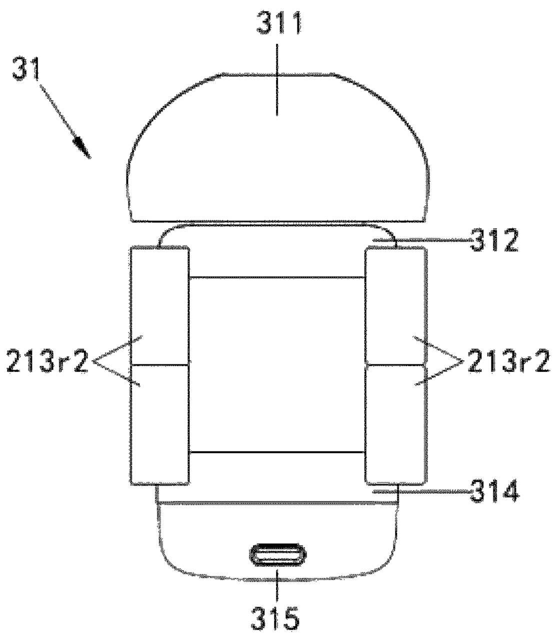
Figure 136:
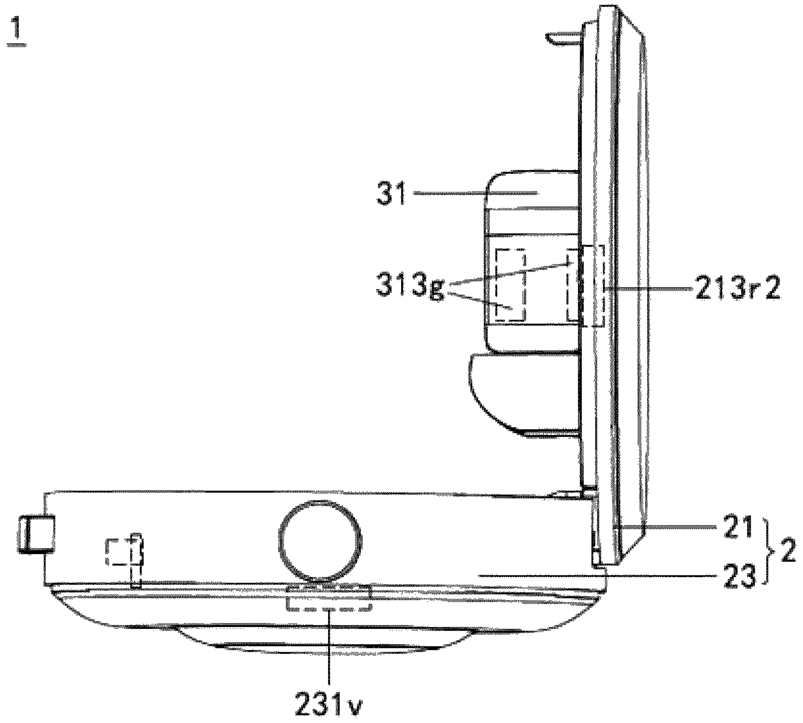
Figure 137:
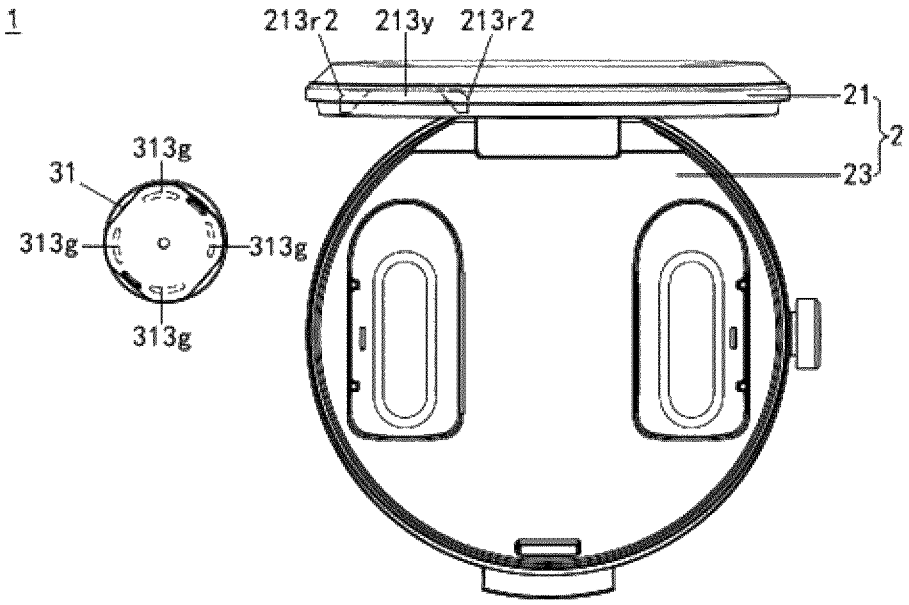
Figure 138:
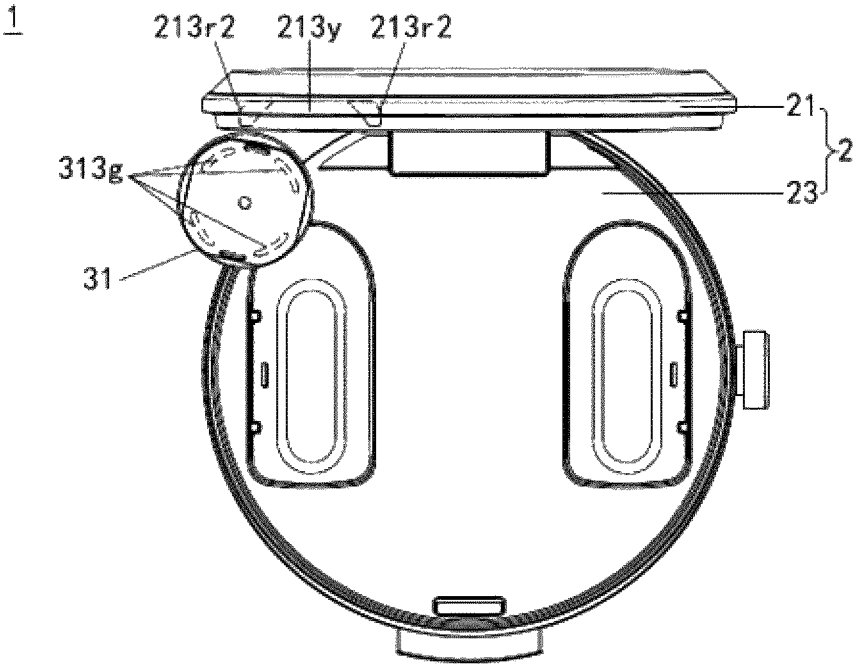
Figure 139:
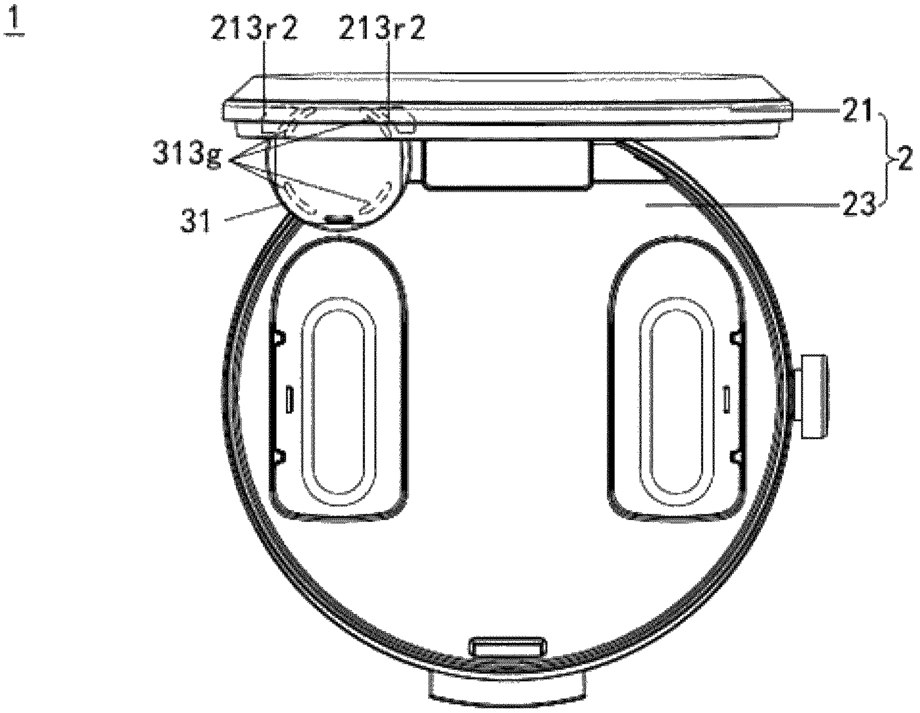
Figure 140:
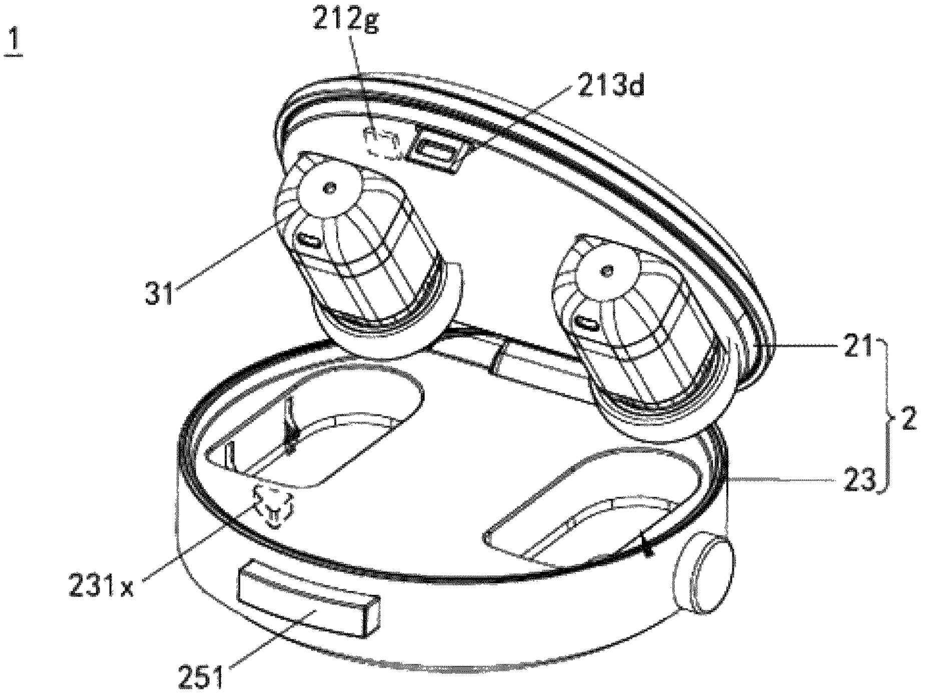
Figure 141:
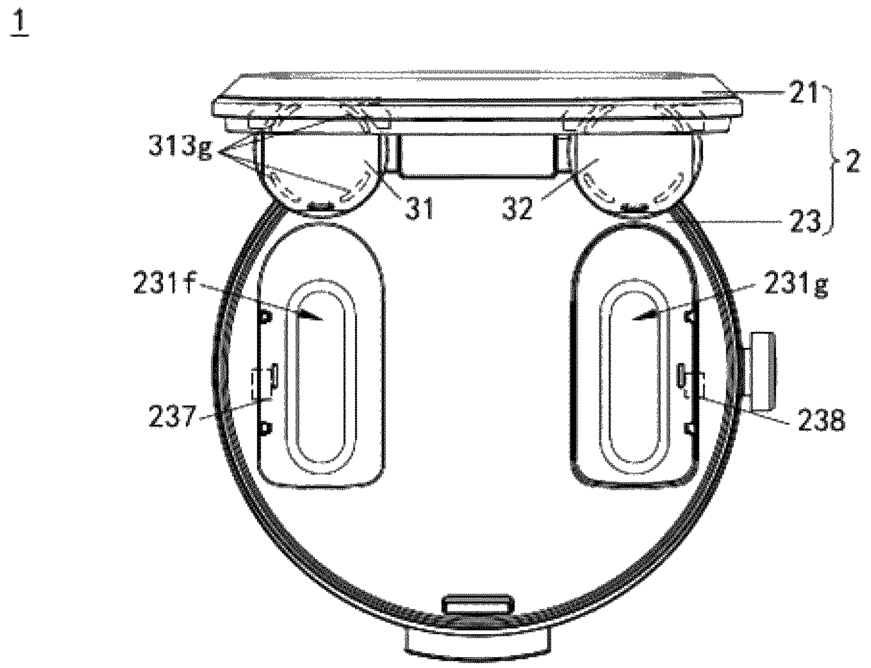
Figure 142:
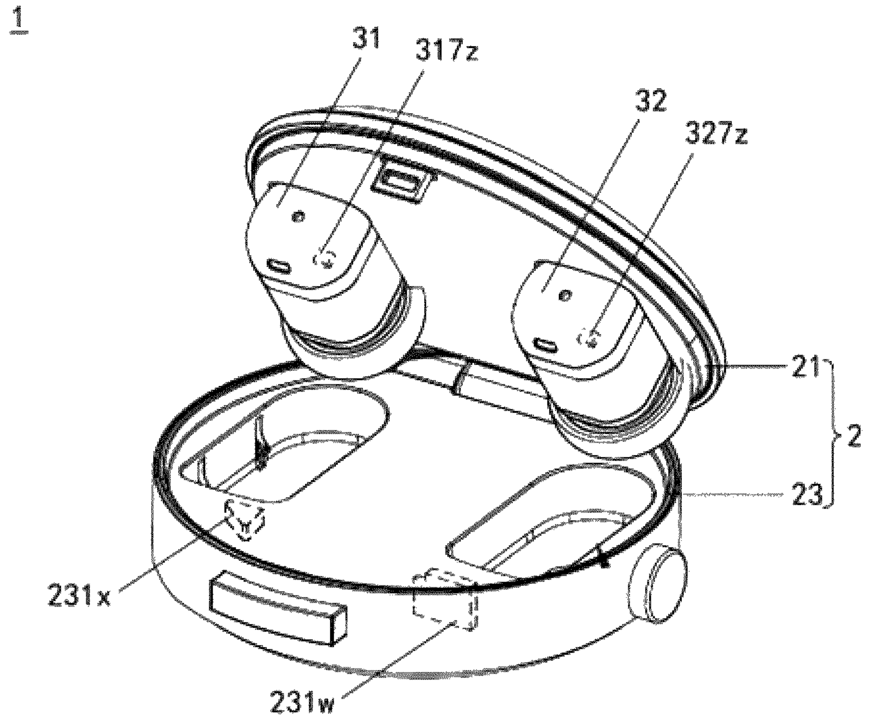
Figure 143:
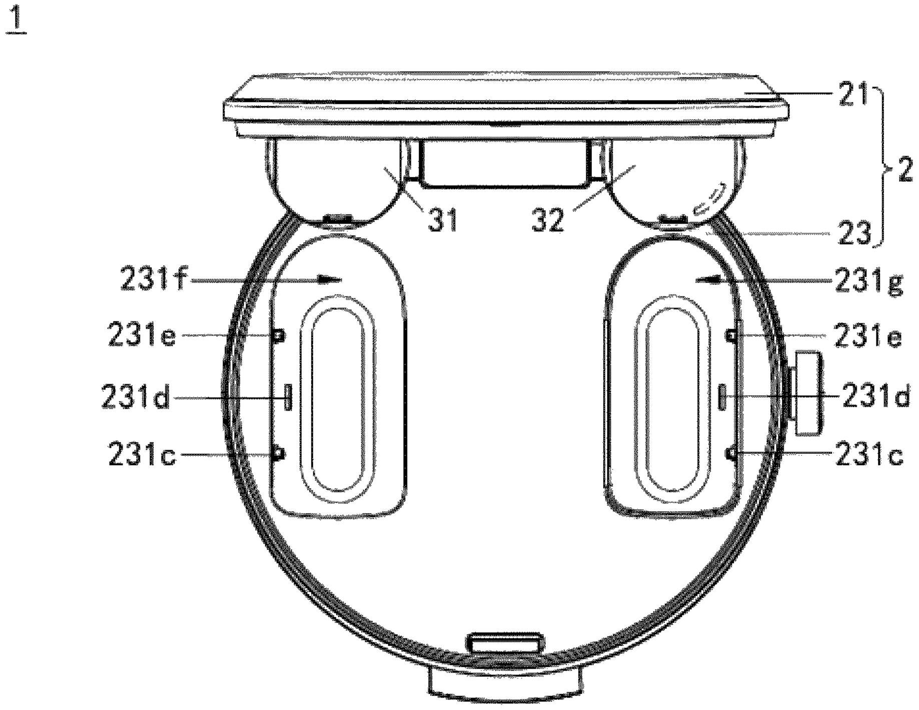

FIG. 132 is a schematic diagram of another magnet design of a first host attachment magnet and an earphone magnet;

FIG. 133 is a schematic diagram of another magnet design of a first host attachment magnet and an earphone magnet;

FIG. 134 is a schematic diagram of another magnet design of a first host attachment magnet and an earphone magnet;

FIG. 135 is a schematic diagram of a design in which a first host attachment magnet is magnetically attached to a first electrode and a second electrode in an earphone;

FIG. 136 is a schematic diagram of a structure in which a first earphone is attached to a first part after a host is opened;

FIG. 137 is a schematic diagram of a process in which a first earphone is automatically placed in position when the first earphone is placed from outside of a host to a first part;

FIG. 138 is a schematic diagram of a process in which a first earphone is automatically placed in position when the first earphone is placed from outside of a host to a first part;

FIG. 139 is a schematic diagram of a process in which a first earphone is automatically placed in position when the first earphone is placed from outside of a host to a first part;

FIG. 140 is a schematic diagram of detecting an open state and a closed state of a host;

FIG. 141 is a schematic diagram in which a host detects an in-box/out-box state of an earphone;

FIG. 142 is a schematic diagram in which an earphone detects an in-box/out-box state of the earphone; and FIG. 143 is a schematic diagram in which a host performs foreign matter detection.

DESCRIPTION OF EMBODIMENTS

The following embodiments of this application provide a wearable device. The wearable device is a brand-new product form in which a host and an earphone are integrated. A product form of the host includes but is not limited to electronic devices such as a smartwatch, an electronic sphygmomanometer, a smart band, a smart helmet, smart clothing, smart glasses, mobile Wi-Fi, and a smart backpack. The earphone is a wireless earphone, and includes but is not limited to a Bluetooth earphone (for example, a true wireless stereo (True Wireless Stereo, TWS) earphone), an infrared earphone, and the like. The following uses an example in which the host has a product form of a smartwatch and the earphone is a Bluetooth earphone for description.

As shown in FIG. 1, FIG. 2, FIG. 3, FIG. 4, and FIG. 5, a wearable device 1 in this embodiment may include a host 2 and earphones 3, and the earphones 3 may be accommodated in the host 2. The following first describes a related design of the host 2, then describes a related design of the earphones 3, and finally describes an overall feature and functions of the wearable device 1.

Product Form and Motion Design of the Host 2

As shown in FIG. 1 to FIG. 4, the host 2 may include a first part 21, a rotating shaft assembly 22, a second part 23, a function button 24, and an open button 25. The first part 21 may be referred to as a cover, and the second part 23 may be referred to as a body.

The host 2 may further include a wrist strap that may be connected to two opposite sides of the second part 23.

Figure 1:
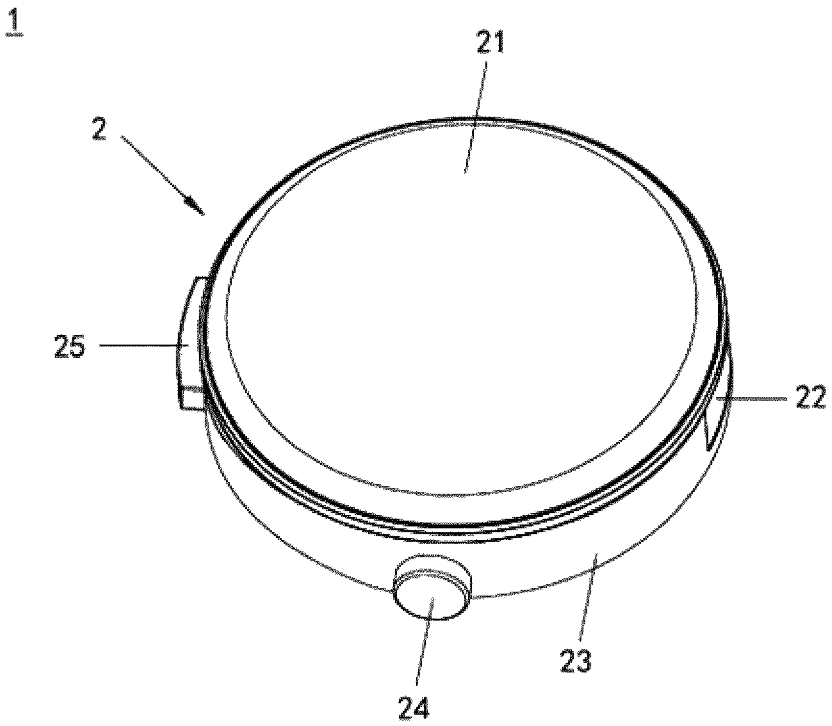
FIG. 1 is a schematic diagram of an assembly structure of a wearable device according to an embodiment of this application.
Figure 2:
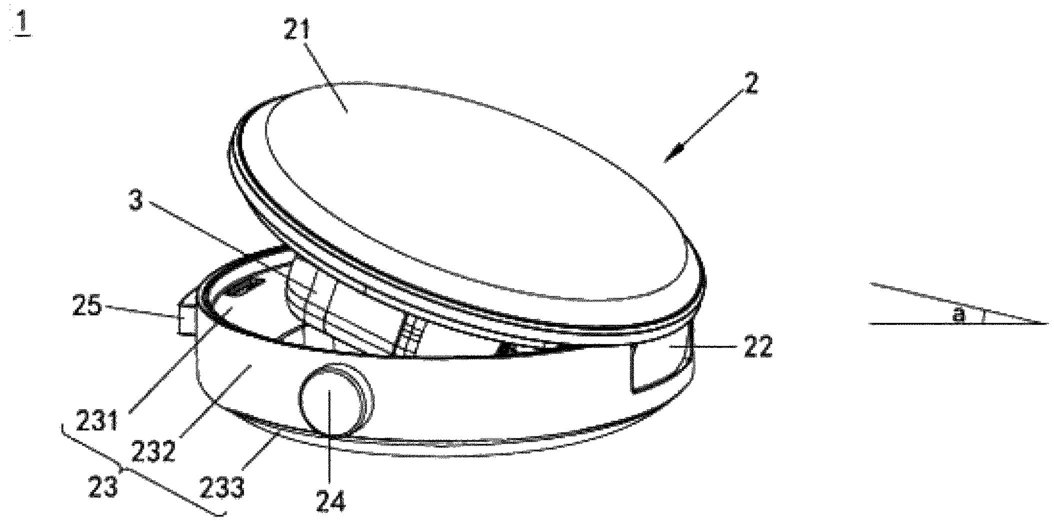
FIG. 2 is a schematic diagram of an assembly structure of a wearable device according to an embodiment of this application.
Figure 3:
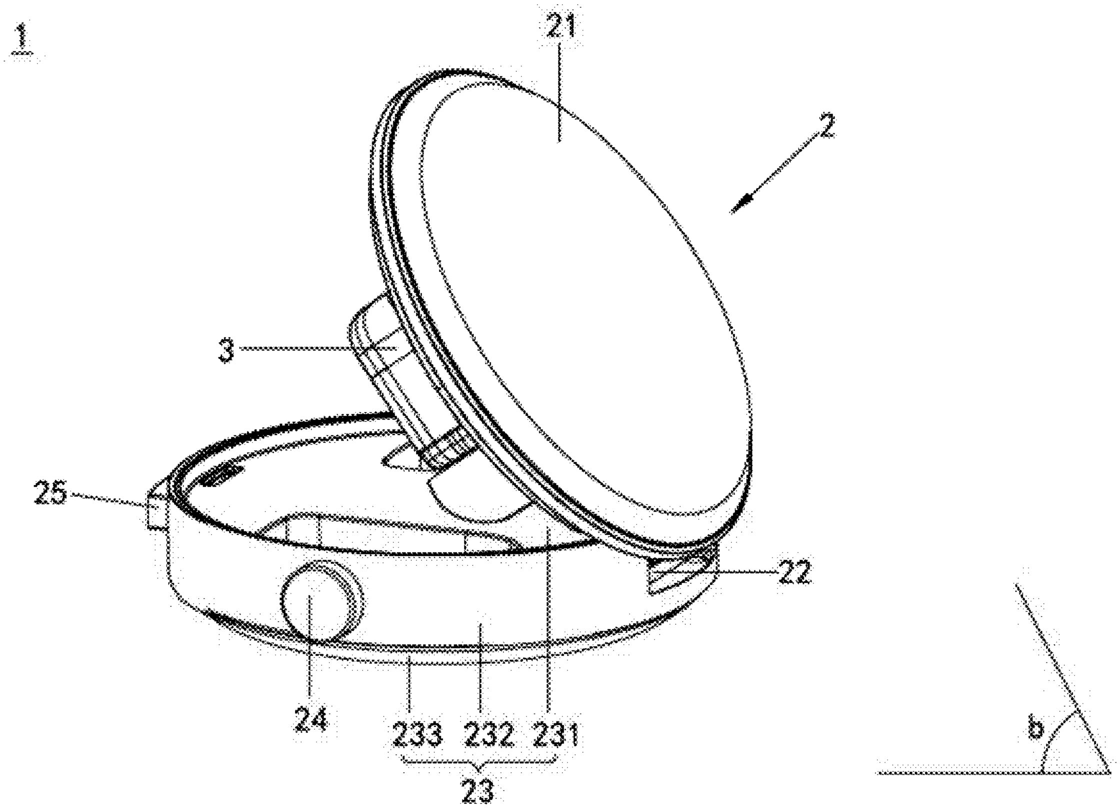
FIG. 3 is a schematic diagram of an assembly structure of a wearable device according to an embodiment of this application.

As shown in FIG. 1 to FIG. 3, the rotating shaft assembly 22 is connected to the first part 21 and the second part 23, and the first part 21 can rotate relative to the second part 23 through the rotating shaft assembly 22, so that the host 2 is in a closed state or an open state. When the host 2 is closed, the first part 21 and the second part 23 can enclose an accommodation space, and the earphones 3 are accommodated in the accommodation space.

In FIG. 1, the host 2 is in the closed state. In this case, the first part 21 and the second part 23 are latched. In all of FIG. 2 to FIG. 5, the host 2 is in the open state. In this case, the first part 21 is opened at an angle relative to the second part 23. For example, an opening angle a of the first part 21 in FIG. 2 may be approximately 15 degrees; an opening angle b of the first part 21 in FIG. 3 may be approximately 75 degrees; and the first part 21 in FIG. 5 rotates to a limit position, and an opening angle c of the first part 21 may be approximately 90 degrees. It may be understood that a specific value of the opening angle c generated when the first part 21 is in the limit position may be designed based on a product requirement, and is not limited to the foregoing descriptions.

Figure 4:
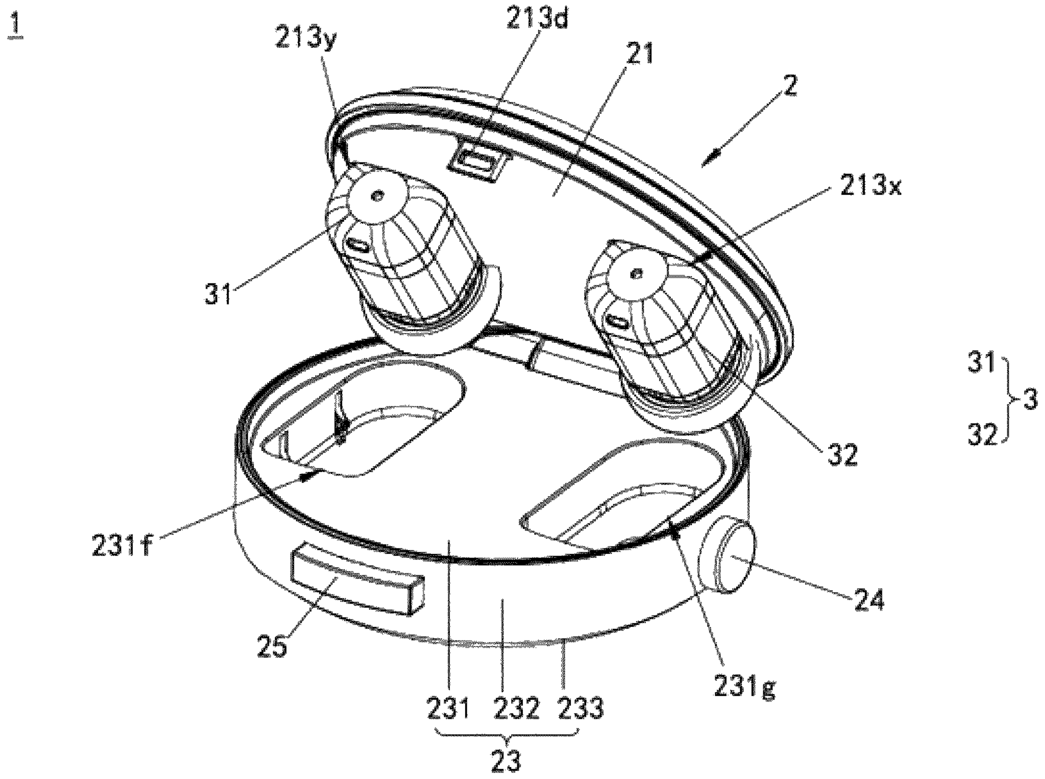
FIG. 4 is a schematic diagram of an assembly structure of a wearable device according to an embodiment of this application.

In addition, in this embodiment, as shown in FIG. 2 to FIG. 4, when the host 2 is in the open state, the earphones 3 may be separated from the second part 23 and attached to the first part 21. This design is convenient for a user to take and place the earphones 3 (descriptions are further provided below). In another embodiment, after the host 2 is opened, the earphones 3 may be accommodated in the second part 23.

In this embodiment, based on a special structure design of the rotating shaft assembly 22, a rotation stroke of the first part 21 can be segmented, and the first part 21 has a corresponding rotation feature in each stroke segment. In a specific stroke segment, the first part 21 can provide a touch feeling feedback (a specific principle is described in detail below).

For example, during opening of the closed host 2, the rotation stroke of the first part 21 may be divided into three segments. A stroke from the state shown in FIG. 1 to the state shown in FIG. 2 may represent a first stroke segment of the first part 21. In the first stroke segment, an opening angle of the first part 21 gradually increases to the opening angle a, and the first part 21 automatically rotates under driving of torque of the rotating shaft assembly 22 without an external force. A stroke from the state shown in FIG. 2 to the state shown in FIG. 3 may represent a second stroke segment of the first part 21. In the second stroke segment, the opening angle of the first part 21 gradually increases from the opening angle a to the opening angle b, the rotating shaft assembly 22 no longer provides the torque for the first part 21, and the first part 21 needs to rotate under driving of the external force. A stroke from the state shown in FIG. 3 to the state shown in FIG. 5 may represent a third stroke segment of the first part 21. In the third stroke segment, the opening angle of the first part 21 gradually increases from the opening angle b to the opening angle c, and the first part 21 automatically rotates under torque driving of the rotating shaft assembly 22 without the external force. When the opening angle of the first part 21 is the opening angle c, the torque of the rotating shaft assembly 22 may continue to exist. It is easily understood that the host 2 has a limiting structure, and the first part 21 may maintain a balanced state under a joint action of the limiting structure and the rotating shaft assembly 22.

A flip of a conventional flip electronic device (for example, a notebook computer or a flip mobile phone) can be opened only after the user continuously applies a force, and touch feeling experience is monotonous. However, in this embodiment, the rotation stroke of the first part 21 is segmented by using a structure design of the rotating shaft assembly 22, so that the first part 21 needs to be driven by a force applied by the user only in the second stroke segment, and may automatically rotate in other stroke segments without the force applied by the user. This provides novel touch feeling experience.

Further, in the third stroke segment, the first part 21 is driven by the rotating shaft assembly 22 in a direction away from the second part 23. When the opening angle of the first part 21 reaches the opening angle c, the driving force of the rotating shaft assembly 22 still exists. Therefore, an operation of removing the earphones 3 from the first part 21 by the user does not easily pull the first part 21 toward the second part 23. This design facilitates the user to remove the earphones 3, and can improve user experience.

In another embodiment, a structure of a rotating shaft may be designed, so that the rotation stroke of the first part 21 does not need to be segmented, and the first part 21 rotates in a manner of continuously applying a force by the user or in an always automatic manner.

As shown in FIG. 1 to FIG. 3, the open button 25 may be mounted on the second part 23. The open button 25 and the rotating shaft assembly 22 may be respectively located at two ends in a radial direction of the second part 23. A part of the open button 25 may be exposed outside the second part 23 for the user to press. A latch structure (descriptions are provided below) in the open button 25 may form a detachable connection with a latch structure (descriptions are provided below) in the first part 21. The open button 25 matches the latch structure in the first part 21 to open and close the host 2.

For example, as shown in FIG. 1, when the host 2 is in the closed state, the latch structure in the open button 25 and the latch structure in the first part 21 form the detachable connection.

With reference to FIG. 1 and FIG. 2, when the user needs to open the host 2, the user may press the open button 25, so that the open button 25 generates a mechanism motion, and the latch structure in the open button 25 no longer matches the latch structure in the first part 21. In this case, the first part 21 may automatically open under driving of the rotating shaft assembly 22, and perform the first stroke segment. Conversely, when the user wants to close the host 2, the user can press down the first part 21 to rotate the first part 21 toward the second part 23. When the latch structure in the second part 23 is in contact with the latch structure in the open button 25, the open button 25 generates a mechanism motion, and the latch structure in the open button 25 recovers to match the latch structure in the first part 21.

A specific principle of opening and closing of the host 2 through latch structures of the open button 25 and the first part 21 is described in detail below.

In another embodiment, the open button may alternatively be mounted in the first part, and the second part has a latch structure. The open button matches the latch structure in the second part, to open and close the host. The first part may be the cover, and the second part may be the body. A design in which the open button 25 is mounted on the second part 23 is used as an example for further description below.

The product form and the motion design of the wearable device 1 are briefly described above. The following describes in detail a specific structure of the wearable device 1 in a sequence of the first part 21, the second part 23, the open button 25, the function button 24, and the rotating shaft assembly 22.

Structure of the Host 2

Figure 5:
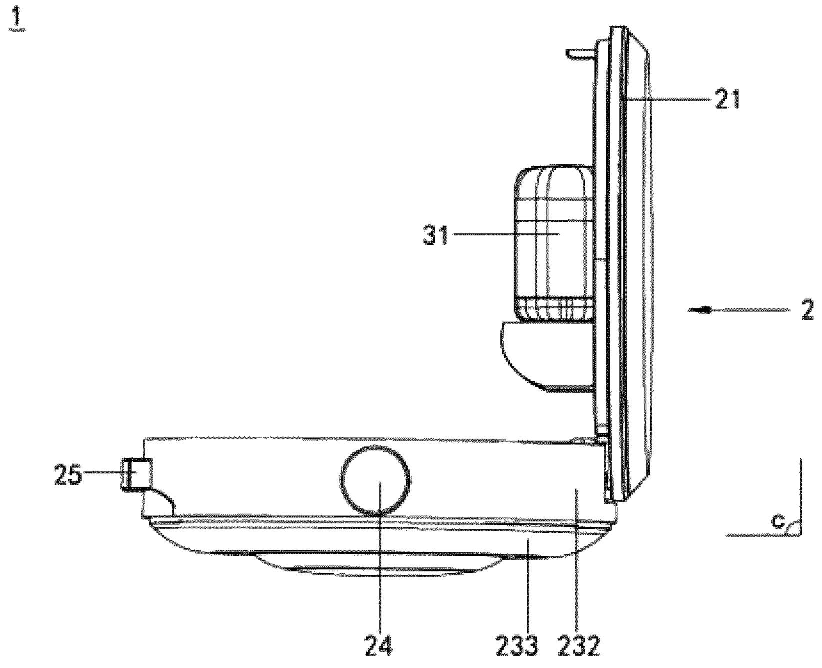
FIG. 5 is a schematic diagram of an assembly structure of a wearable device according to an embodiment of this application.
Figure 6:
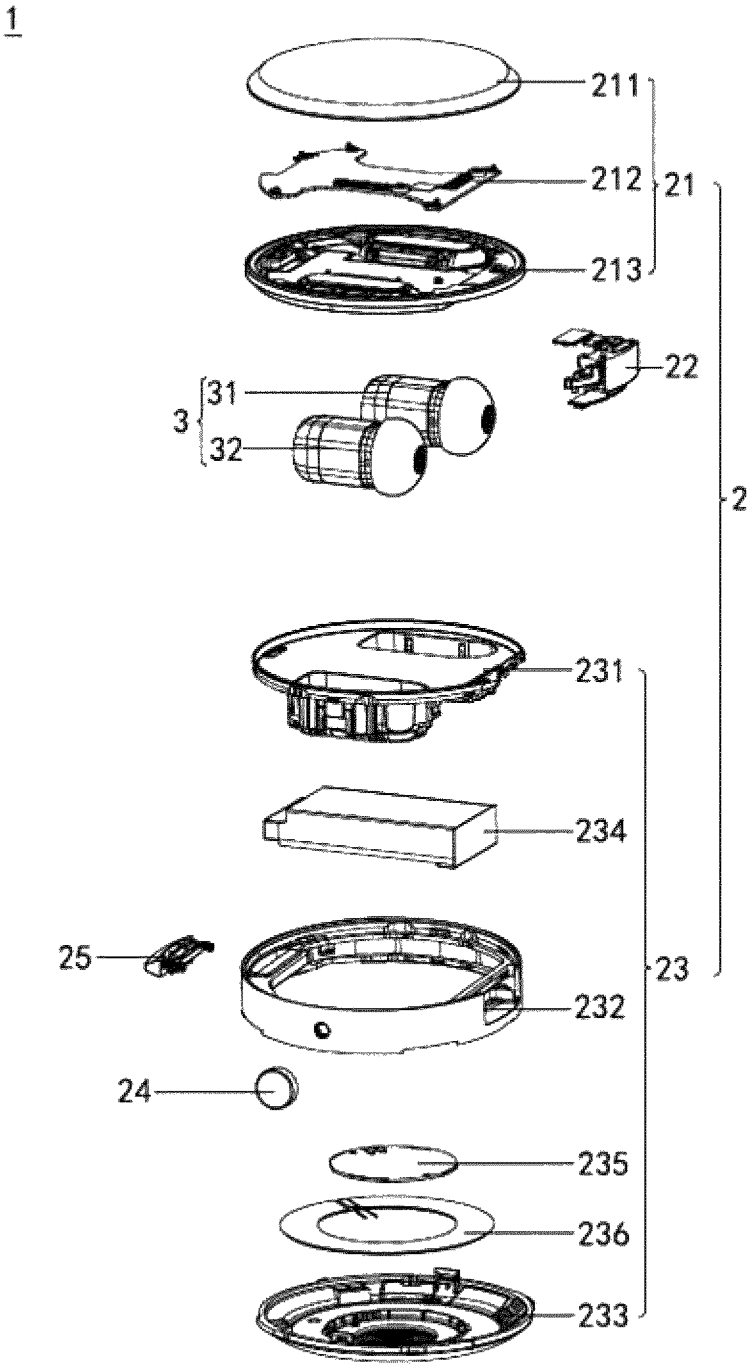
FIG. 6 is a schematic exploded view of a structure of a wearable device according to an embodiment of this application.

As shown in FIG. 5 and FIG. 6, the first part 21 of the host 2 of the wearable device 1 may include a display 211, a first host circuit board assembly 212, and a first host housing 213. Both the display 211 and the first host circuit board assembly 212 are mounted on the first host housing 213, and the first host circuit board assembly 212 is located between the display 211 and the first host housing 213.

Structure of the First Host Housing 213

Figure 7:
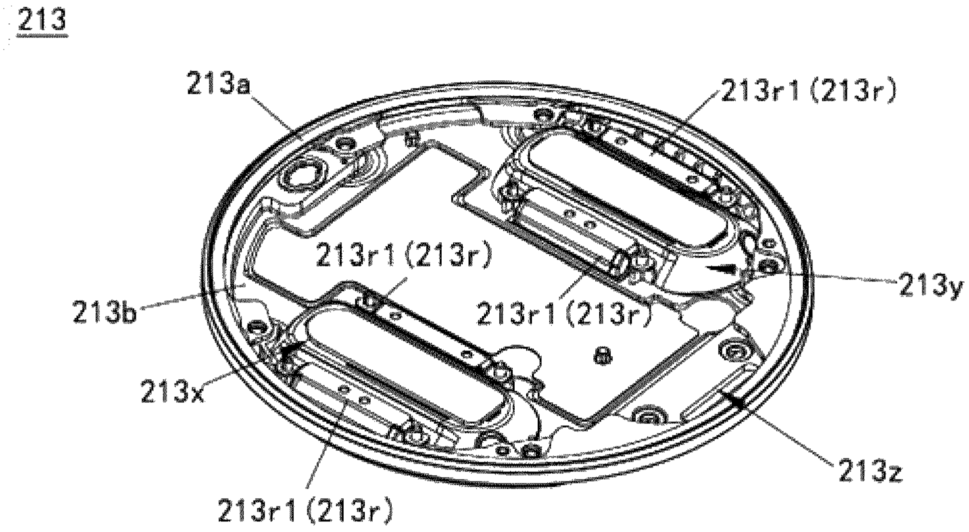
FIG. 7 is a schematic diagram of an assembly structure of a first host housing of the wearable device in FIG. 6.
Figure 8:
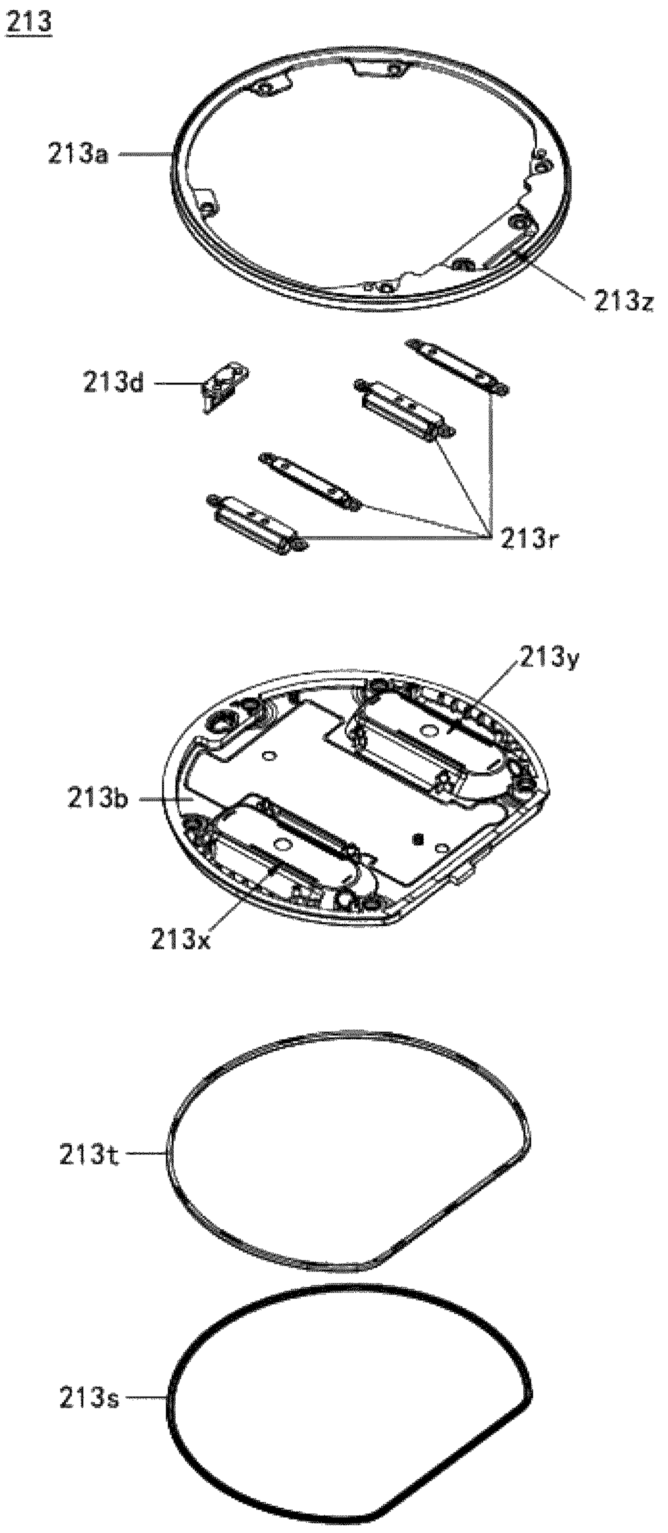
FIG. 8 is a schematic exploded view of a structure of the first host housing in FIG. 7.

As shown in FIG. 7 and FIG. 8, the first host housing 213 may be approximately in a disk shape. The first host housing 213 may be obtained by assembling several components, for example, may include a first frame body **213*a*, a first bracket 213*b*, a magnet assembly 213*r*, a latch portion 213*d* (namely, the latch structure in the first part 21 described above), a sealing bracket 213*t* and a sealing ring 213*s***.

Figure 9:
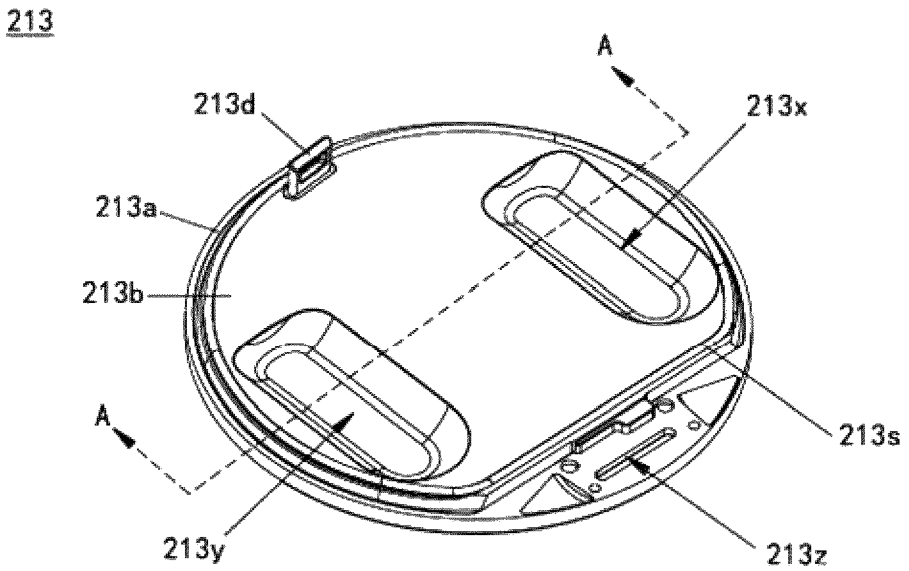
FIG. 9 is a schematic diagram of an assembly structure of a first host housing of the wearable device in FIG. 6.

As shown in FIG. 7 to FIG. 9, the first frame body **213*a* may be roughly a frame structure having a circular outline. A through hole 213*z* may be provided on an edge of the first frame body 213*a*, and the through hole 213*z* may be a waist-shaped hole (or referred to as a runway-shaped hole). The first frame body 213*a* may be made of a conductive material, for example, metal. The first frame body 213*a*** may serve as an antenna (descriptions are provided below).

As shown in FIG. 7 to FIG. 9, the first bracket **213*b* may be approximately of a disk-shaped structure. A first accommodation groove 213*y* and a second accommodation groove 213*x* may be formed in a partial region of the first bracket 213*b*, and the first accommodation groove 213*y* and the second accommodation groove 213*x* are spaced from each other. As shown in FIG. 9, when viewed from one side of the first bracket 213*b*, the partial region in which the first accommodation groove 213*y* and the second accommodation groove 213*x* are formed is in a concave shape. As shown in FIG. 7 and FIG. 8, when viewed from the other side of the first bracket 213*b*, the partial region in which the first accommodation groove 213*y* and the second accommodation groove 213*x* are formed is in a convex shape. As shown in FIG. 4 and FIG. 9, the first accommodation groove 213*y* may be used to accommodate a first earphone 31, and the second accommodation groove 213*x* may be used to accommodate a second earphone 32**.

As shown in FIG. 9, a groove surrounding a periphery of the first bracket **213*b* may further be provided, and an opening of the groove and an opening of the first accommodation groove 213*y* are located on a same side of the first bracket 213*b*. The groove surrounds peripheries of the first accommodation groove 213*y* and the second accommodation groove 213*x*. As described below, the groove is used to mount the sealing bracket 213*t* and the sealing ring 213*s***.

As shown in FIG. 7 to FIG. 9, the first bracket **213*b* is fixedly connected to the first frame body 213*a*, a circumferential region of the first frame body 213*a* surrounds the periphery of the first bracket 213*b*, and the through hole 213*z* of the first frame body 213*a* is also located on an outer side of the first bracket 213*b***.

Figure 10:
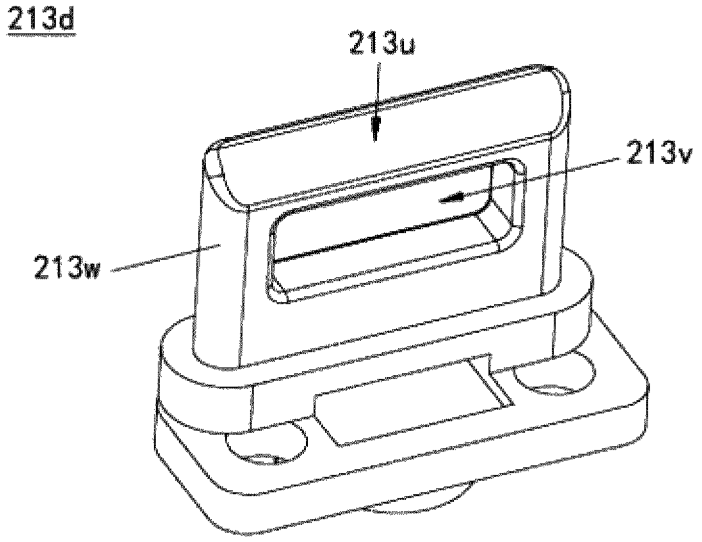
FIG. 10 is a schematic diagram of an assembly structure of a latch portion of the first host housing in FIG. 8.

As shown in FIG. 9, the latch portion **213*d* may be fastened to an edge of the first bracket 213*b*, and may be disposed opposite to the through hole 213$z$ of the first frame body 213$a$. With reference to FIG. 9 and FIG. 10, a frame structure 213$w$ may be provided at an end that is of the latch portion 213$d$ and that is far away from the first bracket 213$b$, and the frame structure 213$w$ may be located on a same side of the first bracket 213$b$ as the opening of the first accommodation groove 213$y$. A through hole 213$v$ may be provided around the frame structure 213$w$. A side that is of the frame structure 213$w$ and that is far away from the first bracket 213$b$ may have a slope 213$u$. The frame structure 213$w$ of the latch portion 213$d$ is used to form a detachable buckle connection (descriptions are provided below) with the latch structure in the open button 25. The slope 213$u$ serves as a guide, so that the frame structure 213$w$ can smoothly match the latch structure in the open button 25**.

Magnet Assembly 213$r$

Figure 11:
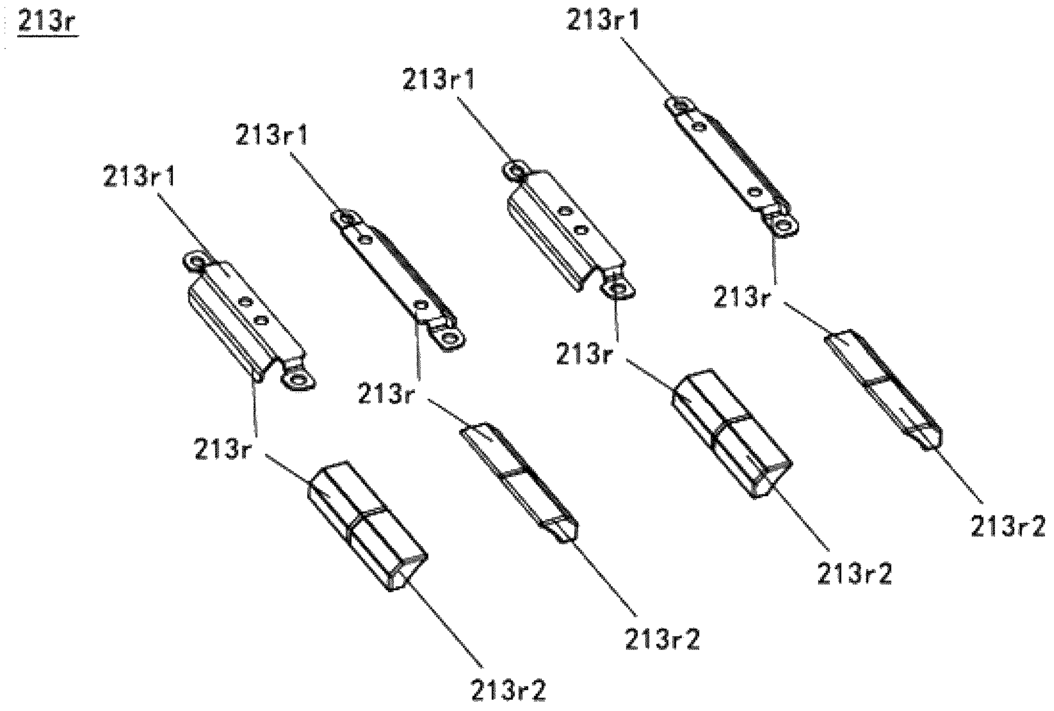
FIG. 11 is a schematic exploded view of a structure of a magnet assembly of the first host housing in FIG. 8.

As shown in FIG. 8 and FIG. 11, the magnet assembly 213$r$ may include a fastening bracket 213$r$1 and a first host attachment magnet 213$r$2.

For example, the first host attachment magnet 213$r$2 may be formed by splicing two single magnets, each single magnet has a single magnetic field direction, and the first host attachment magnet 213$r$2 formed by the two single magnets may have two magnetic field directions. The first host attachment magnet 213$r$2 may form a Halbach array.

Based on a product requirement, in another embodiment, the first host attachment magnet may be a Halbach array formed by splicing another quantity of single magnets. For example, the first host attachment magnet is a Halbach array formed by splicing three single magnets, and the first host attachment magnet may have three magnetic field directions. Alternatively, the first host attachment magnet is a Halbach array formed by splicing four single magnets, and the first host attachment magnet may have four magnetic field directions.

Alternatively, in another embodiment, the first host attachment magnet may be a single magnet and has a single magnetic field direction. Alternatively, the first host attachment magnet may be a single magnet, but the first host attachment magnet may form a Halbach array having at least two magnetic field directions (which may be obtained by magnetizing different physical regions of a single magnet in different directions).

As shown in FIG. 11 and FIG. 7, the first host attachment magnet 213$r$2 in this embodiment may match an outer surface of a groove wall of the first accommodation groove 213$y$ (or the second accommodation groove 213$x$) in the first bracket 213$b$ in shape. The first host attachment magnet 213$r$2 may be fastened to the outer surface of the groove wall of the first accommodation groove 213$y$ and the outer surface of the groove wall of the second accommodation groove 213$x$.

As shown in FIG. 11, there may be, for example, four first host attachment magnets 213$r$2, and structures of the four first host attachment magnets 213$r$2 may be, for example, consistent. With reference to FIG. 11 and FIG. 7, the four first host attachment magnets 213$r$2 may be grouped in pairs. A first group is mounted on the outer surface of the groove wall of the first accommodation groove 213$y$, and two first host attachment magnets 213$r$2 in the first group may be symmetrically mounted on both sides of the groove wall of the first accommodation groove 213$y$ (for example, left and right sides from the perspective of FIG. 7). A second group is mounted on the outer surface of the groove wall of the second accommodation groove 213$x$, and two first host attachment magnets 213$r$2 in the second group are symmetrically mounted on both sides of the groove wall of the second accommodation groove 213$x$ (for example, left and right sides from the perspective of FIG. 7).

In another embodiment, a quantity of first host attachment magnets 213$r$2 may be designed based on a product requirement, and is not limited to the foregoing descriptions.

As shown in FIG. 11, a quantity of fastening brackets 213$r$1 may be consistent with the quantity of first host attachment magnets 213$r$2. For example, there are also four fastening brackets 213$r$1. With reference to FIG. 11 and FIG. 7, the fastening bracket 213$r$1 may be mounted on the first bracket 213$b$, and one fastening bracket 213$r$1 may correspond to one first host attachment magnet 213$r$2, so that each first host attachment magnet 213$r$2 is fastened between one fastening bracket 213$r$1 and the first bracket 213$b$.

In this embodiment, the fastening bracket 213$r$1 can ensure that the first host attachment magnet 213$r$2 is reliably fastened. In another embodiment, the fastening bracket 213$r$1 may not be provided based on a product requirement.

Sealing Bracket 213$t$ and Sealing Ring 213$s$

Figure 12:
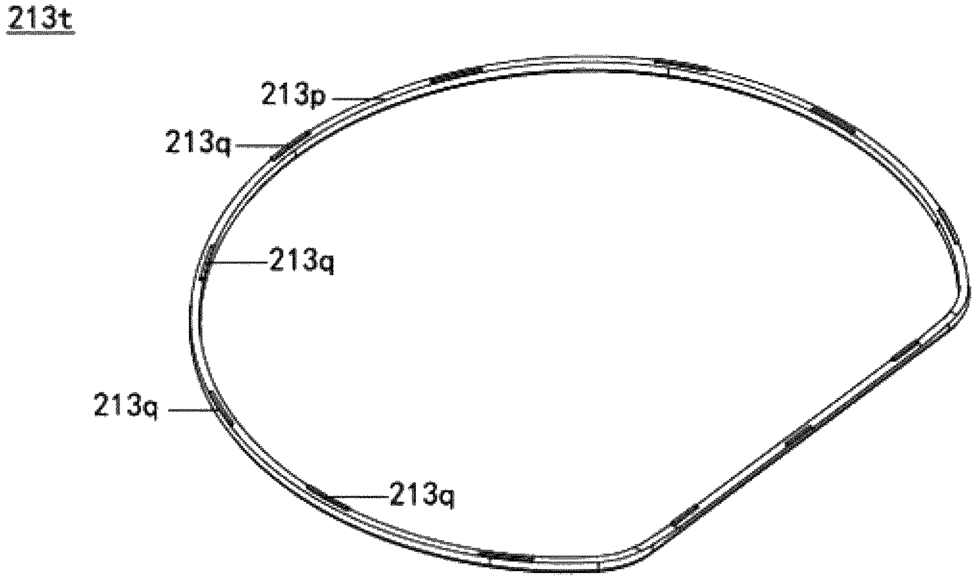
FIG. 12 is a schematic diagram of a structure of a sealing bracket of the first host housing in FIG. 8.

As shown in FIG. 8 and FIG. 12, the sealing bracket 213$t$ may be enclosed in a circle and matches the periphery of the first bracket 213$b$ in shape. The sealing bracket 213 may include a bracket main portion 213$p$, and several protrusions 213$q$ convexly disposed on one side of the bracket main portion 213$p$. All the protrusions 213$q$ may be spaced from each other. A previous protrusion 213$q$ may be close to an outer side of the bracket main portion 213$p$, a next protrusion 213$q$ adjacent to the previous protrusion 213$q$ may be close to an inner side of the bracket main portion 213$p$, and all the protrusions 213$q$ may be arranged according to this rule. In another embodiment, all the protrusions 213$q$ may alternatively not be arranged in a "one inside one outside" manner. For example, all the protrusions 213$q$ may be located on the outer side or the inner side of the bracket main portion 213$p$.

As shown in FIG. 8, the sealing ring 213$s$ may be enclosed in a circle and matches the sealing bracket 213$t$ in shape. The sealing ring 213$s$ is fixedly connected to the sealing bracket 213$t$, and the sealing ring 213$s$ and the sealing bracket 213$t$ may be integrally formed, for example, formed by using an integral injection molding technique. The sealing bracket 213$t$ may have a hard material and large structural strength, and is not easily deformed. The sealing ring 213$s$ may have a soft material and small structural strength, and is easily deformed. A component formed by the sealing ring 213$s$ and the sealing bracket 213$t$ may be referred to as a sealing member.

Figure 13:
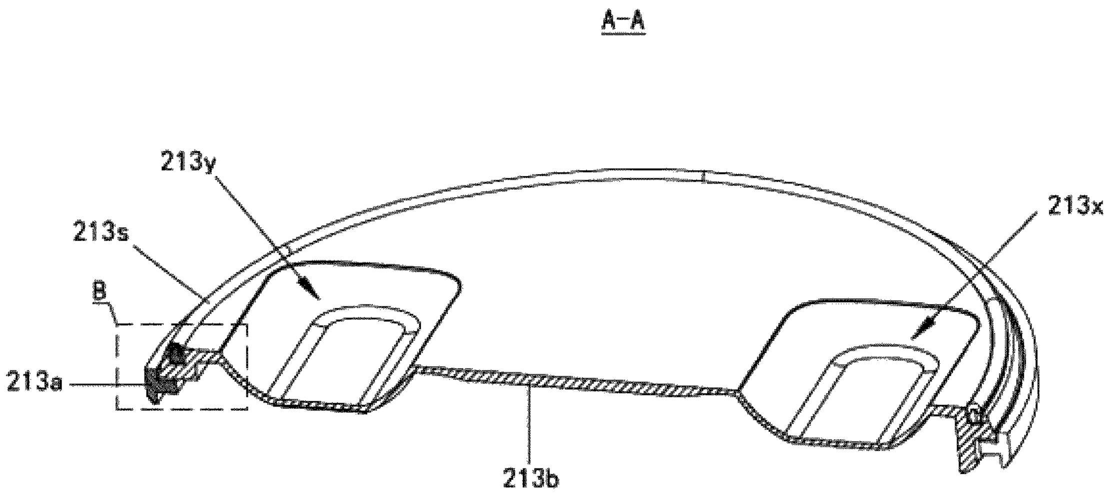
FIG. 13 is a schematic diagram of an A-A sectional structure of the first host housing in FIG. 9.
Figure 14:
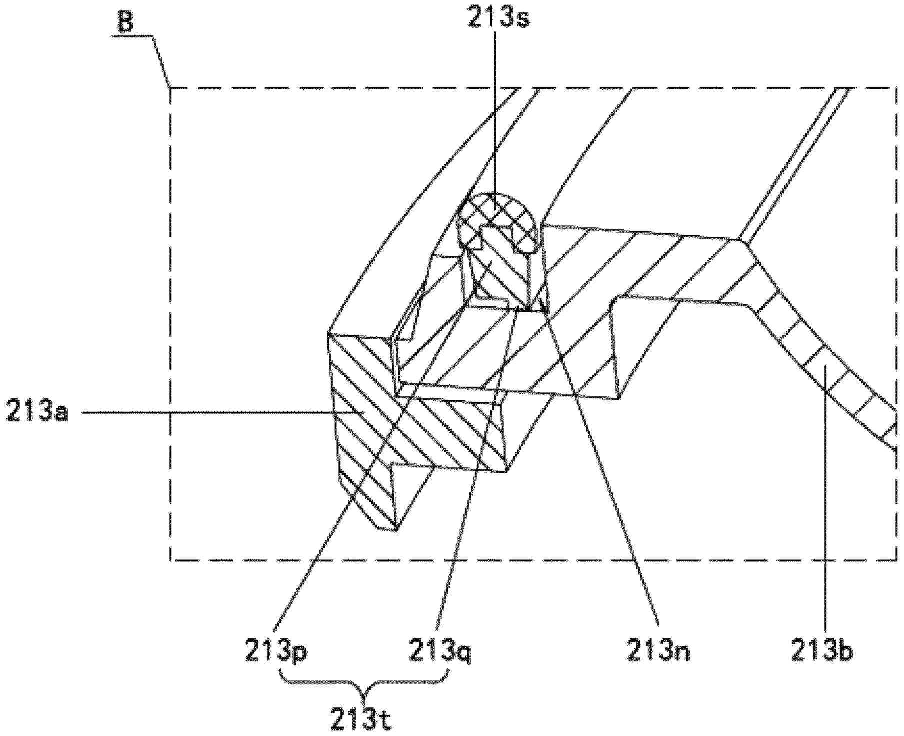
FIG. 14 is a schematic diagram of a partially enlarged structure at a position B in FIG. 13.

FIG. 13 shows an assembly structure including the first frame body 213$a$, the first bracket 213$b$, the sealing bracket 213$t$, and the sealing ring 213$s$. FIG. 14 is a partially enlarged view at a position B in FIG. 13.

As shown in FIG. 14, a groove 213$n$ may be provided on the periphery of the first bracket 213$b$. With reference to FIG. 13 and FIG. 14, the groove 213$n$ surrounds the periphery of the first bracket 213$b$, and the groove 213$n$ may surround the peripheries of the first accommodation groove 213$y$ and the second accommodation groove 213$x$. The sealing bracket 213$t$ is fastened in the groove 213$n$, and the protrusion 213$q$ can be in contact with a bottom surface of the groove 213$n$. A gap is formed between the bottom surface of the groove 213$n$ and a region that is of the bracket main portion 213$p$ and that is not provided with the protrusion 213$q$.

The sealing bracket 213$t$ may be bonded to the groove 213$n$ based on, for example, a dispensing technique. An adhesive may be filled in the groove 213$n$, and is filled in the gap between the bottom surface of the groove 213$n$ and the region that is of the bracket main portion 213*p* and that is not provided with the protrusion 213*q*. Because the sealing bracket 213*t* has several protrusions 213*q* spaced from each other, several gaps are formed between the sealing bracket 213*t* and the bottom surface of the groove 213*n*. This ensures a filling amount of the adhesive, and further ensures adhesive strength. In addition, due to existence of the gap, the adhesive is not easy to overflow, so that a yield of the dispensing technique can be ensured.

As shown in FIG. 14, the sealing ring 213*s* is located on a side that is of the sealing bracket 213*t* and that is far away from the protrusion 213*q*. As explained below, the sealing ring 213*s* is used to seal a gap between the first bracket 213*b* and a second host housing 231 of the host 2.

In this embodiment, the groove 213*n* of the first frame body 213*a* is narrower, and the sealing ring 213*s* is thinner and softer (that is, material hardness of the sealing ring 213*s* is low). It is difficult to separately insert the sealing ring 213*s* into the groove 213*n*. However, the sealing ring 213*s* can be easily assembled to the first frame body 213*a* by connecting the soft sealing ring 213*s* to the hard sealing bracket 213*t* (material hardness of the sealing bracket 213*t* is high), and then placing the sealing bracket 213*t* into the groove 213*n*.

First Host Circuit Board Assembly 212

Figure 15:
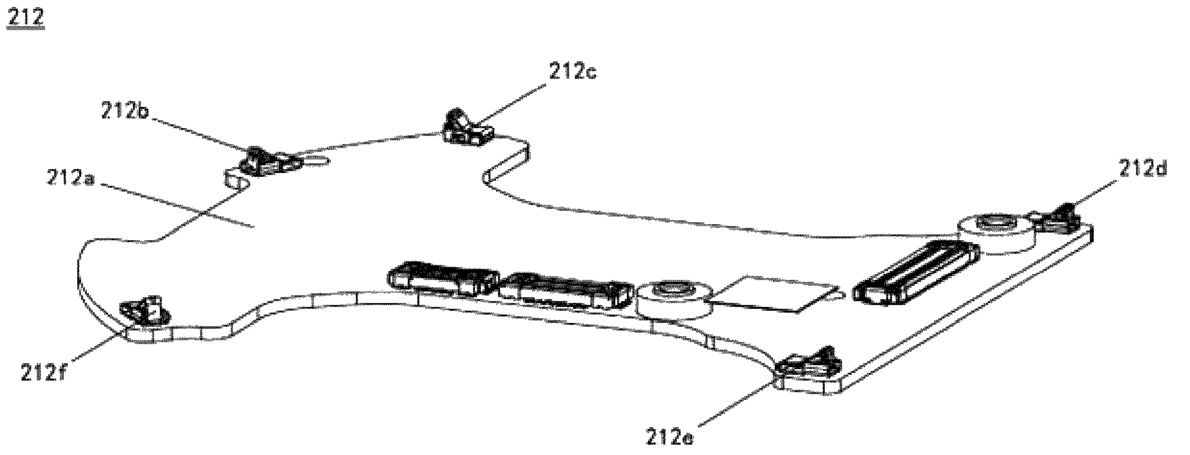
FIG. 15 is a schematic diagram of a structure of a first host circuit board assembly of the wearable device in FIG. 6.

As shown in FIG. 15, the first host circuit board assembly 212 may include a circuit board 212*a* and components disposed on the circuit board 212*a*. The circuit board 212*a* may be, for example, a main circuit board of the host 2. The components on the circuit board 212*a* may include, for example, a grounding spring 212*b*, a grounding spring 212*c*, a grounding spring 212*d*, a grounding spring 212*e*, and a feeding spring 212*f*. The grounding spring 212*b*, the grounding spring 212*c*, the grounding spring 212*d*, and the grounding spring 212*e* may all be electrically connected to a grounding point on the circuit board 212*a*, and the feeding spring 212*f* may be connected to a feeding point on the circuit board 212*a*. The components on the circuit board 212*a* may further include a magnetic field sensor like a Hall effect sensor or a magnetometer.

With reference to FIG. 6 and FIG. 7, the first host circuit board assembly 212 may be mounted on a side that is of the first bracket 213*b* and that is far away from the opening of the first accommodation groove 213*y*, and is partially located between the groove wall of the first accommodation groove 213*y* and the groove wall of the second accommodation groove 213*x*.

Display 211

As shown in FIG. 6, the display 211 may have a circular outline, and an edge of the display 211 may have a transition rounded corner. The display 211 may be connected to both the first frame body 213*a* and the first bracket 213*b* of the first host housing 213. The display 211 may face the first host circuit board assembly 212. The display 211 may be electrically connected to the first host circuit board assembly 212, to implement image display. The display 211 may further have a touch control function.

As shown in FIG. 4 and FIG. 6, the second part 23 of the host 2 of the wearable device 1 may include the second host housing 231, a host battery 234, a third host housing 232, a second host circuit board assembly 235, a wireless charging coil 236, and a fourth host housing 233.

Second Host Housing 231

Figure 16:
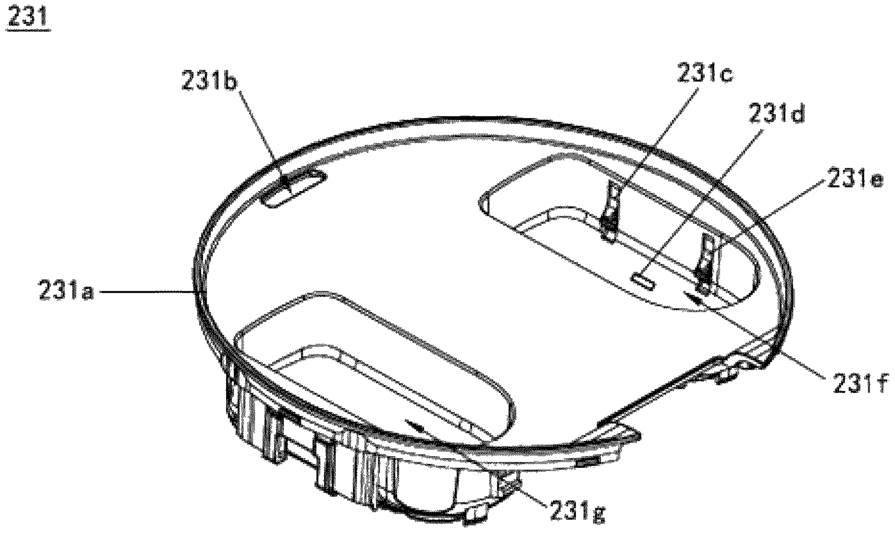
FIG. 16 is a schematic diagram of a structure of a second host housing of the wearable device in FIG. 6.
Figure 17:
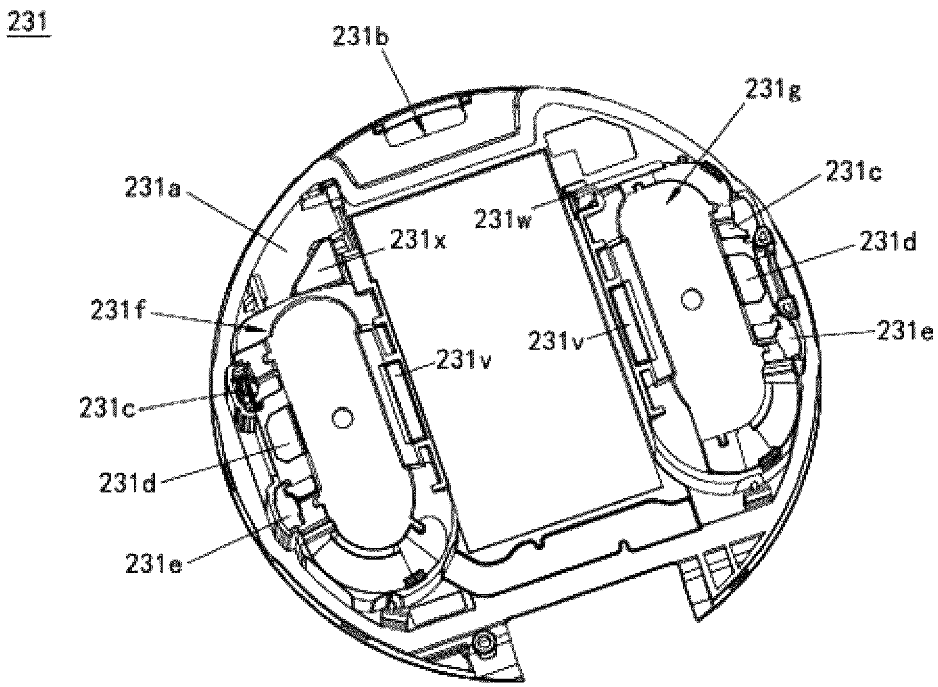
FIG. 17 is a schematic diagram of a structure of a second host housing of the wearable device in FIG. 6.
Figure 18:
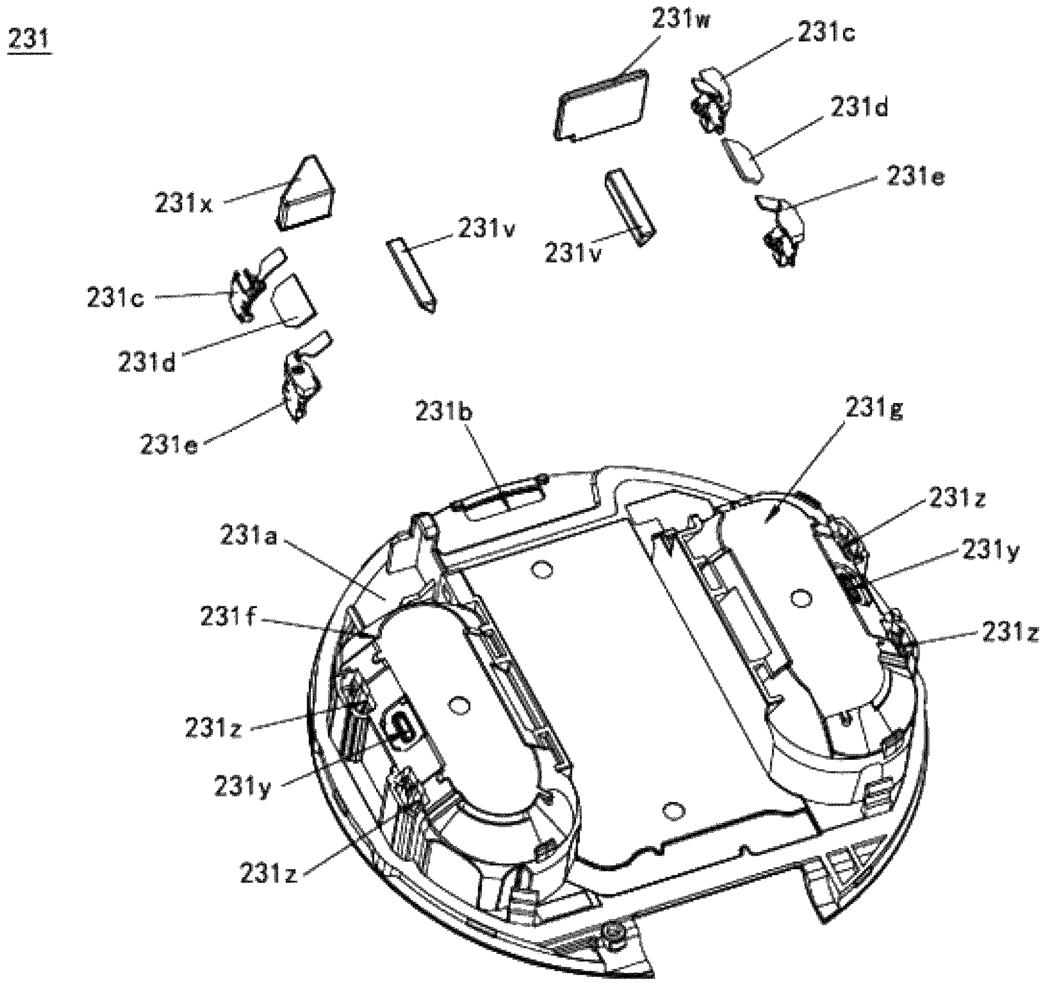
FIG. 18 is a schematic exploded view of a structure of the second host housing in FIG. 17.

As shown in FIG. 16, FIG. 17, and FIG. 18, the second host housing 231 may include a second bracket 231*a*, a second charging spring 231*c*, a first charging spring 231*e*, a foreign matter detection spring 231*d*, a status detection magnet 231*x*, a status detection magnet 231*w*, and a second host attachment magnet 231*v*.

Figure 19:
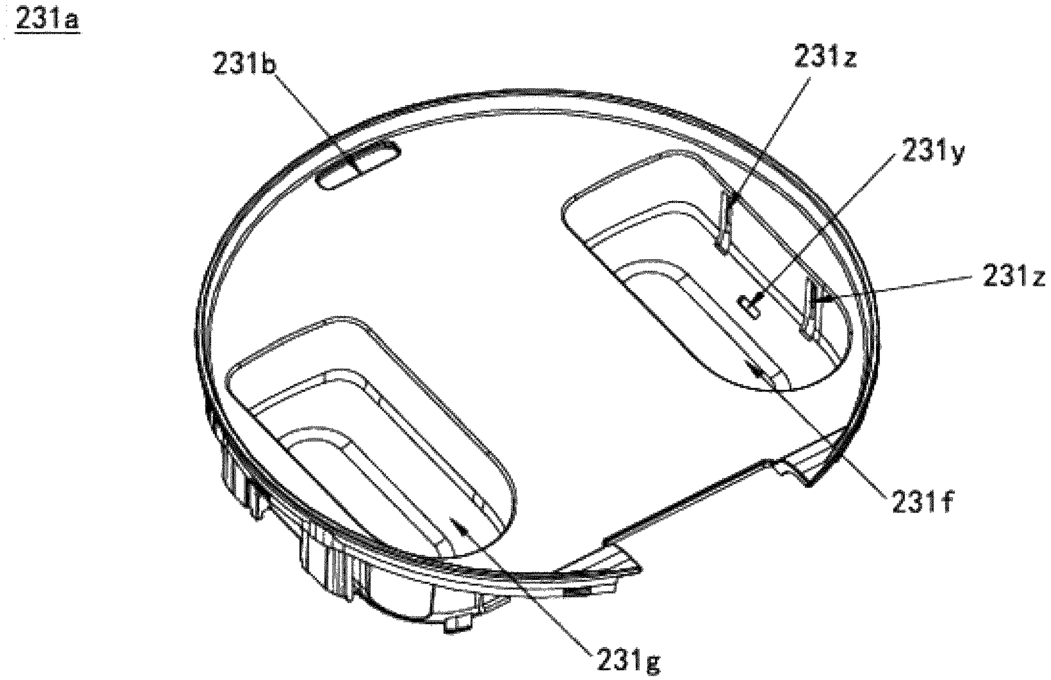
FIG. 19 is a schematic diagram of a structure of a second bracket of the second host housing in FIG. 16.

As shown in FIG. 19, the second bracket 231*a* may have a roughly circular profile. A third accommodation groove 231*f* and a fourth accommodation groove 231*g* may be formed in a partial region of the second bracket 231*a*. The third accommodation groove 231*f* and the fourth accommodation groove 231*g* are spaced from each other, and structures of the third accommodation groove 231*f* and the fourth accommodation groove 231*g* may be basically consistent. When viewed from one side of the second bracket 231*a*, the partial region in which the third accommodation groove 231*f* and the fourth accommodation groove 231*g* are formed is in a concave shape. When viewed from the other side of the second bracket 231*a*, the partial region in which the third accommodation groove 231*f* and the fourth accommodation groove 231*g* are formed is in a convex shape.

With reference to FIG. 4 and FIG. 19, the third accommodation groove 231*f* is used to accommodate the first earphone 31, and the fourth accommodation groove 231*g* is used to accommodate the second earphone 32. When the host 2 is closed, the third accommodation groove 231*f* and the first accommodation groove 213*y* enclose an accommodation space for accommodating the first earphone 31, and the fourth accommodation groove 231*g* and the second accommodation groove 213*x* enclose an accommodation space for accommodating the second earphone 32.

In this embodiment, a groove depth of the third accommodation groove 231*f* may be greater than that of the first accommodation groove 213*y*, and a groove depth of the fourth accommodation groove 231*g* may be greater than that of the second accommodation groove 213*x*. The groove depth may be defined as a maximum distance from an opening of an accommodation groove (a collective name of the first accommodation groove 213*y*, the second accommodation groove 213*x*, the third accommodation groove 231*f*, and the fourth accommodation groove 231*g*) to a groove bottom surface of the accommodation groove in a normal direction of a circuit board in the host 2.

In this embodiment, when the host 2 is opened, the earphones 3 may be attached to the first part 21. One part of the first earphone 31 is located in the first accommodation groove 213*y*, and the other part is located outside the first accommodation groove 213*y*. A maximum distance between the part that is of the first earphone 31 and that is located in the first accommodation groove 213*y* and a plane on which the opening of the first accommodation groove 213*y* is located may be defined as a first distance. A maximum distance between the part that is of the first earphone 31 and that is located outside the first accommodation groove 213*y* and the plane on which the opening of the first accommodation groove 213*y* is located may be defined as a second distance. The first distance is less than the second distance. In other words, when the host 2 is opened, a small part of the first earphone 31 is located in the first accommodation groove 213*y*, and a large part of the first earphone 31 is exposed outside the first accommodation groove 213*y*. For the second earphone 32, similarly, when the host 2 is opened, a small part of the second earphone 32 is located in the second accommodation groove 213*x*, and a large part of the second earphone 32 is located outside the second accommodation groove 213*x*. The design is further described below.

As shown in FIG. 19, two through holes 231*z* may be provided on a groove wall of the third accommodation groove 231*f*. For example, the two through holes 231*z* may be disposed on a side wall of a side that is of the third accommodation groove 231*f* and that is far away from the fourth accommodation groove 231*g*. There is a spacing between the two through holes 231*z*. The two through holes 231*z* are respectively used to mount the second charging spring 231*c* and the first charging spring 231*e* (descriptions are further provided below). A through hole 231*y* may be further provided on the groove wall of the third accommodation groove 231*f*. For example, the through hole 231*y* may be roughly located on a bottom wall of the third accommodation groove 231*f*. The through hole 231*y* is spaced from the two through holes 231*z*. The through hole 231*y* is used to mount the foreign matter detection spring 231*d* (descriptions are further provided below).

As shown in FIG. 19, a groove wall of the fourth accommodation groove 231*g* may also be provided with the through hole 231*z* and the through hole 231*y* (which are collectively referred to as a through hole below). The through holes on the groove wall of the fourth accommodation groove 231*g* may be located on a side that is of the fourth accommodation groove 231*g* and that is far away from the third accommodation groove 231*f*. The through holes on the groove wall of the fourth accommodation groove 231*g* and the through hole on the groove wall of the third accommodation groove 231*f* may be basically symmetrically distributed on both sides of a symmetrical plane of the second bracket 231*a*.

As shown in FIG. 19, a through hole 231*b* may be formed at an edge of the second bracket 231*a*. The through hole 231*b* may be located between the third accommodation groove 231*f* and the fourth accommodation groove 231*g*, and distances between the through hole 231*b* and the third accommodation groove 231*f* and between the through hole 231*b* and the fourth accommodation groove 231*g* may be basically equal. With reference to FIG. 19 and FIG. 4, the through hole 231*b* is used for the latch portion 213*d* in the first part 21 to pass through (descriptions are further provided below).

Charging Spring

As shown in FIG. 18, there may be two second charging springs 231*c* and two first charging springs 231*e*. With reference to FIG. 16 to FIG. 19, one second charging spring 231*c* and one first charging spring 231*e* are mounted on the groove wall of the third accommodation groove 231*f*; and the other second charging spring 231*c* and the other first charging spring 231*e* are mounted on the groove wall of the fourth accommodation groove 231*g*. For the third accommodation groove 231*f*, the second charging spring 231*c* may be located at one through hole 231*z* of the third accommodation groove 231*f*, and a contact of the second charging spring 231*c* may extend into the third accommodation groove 231*f* through the through hole 231*z*. The first charging spring 231*e* may be located at the other through hole 231*z* of the third accommodation groove 231*f*, and a contact of the first charging spring 231*e* may extend into the third accommodation groove 231*f* through the other through hole 231*z*. For the fourth accommodation groove 231*g*, the second charging spring 231*c* may be located at one through hole 231*z* of the fourth accommodation groove 231*g*, and the contact of the second charging spring 231*c* may extend into the fourth accommodation groove 231*g* through the through hole 231*z*. The first charging spring 231*e* may be located at the other through hole 231*z* of the fourth accommodation groove 231*g*, and the contact of the first charging spring 231*e* may extend into the fourth accommodation groove 231*g* through the other through hole 231*z*.

In this embodiment, both the two second charging springs 231*c* and the two first charging springs 231*e* may be electrically connected to the first host circuit board assembly 212 through a line (for example, a flexible circuit board). The second charging spring 231*c* and the first charging spring 231*e* in the third accommodation groove 231*f* are respectively used to be in elastic contact with two electrodes on the first earphone 31, and the second charging spring 231*c* and the first charging spring 231*e* in the fourth accommodation groove 231*g* are respectively used to be in elastic contact with two electrodes on the second earphone 32 (descriptions are further provided below). Therefore, the first earphone 31 may be charged by using the second charging spring 231*c* and the first charging spring 231*e* in the third accommodation groove 231*f*, and the second earphone 32 may be charged by using the second charging spring 231*c* and the first charging spring 231*e* in the fourth accommodation groove 231*g*.

Foreign Matter Detection Spring

As shown in FIG. 18, there may be two foreign matter detection springs 231*d*. With reference to FIG. 16 to FIG. 19, one foreign matter detection spring 231*d* may be mounted on the groove wall of the third accommodation groove 231*f*, and the foreign matter detection spring 231*d* may be located at the through hole 231*y* of the third accommodation groove 231*f*. A contact of the foreign matter detection spring 231*d* may penetrate the through hole 231*y*. The other foreign matter detection spring 231*d* may be mounted on the groove wall of the fourth accommodation groove 231*g*, and the foreign matter detection spring 231*d* may be located at the through hole 231*y* of the fourth accommodation groove 231*g*. A contact of the foreign matter detection spring 231*d* may penetrate the through hole 231*y*.

In this embodiment, the foreign matter detection springs 231*d* may be electrically connected to the first host circuit board assembly 212 through a line (for example, a flexible circuit board). The foreign matter detection springs 231*d* are used to implement foreign matter detection (detecting whether foreign matter enters the third accommodation groove 231*f* and the fourth accommodation groove 231*g*). A specific principle is described below.

Status Detection Magnet

As shown in FIG. 18, schematically, the status detection magnet 231*x* may be a single magnet. The status detection magnet 231*x* may have a single magnetic field direction, or at least two magnetic field directions (that is, a Halbach array is formed). The status detection magnet 231*w* may be a single magnet. The status detection magnet 231*x* may have a single magnetic field direction, or at least two magnetic field directions (namely, a Halbach array).

In another embodiment, the status detection magnet may be a Halbach array formed by splicing at least two single magnets.

As shown in FIG. 18 and FIG. 17, the status detection magnet 231*x* may be fastened to a side that is of the second bracket 231*a* and that is far away from the opening of the third accommodation groove 231*f*, and the status detection magnet 231*x* may be adjacent to the groove wall of the third accommodation groove 231*f*, or may be close to the through hole 231*b*. The status detection magnet 231*w* and the status detection magnet 231*x* are located on a same side of the second bracket 231*a*, and the status detection magnet 231*w* may be adjacent to the groove wall of the fourth accommodation groove 231*g*.

Second Host Attachment Magnet 231*v*

As shown in FIG. 18, schematically, the second host attachment magnet 231*v* may be a single magnet. The second host attachment magnet 231*v* may have a single magnetic field direction, or at least two magnetic field directions (that is, a Halbach array is formed).

Based on a product requirement, in another embodiment, the second host attachment magnet 231*v* may alternatively be a Halbach array formed by splicing at least two single magnets.

As shown in FIG. 18 and FIG. 17, there may be, for example, two second host attachment magnets 231*v* in this embodiment, and structures of the two second host attachment magnets 231*v* may be, for example, consistent. Each of the two second host attachment magnets 231*v* may be fastened to the side that is of the second bracket 231*a* and that is far away from the opening of the third accommodation groove 231*f*. One second host attachment magnet 231*v* may be located on a side that is of the groove wall of the third accommodation groove 231*f* and that faces the fourth accommodation groove 231*g*; and the other second host attachment magnet 231*v* may be located on a side that is of the groove wall of the fourth accommodation groove 231*g* and that faces the third accommodation groove 231*f*.

In another embodiment, a quantity and positions of second host attachment magnets 231*v* may be designed based on a product requirement. For example, one second host attachment magnet 231*v* may be mounted on both sides of the groove wall of the third accommodation groove 231*f*, and one second host attachment magnet 231*v* may be mounted on both sides of the groove wall of the fourth accommodation groove 231*g*.

Host Battery 234

Figure 20:
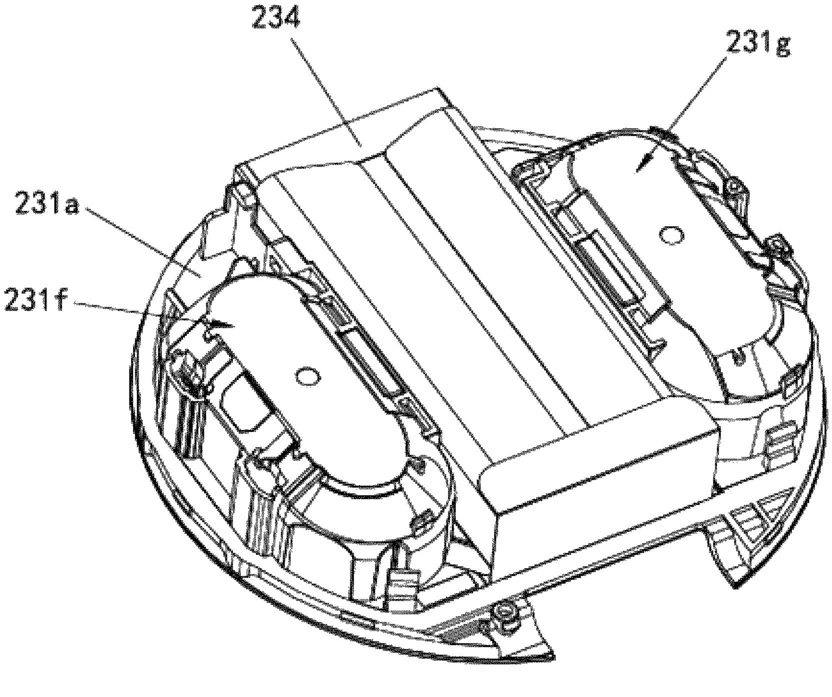
FIG. 20 is a schematic diagram of an assembly structure including a second host housing and a host battery.

As shown in FIG. 6 and FIG. 20, the host battery 234 may be fastened to the second bracket 231*a*, and is located on the side that is of the second bracket 231*a* and that is far away from the opening of the third accommodation groove 231*f*. The host battery 234 may be located between the groove wall of the third accommodation groove 231*f* and the groove wall of the fourth accommodation groove 231*g*. The host battery 234 may be electrically connected to the second host circuit board assembly 235 through a line (for example, a flexible circuit board), and the second host circuit board assembly 235 may be electrically connected to the first host circuit board assembly 212 through a line (for example, a flexible circuit board). Therefore, the host battery 234 can be electrically connected to the first host circuit board assembly 212.

Third Host Housing 232

Figure 21:
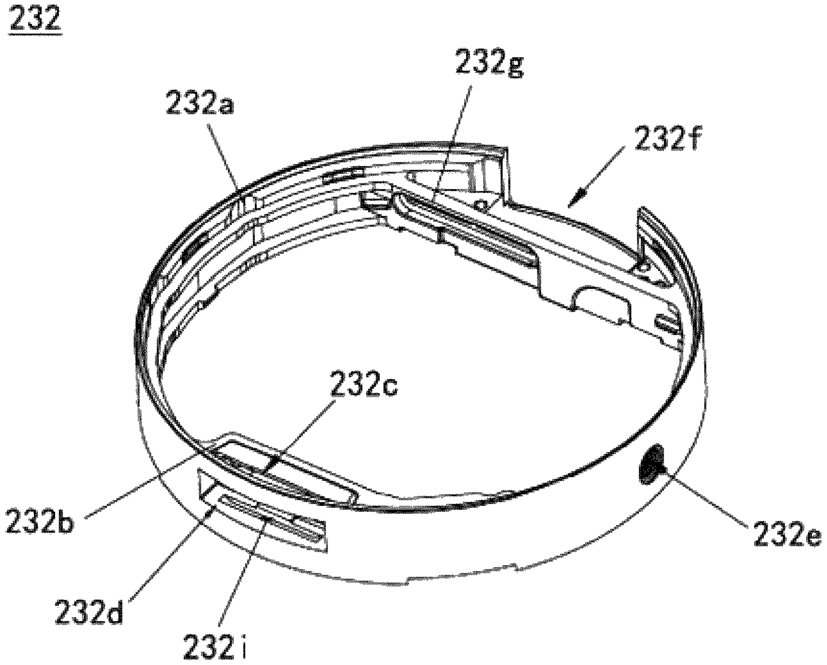
FIG. 21 is a schematic diagram of an assembly structure of a third host housing of the wearable device in FIG. 6.

As shown in FIG. 21, the third host housing 232 may be roughly of a ring-shaped structure. The third host housing 232 may include a circumferential side wall 232*a*, an inner bearing platform 232*b*, and an inner bearing platform 232*g*. The circumferential side wall 232*a* may be enclosed in a ring shape. Both the inner bearing platform 232*b* and the inner bearing platform 232*g* are connected to an inner side of the circumferential side wall 232*a*, and the inner bearing platform 232*b* and the inner bearing platform 232*g* may be spaced from each other, for example, roughly located at both ends in a radial direction of the circumferential side wall 232*a*.

Figure 22:
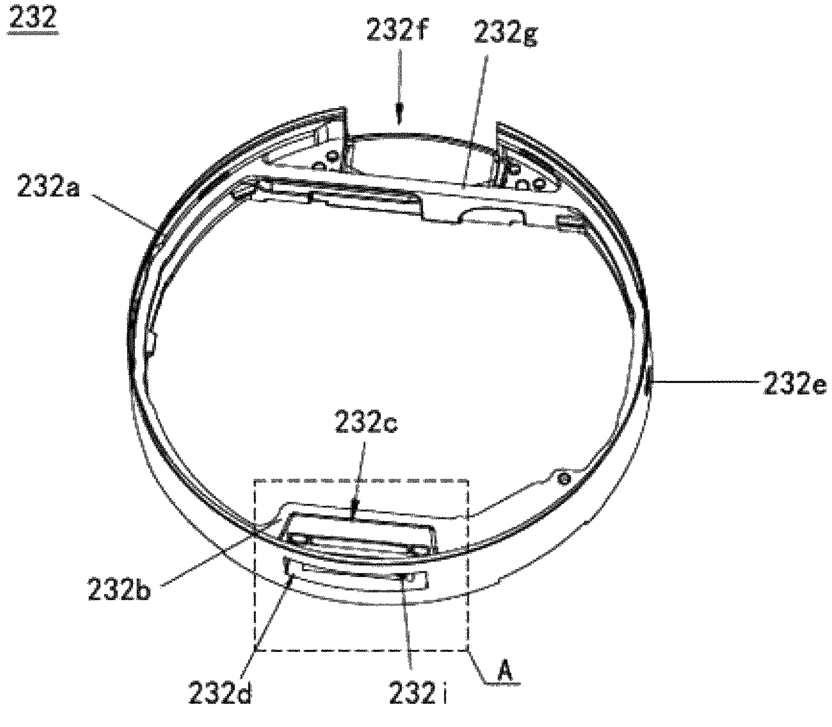
FIG. 22 is a schematic diagram of an assembly structure of a third host housing of the wearable device in FIG. 6.
Figure 24:
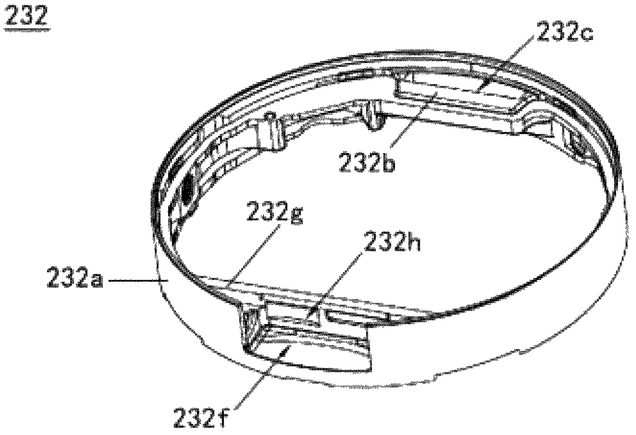
FIG. 24 is a schematic diagram of an assembly structure of a third host housing of the wearable device in FIG. 6.

As shown in FIG. 22, the third host housing 232 may have a rotating shaft mounting space 232*f*, and the rotating shaft mounting space 232*f* may be a groove formed in the inner bearing platform 232*g* and penetrating the circumferential side wall 232*a*. The rotating shaft mounting space 232*f* is used to mount the rotating shaft assembly 22. As shown in FIG. 24, an inner surface of the rotating shaft mounting space 232*f* may have a limiting groove 232*h*, and the limiting groove 232*h* may be opposite to an opening that is of the rotating shaft mounting space 232*f* and that is formed on the circumferential side wall 232*a*.

As shown in FIG. 22, the third host housing 232 may further have an open button mounting space, the open button mounting space may form a second opening 232*c* on the inner bearing platform 232*b*, and the open button mounting space may further penetrate the circumferential side wall 232*a* and form a first opening 232*d* on the circumferential side wall 232*a*. The open button mounting space may be opposite to the rotating shaft mounting space 232*f*. For example, the open button mounting space and the rotating shaft mounting space 232*f* may be located roughly at two opposite ends of a same diameter of the third host housing 232.

Figure 23:
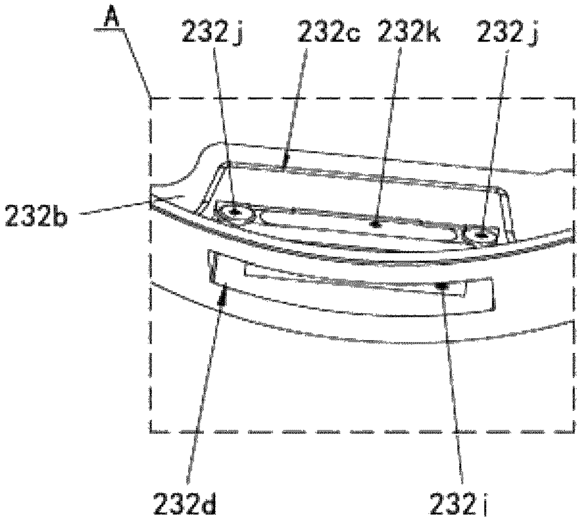
FIG. 23 is a schematic diagram of a partially enlarged structure at a position A in FIG. 22.

As shown in FIG. 22 and FIG. 23, a groove 232*i* may be provided on an inner surface that is of the open button mounting space and that is opposite to the second opening 232*c*. The groove 232*i* may be an elongated groove. A guiding groove 232*j* and a groove 232*k* may be provided on an inner surface that is of the open button mounting space and that is opposite to the first opening 232*d*. The guiding groove 232*j* may be a round hole, and there may be two guiding grooves 232*j*. The groove 232*k* may be runway-shaped, and the groove 232*k* may be located between the two guiding grooves 232*j*.

As shown in FIG. 21 and FIG. 22, the third host housing 232 may further have a function button mounting through hole 232*e*, and the function button mounting through hole 232*e* may be opened on the circumferential side wall 232*a*, and may be located between the rotating shaft mounting space 232*f* and the first opening 232*d*. The function button mounting through hole 232*e* is used to mount the function button 24.

Open Button 25

Figure 25:
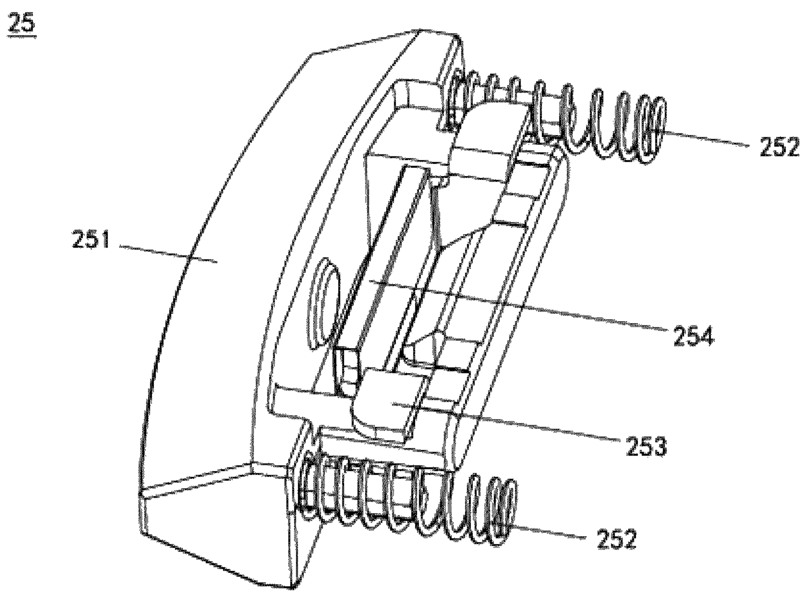
FIG. 25 is a schematic diagram of an assembly structure of an open button of the wearable device in FIG. 6.
Figure 26:
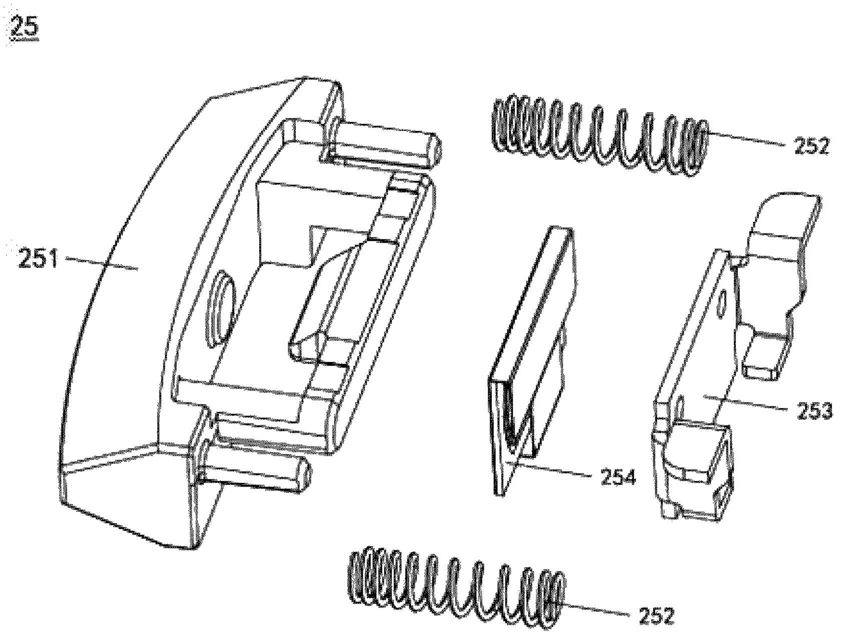
FIG. 26 is a schematic exploded view of a structure of the open button in FIG. 25.

As shown in FIG. 25 and FIG. 26, the open button 25 may include a cap 251, an elastic member 252, a button support 253, and a touch-sensitive spring 254.

Figure 27:
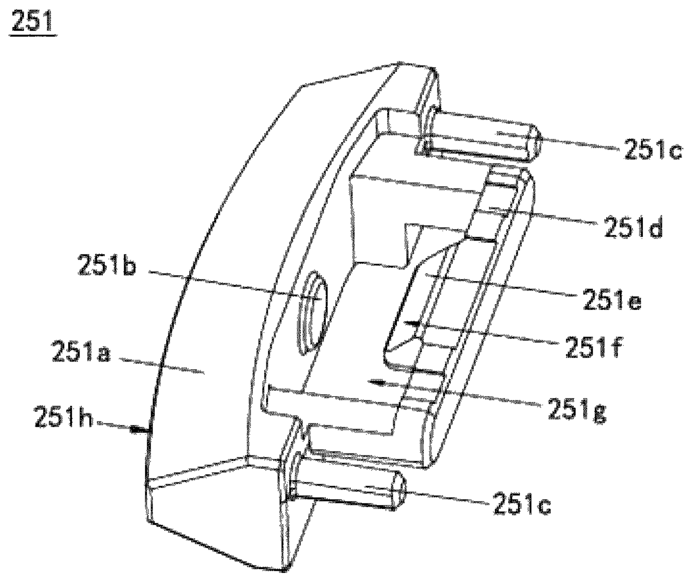
FIG. 27 is a schematic diagram of a structure of a cap of the open button in FIG. 25.

As shown in FIG. 27, the cap 251 may be an integrated frame structure. The cap 251 may include a pressing portion 251*a*, a bump 251*b*, a guiding portion 251*c*, a bearing portion 251*d*, and a buckle 251*e*.

As shown in FIG. 27, the pressing portion 251*a* may be roughly in a long strip shape, and a cross section of the pressing portion 251*a* is roughly a trapezoid (the cross section may be perpendicular to a length direction of the pressing portion 251*a*). The pressing portion 251*a* has a surface 251*h*, and the surface 251*h* is a surface on which an upper bottom of the trapezoidal cross section of the pressing portion 251*a* is located.

As shown in FIG. 27, the bump 251*b* may be provided on another surface of the pressing portion 251*a* and is far away from the surface 251*h* of the pressing portion 251*a*. A surface of the bump 251*b* may be a curved surface, a plane, or formed by connecting a curved surface and a plane.

As shown in FIG. 27, the guiding portion 251*c* may be in a column shape, for example, a cylinder. The guiding portion 251*c* may be convexly disposed on the another surface of the pressing portion 251*a*, and the guiding portion 251*c* and the bump 251*b* may be located on a same side of the pressing portion 251*a*. There may be two guiding portions 251*c*, and the two guiding portions 251*c* may be respectively located at two opposite ends of the pressing portion 251*a*. The guiding portions 251*c* are configured to guide the cap 251 when the cap 251 moves.

As shown in FIG. 27, the bearing portion 251*d* is connected to a side that is of the pressing portion 251*a* and that is far away from the surface 251*h*, and the bearing portion

251_d_ is located between the two guiding portions 251_c_. The bearing portion 251_d_ may be roughly C-shaped. Two free ends of a C-shaped structure of the bearing portion 251_d_ are connected to the pressing portion 251_a_. The bearing portion 251_d_ and the pressing portion 251_a_ may jointly form an open space 251_g_. The bearing portion 251_d_ is used to bear the button support 253.

As shown in FIG. 27, the buckle 251_e_ may be connected to the bearing portion 251_d_ and located in the open space 251_g_. The buckle 251_e_ may face the bump 251_b_. The buckle 251_e_ may have an assembly guide slope 251_f_. The buckle 251_e_ is the latch structure in the open button 25 described above.

As shown in FIG. 25 and FIG. 26, the elastic member 252 may be a spring. Alternatively, the elastic member 252 may be another component that can be elastically telescopic. There may be two elastic members 252. With reference to FIG. 26 and FIG. 27, one elastic member 252 may be sleeved on one guiding portion 251_c_, and the other elastic member 252 may be sleeved on the other guiding portion 251_c_.

Figure 28:
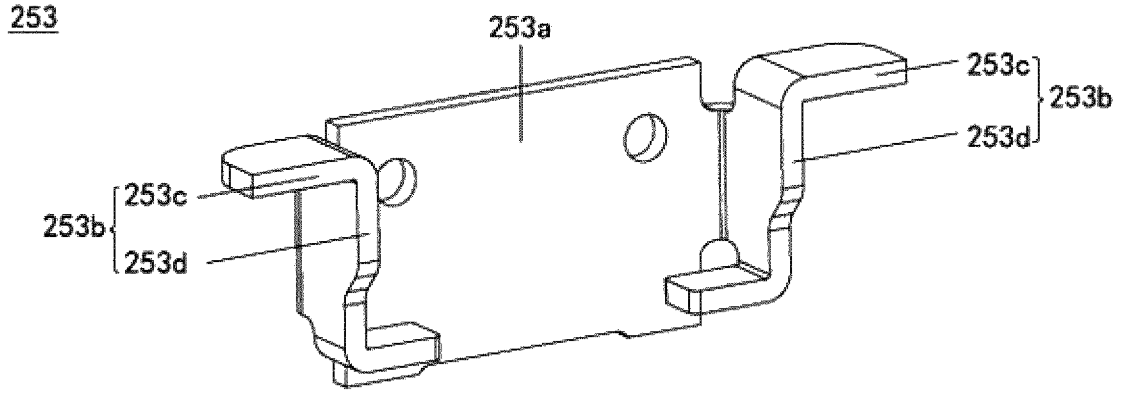
FIG. 28 is a schematic diagram of a structure of a button support of the open button in FIG. 25.

As shown in FIG. 28, the button support 253 may include a support body 253_a_ and two mounting ears 253_b_ that are respectively connected to two sides of the support body 253_a_. The support body 253_a_ may be in a flat-plate shape. The mounting ears 253_b_ may be bent plate-like. The mounting ears 253_b_ each may include a first plate 253_c_ and a second plate 253_d_, and the first plate 253_c_ and the second plate 253_d_ may be roughly bent by 90 degrees. The two first plates 253_c_ in the two mounting ears 253_b_ may be bent backward relative to the second plate 253_d_. For example, from the perspective of the figure, the first plate 253_c_ on the left side may be bent to the left relative to the second plate 253_d_ on the left side, and the first plate 253_c_ on the right side may be bent to the right relative to the second plate 253_d_ on the right side.

In another embodiment, the two mounting ears may alternatively be bent in a same direction.

With reference to FIG. 27 and FIG. 28, the button support 253 may be mounted in the open space 251_g_ of the cap 251, and the two mounting ears 253_b_ of the button support 253 may be supported on the bearing portion 251_d_ of the cap 251. The button support 253 is configured to fasten the touch-sensitive spring 254, and may be further configured to limit the cap 251 when the cap 251 moves to a limit position.

Figure 29:
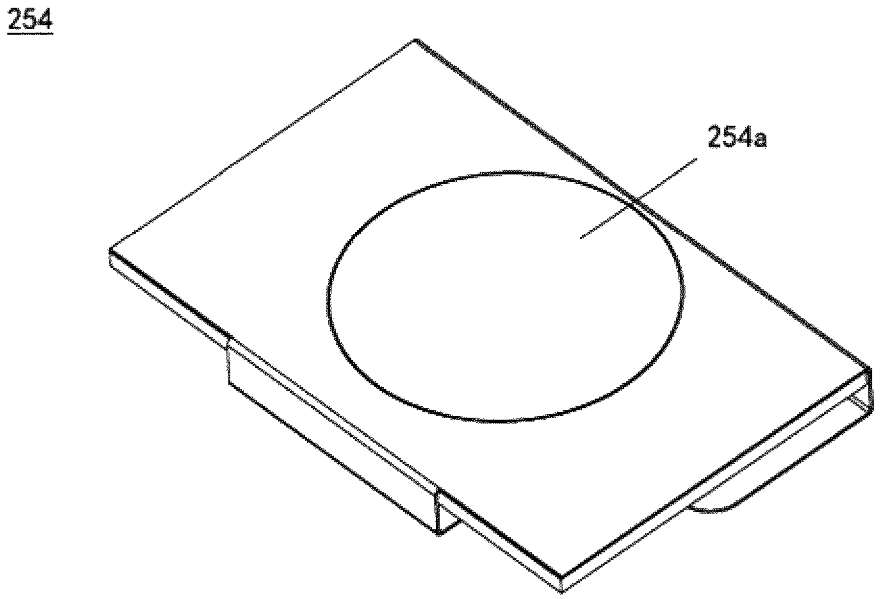
FIG. 29 is a schematic diagram of a structure of a touch-sensitive spring of the open button in FIG. 25.

In this embodiment, the touch-sensitive spring 254 has elastic deformation performance, and can be compressed when a force is applied, and rebound after pressure disappears. As shown in FIG. 29, the touch-sensitive spring 254 may be, for example, a dome spring. The dome spring may include a polyethylene glycol terephthalate (polyethylene glycol terephthalate, PET) sheet, a metal dome (or referred to as a button spring), an adhesive, a film, and the like. The touch-sensitive spring 254 may have an elastic region 254_a_. The elastic region 254_a_ may be in a convex shape when being not pressed, may be in a concave shape after being pressed, and may restore to the convex shape after pressure disappears.

With reference to FIG. 29 and FIG. 25, the touch-sensitive spring 254 may be fastened to the button support 253, and the elastic region 254_a_ may face the bump 251_b_.

The foregoing describes a detailed structure of the open button 25. The following describes assembly of the open button 25 and the third host housing 232 and matching between the open button 251 and the latch portion 213_d_ on the first bracket 213_b_.

Figure 30:
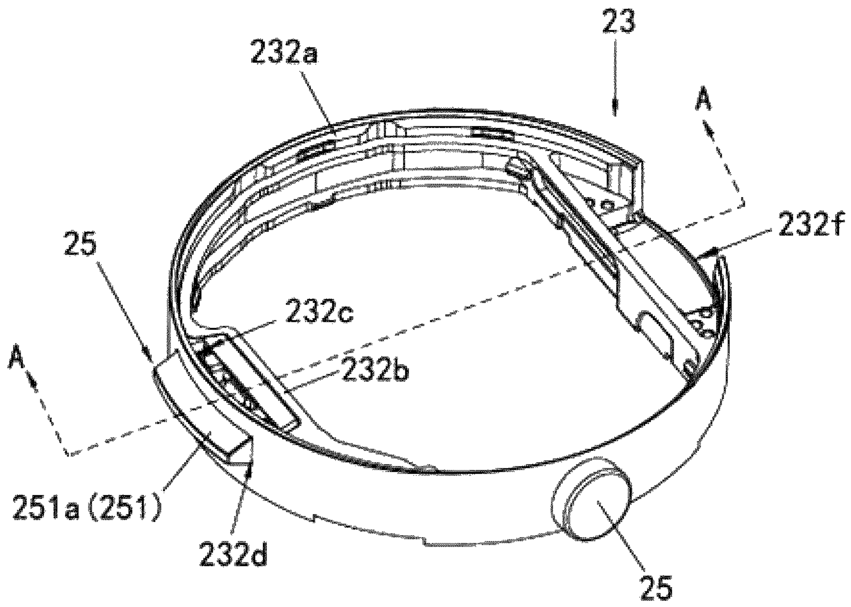
FIG. 30 is a schematic diagram of an assembly structure including an open button and a third host housing.
Figure 31:
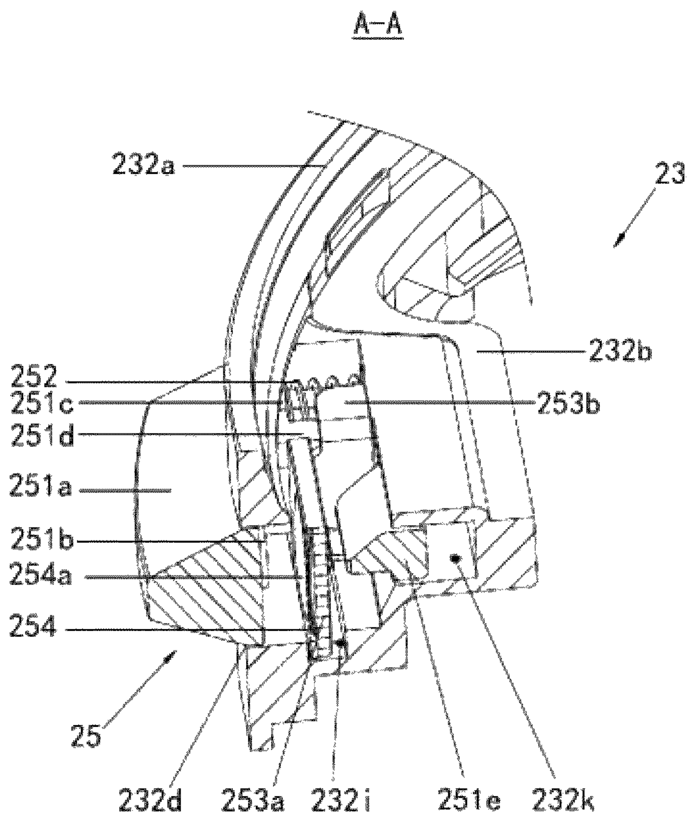
FIG. 31 is a schematic diagram of an A-A sectional structure in FIG. 30.

As shown in FIG. 30 and FIG. 31, the open button 25 may be mounted in the open button mounting space of the third host housing 232. A state of the open button 25 shown in FIG. 30 and FIG. 31 corresponds to the closed state of the host 2.

As shown in FIG. 31, the pressing portion 251_a_ may be exposed from the first opening 232_d_ of the open button mounting space. With reference to FIG. 31 and FIG. 23, a part of the guiding portion 251_c_ may be located in the guiding groove 232_j_, but is not in contact with a bottom surface of the guiding groove 232_j_. As shown in FIG. 31, a part that is of the bearing portion 251_d_ and that is spaced opposite to the pressing portion 251_a_ may be located in the groove 232_k_. The buckle 251_e_ may be located in the open button mounting space and outside the groove 232_k_. The cap 251 can move in an axial direction of the guiding portion 251_c_. Due to a limiting effect of the first opening 232_d_ on the pressing portion 251_a_, the cap 251 basically cannot move in other directions.

With reference to FIG. 31 and FIG. 23, the elastic member 252 is sleeved on the guiding portion 251_c_, and a part of the elastic member 252 may be located in the guiding groove 232_j_. One end of the elastic member 252 is in contact with the pressing portion 251_a_, and the other end is in contact with the bottom surface of the guiding groove 232_j_.

As shown in FIG. 31 and FIG. 27, the button support 253 and the cap 251 may be assembled and fastened in the open button mounting space. The support body 253_a_ of the button support 253 may be located in the open space 251_g_ of the cap 251 and inserted into the groove 232_i_, and the support body 253_a_ may abut against a side wall of a side that is of the groove 232_i_ and that is close to the first opening 232_d_. The two mounting ears 253_b_ of the button support 253 may be respectively supported (or referred to as overlapped) on both sides of the bearing portion 251_d_. Each mounting ear 253_b_ may abut against a part that is of the bearing portion 251_d_ and that is spaced opposite to the pressing portion 251_a_, so that the cap 251 cannot continue to move out of the open button mounting space. In other words, this is a limiting effect of the button support 253 on the cap 251 at a limit position. Each mounting ear 253_b_ may abut against a top surface of a side wall of the groove 232_k_ (a surface that is of the side wall and that faces the first opening 232_d_). Therefore, a side wall of the groove 232_i_ and the side wall of the groove 232_k_ may limit the button support 253 in an opposite direction, so that the button support 253 basically cannot move in an axial direction of the guiding groove 232_j_.

As shown in FIG. 31, the touch-sensitive spring 254 may be fastened to the support body 253_a_. The touch-sensitive spring 254 may be inserted into the groove 232_i_, or the touch-sensitive spring 254 may be located outside the groove 232_i_. The touch-sensitive spring 254 is located between the bump 251_b_ and the buckle 251_e_, and the elastic region 254_a_ of the touch-sensitive spring 254 faces the bump 251_b_. There is a specific spacing between the touch-sensitive spring 254 and the buckle 251_e_.

As shown in FIG. 31, when the user presses the cap 251 from the pressing portion 251_a_, the cap 251 moves into the open button mounting space. In this case, the guiding portion 251_c_ moves into the guiding groove 232_j_, and the elastic member 252 is gradually compressed. The bearing portion 251_d_ slides into the groove 232_k_ relative to the mounting ears 253_b_, and the buckle 251_e_ moves into the groove 232_k_. The bump 251_b_ is close to the touch-sensitive spring 254. When the bump 251_b_ squeezes the elastic region 254*a* and enables the elastic region 254*a* to elastically deform, the user may experience a touch feeling feedback.

On the contrary, when the pressing portion 251*a* is no longer pressed, the elastic member 252 bounces and pushes the cap 251 to move out of the open button mounting space. In this case, the guiding portion 251*c* moves out of the guiding groove 232*j*, and the elastic member 252 is gradually elongated. The bearing portion 251*d* slides out of the groove 232*k* relative to the mounting ears 253*b*, and the buckle 251*e* moves out of the groove 232*k*. The bump 251*b* is far away from the touch-sensitive spring 254. The cap 251 stops moving when the part that is of the bearing portion 251*d* and that is spaced opposite to the pressing portion 251*a* abuts against the mounting ear 253*b* again.

Figure 32:
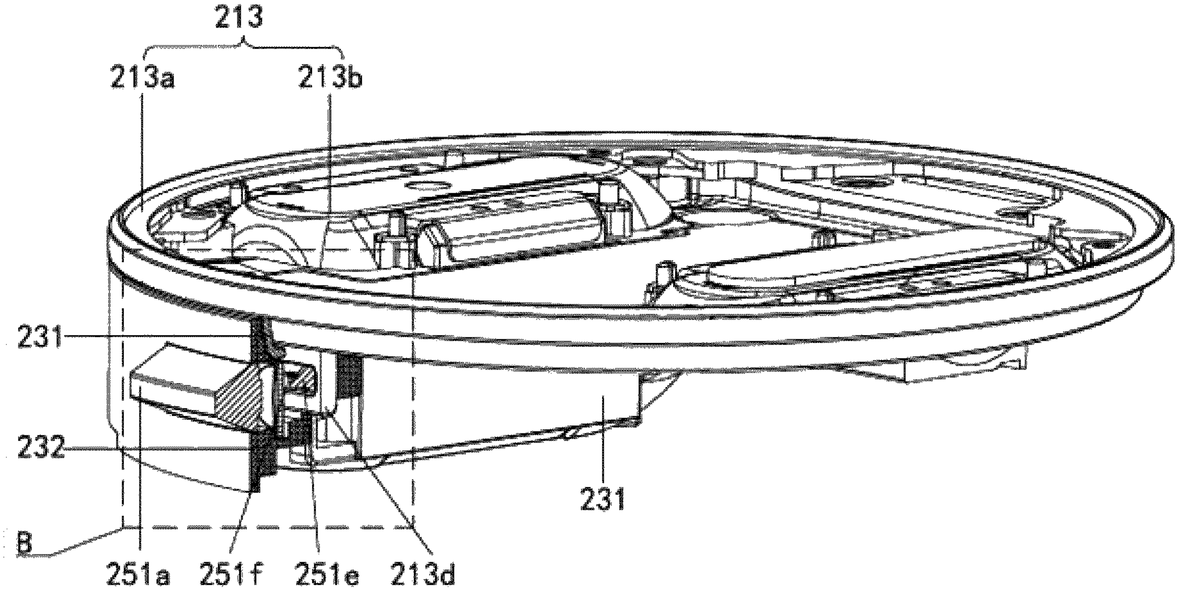
FIG. 32 is a schematic diagram of an assembly structure including an open button and a first host housing.
Figure 33:
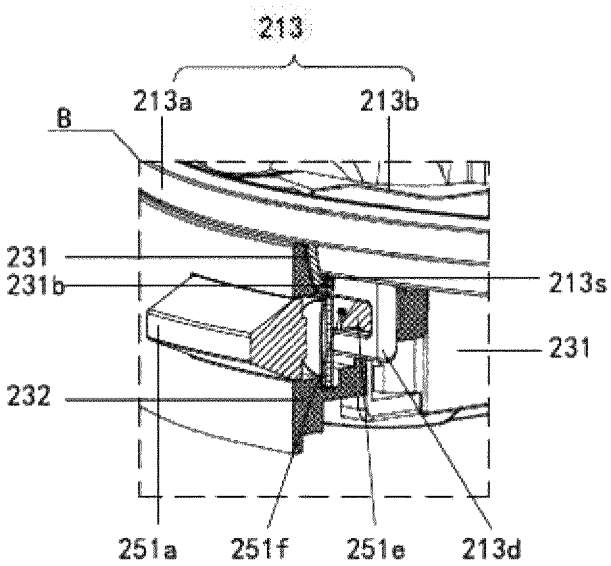
FIG. 33 is a schematic diagram of a partially enlarged structure at a position B in FIG. 32.

FIG. 32 is a schematic sectional view of an assembly structure including the first host housing 213, the second host housing 231, the third host housing 232, and the open button 25. A sectional view of the first host housing 213 is not provided, to clearly show the assembly structure. FIG. 33 is a partially enlarged view at a position B in FIG. 32.

With reference to FIG. 33 and FIG. 16, the latch portion 213*d* on the first bracket 213*b* of the first host housing 213 may pass through the through hole 231*b* of the second host housing 231, and enter the open button mounting space of the third host housing 232. In addition, the latch portion 213*d* and the buckle 251*e* may form a buckle connection, and the buckle connection is a detachable connection. Therefore, the first host housing 213 and the third host housing 232 can be kept closed through matching between the latch portion 213*d* and the buckle 251*e*. In other words, the first part 21 and the second part 23 of the host 2 can be closed.

As shown in FIG. 33, when the user presses the pressing portion 251*a*, the buckle 251*e* moves and no longer maintains the buckle connection with the latch portion 213*d*. In this case, the first host housing 213 automatically opens under driving of the rotating shaft assembly 22. When the user wants to latch the first part 21 and the second part 23, after the latch portion 213*d* is in contact with the buckle 251*e*, the latch portion 213*d* can press the buckle 251*e* until the latch portion 213*d* forms the buckle connection with the buckle 251*e* again. In this case, the first part 21 and the second part 23 are latched.

The reciprocating buckle 251*e* is designed, so that the host 2 can be opened and closed by using the open button 25 in this embodiment. The touch-sensitive spring 254 is designed, so that the touch feeling feedback can be provided when the host 2 is opened. This improves user experience.

In another embodiment, based on a product requirement, the host may be opened and latched by using an open button having another structure. For example, a buckle may be disposed on the first support of the first host housing (the buckle corresponds to the buckle 251*e*), and a latch portion is disposed in the open button (for example, the latch portion is disposed on the bearing portion of the cap, and the latch portion corresponds to the latch portion 213*d*). Alternatively, for example, a torsion spring mechanism may be used to provide a rebound force for a movable cap, a buckle (or a latch portion) is designed on the cap of the open button, and the host is opened and closed through matching between the buckle (or the latch portion) and the buckle (or the latch portion) that is on the first bracket of the first host housing. In another embodiment, the touch-sensitive spring may not be disposed.

In addition, with reference to FIG. 33 and FIG. 13, when the first part 21 and the second part 23 are closed, the first bracket 213*b* and the second host housing 231 are closed and match with each other, and the sealing ring 213*s* on the first bracket 213*b* abuts against a periphery of the second host housing 231. Therefore, the sealing ring 213*s* can seal a gap between the first bracket 213*b* and the second host housing 231, and prevent external water vapor from entering inside of the host 2 through the gap.

In another embodiment, it is easily understood that the sealing bracket and the sealing ring may alternatively be mounted on the circumferential edge of the second host housing 231. An assembly structure including the sealing bracket, the sealing ring, and the second host housing is similar to that described above. Details are not described herein again. When the first part 21 and the second part 23 are closed, the sealing ring on the second host housing 231 abuts against a periphery of the first bracket to seal a gap between the second host housing 231 and the first bracket 213*b*.

Alternatively, different from that in the foregoing sealing design, in another embodiment, the sealing bracket 213*t* may not be disposed, but a sealing ring is disposed only on the first bracket 213*b* or the second host housing 231. In this way, the gap between the first bracket 213*b* and the second host housing 231 may also be sealed.

As shown in FIG. 6 and FIG. 21, the function button 24 may be roughly a cylinder. The function button 24 may be fitted into the function button mounting through hole 232*e* of the third host housing 232, and is movably connected to the third host housing 232. The function button 24 may be moved in an axis of the function button mounting through hole 232*e* within the function button mounting through hole 232*e*, and/or the function button 24 may be rotated about the axis of the function button mounting through hole 232*e*. The function button 24 is configured to be pressed and/or rotated by the user, so that the host 2 implements a corresponding function, for example, selection, confirmation, or picture display switching.

Figure 34:
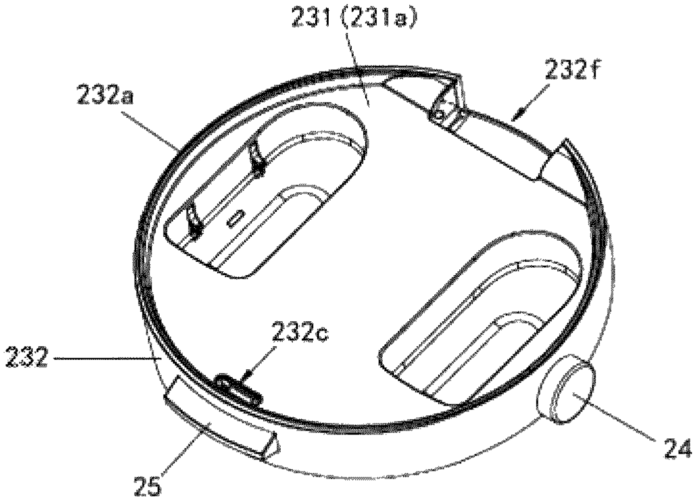
FIG. 34 is a schematic diagram of an assembly structure including a second host housing, a third host housing, and an open button.

As shown in FIG. 34 and FIG. 6, the open button 25 and the function button 24 may be assembled to the third host housing 232, and the third host housing 232 may be assembled to the second host housing 231. The circumferential side wall 232*a* of the third host housing 232 surrounds peripheries of the second host housing 231 and the host battery 234. With reference to FIG. 34 and FIG. 16, the second opening 232*c* of the third host housing 232 may communicate with the through hole 231*b* of the second bracket 231*a*. A wall of the second bracket 231*a* may avoid the rotating shaft mounting space 232*f* of the third host housing 232, so as to mount the rotating shaft assembly 22.

Fourth Host Housing 233

Figure 35:
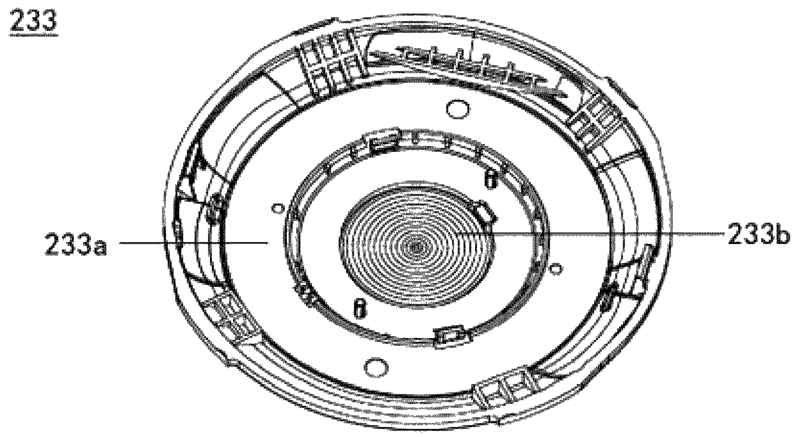
FIG. 35 is a schematic diagram of an assembly structure of a fourth host housing of the wearable device in FIG. 6.
Figure 36:
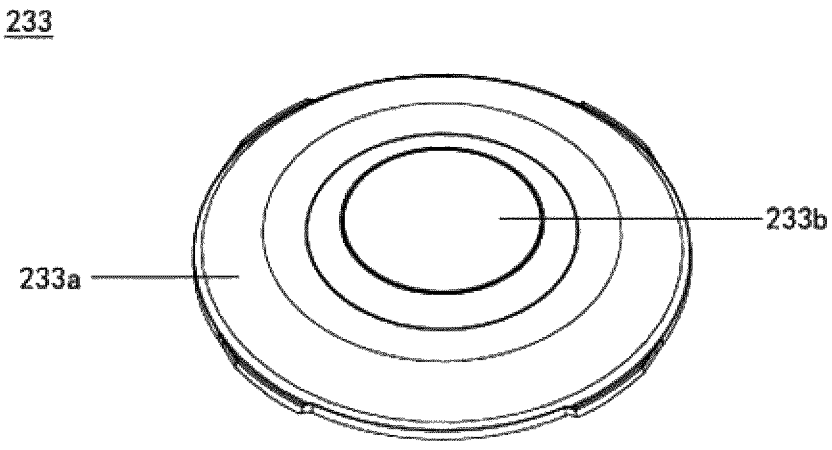
FIG. 36 is a schematic diagram of an assembly structure of a fourth host housing of the wearable device in FIG. 6.
Figure 37:
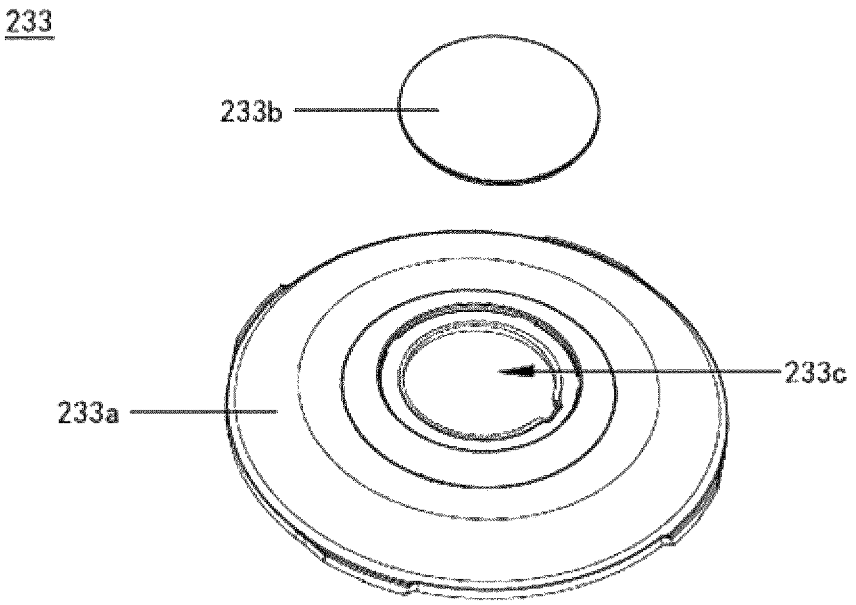
FIG. 37 is a schematic exploded view of a structure of the fourth host housing in FIG. 36.

As shown in FIG. 35, FIG. 36, and FIG. 37, the fourth host housing 233 may be roughly in a disk shape. The fourth host housing 233 may include a third bracket 233*a* and a lens 233*b*. The third bracket 233*a* may be roughly in a disk shape. The third bracket 233*a* may have a mounting through hole 233*c*. The lens 233*b* is mounted on the third bracket 233*a* and covers the mounting through hole 233*c*. The lens 233*b* may be configured to transmit light emitted by a photoplethysmography (photoplethysmography, PPG) sensor (descriptions are provided below) and transmit light reflected back by a human body.

Second Host Circuit Board Assembly 235

As shown in FIG. 6, the second host circuit board assembly 235 may include a circuit board and wires and components disposed on the circuit board. The circuit board in the second host circuit board assembly 235 may be, for example, a subsidiary board of the host 2. For example, the components such as a PPG sensor may be disposed on the subsidiary board. As shown in FIG. 6, the second host circuit board assembly 235 may be mounted on the fourth host housing 233.

Wireless Charging Coil 236

The wireless charging coil 236 is configured to implement wireless charging. The wireless charging coil 236 may be mounted on the fourth host housing 233. The wireless charging coil 236 may be electrically connected to the circuit board in the second host circuit board assembly 235. For example, a pin of the wireless charging coil 236 may be soldered to the circuit board. As shown in FIG. 6, for example, the wireless charging coil 236 may be located on a periphery of the second host circuit board assembly 235.

As shown in FIG. 5 and FIG. 6, the fourth host housing 233 and the third host housing 232 may be assembled and fastened, and the fourth host housing 233 and the third host housing 232 together surround the second host housing 231, the host battery 234, the second host circuit board assembly 235, and the wireless charging coil 236. Both the second host circuit board assembly 235 and the wireless charging coil 236 may be located between the host battery 234 and the fourth host housing 233.

Rotating Shaft Assembly 22

Figure 38:
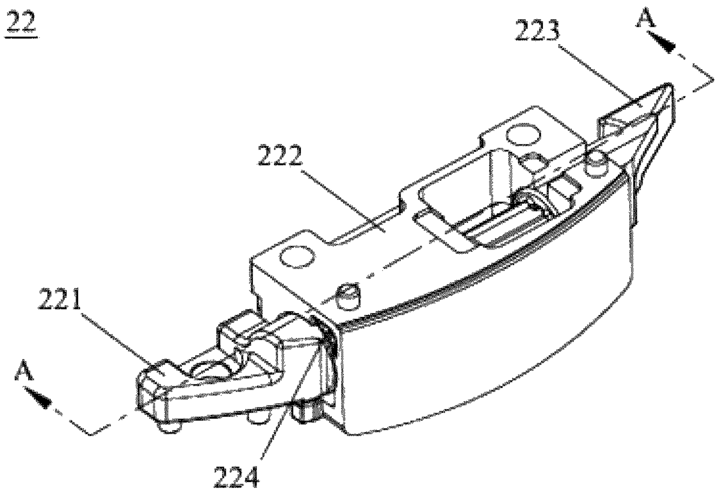
FIG. 38 is a schematic diagram of an assembly structure of a rotating shaft assembly of the wearable device in FIG. 6.
Figure 39:
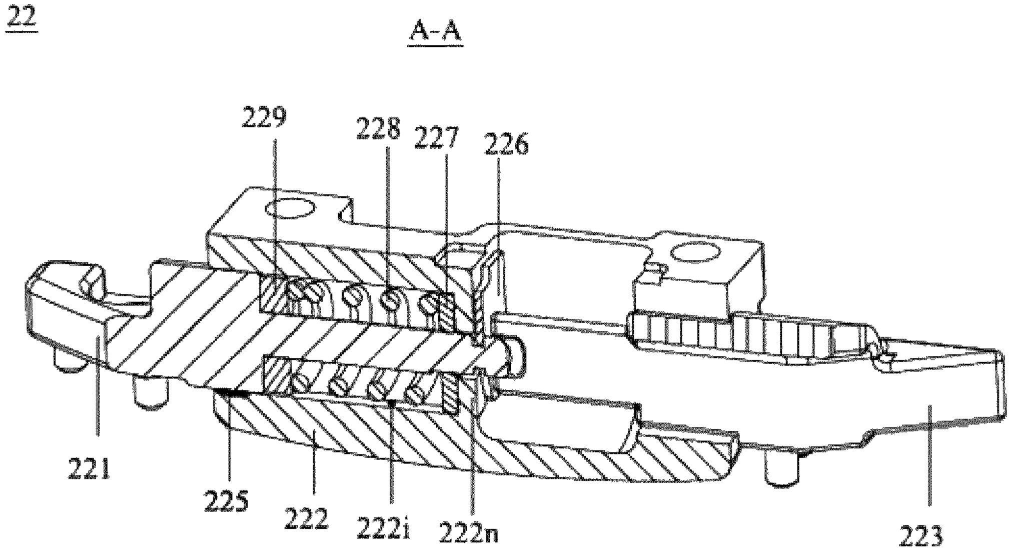
FIG. 39 is a schematic diagram of an A-A sectional structure in FIG. 38.
Figure 40:
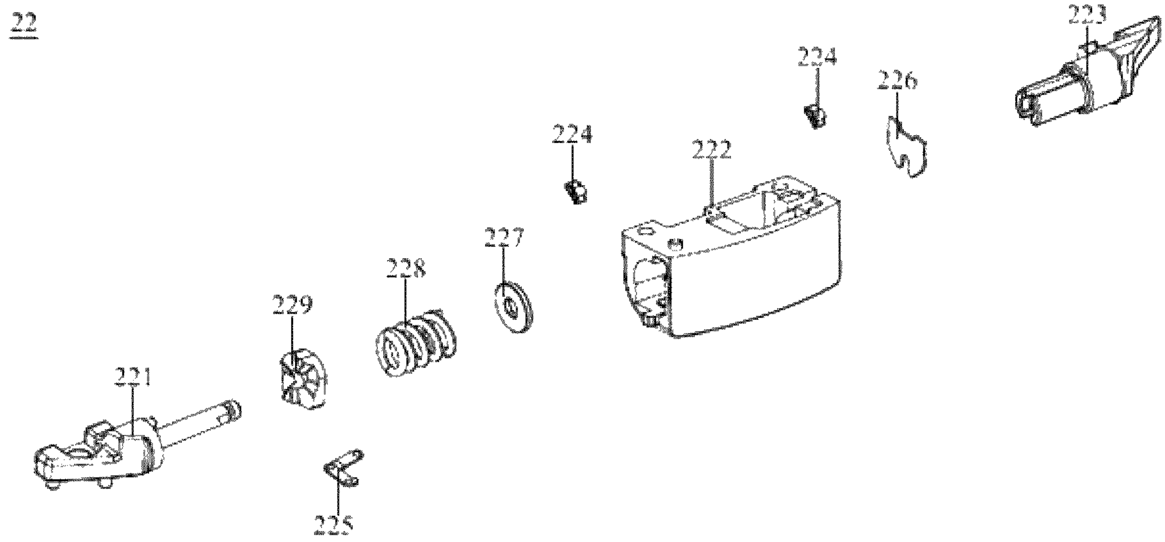
FIG. 40 is a schematic exploded view of a structure of the rotating shaft assembly in FIG. 38.

As shown in FIG. 38, FIG. 39, and FIG. 40, in an implementation 1 of this embodiment, the rotating shaft assembly 22 may include a shaft sleeve 222, a bump matching member 227, a driven member 229, a gasket 225, an elastic member 228, a first shaft 221, a limiting member 226, a second shaft 223, and a shaft contact member 224.

Figure 41:
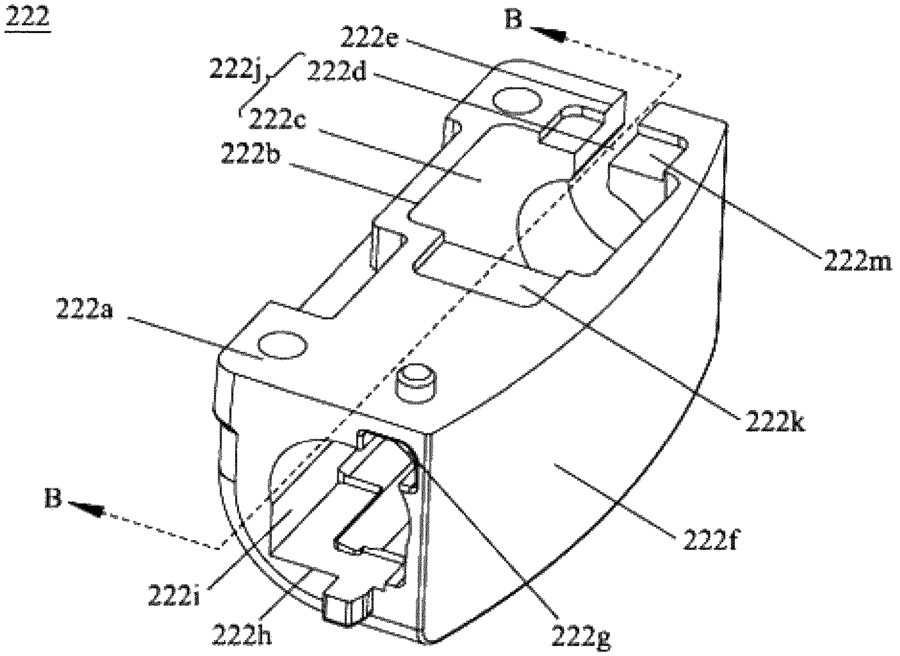
FIG. 41 is a schematic diagram of a structure of a shaft sleeve in a rotating shaft assembly.

As shown in FIG. 41, the shaft sleeve 222 may be roughly a hollow cuboid structure. The shaft sleeve 222 may have a first outer surface 222*a* and a second outer surface 222*f*, which are two outer surfaces intersected on the shaft sleeve 222. In the host 2, a side on which the first outer surface 222*a* of the shaft sleeve 222 is located can be fixedly connected to the first frame body 213*a* in the first part 21, and is covered by the first part 21, so as not to be seen (descriptions are further provided below). When the host 2 is in the closed state, the second outer surface 222*f* may be seen as an external surface of the host 2 (descriptions are further provided below).

Figure 42:
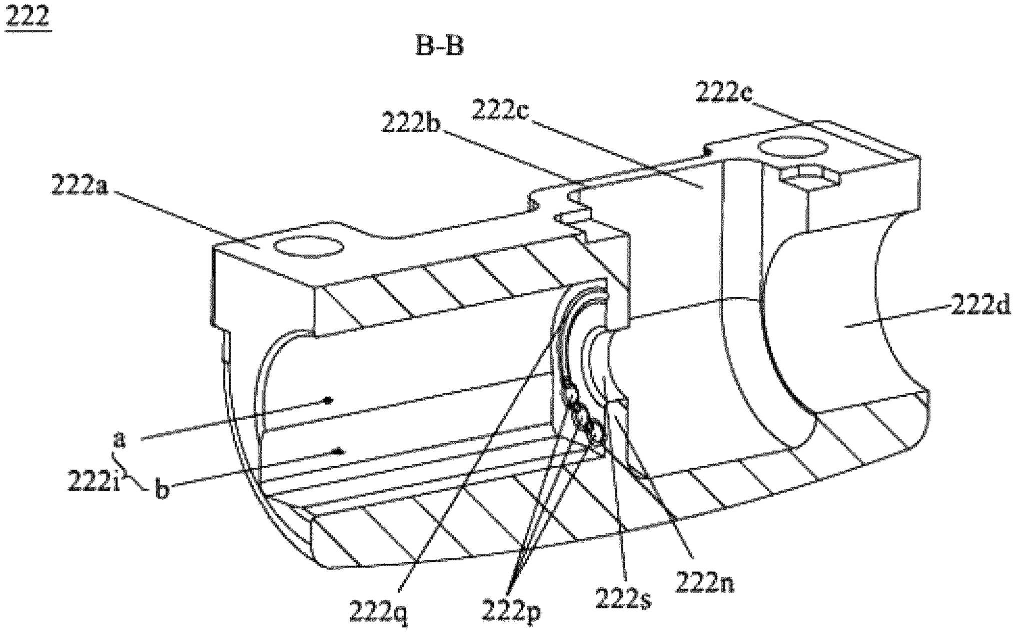
FIG. 42 is a schematic diagram of a B-B sectional structure of the shaft sleeve in FIG. 41.

As shown in FIG. 41 and FIG. 42, an inner cavity of the shaft sleeve 222 has a spacer plate 222*n* that divides the inner cavity into a first inner cavity 222*i* and a second inner cavity 222*j*. The spacer plate 222*n* is provided with a through hole 222*s*, and the through hole 222*s* communicates the first inner cavity 222*i* with the second inner cavity 222*j*.

Figure 43:
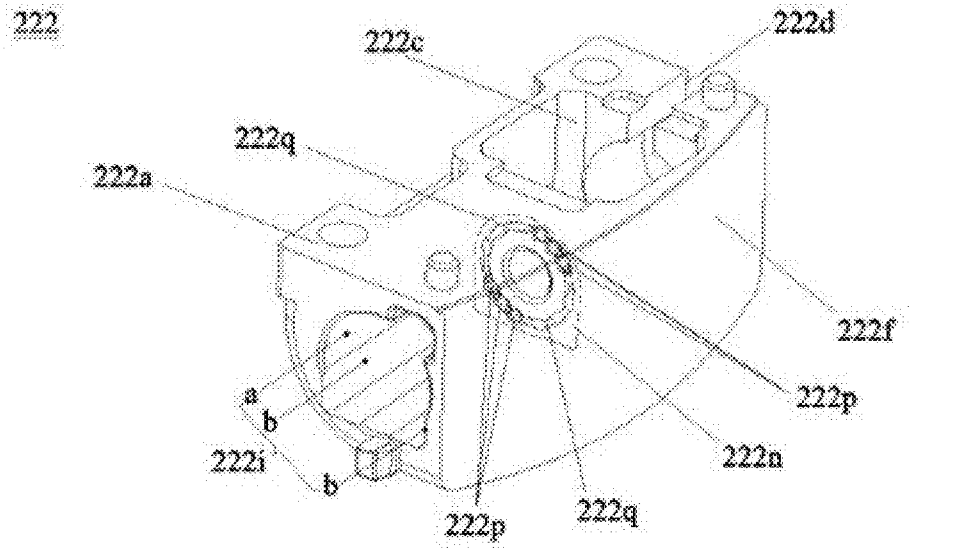
FIG. 43 is a schematic diagram of a structure of a shaft sleeve in a rotating shaft assembly.

As shown in FIG. 42 and FIG. 43, a chute 222*q* and several matching grooves 222*p* may be provided on a surface that is of a side of the spacer plate 222*n* and that faces the first inner cavity 222*i*. The chute 222*q* and all the matching grooves 222*p* may be connected to form a ring, and the ring is located on a periphery of the through hole 222*s* and may be concentric with the through hole 222*s*.

As shown in FIG. 42, the matching grooves 222*p* may be concave, and an inner surface of each of the matching grooves 222*p* may be a curved surface. All the matching grooves 222*p* may be arranged along a circular arc, and may be divided into two groups. The two groups are spaced from each other, and several matching grooves 222*p* in each group are sequentially connected. A quantity of matching grooves 222*p* in the two groups may be consistent, for example, three in each group. In each group, two adjacent matching grooves 222*p* have a common side wall. A side of the side wall may have a rounded corner. A top surface of the side wall may also be depressed (that is, there is a step difference) relative to a surface on which openings of the matching grooves 222*p* are located.

As shown in FIG. 42 and FIG. 43, the chute 222*q* may be a long strip-shaped groove, and an extension track of the chute 222*q* may be a circular arc. There may be two chutes 222*q*, both of which are on a same circumference. Positions of the two chutes 222*q* on the circumference may be symmetrical, and two center angles (included angle formed by lines between two ends of the chute 222*q* and a center of the circumference) corresponding to the two chutes 222*q* may be opposite angles. The two chutes 222*q* and the two groups of matching grooves 222*p* are arranged alternately along the circumference. To be specific, the two chutes 222*q* and the two groups of matching grooves 222*p* are arranged on the circumference in an order of one chute 222*q*, one group of matching grooves 222*p*, the other chute 222*q*, and the other group of matching grooves 222*p*. One end of each chute 222*q* is connected to one matching groove 222*p* of a group of matching grooves 222*p*, and the other end of the chute 222*q* is connected to one matching groove 222*p* of the other group of matching grooves 222*p*. There may be a common side wall between the chute 222*q* and the matching grooves 222*p*. Alternatively, there is not a side wall between the chute 222*q* and the matching grooves 222*p*, but the chute 222*q* communicates with the matching grooves 222*p*.

The foregoing designs such as a quantity, structures, and positions of chutes 222*q* and designs such as a quantity, structures, and positions of matching grooves 222*p* are merely examples for description, and this embodiment is not limited thereto.

In this embodiment, the chute 222*q* and the matching grooves 222*p* are used to match bumps on the bump matching member 227 (descriptions are provided below). In another embodiment, the spacer plate 222*n* may not be provided with the chute 222*q* and the matching grooves 222*p*, and the rotating shaft may not be provided with the bump matching member 227.

As shown in FIG. 41 and FIG. 42, an end that is of the first inner cavity 222*i* and that is far away from the spacer plate 222*n* may pass through the shaft sleeve 222 to form an opening 222*h*. As shown in FIG. 41 and FIG. 43, an inner surface of the first inner cavity 222*i* may include an arc surface a and two planes b, and the two planes b are respectively connected to two opposite sides of the arc surface a. The arc surface a is close to the first outer surface 222*a*, and the planes b are far away from the first outer surface 222*a*. In other words, the first inner cavity 222*i* approximates an arch in shape, and the opening 222*h* is approximately arch-shaped.

As shown in FIG. 41 and FIG. 42, the second inner cavity 222*j* may include a first region 222*c* and a second region 222*d* that communicates with each other. The first region 222*c* is located between the spacer plate 222*n* and the second region 222*d*. The first region 222*c* forms an opening 222*b* on the first outer surface 222*a*. The second region 222*d* may be a circular hole with an axis facing the spacer plate 222*n*. The second region 222*d* forms an opening 222*e* on the first outer surface 222*a*, and an end that is of the second region 222*d* and that is far away from the spacer plate 222*n* may pass through the shaft sleeve 222.

As shown in FIG. 41, a groove 222*k* and a groove 222*m* may be further provided on the first outer surface 222*a* of the shaft sleeve 222. The groove 222*k* and the groove 222*m* are respectively located on two opposite sides of the first region 222*c*. The groove 222*m* may alternatively be located above the second region 222*d*. A side that is of the groove 222*k* and that faces the groove 222*m* communicates with the first region 222*c*, and a side that is of the groove 222*m* and that faces the groove 222*k*, communicates with the first region 222*c*.

Figure 44:
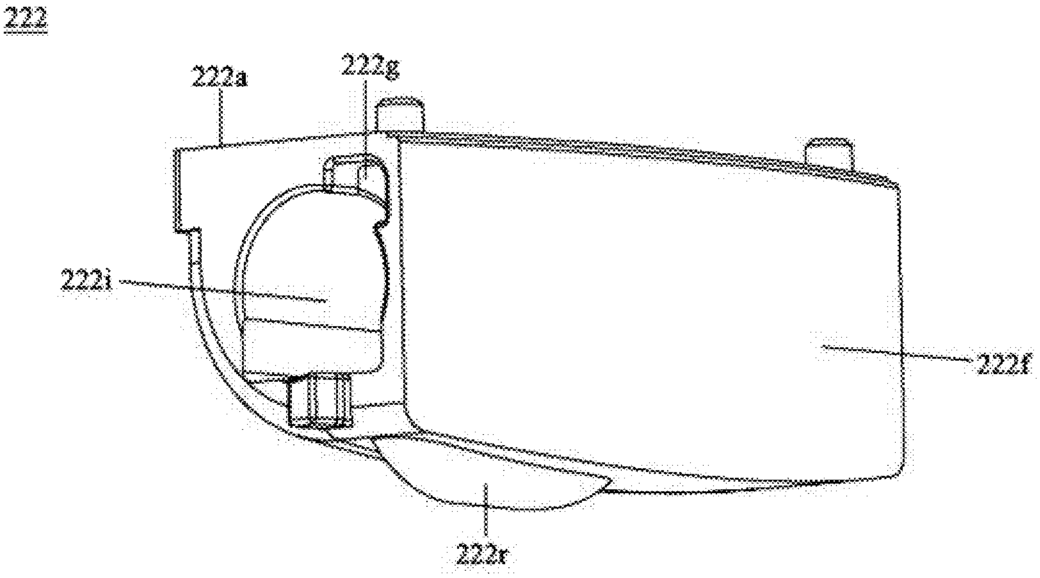
FIG. 44 is a schematic diagram of a structure of a shaft sleeve in a rotating shaft assembly.

As shown in FIG. 44, a limiting protrusion 222*r* is disposed on a side that is of the shaft sleeve 222 and that is opposite to the first outer surface 222*a*. A structure of the limiting protrusion 222*r* may be designed as required and is not limited in this embodiment. In this embodiment, the limiting protrusion 222*r* may be located on a side of the first inner cavity 222*i* on the shaft sleeve 222. In another embodiment, a position of the limiting protrusion 222*r* may be flexibly determined as required, and is not limited to a side that is of the spacer plate 222*n* and that is close to the first inner cavity 222*i*. Alternatively, the limiting protrusion 222*r* may not be provided.

As shown in FIG. 44, a mounting groove 222*g* may be further provided on a surface of the shaft sleeve 222, on which the opening 222*h* is formed, and the mounting groove 222*g* may communicate with the first inner cavity 222*i*. Similarly, another mounting groove 222*g* may be provided on a surface of one end that is of the shaft sleeve 222 and that is opposite to the opening 222*h*, and the another mounting groove 222*g* may communicate with the second region 222*d*. The mounting groove 222*g* is used to mount the shaft contact member 24 (descriptions are further provided below). In another embodiment, a position of the mounting groove 222*g* may be flexibly determined as required, and is not limited to the foregoing descriptions. Alternatively, the mounting groove 222*g* may not be provided.

Figure 45:
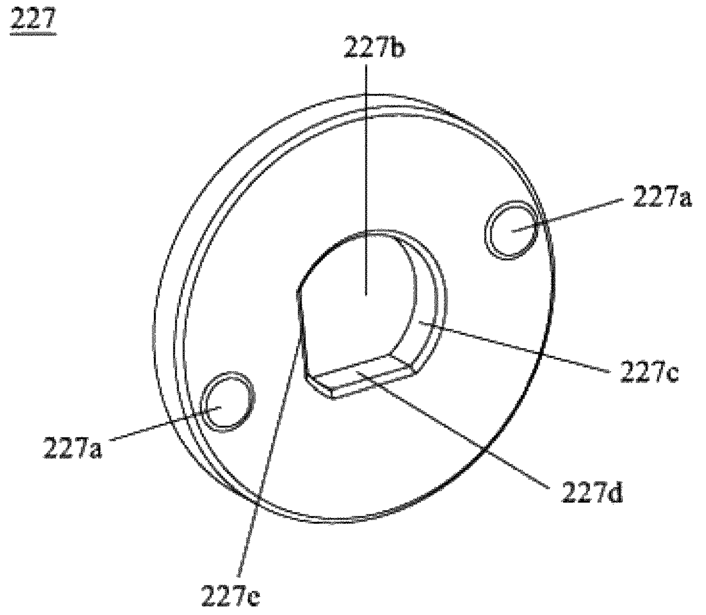
FIG. 45 is a schematic diagram of a structure of a bump matching member in a rotating shaft assembly.

As shown in FIG. 45, the bump matching member 227 may be roughly a cylinder. A bottom surface of the bump matching member 227 may be provided with a bump 227*a*, and the bump 227*a* may have a curved surface protruding from the bottom surface. There is at least one bump 227*a*. For example, two bumps 227*a* are shown in FIG. 45. When there are at least two bumps 227*a*, the bumps 227*a* may be evenly spaced along a circumference. The bumps 227*a* are used to match the chute 222*q* and the matching grooves 222*p* on the spacer plate 222*n* of the shaft sleeve 222 (descriptions are further provided below).

As shown in FIG. 45, the bump matching member 227 may further have a through hole 227*b*, and the through hole 227*b* may penetrate the bump matching member 227 in a direction of a center line of the bump matching member 227. In this embodiment, an inner surface of the through hole 227*b* may include an arc surface 227*c*, a plane 227*d*, and a plane 227*e*. Two sides of the arc surface 227*c* are respectively connected to the plane 227*d* and the plane 227*e*, and an included angle may be formed between the plane 227*d* and the plane 227*e*. The bump matching member 227 may be mounted on the first shaft 221, and the through hole 227*b* may cooperate with the first shaft 221. The through hole 227*b* having the foregoing structure allows the bump matching member 227 to move along the first shaft 221, but not rotate relative to the first shaft 221 (descriptions are further provided below).

In another embodiment, the rotating shaft may not be provided with the bump matching member 227.

Figure 46:
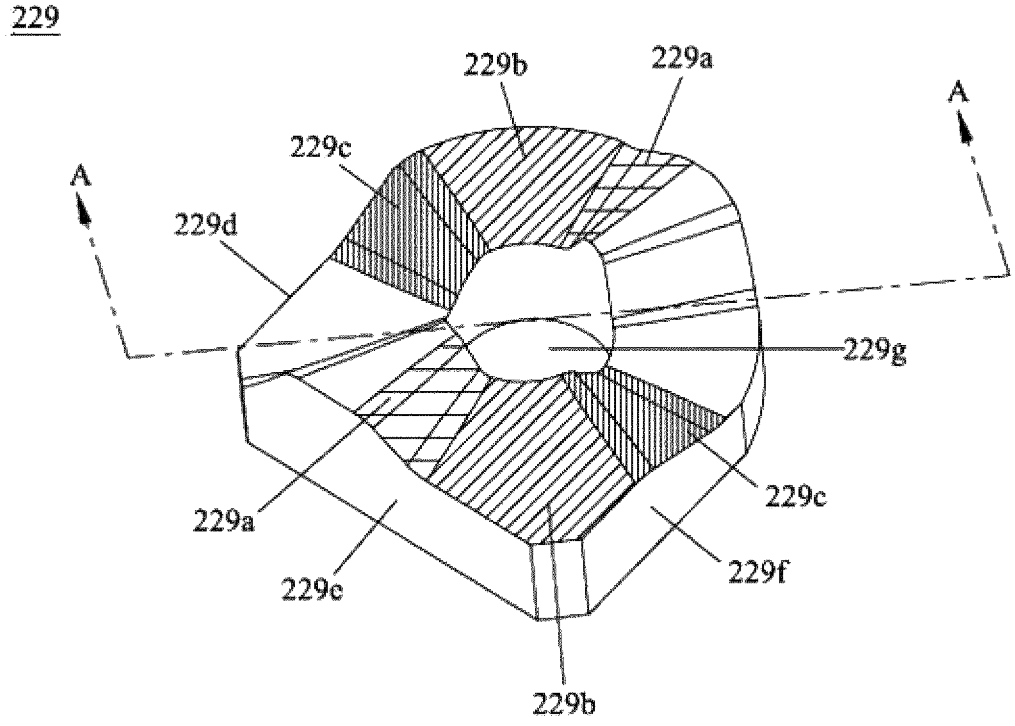
FIG. 46 is a schematic diagram of a structure of a driven member in a rotating shaft assembly.
Figure 47:
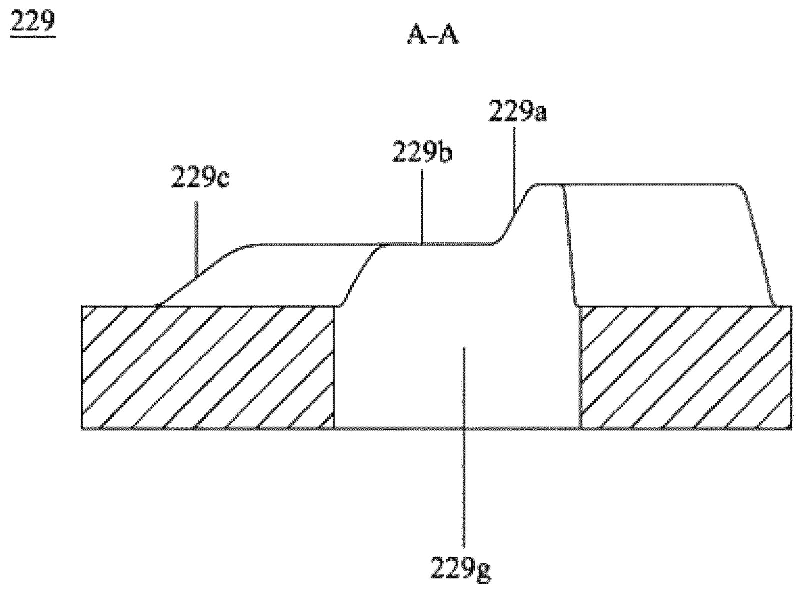
FIG. 47 is a schematic diagram of an A-A sectional structure of the driven member in FIG. 46.

As shown in FIG. 46 and FIG. 47, the driven member 229 may be roughly in a block shape or a sheet shape. The driven member 229 has a through hole 229*g*, and an axis of the through hole 229*g* is roughly in a thickness direction of the driven member 229. A surface on one side of the driven member 229 in the thickness direction may be referred to as a shaft matching surface. The shaft matching surface may form a two-step ladder. The shaft matching surface may include a first slope 229*a*, a plane 229*b*, and a second slope 229*c* that are sequentially connected (to highlight the three regions, the three regions are represented by shadows). A normal line of the plane 229*b* may be in an axial direction of the through hole 229*g*. The first slope 229*a* and the plane 229*b* form an obtuse angle. The plane 229*b* and the second slope 229*c* form an obtuse angle. There is a step difference between the first slope 229*a* and the second slope 229*c*. A side that is of the first slope 229*a* and that is far away from the plane 229*b* may be higher than the plane 229*b*, and a side that is of the second slope 229*c* and that is far away from the plane 229*b* may be lower than the plane 229*b*.

As shown in FIG. 46, the shaft matching surface of the driven member 229 may include two first slopes 229*a*, two planes, and two second slopes 229*c*. The shaft matching surface may form two two-step ladders and may extend downward step by step in a circumferential direction of the shaft matching surface. The two two-step ladders may be spaced from each other. For example, the two two-step ladders may be centrosymmetric with respect to the through hole 229*g*.

Figure 48:
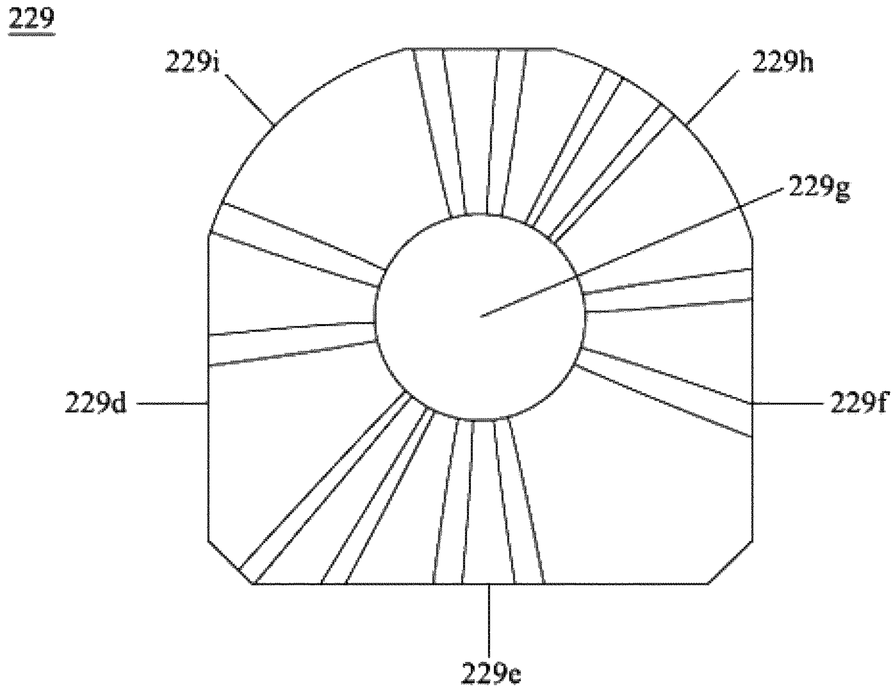
FIG. 48 is a schematic diagram of a structure of a driven member in a rotating shaft assembly.

As shown in FIG. 48, an outer side surface of the driven member 229, whose normal line points to the through hole 229*g*, may be approximately arched. The outer side surface may include an arc surface 229*h*, an arc surface 229*i*, a plane 229*d*, a plane 229*e*, and a plane 229*f*. The arc surface 229*h* and the arc surface 229*i* may serve as a top of the arch, and both may be roughly symmetrical with respect to the axis of the through hole 229*g*. The plane 229*e* may serve as a bottom of the arch. The plane 229*f* may be located between the arc surface 229*h* and the plane 229*e*, and one side of the plane 229*f* may be connected to the arc surface 229*h*. The plane 229*d* may be located between the arc surface 229*i* and the plane 229*e*, and one side of the plane 229*d* may be connected to the arc surface 229*i*.

The driven member 229 may be mounted in the first inner cavity 222*i* of the shaft sleeve 222, and the outer side surface of the driven member 229 has the foregoing structure, so that the driven member 229 can move in the first inner cavity 222*i* without rotating (descriptions are further provided below). In another embodiment, the outer side surface of the driven member 229 may have another appropriate structure, provided that a design requirement that the driven member 229 moves in the first inner cavity 222*i* without rotation is met.

Figure 49:
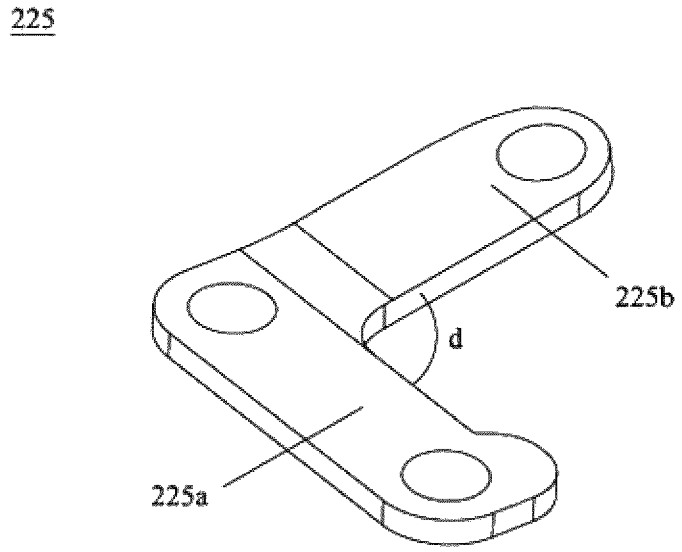
FIG. 49 is a schematic diagram of a structure of a gasket in a rotating shaft assembly.
Figure 50:
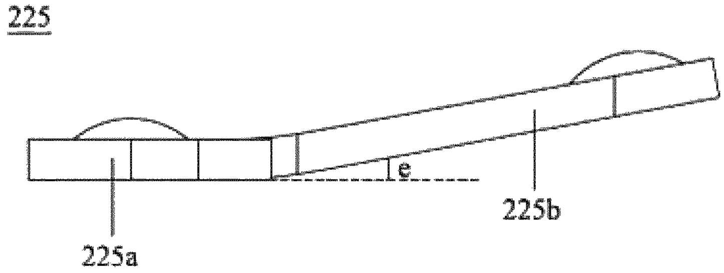
FIG. 50 is a schematic diagram of a structure of a gasket in a rotating shaft assembly.

As shown in FIG. 49 and FIG. 50, the gasket 225 may be roughly in a sheet shape. The gasket 225 may include a first part 225*a* and a second part 225*b*. The first part 225*a* and the second part 225*b* may be connected (for example, connected as a whole). The first part 225*a* and the second part 225*b* may, for example, form an included angle d. The included angle d is, for example, approximately 90°. The first part 225*a* and the second part 225*b* may not be in a same plane, and the second part 225*b* may form an included angle e with a plane in which the first part 225*a* is located. For example, from the perspective of FIG. 50, the second part 225*b* may be tilted upward relative to the first part 225*a*, and form the included angle e with the plane on which the first part 225*a* is located (in other words, form the included angle e with the first part 225*a*).

The first part 225*a* of the gasket 225 may be fastened in the first cavity 222*i* of the shaft sleeve 222, and the second part 225*b* of the gasket 225 may abut against the plane 229*e* of the driven member 229 (descriptions are further provided below).

Figure 51:
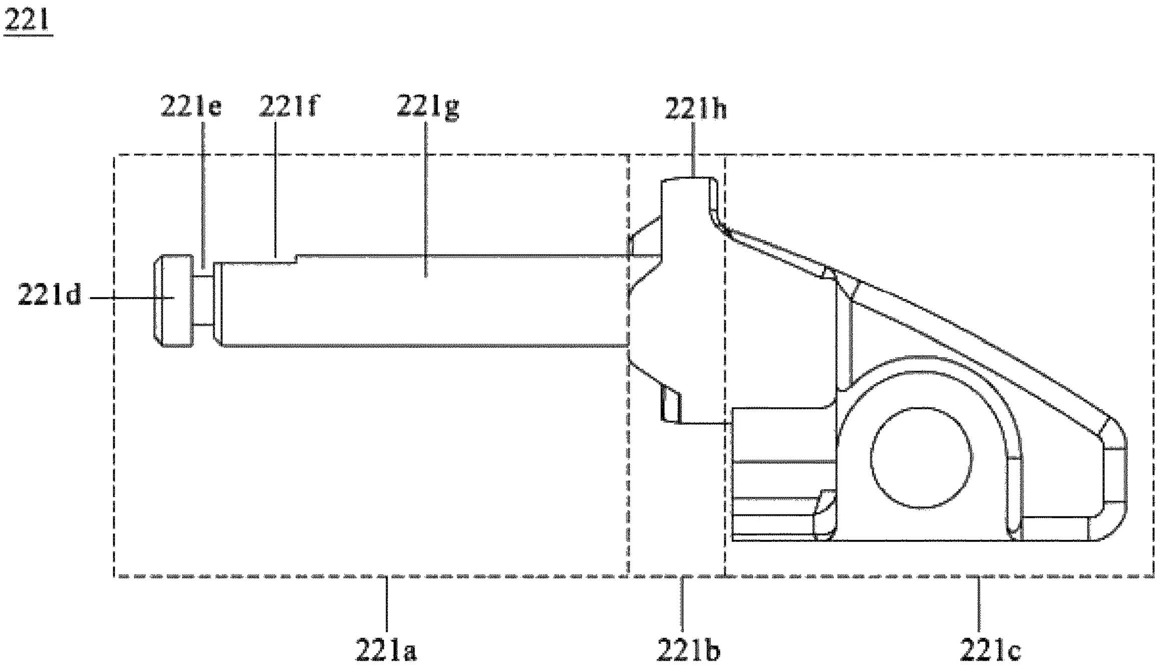
FIG. 51 is a schematic diagram of a structure of a first shaft in a rotating shaft assembly.

As shown in FIG. 51, the first shaft 221 may be an integrated structure, and may include a first part 221*a*, a second part 221*b*, and a third part 221*c* that are sequentially connected. It may be understood that, in FIG. 51, the first part 221*a*, the second part 221*b*, and the third part 221*c* are respectively distinguished by using three dotted line boxes, which is merely intended to intuitively illustrate approximate positions of the first part 221*a*, the second part 221*b*, and the third part 221*c*, but is not intended to strictly define boundaries among the first part 221*a*, the second part 221*b*, and the third part 221*c*.

Figure 52:
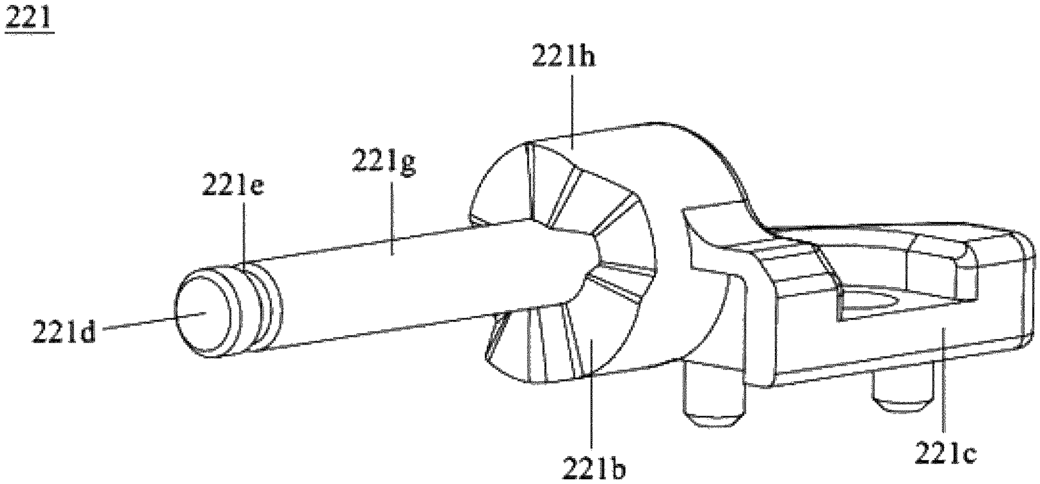
FIG. 52 is a schematic diagram of a structure of a first shaft in a rotating shaft assembly.

As shown in FIG. 51 and FIG. 52, the first part 221*a* may include an end portion 221*d* and a main portion 221g, and both the end portion 221*d* and the main portion 221g may be roughly cylinders. The main portion 221g is connected to the second part 221*b*, and the end portion 221*d* is far away from the second part 221*b*. A slot 221*e* may be formed between the end portion 221*d* and the main portion 221g, and the slot 221*e* may surround an axis of the end portion 221*d*. A bottom surface of the slot 221*e* is lower than an outer circumferential surface of the end portion 221*d* and an outer circumferential surface of the main portion 221g.

Figure 53:
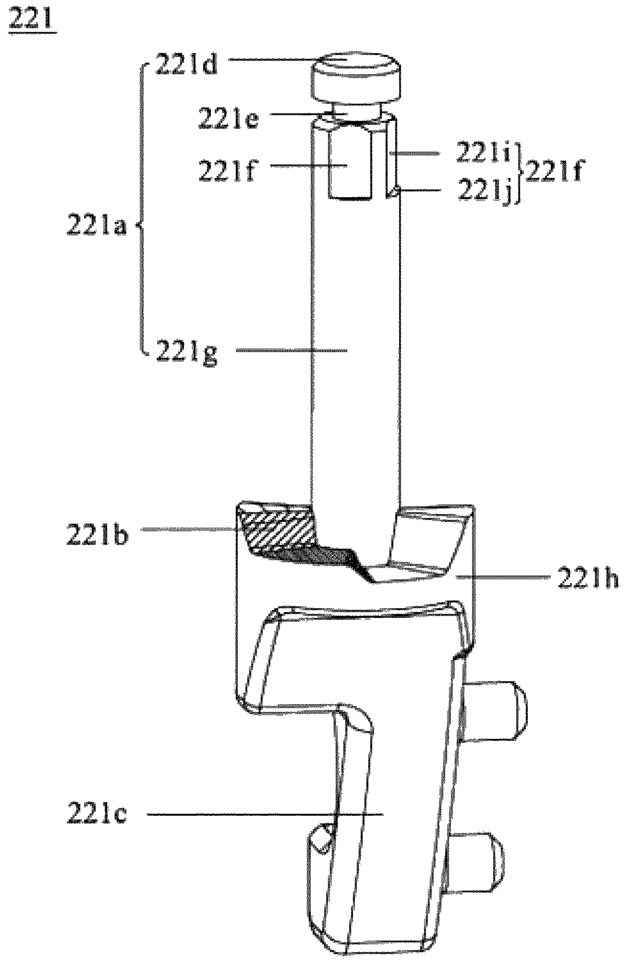
FIG. 53 is a schematic diagram of a structure of a first shaft in a rotating shaft assembly.

As shown in FIG. 51 and FIG. 53, an end that is of the main portion 221g and that is close to the end portion 221*d* may form a concave space 221*f*. The concave space 221*f* may have a plane 221*i* and a plane 221*j*. The plane 221*i* may be basically parallel to an axis of the end portion 221*d*, the plane 221*j* may be basically perpendicular to the axis of the end portion 221*d*, and the plane 221*i* may be basically perpendicular to the plane 221*j*. The plane 221*j* may be connected to the outer circumferential surface of the main portion 221g and the plane 221*i*. Both sides of the plane 221*i* may be connected to the outer circumferential surface of the main portion 221g. The concave space 221*f* may be formed by cutting the outer circumferential surface of the main portion 221g.

As shown in FIG. 53, there may be two concave spaces 221*f*, and the two concave spaces 221*f* may have a specific spacing. In another embodiment, a quantity of concave spaces 221*f* is not limited to the foregoing descriptions, for example, may be one or more.

In this embodiment, an end that is of the main portion 221g and that is close to the end portion 221*d* may match the through hole 227*b* of the bump matching member 227, and a surface of the end of the main portion 221g may match the inner wall of the through hole 227*b*, so that the bump matching member 227 may move along the main portion 221g but cannot rotate (descriptions are further provided below). In another embodiment, if the bump matching member 227 is not provided, the end that is of the main portion 221g and that is close to the end portion 221*d* may not form the concave space 221*f*.

As shown in FIG. 51 to FIG. 53, the second part 221*b* may have an outer circumferential surface 221*h*, and the outer circumferential surface 221*h* may be roughly a cylindrical surface. In this embodiment, the second part 221*b* may be mounted into the first inner cavity 222*i* of the shaft sleeve 22, and the outer circumferential surface 221*h* may rotate and match the arc surface a of the first inner cavity 222*i*.

As shown in FIG. 52 and FIG. 53, a two-step ladder may be formed on a surface that is of the second part 221*b* and that faces the end portion 221*d* (a surface of the two-step ladder is shown by using a shadow in FIG. 53), and the two-step ladder has a similar (or roughly similar) structure to the two-step ladder of the driven member 229 described above. With reference to FIG. 52, FIG. 46, and FIG. 40, the second part 221*b* may be assembled with the driven member 229 to form a cam mechanism, and the surface of the two-step ladder of the second part 221*b* may move and match the surface of the two-step ladder of the driven member 229, so that the driven member 229 implements a specific motion (descriptions are further provided below).

A structure of the third part 221*c* may be designed as required, and is not limited to that shown in FIG. 51 to FIG. 53. The third part 221*c* is fastened to the inner bearing platform 232*g* of the third host housing 232 (descriptions are further provided below). As shown in FIG. 40, the elastic member 228 is a component capable of providing a rebound force, for example, may be a spring.

The foregoing respectively describes structures of the shaft sleeve 222, the bump matching member 227, the first shaft 221, the driven member 229, and the elastic member 228. The following describes an assembly structure including these components.

As shown in FIG. 39, FIG. 45, FIG. 43, and FIG. 46, the driven member 229, the elastic member 228, and the bump matching member 227 may all be located in the first inner cavity 222*i* of the shaft sleeve 222. The bump matching member 227 is close to the spacer plate 222*n* of the shaft sleeve 222, and the bumps 227*a* of the bump matching member 227 may face the chute 222*q* (or face the matching grooves 222*p*) of the spacer plate 222*n*. The driven member 229 is remote from the spacer plate 222*n*, and the two-step ladder of the driven member 229 backs onto the spacer plate 222*n*. Both the arc surface 229*h* and the arc surface 229*i* of the driven member 229 may be opposite to and match the arc surface a of the first inner cavity 222*i*. Both the plane 229*e* and the plane 229*f* of the driven member 229 can be opposite to and match the plane b of the first inner cavity 222*i*. Therefore, the driven member 229 can move in the first inner cavity 222*i*, but cannot rotate relative to the first inner cavity 222*i*.

It is easily understood that the foregoing matching structure including the driven member 229 and the first inner cavity 222*i* is merely an example. In another embodiment, another appropriate matching structure may be designed as required, so that the driven member 229 can move only in the first inner cavity 222*i*, but cannot rotate relative to the first inner cavity 222*i* (descriptions that the driven member 229 may rotate with the shaft sleeve 222 are provided below).

As shown in FIG. 39, the elastic member 228 is located between the driven member 229 and the bump matching member 227. One end of the elastic member 228 may abut against the driven member 229, and the other end may abut against the bump matching member 227.

As shown in FIG. 51, FIG. 39, FIG. 41, and FIG. 42, both the main portion 221g of the first part 221*a* of the first shaft 221 and the second part 221*b* of the first shaft 221 may be located in the first inner cavity 222*i* of the shaft sleeve 222. The end portion 221*d* of the first part 221*a* may be located in the first region 222*c* of the second inner cavity 222*j* of the shaft sleeve 222, and a part or all of the slot 221*e* of the first part 221*a* may be located in the first region 222*c*.

As shown in FIG. 51, FIG. 46, FIG. 45, and FIG. 42, the first part 221*a* may pass through the through hole 229*g* of the driven member 229, the elastic member 228, a through hole 227*c* of the bump matching member 227, and a through hole of the spacer plate 222*n*. The two-step ladder of the second part 221*b* may face the two-step ladder of the driven member 229. The two-step ladder of the second part 221*b* may cooperate with the two-step ladder of the driven member 229, so that the second part 221*b* and the driven member 229 form the cam mechanism.

As shown in FIG. 53 and FIG. 45, a plane 221*i* of one concave space 221*f* of the main portion 221g may be opposite to and match the plane 227*d* of the through hole 227*b* of the bump matching member 227. A plane 221*i* of the other concave space 221*f* of the main portion 221*g* may be opposite to and match the plane 227*e* of the through hole 227*b* of the bump matching member 227. The outer circumferential surface of the main portion 221*g* may be opposite to and match the arc surface 227*c* of the through hole 227*b* of the bump matching member 227. Therefore, the bump matching member 227 can move along the main portion 221*g* in the first inner cavity 222*i*, but cannot rotate around the main portion 221*g*.

It is easily understood that the foregoing matching structure including the main portion 221*g* and the bump matching member 227 is merely an example. In another embodiment, another appropriate matching structure may be designed as required, so that the bump matching member 227 can move only along the main portion 221*g* but cannot rotate around the main portion 221*g*.

With reference to FIG. 51 and FIG. 39, the third part 221*c* of the first shaft 221 may be located outside the shaft sleeve 222.

Figure 54:
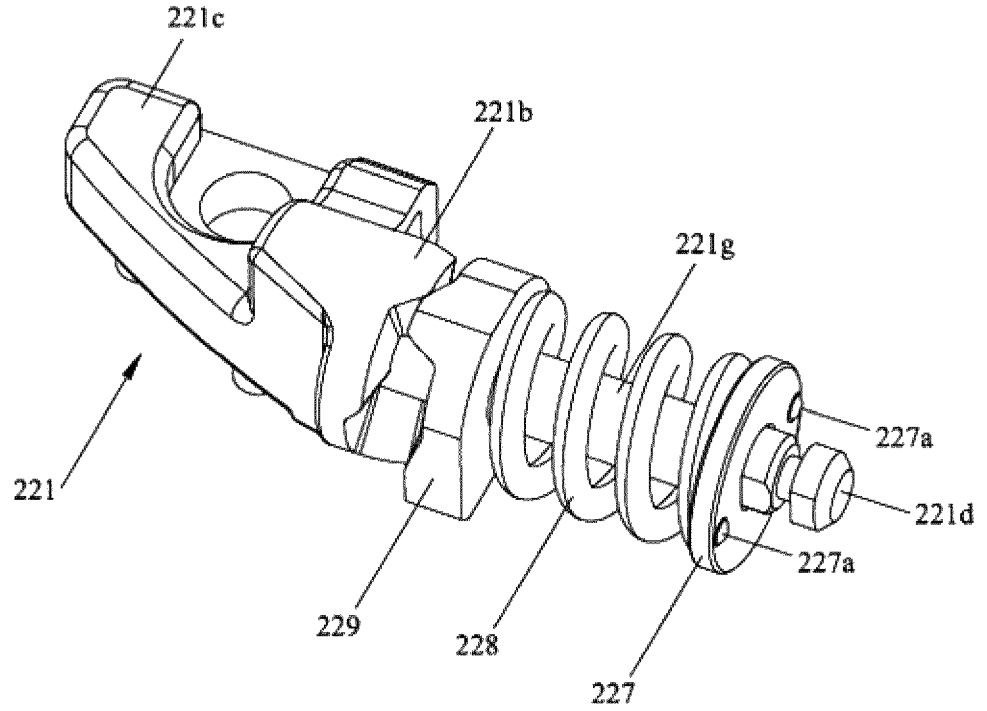
FIG. 54 is a schematic diagram of an assembly structure including a first shaft, a driven member, and an elastic member in a rotating shaft assembly.

FIG. 54 may intuitively show an assembly structure including the first shaft 221, the driven member 229, the elastic member 228, and the bump matching member 227.

As shown in FIG. 39 and FIG. 50, the gasket 225 may be fastened to the first inner cavity 222*i* of the shaft sleeve 222. The first part 225*a* of the gasket 225 may be located between the third part 221*c* of the first shaft 221 and the shaft sleeve 222. The second part 225*b* of the gasket 225 may be located between the driven member 229 and the shaft sleeve 222. The second part 225*b* may always abut against the driven member 229 in an entire motion process of the driven member 229. Because the second part 225*b* is tilted relative to the first part 225*a*, the second part 225*b* can press the driven member 229 against the inner surface of the first inner cavity 222*i* of the shaft sleeve 222, so that the driven member 229 closely matches the inner surface of the first inner cavity 222*i*. This can prevent the driven member 229 from shaking during movement due to a manufacturing error. In another embodiment, the gasket 225 may not be provided based on an actual requirement.

Figure 55:
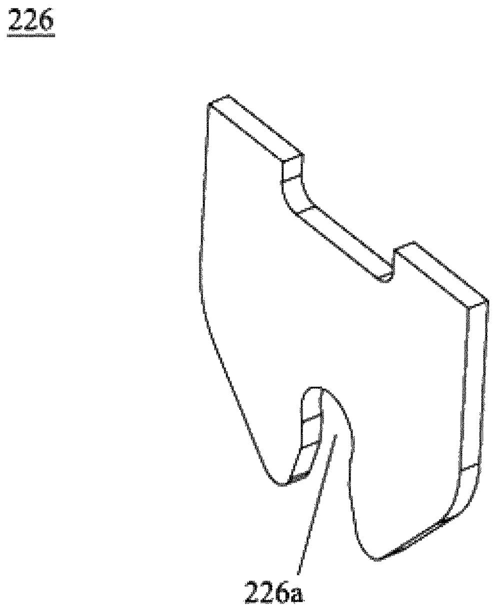
FIG. 55 is a schematic diagram of a structure of a limiting member in a rotating shaft assembly.

As shown in FIG. 55, the limiting member 226 may be basically in a plate shape, and a structure of the limiting member 226 may be designed as required. For example, an outline of the limiting member 226 may match a shape of the first region 222*c* of the second inner cavity 222*i* of the shaft sleeve 22. An opening 226*a* may be formed on the limiting member 226.

With reference to FIG. 39, FIG. 52, and FIG. 55, the limiting member 226 may be located in the first region 222*c* of the second inner cavity 222*i* of the shaft sleeve 22, and may be in contact with the spacer plate 222*n* of the shaft sleeve 22. An edge of the opening 226*a* of the limiting member 226 may be snapped into the slot 221*e* of the first part 221*a* of the first shaft 221. Therefore, the limiting member 226 can limit the first shaft 221, to prevent the first shaft 221 from detaching from the shaft sleeve 22, and ensure that a position of the first shaft 221 relative to the shaft sleeve 22 remains unchanged. This further ensures reliable assembly of the driven member 229, the elastic member 228, and the bump matching member 227, and the shaft sleeve 22.

Figure 56:
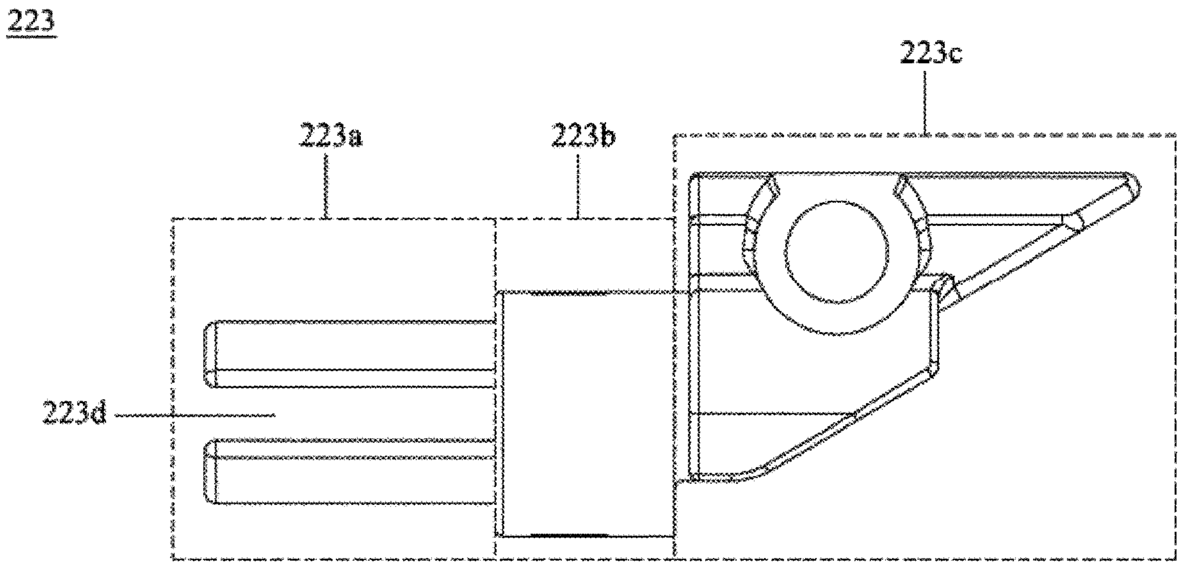
FIG. 56 is a schematic diagram of a structure of a second shaft in a rotating shaft assembly.
Figure 57:
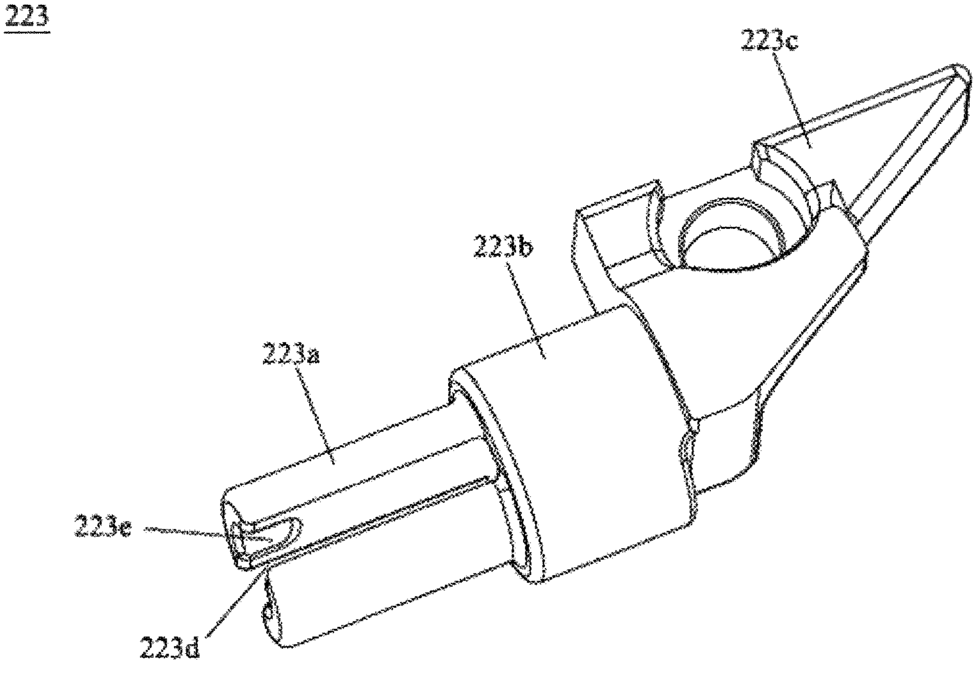
FIG. 57 is a schematic diagram of a structure of a second shaft in a rotating shaft assembly.
Figure 58:
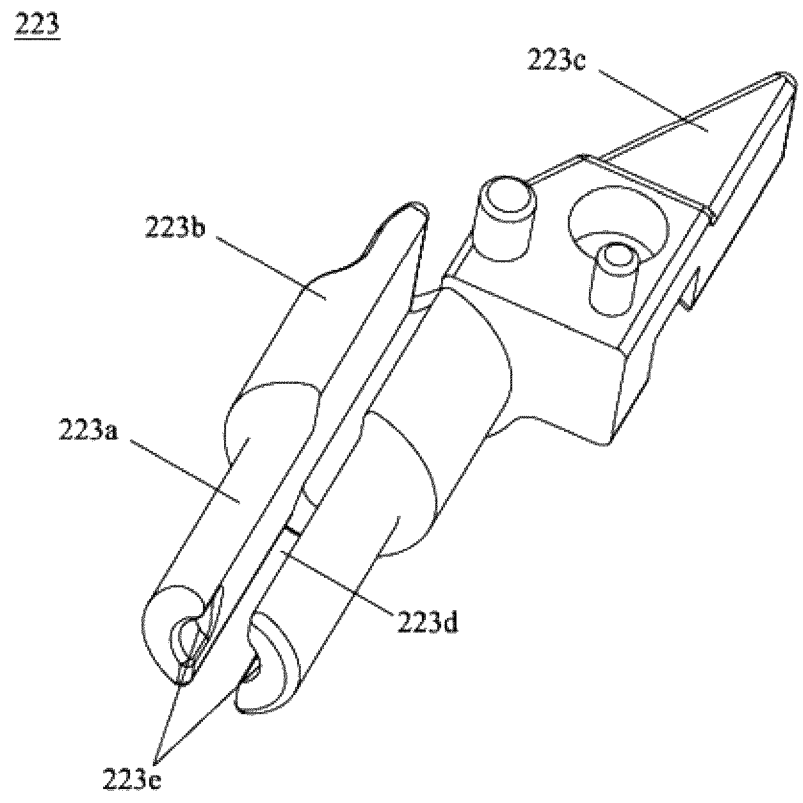
FIG. 58 is a schematic diagram of a structure of a second shaft in a rotating shaft assembly.

As shown in FIG. 56, FIG. 57, and FIG. 58, the second shaft 223 may be an integrated structure, and may include a first part 223*a*, a second part 223*b*, and a third part 223*c* that are sequentially connected. It may be understood that, in FIG. 56, the first part 223*a*, the second part 223*b*, and the third part 223*c* are respectively distinguished by using three dotted line boxes, which is merely intended to intuitively illustrate approximate positions of the first part 223*a*, the second part 223*b*, and the third part 223*c*, but is not intended to strictly define boundaries among the first part 223*a*, the second part 223*b*, and the third part 223*c*.

As shown in FIG. 56 to FIG. 58, both the first part 223*a* and the second part 223*b* may be roughly cylinders. A structure of the third part 223*c* may be designed as required. FIG. 56 to FIG. 58 are merely schematic diagrams. A channel 223*d* may be formed on the second shaft 223, and may extend basically in an axial direction of the first part 223*a*. The channel 223*d* may pass through two opposite ends in a radial direction of the first part 223*a* and through one end of the second part 223*b* and the third part 223*c* in a radial direction of the second part 223*b*. Therefore, the first part 223*a* may be divided into two completely disconnected parts by the channel 223*d*, and the second part 223*b* and the third part 223*c* each may be divided into two connected parts by the channel 223*d*.

As shown in FIG. 57 and FIG. 58, an end that is of the first part 223*a* and that is far away from the second part 223*b* has a groove 223*e*, and the groove 223*e* may be specifically provided on an inner surface of the channel 223*d*. There may be two grooves 223*e*. Each part of the first part 223*a* has one groove 223*e*, and openings of the two grooves 223*e* face each other.

In this embodiment, a flexible circuit board may be mounted on the second shaft 223. Details are described below.

Figure 59:
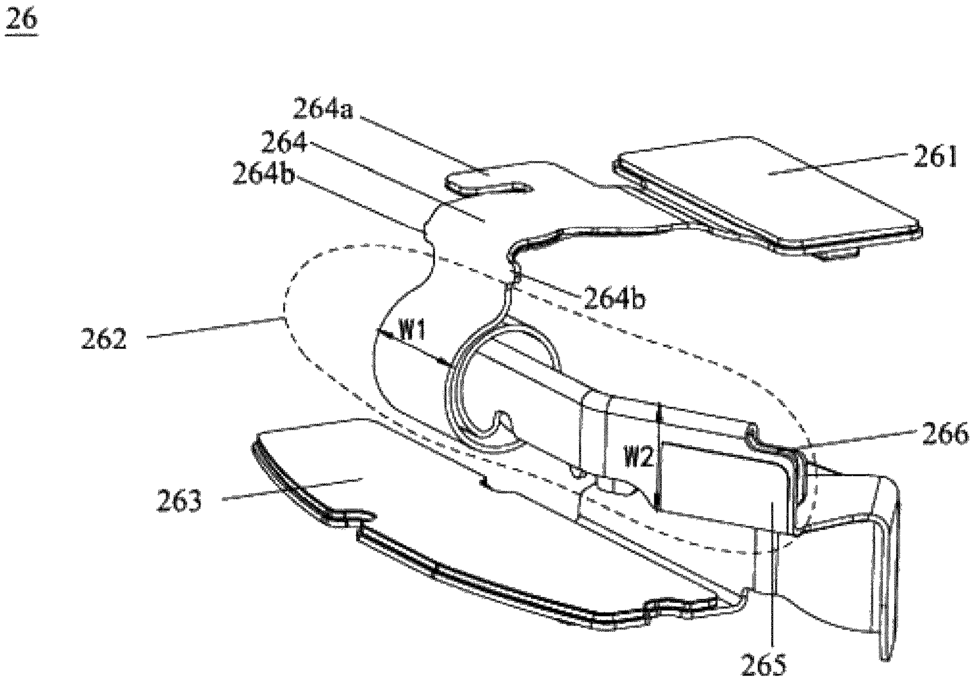
FIG. 59 is a schematic diagram of a structure of a flexible circuit board in a rotating shaft assembly.
Figure 60:
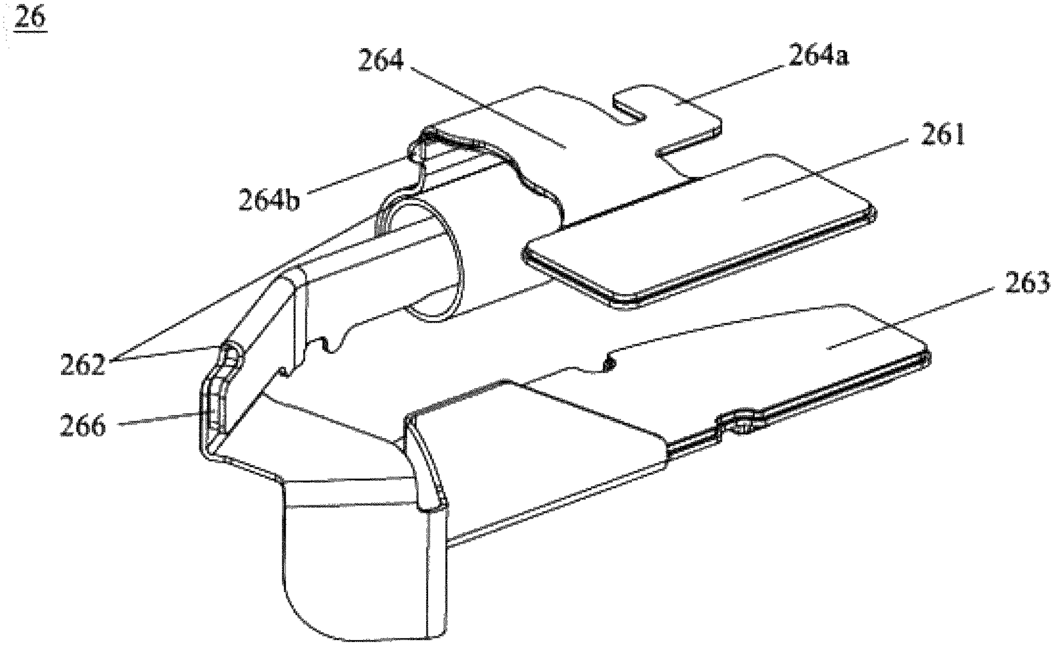
FIG. 60 is a schematic diagram of a structure of a flexible circuit board in a rotating shaft assembly.
Figure 61:
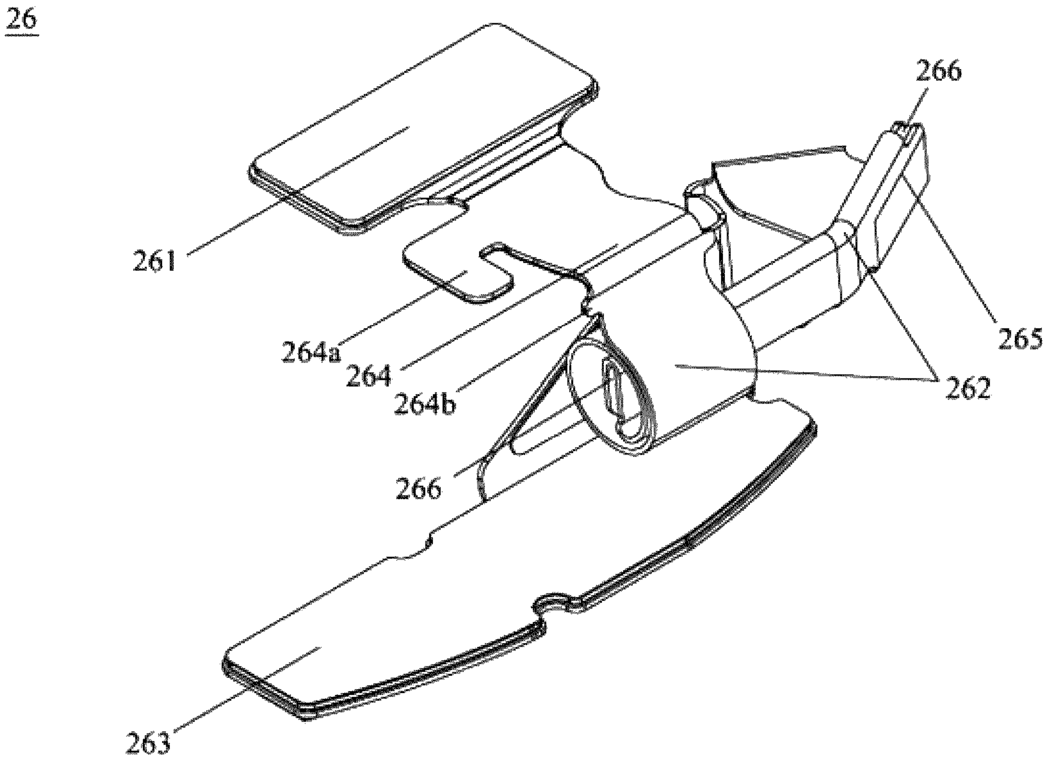
FIG. 61 is a schematic diagram of a structure of a flexible circuit board in a rotating shaft assembly.

FIG. 59, FIG. 60, and FIG. 61 show schematic structures of a flexible circuit board 26 obtained by bending and winding (the flexible circuit board 26 is bent and wound after being mounted on the second shaft 223). Actually, the flexible circuit board 26 is in an unfolded state before being mounted on the second shaft 223, and in the unfolded state, the flexible circuit board 26 may be roughly of a long strip-shaped structure.

As shown in FIG. 59 to FIG. 61, the flexible circuit board 26 may include an electrical connection end 261 and an electrical connection end 263. After the flexible circuit board 26 is unfolded, the electrical connection end 261 and the electrical connection end 263 are respectively two ends in an extension direction of the flexible circuit board 26. Both the electrical connection end 261 and the electrical connection end 263 are configured to transmit an electrical signal, and the electrical connection end 261 and the electrical connection end 263 each may include a connector.

For example, the electrical connection end 261 may be connected to the first host circuit board assembly 212. For example, the connector of the electrical connection end 261 may be connected to a connector on the circuit board 212*a* of the first host circuit board assembly 212, so as to electrically connect the flexible circuit board 26 to the first host circuit board assembly 212.

For example, the electrical connection end 263 may be electrically connected to the second host circuit board assembly 235 and a flexible circuit board connecting the function button 24 and a motor (for example, the function button 24 and the motor may share the same flexible circuit board). The flexible circuit board connecting the function button 24 and the motor may be fastened, for example, to a side that is of the second bracket 231*a* and that is far away from the opening of the third accommodation groove 231*f*. A magnetic field sensor (for example, a Hall effect sensor or a magnetometer) may be further disposed on the flexible circuit board. For example, there may be two magnetic field sensors, and the two magnetic field sensors may be respectively close to the groove wall of the third accommodation groove 231*f* and the groove wall of the fourth accommodation groove 231*g*.

As shown in FIG. 59 to FIG. 61, the flexible circuit board 26 may further include a connection part 264 and a mounting part 262. The connection part 264 connects the mounting part 262 to the electrical connection end 261, and the mounting part 262 is further connected to the electrical connection end 263.

As shown in FIG. 59 to FIG. 61, the connection part 264 has a grounding portion 264*a* and a limiting portion 264*b*. For example, the grounding portion 264*a* may be close to the electrical connection end 261, and the limiting portion 264*b* may be far away from the electrical connection end 261. The limiting portion 264*b* may be, for example, lug-like. For example, there may be two limiting portions 264*b*, and the two limiting portions 264*b* are respectively located on edges of two sides of the connection part 264.

As shown in FIG. 59 to FIG. 61, the mounting part 262 is used to match the second shaft 223 and may be in a bent and wound state. For example, from the perspective of FIG. 59, one part of the mounting part 262 may be folded in half to form layers, and thus may be referred to as a laminated part. Another part of the mounting part 262 may be connected to the laminated part and wound into a loop, and thus may be referred to as a wound part. The wound part may be located at one end of the laminated part. It may be understood that the mounting part 262 is marked with a dashed box in FIG. 59, which is merely intended to visually illustrate a general position of the mounting part 262, and is not intended to strictly define a boundary of the mounting part 262.

Figure 62:
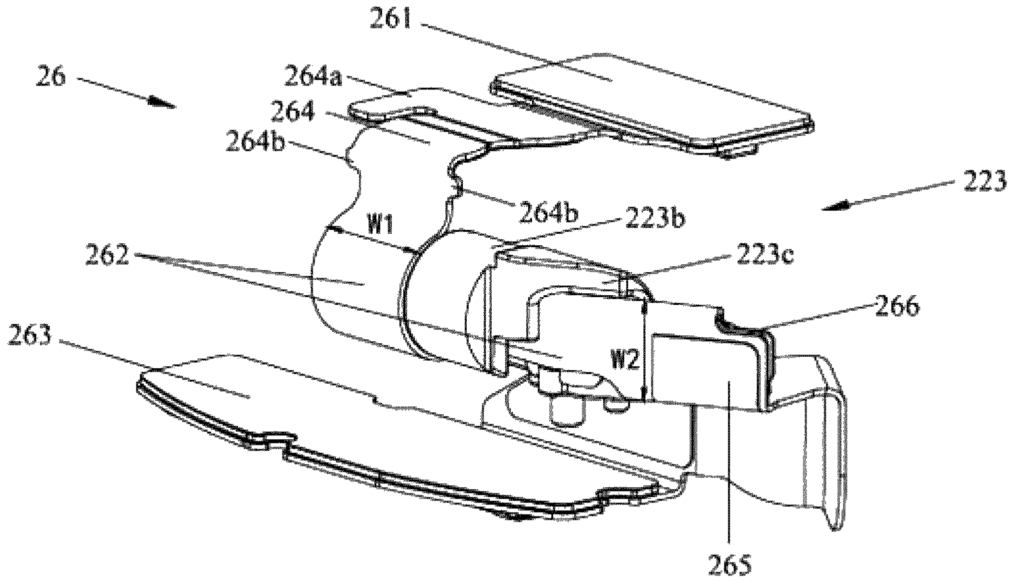
FIG. 62 is a schematic diagram of an assembly structure including a second shaft and a flexible circuit board in a rotating shaft assembly.

In this embodiment, a quantity of wires in the flexible circuit board 26 needs to meet a design requirement, and a width of the flexible circuit board 26 affects the quantity of wires in the flexible circuit board 26. Therefore, the width (for example, a minimum width) of the flexible circuit board 26 needs to meet the design requirement. FIG. 59 and FIG. 62 schematically show a width W1 of the wound part of the mounting part 262 of the flexible circuit board 26 and a folding width W2 of the laminated part (an unfolding width of the laminated part is approximately 2*W2). The width W1 of the wound part and the folding width W2 of the laminated part can be designed as required.

As shown in FIG. 59 to FIG. 61, the flexible circuit board 26 may further include a separation bracket 266. A structure of the separation bracket 266 may be designed as desired, for example, roughly in a flat-plate shape. A quantity of the separation brackets 266 may be determined as required. There may be one or at least two separation brackets. The separation bracket 266 is sandwiched between folded layers of the laminated part, and each layer may be connected (for example, bonded) to the separation bracket 266.

In this embodiment, the unfolded width of the laminated part is generally small, and it is difficult to maintain a folded form after the laminated part is folded (the folded layers are easily tilted). However, because the separation bracket 266 is provided, the laminated part is allowed to remain in a folded configuration. In addition, the separation bracket 266 can also limit a bending radius of the laminated part to avoid damage caused by excessive bending of the laminated part. In another embodiment, the separation bracket 266 may not be provided based on a product requirement. As shown in FIG. 59 and FIG. 61, the flexible circuit board 26 may further include a protective layer 265. For example, the protective layer 265 may be attached to a surface of the laminated part, and may be located at an end that is of the laminated part and that is far away from the wound part. A material of the protective layer 265 may be, for example, mylar (mylar). In this embodiment, the position and the material of the protective layer 265 may alternatively be designed based on a product requirement, and are not limited to the foregoing descriptions.

In this embodiment, the laminated part may be fastened to the third host housing 232, and the protective layer 265 may separate the laminated part from the third host housing 232, so as to prevent damage to the flexible circuit board 26 caused by friction between the laminated part and the third host housing 232 (descriptions are further provided below). In addition, the protective layer 265 may further enhance a structure of the laminated part. In another embodiment, the protective layer 265 may not be provided based on a product requirement.

Figure 63:
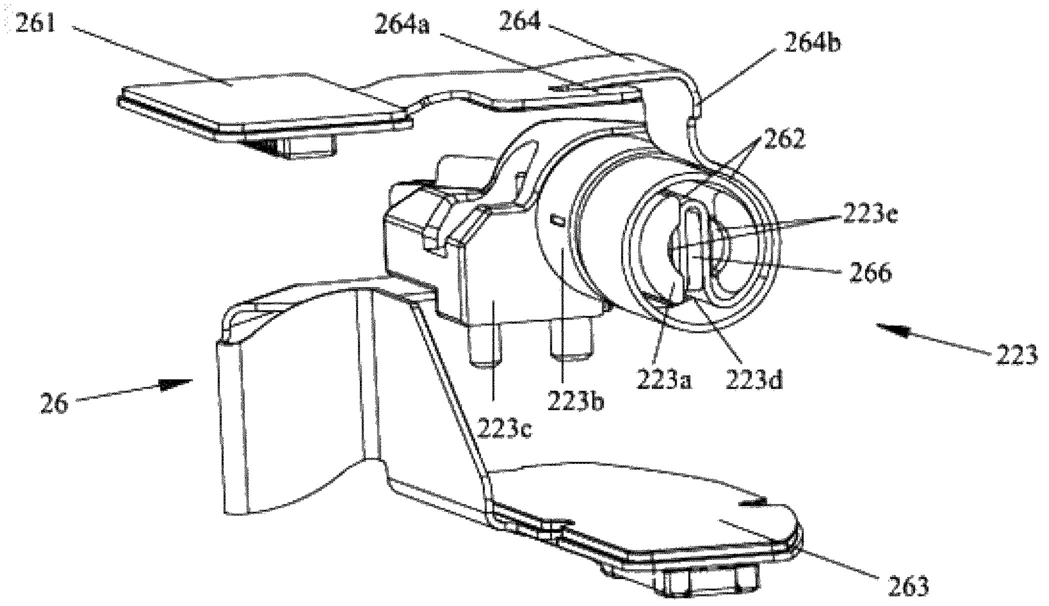
FIG. 63 is a schematic diagram of an assembly structure including a second shaft and a flexible circuit board in a rotating shaft assembly.

FIG. 62 and FIG. 63 show assembly structures of the flexible circuit board 26 and the second shaft 223. When the flexible circuit board 26 and the second shaft 223 are assembled, the laminated part of the mounting part 262 of the flexible circuit board 26 in the unfolded state may be folded in half, and the wound part of the mounting part 262 may continue to be in the unfolded state. With reference to FIG. 62, FIG. 63, and FIG. 58, the entire mounting part 262 is then fitted into the channel 223*d* of the second shaft 223 from the end of the third part 223*c* of the second shaft 223, so that the wound part of the mounting part 262 is positioned to the first part 223*a* of the second shaft 223. In this case, the wound part may be bent so that the wound part is wound around a periphery of the first part 223*a*, and a quantity of winding turns may be determined based on the actual requirement. After the winding is completed, there is a specific distance between the wound part and an end portion that is of the first part 223*a* and that is far away from the second part 223*b* (that is, the wound part does not cover the end portion of the first part 223*a*). This helps avoid that the wound part is scratched and a life is affected (descriptions are further provided below). Both the electrical connection end 261 and the electrical connection end 263 of the flexible circuit board 26 are located outside the second shaft 223. The electrical connection end 261 and the electrical connection end 263 may be bent to adapt to internal space of the host 2. The protective layer 265 and the connection part 264 of the flexible circuit board 26 may alternatively be exposed outside the second shaft 223.

In this embodiment, an inner ring of the wound part of the flexible circuit board 26 is in direct contact with the first part 223*a* of the second shaft 223, and a joint between the wound part and the laminated part may be fastened, for example, by bonding, to the first part 223*a*. Other regions of the wound part may be not fastened but remain in a natural wound state, and may be relaxed to increase a diameter of the part, or tightened to decrease the diameter of the part.

In this embodiment, because the wound part of the flexible circuit board 26 is wound around the first part 223*a* of the second shaft 223, the width W1 of the wound part can be ensured by using an axial size of the first part 223*a*. The laminated part of the flexible circuit board 26 is accommodated in the channel 223*d* of the second shaft 223 in a folded state, so that the laminated part with the unfolding width of 2*W2 can be accommodated in only a small space of the second shaft 223. This facilitates miniaturization of the second shaft 223 and is beneficial to realizing miniaturization of the host 2.

To sum up, the second shaft 223 having the foregoing structure is designed, and the flexible circuit board 26 is mounted on the second shaft 223 in a bent and wound manner, so that electrical connection of the host 2 can be implemented, and a width of the flexible circuit board 26 can meet a design requirement, and miniaturization of the host 2 can be implemented.

In this embodiment, the second shaft 223 on which the flexible circuit board 26 is mounted may be mounted in the second inner cavity 222*j* of the shaft sleeve 222.

Figure 67:
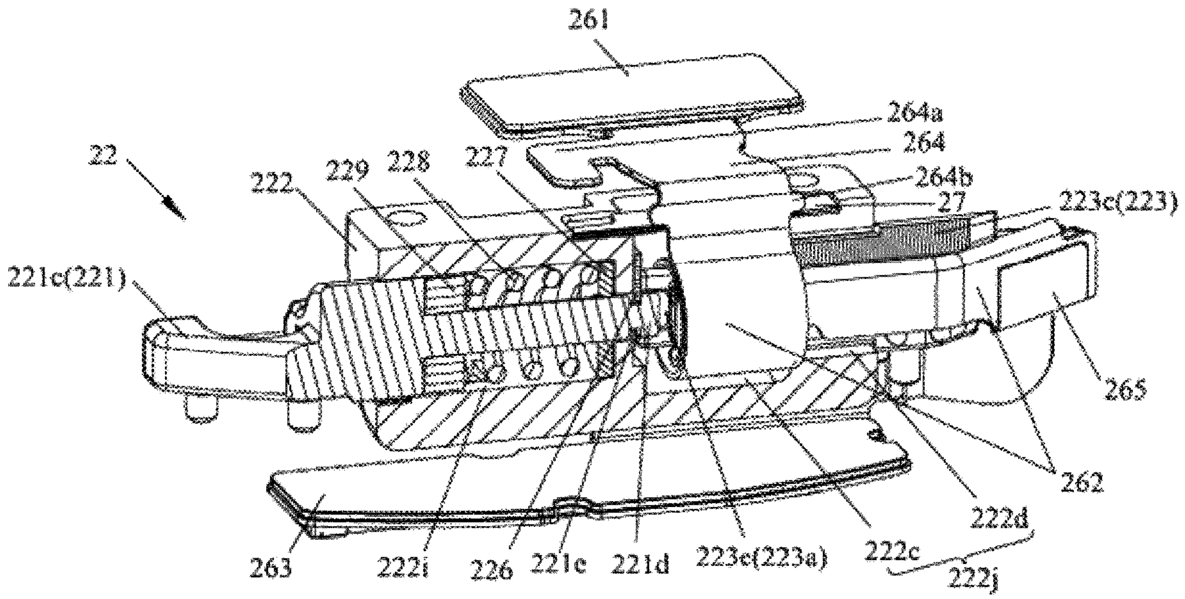
FIG. 67 is a schematic diagram of a sectional structure of a rotating shaft assembly.

With reference to FIG. 57 and FIG. 67, the first part 223*a* of the second shaft 223 is located in the first region 222*c* of the shaft sleeve 222. The second part 223*b* of the second shaft 223 may be located in the second region 222*d* of the second inner cavity 222*j*. The outer circumferential surface of the second part 223*b* may rotate and match the inner surface of the second region 222*d*. In other words, the outer circumferential surface of the second part 223*b* may be in contact with or may not be in contact with the inner surface of the second region 222*d* (with a small gap), and the inner surface of the second region 222*d* may rotate relative to the outer circumferential surface of the second part 223*b*. The third part 223*c* of the second shaft 223 is located outside the shaft sleeve 222.

Figure 64:
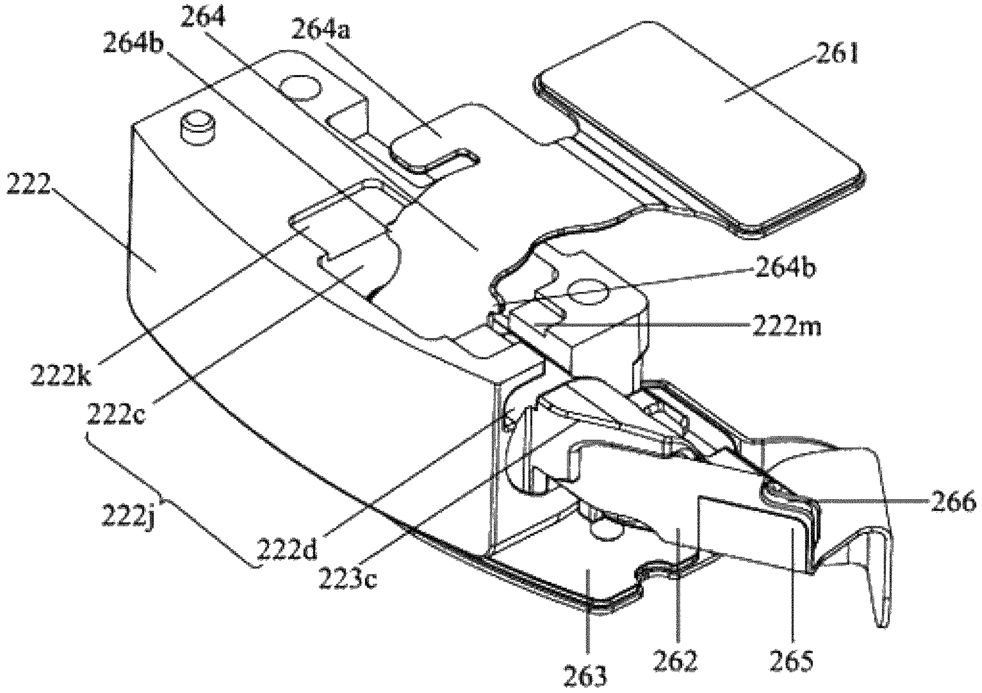
FIG. 64 is a schematic diagram of an assembly structure of a rotating shaft assembly.

As shown in FIG. 59, FIG. 64, and FIG. 67, the wound part of the flexible circuit board 26 is located in the first region 222*c*. One part of the laminated part of the flexible circuit board 26 is located in the first region 222*c* and the second region 222*d*, and the other part of the laminated part is located outside the shaft sleeve 222. Both the electrical connection end 261 and the electrical connection end 263 of the flexible circuit board 26 are located outside the shaft sleeve 222. The connection part 264 of the flexible circuit board 26 may pass through an opening of the first region 222*c*, and both the grounding portion 264*a* and the limiting portion 264*b* of the connection part 264 are located outside the shaft sleeve 222.

With reference to FIG. 64, in this embodiment, the electrical connection end 261 of the flexible circuit board 26 may be fastened to the first host circuit board assembly 212, and the electrical connection end 261 may move with the first part 21 of the host 2. Accordingly, the connection part 264 connected to the electrical connection end 261 also moves with the electrical connection end 261. To enable the connection part 264 to move based on the design requirement, ensure that the motion of the connection part 264 is controllable, and avoid fatigue damage to the connection part 264, the connection part 264 may be clamped by using a clamping member, so as to limit the connection part 264. Descriptions are provided below.

Figure 65:
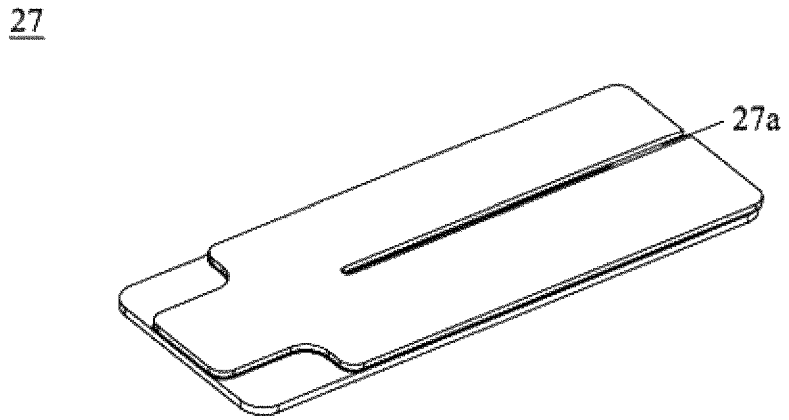
FIG. 65 is a schematic diagram of a structure of a clamping member in a rotating shaft assembly.

As shown in FIG. 65, the clamping member 27 may be roughly in a sheet shape, and a clamping gap 27*a* may be provided on the clamping member 27. The clamping gap 27*a* may be roughly in a straight-line shape. One end of the clamping gap 27*a* passes through the clamping member 27, and the other end does not pass through the clamping member 27. The clamping member 27 may be made of a material having good insulation and moisture resistance, like mylar (mylar).

Figure 66:
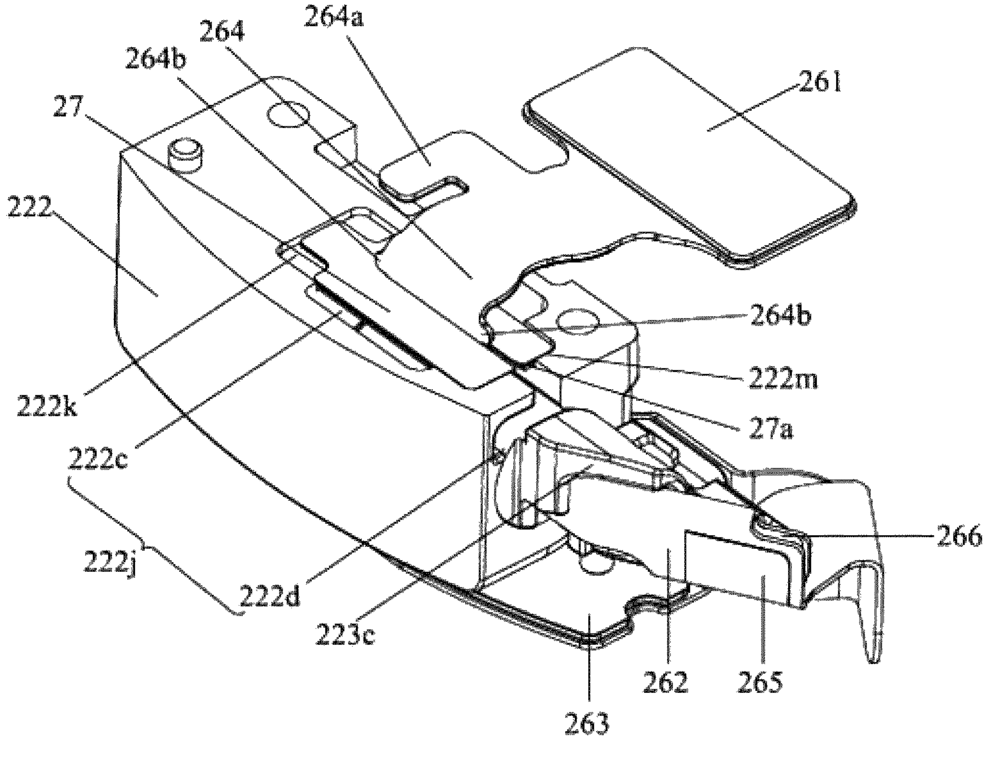
FIG. 66 is a schematic diagram of an assembly structure of a rotating shaft assembly.

As shown in FIG. 65 and FIG. 66, the connection part 264 may penetrate the clamping gap 27*a* of the clamping member 27, the limiting portion 264*b* of the connection part 264 may be clamped on an edge of the clamping gap 27*a*, the clamping member 27 may be fastened to the groove 222*k* and the groove 222*m* of the shaft sleeve 222, and the clamping member 27 covers at least a part of the first region 222*c*. Therefore, the clamping member 27 can clamp the connection part 264 and limit the connection part 264. When the connection part 264 moves, due to existence of the clamping member 27, a motion stroke of the connection part 264 meets the design requirements and is not prone to fatigue damage. In addition, the limiting portion 264*b* is designed, so that accurate positioning of the clamping member 27 and the flexible circuit board 26 during production line assembly is facilitated. This ensures an assembly yield. In another embodiment, the design of clamping the connection part 264 by the clamping member 27 may not be used.

The foregoing describes structures and assembly of the second shaft 223, the flexible circuit board 26, the shaft sleeve 222, and the clamping member 27. The following describes an overall assembly structure of the rotating shaft assembly 22 and assembly relationships among the flexible circuit board 26, the second shaft 223, and the first shaft 221.

FIG. 67 shows a sectional view of an assembly structure including the rotating shaft assembly 22, the flexible circuit board 26, and the clamping member 27. A sectional view of the flexible circuit board 26 is not provided, to clearly show the flexible circuit board 26. The foregoing describes an assembly relationship among the first shaft 221, the driven member 229, the elastic member 228, the bump matching member 227, and the shaft sleeve 222, and an assembly relationship among the second shaft 223, the flexible circuit board 26, the clamping member 27, and the shaft sleeve 222, as shown in FIG. 67. This is not repeated herein. As described above, the end portion of the first part 223*a* of the second shaft 223 is not covered by the wound part of the flexible circuit board 26. This facilitates insertion of the end portion 221*d* of the first shaft 221 into the groove 223*e* of the first part 223*a* of the second shaft 223. There may be a specific gap between the end portion 221*d* and the wound part in an axial direction of the first shaft 221, to avoid interference between the end portion 221*d* and the wound part.

In addition, as shown in FIG. 44, FIG. 38, and FIG. 40, one shaft contact member 224 may be fastened in the mounting groove 222*g* that is of the shaft sleeve 222 and that is close to the second part 221*b* of the first shaft 221, and the shaft contact member 224 is in contact with the second part 221*b*. Similarly, another shaft contact member 224 may be fastened in a groove that is of the shaft sleeve 222 and that is close to the second part 223*b* of the second shaft 223, and the shaft contact member 224 is in contact with the second part 223*b* (due to an angle of view, the groove that is assembled in the shaft sleeve 222 and that is close to the second part 223*b* and the shaft contact member 224 within the groove are not displayed). In this embodiment, the shaft contact member 224 may be a conductor, for example, a metal spring.

The assembly structure of the rotating shaft assembly 22, the flexible circuit board 26, the first part 21, and the second part 23 of the host 2 is described step by step below.

Figure 68:
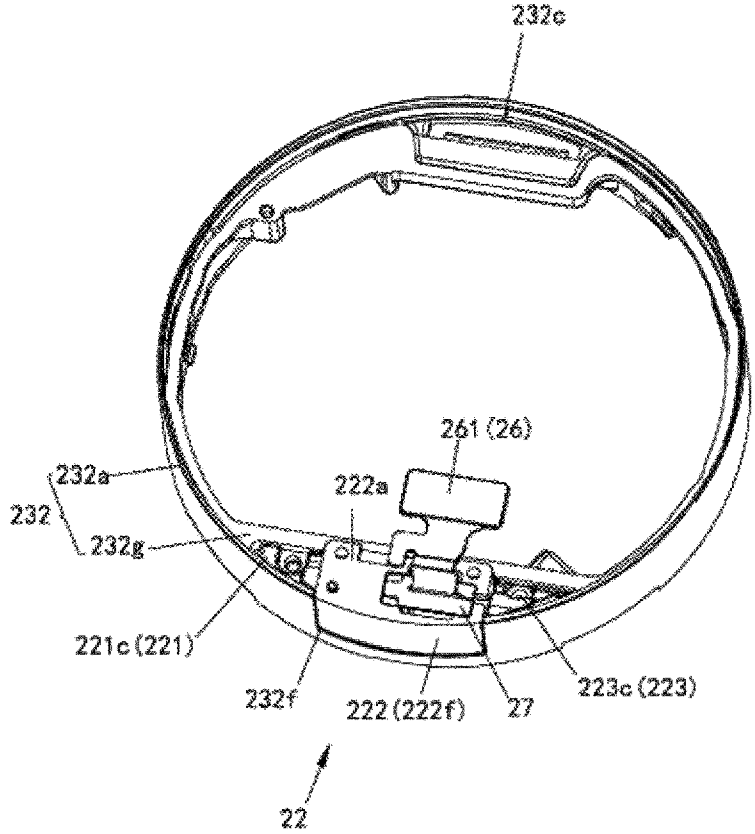
FIG. 68 is a schematic diagram of an assembly structure including a rotating shaft assembly and a third host housing.

As shown in FIG. 68, both the third part 221*c* of the first shaft 221 and the third part 223*c* of the second shaft 223 may be fastened to the inner bearing platform 232*g* of the third host housing 232. The shaft sleeve 222 may be located in the rotating shaft mounting space 232*f* of the third host housing 232, and the shaft sleeve 222 may rotate in the rotating shaft mounting space 232*f* The second outer surface 222*f* of the shaft sleeve 222 may face an outer side of the circumferential side wall 232*a* of the third host housing 232. The electrical connection end 261 of the flexible circuit board 26 may be located on the inner side of the circumferential side wall 232*a*.

With reference to FIG. 67 and FIG. 68, the electrical connection end 263 of the flexible circuit board 26 may be located on the inner side of the circumferential side wall 232*a* and fastened to the inner bearing platform 232*g*. For example, the electrical connection end 263 may have an adhesive, and the electrical connection end 263 may be bonded to the inner bearing platform 232*g*. With reference to FIG. 67, FIG. 24, and FIG. 68, the protective layer 265 of the flexible circuit board 26 may be located on the inner side of the circumferential side wall 232*a*, and is located between the circumferential side wall 232*a* and the laminated part of the flexible circuit board 26, so as to prevent the flexible circuit board 26 from being damaged due to friction caused because the laminated part is in direct contact with the circumferential side wall 232*a*.

Figure 69:
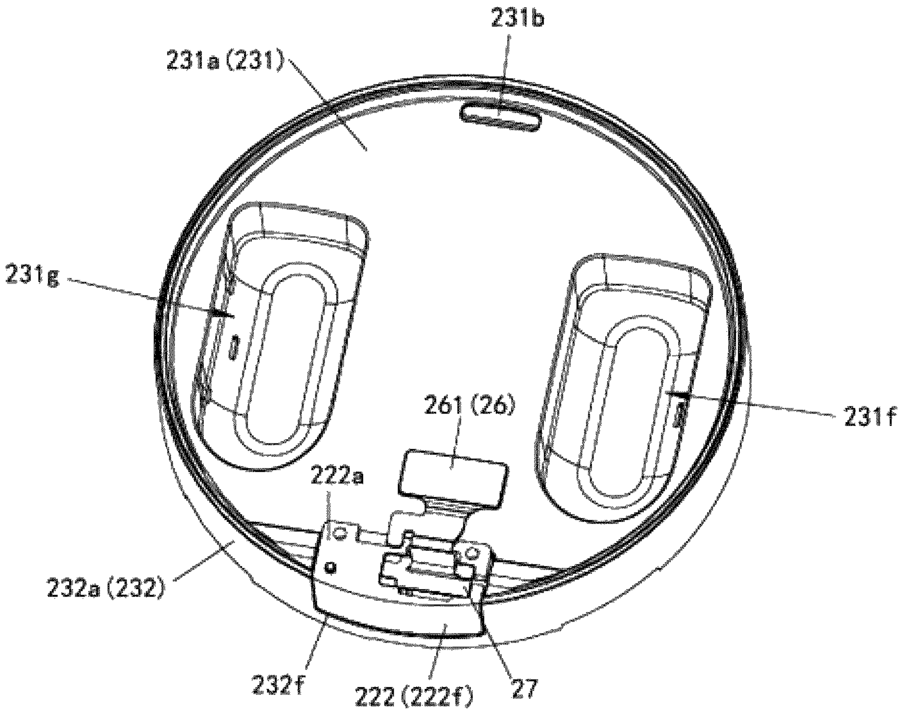
FIG. 69 is a schematic diagram of an assembly structure including a rotating shaft assembly, a third host housing, and a second host housing.

As shown in FIG. 69, the second bracket 231*a* of the second host housing 231 and the third host housing 232 may be assembled and fastened, and the second host housing 231 may be located on the inner side of the circumferential side wall 232*a*. From the perspective of FIG. 69, openings of the third accommodation groove 231*f* and the fourth accommodation groove 231*g* of the second bracket 231*a* face upward. The second bracket 231*a* covers both the third part 221*c* of the first shaft 221 and the third part 223*c* of the second shaft 223. The through hole 231*b* of the second bracket 231*a* and the shaft sleeve 222 may be respectively located at two opposite ends of a same diameter of the circumferential side wall 232*a*. With reference to FIG. 69 and FIG. 68, the through hole 231*b* may communicate with the second opening 232*c* of the third host housing 232.

Figure 70:
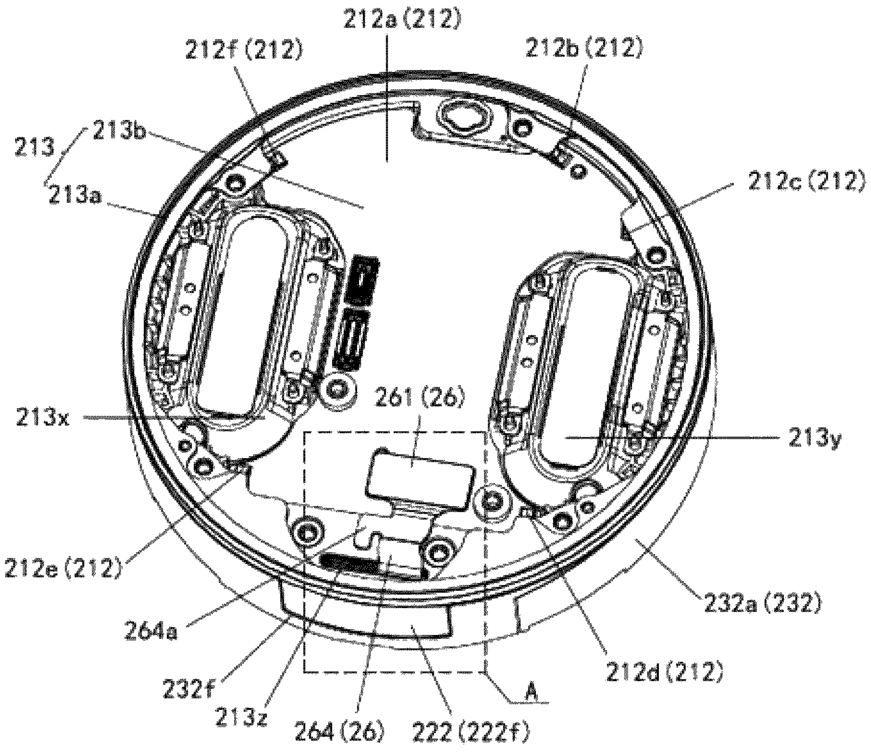
FIG. 70 is a schematic diagram of an assembly structure including a rotating shaft assembly, a third host housing, a second host housing, and a first host housing.

With reference to FIG. 70 and FIG. 69, the first host housing 213 may cover the second host housing 231 and the third host housing 232. From the perspective of FIG. 70, openings of the first accommodation groove 213*y* and the second accommodation groove 213*x* of the first bracket 213*b* of the first host housing 213 may face downward. In this embodiment, the opening of the first accommodation groove 213*y* may face the opening of the third accommodation groove 231*f*, and the opening of the first accommodation groove 213*y* may be aligned with the opening of the third accommodation groove 231*f*. The opening of the second accommodation groove 213*x* may face the opening of the fourth accommodation groove 231*g*, and the opening of the second accommodation groove 213*x* may be aligned with the opening of the fourth accommodation groove 231*g*.

With reference to FIG. 70 and FIG. 69, the first frame body 213*a* in the first host housing 213 may be fixedly connected to a side that is of the shaft sleeve 222 and that has the first outer surface 222*a*, and the first frame body 213*a* may cover a part of the first outer surface 222*a* and a part of the clamping member 27. The other part of the first outer surface 222*a* and the other part of the clamping member 27 may be exposed from the through hole 213*z* of the first frame body 213*a*. The electrical connection end 261 and the connection part 264 of the flexible circuit board 26 may pass through the through hole 213*z* of the first frame body 213*a*. The electrical connection end 261 may be connected to a circuit board of the first host circuit board assembly 212, so that the flexible circuit board 26 is electrically connected to the first host circuit board assembly 212. The grounding portion 264*a* of the connection part 264 may pass through the through hole 213*z*, and is connected to the first frame body 213*a* by using a conductor. The conductor may be, for example, conductive foam or a conductive adhesive. This enables the flexible circuit board 26 to be grounded, to avoid interference to antenna radiation performance of the host 2 (descriptions are further provided below). The limiting portion 264*b* of the connection part 264 is located in the through hole 213*z*.

Figure 71:
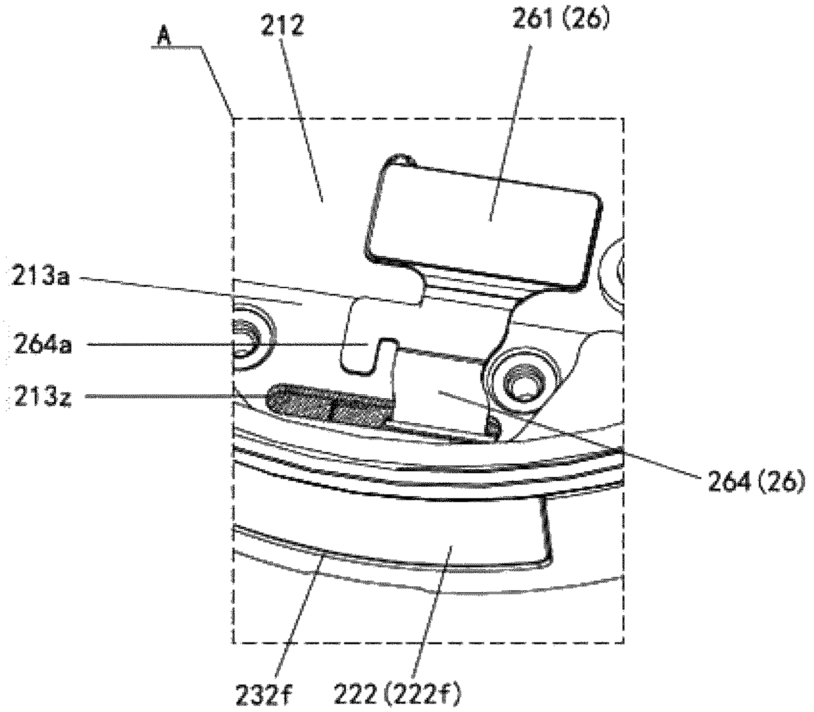
FIG. 71 is a schematic diagram of a partially enlarged structure at a position A in FIG. 70.

As shown in FIG. 71 and FIG. 69, the through hole 213*z* of the first frame body 213*a* may be filled with a sealing material (indicated by shading). The sealing material may fill the through hole 213*z* and cover the first outer surface 222*a* and a surface of the clamping member 27. The sealing material surrounds the connection part 264 of the flexible circuit board 26. The sealing material may be, for example, a sealant. The sealing material has a sealing effect, and can prevent moisture from intruding into the electrical connection end 261 and the first host circuit board assembly 212 through the through hole 213*z* of the first frame body 213*a*. The moisture may come from the outside, and the outside moisture may enter the through hole through an assembly gap between the shaft sleeve 222 and the circumferential side wall 232*a*. The moisture may also come from the inside of the host 2, and the moisture inside the host 2 may enter the through hole through an assembly gap between the shaft sleeve 222 and the second bracket 231*a*.

In another embodiment, a structure design may be adjusted (for example, a position and/or a size of the through hole of the first frame body 213*a* may be adjusted), so that only a part of the region of the clamping member 27 may be exposed from the through hole 213*z* of the first frame body 213*a*, and the first outer surface 222*a* of the shaft sleeve 222 is completely covered by the first frame body 213*a*. Accordingly, the sealing material in the through hole 213*z* covers only the surface of the clamping member 27. Alternatively, in another embodiment, based on an actual requirement, the first frame body 213*a* may not be provided with the through hole 213*z*, and may be sealed without filling the sealing material.

Figure 72:
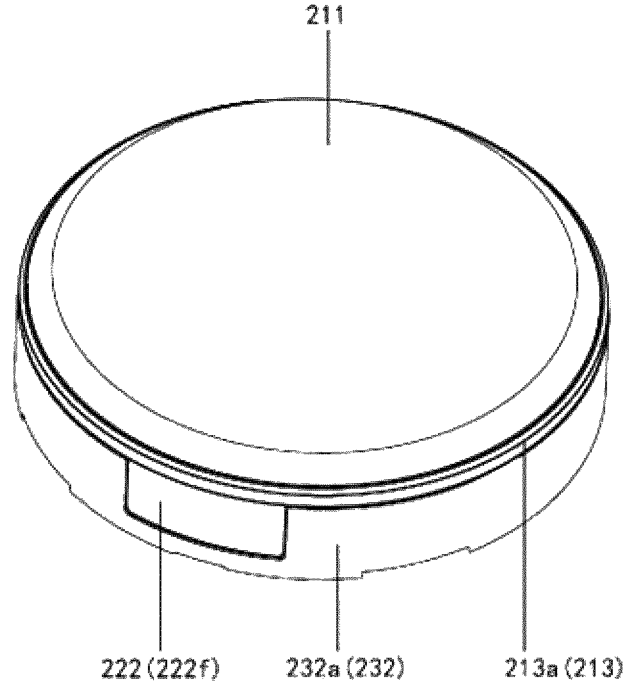
FIG. 72 is a schematic diagram of an assembly structure of a host in a wearable device.

As shown in FIG. 72, the display 211 is mounted on the first host housing 213. With reference to FIG. 72, FIG. 70, and FIG. 6, the display 211 may cover the first bracket 213*b* of the first host housing 213, the first host circuit board assembly 212, the electrical connection end 261 and the connection part 264 of the flexible circuit board 26, and a part of the first frame body 213*a* of the first host housing 213. The circumferential edge of the first frame body 213*a* may surround a periphery of the display 211. FIG. 72 shows the closed state of the host 2. The second outer surface 222*f* of the shaft sleeve 222 can be seen as the external surface of the host 2.

To sum up, in the host 2, the shaft sleeve 222 of the rotating shaft assembly 22 is fixedly connected to the first part 21, and the first shaft 221 and the second shaft 223 of the rotating shaft assembly 22 are fixedly connected to the second part 23. The first part 21 can rotate around the first shaft 221 and the second shaft 223 along with the shaft sleeve 222.

The following describes a mechanism motion generated in the host 2 during opening and closing of the host 2.

Figure 73:
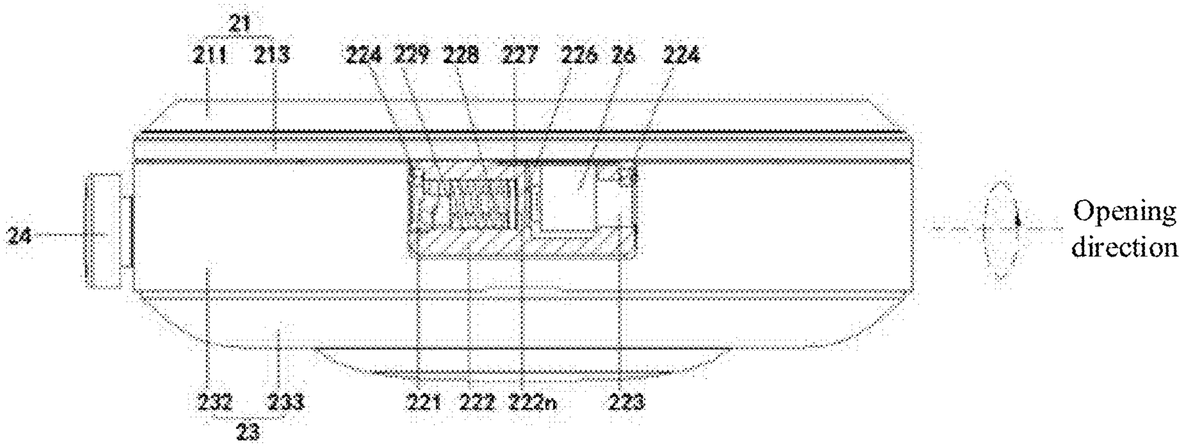
FIG. 73 is a schematic partial sectional view of an assembly structure of a host in a wearable device.
Figure 74:
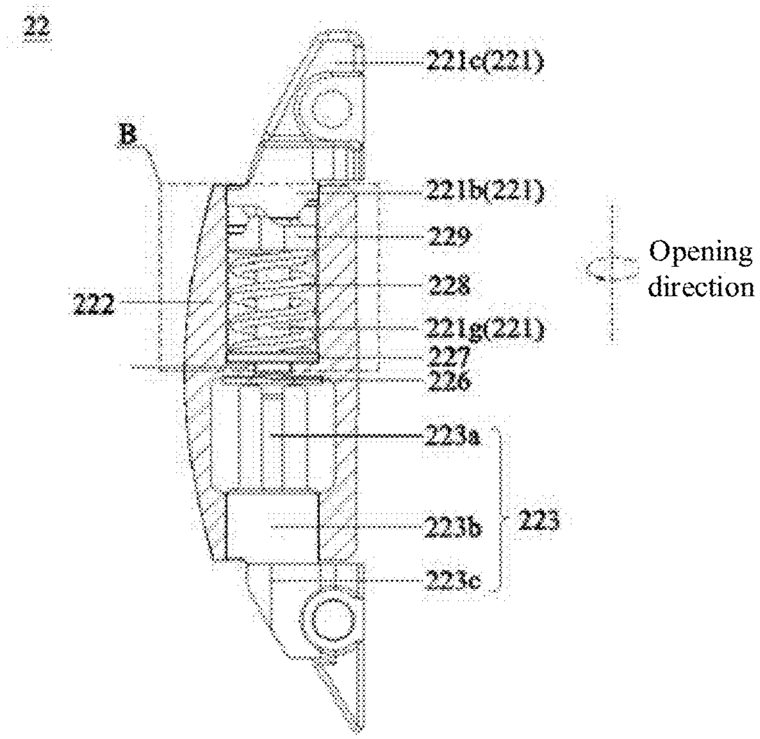
FIG. 74 is a schematic diagram of a sectional structure of a rotating shaft assembly.
Figure 75:
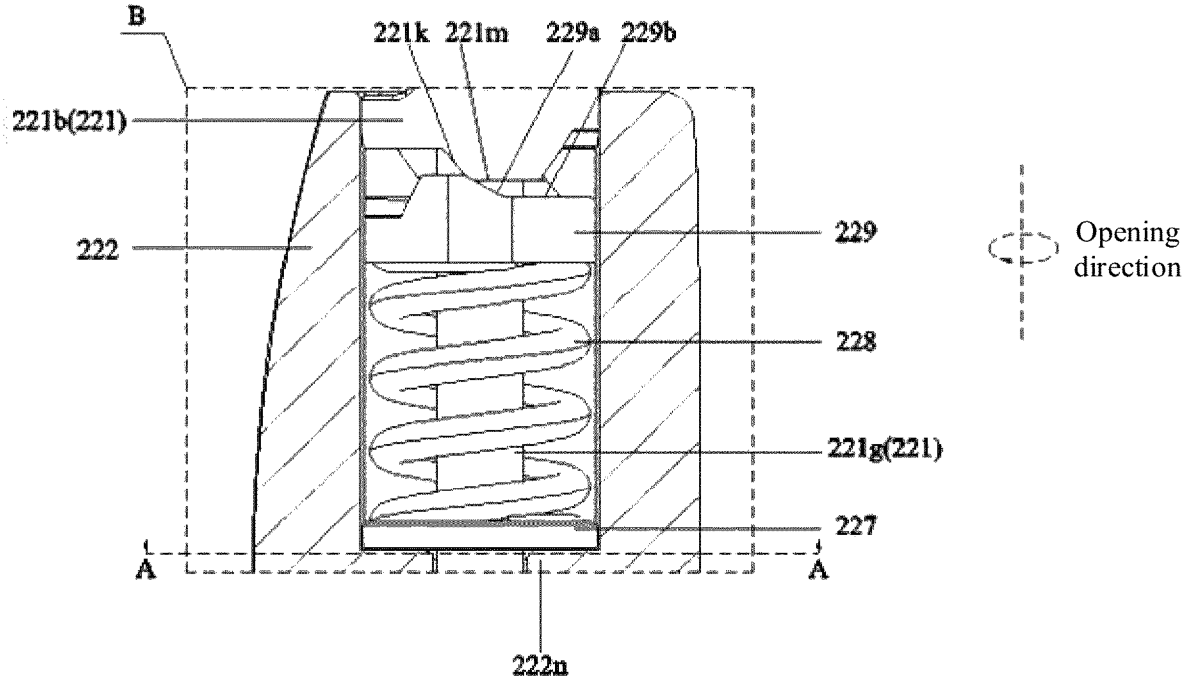
FIG. 75 is a schematic diagram of a partially enlarged structure at a position B in FIG. 74.

FIG. 73 is a schematic side view of the host 2 in a closed state, and FIG. 74 is a schematic top view of the rotating shaft assembly 22 of the host 2 in FIG. 73. In FIG. 73 and FIG. 74, the shaft sleeve 222 is cut open, to show an internal state of the rotating shaft assembly 22. It should be noted that a cross section of the shaft sleeve 222 in FIG. 73 and a cross section of the shaft sleeve 222 in FIG. 74 are perpendicular to each other. FIG. 75 is a partially enlarged view at a position B in FIG. 74.

As described above, when the host 2 is in the closed state, the latch portion 213*d* in the first part 21 forms a buckle connection with the buckle 251*e* of the open button 25, so that the first part 21 is locked by the second part 23.

As shown in FIG. 73 and FIG. 75, when the host 2 is in the closed state, one end of the elastic member 228 presses against the driven member 229, so that the driven member 229 remains in contact with the second part 221*b*. A top (namely, an end that is of the first slope 229*a* and that is far away from the plane 229*b*) of the first slope 229*a* of the driven member 229 may be in contact with a top (namely, an end that is of the slope 221*k* and that is close to the plane 221*m*) of the slope 221*k* of the second part 221*b* of the first shaft 221, and there is a gap between the plane 229*b* of the driven member 229 and the plane 221*m* of the second part 221*b*. A force of the slope 221*k* against the first slope 229*a* may cause the driven member 229 to tend to rotate in an opening direction in which the first part 21 of the host 2 may rotate to open relative to the second part 23.

As shown in FIG. 75, due to matching between the driven member 229 and the shaft sleeve 222, when the driven member 229 tends to rotate in a clockwise direction, the shaft sleeve 222 also tends to rotate in the opening direction. The shaft sleeve 222 is fixedly connected to the first part 21, so that the first part 21 also tends to rotate in the opening direction. However, because the first part 21 is locked by the second part 23, the first part 21 cannot actually rotate in the opening direction.

As shown in FIG. 75, the other end of the elastic member 228 abuts against the bump matching member 227, so that the bump matching member 227 abuts against the spacer plate 222*n*.

Figure 76:
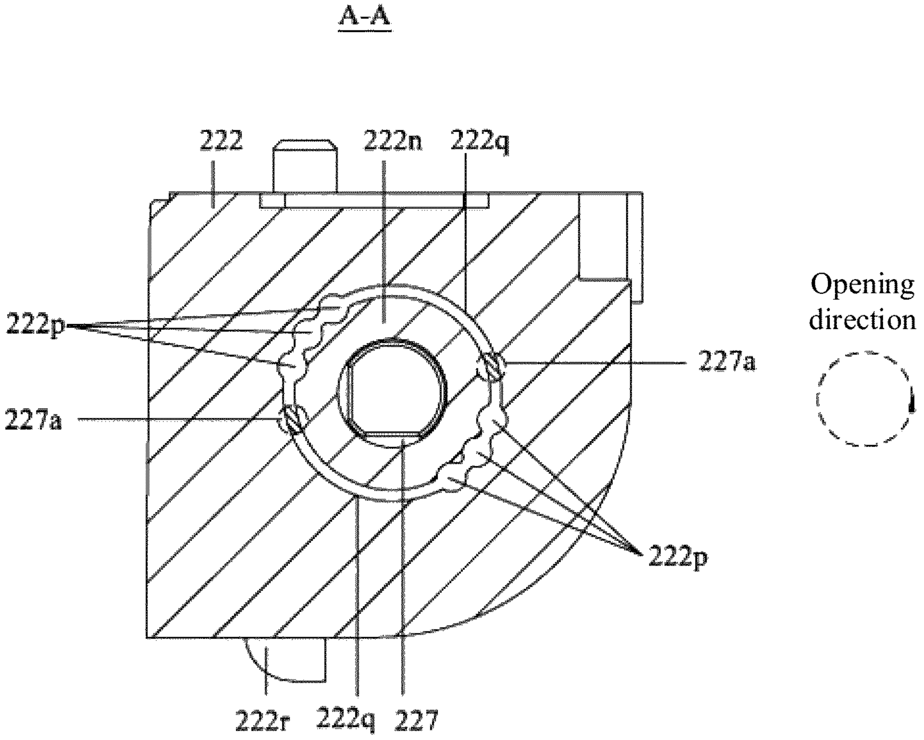
FIG. 76 is a schematic diagram of an A-A sectional structure of the structure shown in FIG. 75.

FIG. 76 is a schematic diagram of an A-A sectional structure of FIG. 75. FIG. 76 shows a sectional matching structure that includes the bump matching member 227 and the spacer plate 222*n* and that is obtained when the host 2 is in the closed state. The bumps 227*a* on the bump matching member 227 are shown in dotted lines. As shown in FIG. 76, the bumps 227*a* are located in the chute 222*q* on the spacer plate 222*n*, and the bumps 227*a* are spaced apart from the matching grooves 222*p*.

When the user presses the cap 251 of the open button 25, the buckle 251*e* of the open button 25 no longer forms a buckle connection with the latch portion 213*d* of the first part 21, and the first part 21 is no longer locked by the second part 23. The first rotation stroke segment of the first part 21 starts at this time.

Figure 77:
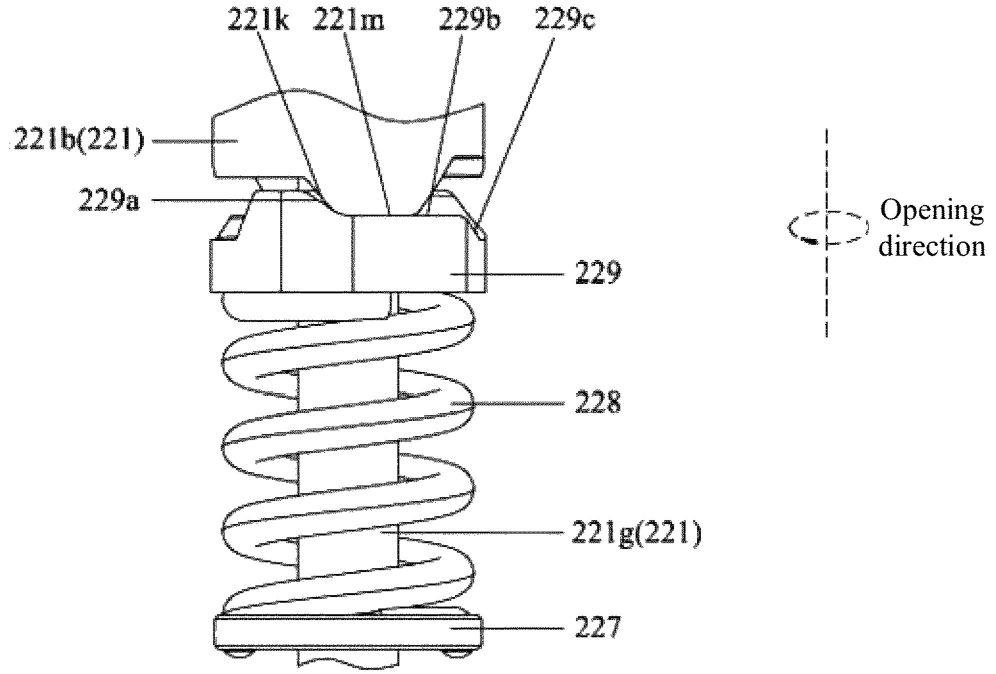
FIG. 77 is a schematic diagram of a matching structure including a first shaft, a driven member, and an elastic member in a rotating shaft assembly.

As shown in FIG. 77 (in FIG. 77, the shaft sleeve 222 is not shown, to clearly show matching between the driven member 229 and the second part 221*b*, and the same is hereinafter), the driven member 229 performs a composite motion under a joint action of the elastic member 228 and the slope 221*k*. The driven member 229 rotates in the opening direction and moves toward the second part 221*b* until a root of the first slope 229*a* (namely, one end that is of the first slope 229*a* and that is connected to the plane 229*b*) is in contact with the top of the slope 221*k*, and the plane 229*b* is in contact with the plane 221*m* (influence of inertia on a position of the driven member 229 can be ignored based on a structure design). With reference to FIG. 73, when the driven member 229 moves, the shaft sleeve 222 and the first part 21 also rotate around the second part 221*b* in the opening direction.

As shown in FIG. 73 and FIG. 2, when the driven member 229, the shaft sleeve 222, and the first part 21 stop rotating, the first part 21 completes the first rotation stroke segment, and the first part 21 is opened by an angle a relative to the second part 23. The angle a may be, for example, approximately 15°. It is easily understood that, in the first rotation stroke segment, because the first part 21 is driven by the shaft sleeve 222 to rotate, the first part 21 rotates automatically without the external force applied by the user.

Figure 78:
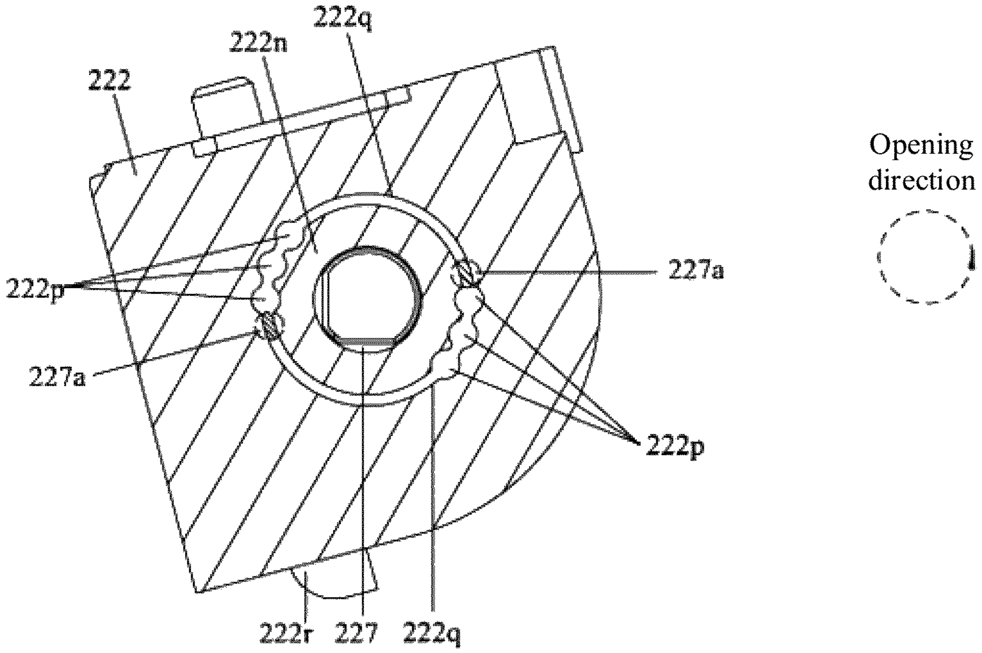
FIG. 78 is a schematic diagram of a structure showing a matching state of a shaft sleeve and a bump matching member in a rotating shaft assembly.

With reference to FIG. 76 and FIG. 78, in the first rotation stroke segment, because the shaft sleeve 222 rotates relative to the bump matching member 227, the bumps 227*a* of the bump matching member 227 slide in the chute 222*q* and gradually approach the matching grooves 222*p*. When the first rotation stroke segment ends, the bumps 227*a* each may just reach a joint between the chute 222*q* and the matching groove 222*p* (as shown in FIG. 78). In the first rotation stroke segment, the bumps 227*a* always slide smoothly in the chute 222*q*. In this case, no displacement (or jolt) occurs between the bump matching member 227 and the shaft sleeve 222 in a direction of a rotating shaft of the shaft sleeve 222, and the bump matching member 227 does not impact the shaft sleeve 222. Therefore, when the user touches the first part 21, the user cannot experience the touch feeling feedback.

Alternatively, in another embodiment, when the first rotation stroke segment ends, the bumps 227*a* may enter the matching grooves 222*p*. When the bumps 227*a* enter first matching grooves 222*p* from the chute 222*q*, a displacement in the rotating shaft direction of the shaft sleeve 222 is generated between the bump matching member 227 and the shaft sleeve 222, and the bump matching member 227 may impact the shaft sleeve 222. Therefore, if the user touches the first part 21, the user may experience the touch feeling feedback.

As shown in FIG. 77, when the first part 21 is opened by the angle a relative to the second part 23, the plane 229*b* is in contact with the plane 221*m*, and a combined force applied by the elastic member 228 and the first shaft 221 to the driven member 229 in an axial direction of the main portion 221*g* is zero. Therefore, only the elastic member 228 and the first shaft 221 cannot drive the driven member 229 to rotate, in other words, the first part 21 cannot continue to rotate automatically. At this time, the user can rotate the first part 21 in the opening direction. The first part 21 can drive the shaft sleeve 222 to rotate in the opening direction, and the shaft sleeve 222 can drive the driven member 229 to rotate in the opening direction. It is easily understood that, because the plane 229*b* is in sliding contact with the plane 221*m* during the rotation of the driven member 229, the driven member 229 only rotates but does not move in the axial direction of the main portion 221*g*.

Figure 79:
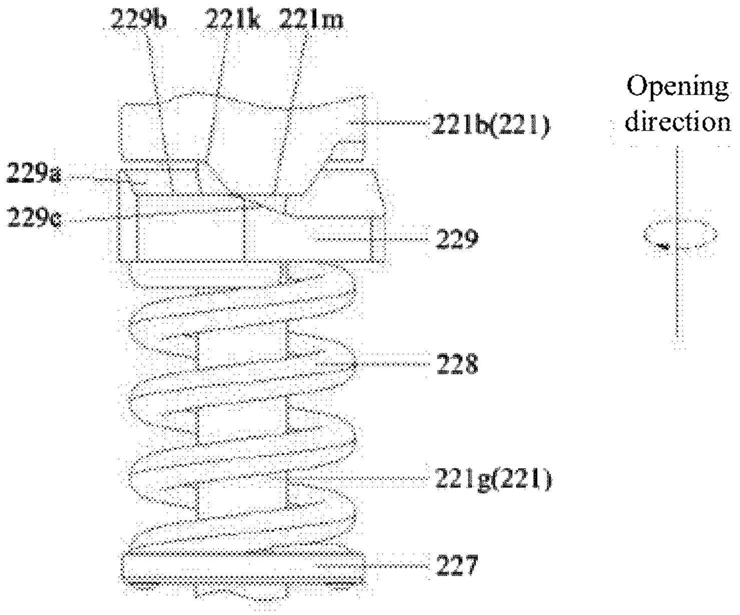
FIG. 79 is a schematic diagram of a matching structure including a first shaft, a driven member, and an elastic member in a rotating shaft assembly.

As shown in FIG. 79, when the end that is of the plane 229*b* and that is far away from the first slope 229*a* is in contact with the top of the slope 221*k* (or the top of the second slope 229*c* is in contact with the top of the slope 221*k*), the first part 21 may complete the second stroke segment. As shown in FIG. 3, when the second stroke segment is completed, the first part 21 is opened by an angle b relative to the second part 23. The angle b may be, for example, approximately 75°. As described above, in the second stroke segment, the first part 21 needs to be manually rotated by the user.

Figure 80:
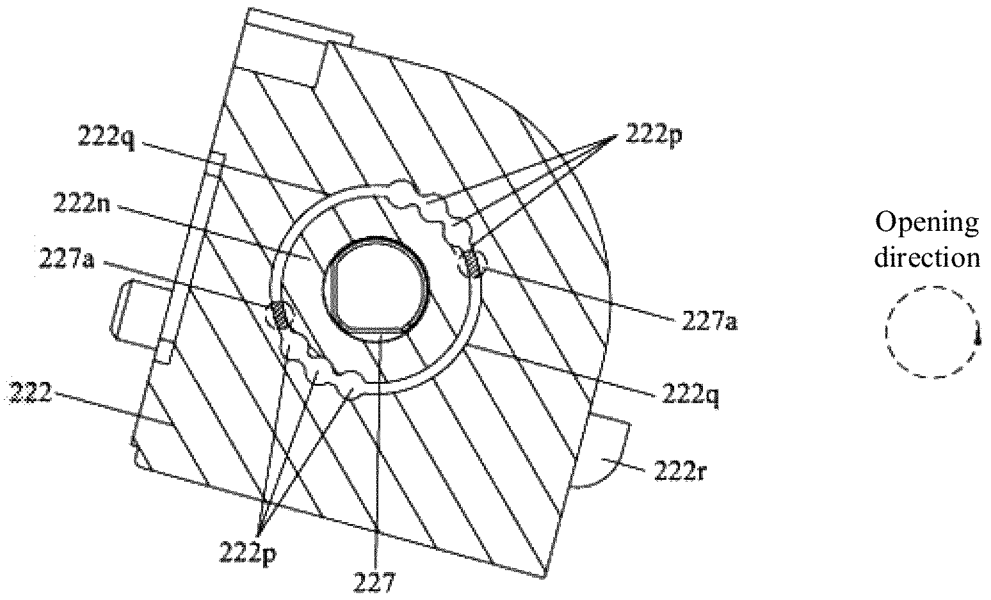
FIG. 80 is a schematic diagram of a structure showing a matching state of a shaft sleeve and a bump matching member in a rotating shaft assembly.

With reference to FIG. 78 and FIG. 80, in the second rotation stroke segment, the bumps 227*a* sequentially enter the respective matching grooves 222*p*. The bumps 227*a* can slide out of one matching groove 222*p* and into the chute 222*q* by the end of the second rotation stroke segment. In the second rotation stroke segment, when the bumps 227*a* enter and leave the matching grooves 222*p*, a displacement occurs between the bump matching members 227 and the shaft sleeve 222 in the direction of the rotating shaft of the shaft sleeve 222, and the bump matching members 227 impact the shaft sleeve 222. Therefore, the user can experience the touch feeling feedback.

As shown in 3, when the first part 21 is opened by the angle b relative to the second part 23, the first part 21 may start to enter the third stroke segment. A rotation feature of the first part 21 in the third stroke segment is similar to a rotation feature of the first part 21 in the first stroke segment, and the first part 21 also rotates automatically in the third stroke segment. Details are described below.

Figure 81:
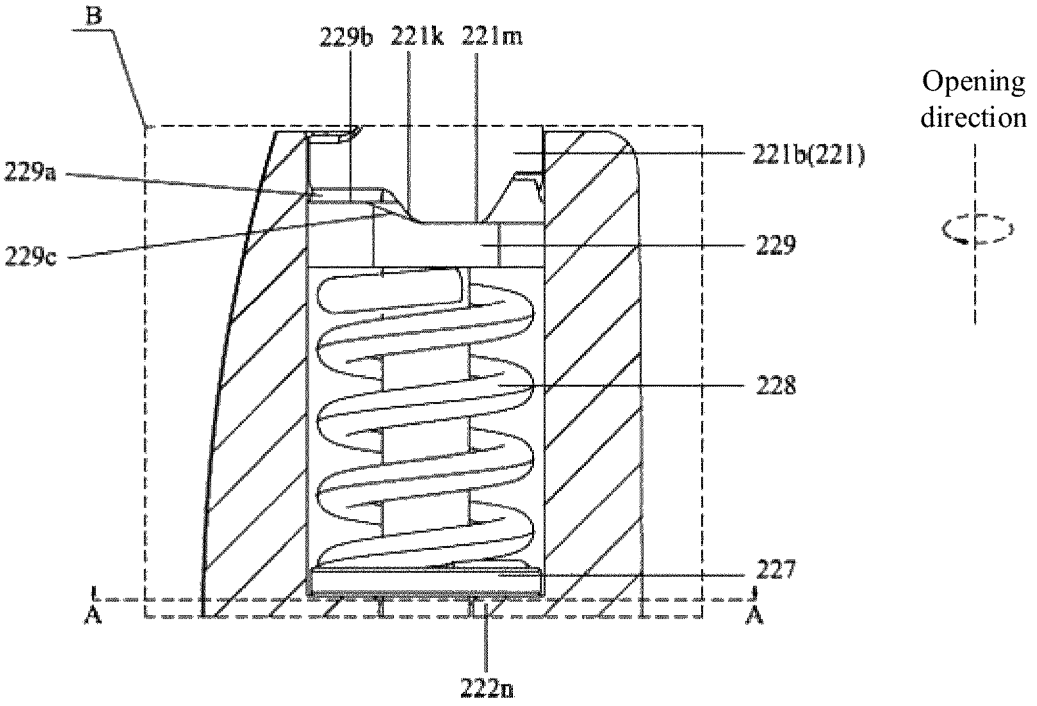
FIG. 81 is a schematic diagram of a matching structure including a first shaft, a driven member, and an elastic member in a rotating shaft assembly.

As shown in FIG. 79 and FIG. 81, when the third stroke segment begins, the top end of the second slope 229*c* is in contact with the top end of the slope 221*k*. The driven member 229 performs a composite motion under the joint action of the elastic member 228 and the slope 221*k*. The driven member 229 rotates in the opening direction and moves toward the second part 221*b* until a root of the second slope 229*c* (namely, one end that is of the second slope 229*c* and that is far away from the plane 229*b*) is in contact with the top of the slope 221*k*. When the driven member 229 moves, the shaft sleeve 222 and the first part 21 also rotate around the second part 221*b* in the opening direction.

Figure 83:
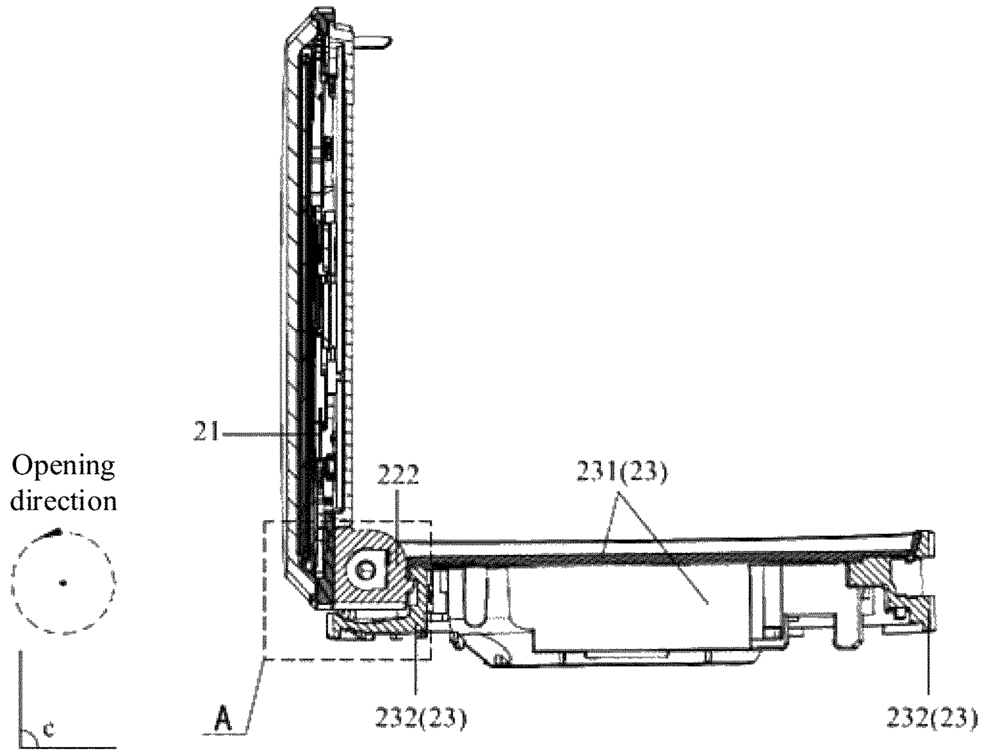
FIG. 83 is a schematic diagram of a structure in which a first part of a host is opened to a limit position relative to a second part.
Figure 84:
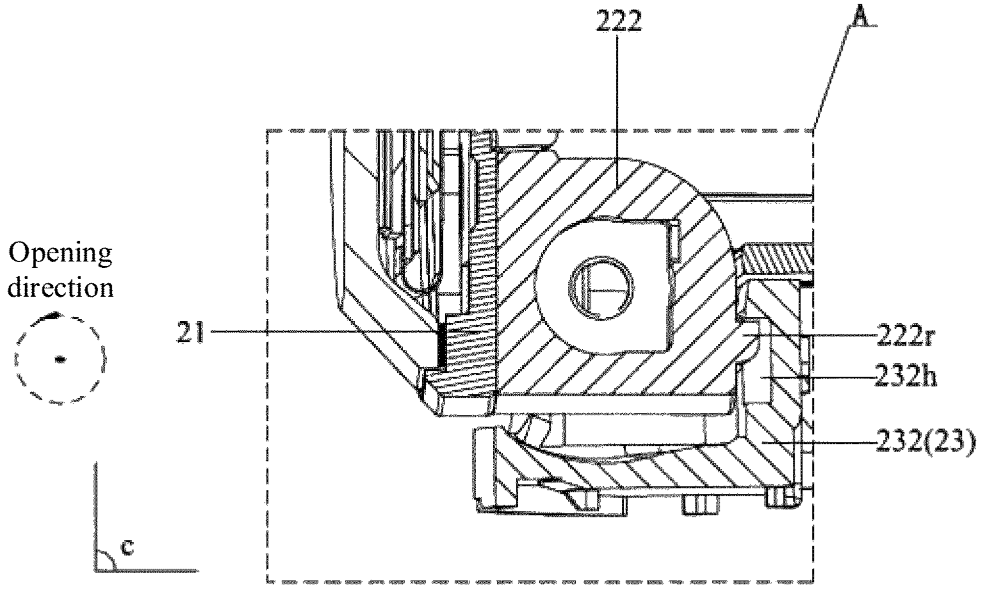
FIG. 84 is a schematic diagram of a partially enlarged structure at a position A in FIG. 83.

As shown in FIG. 83 and FIG. 84, the limiting protrusion 222*r* on the shaft sleeve 222 may enter the limiting groove 232*h* of the third host housing 232, and the limiting protrusion 222*r* abuts against an inner wall of the limiting groove 232*h*. In this case, because the shaft sleeve 222 cannot continue to rotate in the opening direction, the first part 21 also stops rotating.

When the driven member 229, the shaft sleeve 222, and the first part 21 stop rotating, the first part 21 completes the third rotation stroke segment. As shown in FIG. 5, the first part 21 is opened by an angle c relative to the second part 23. The angle c may be, for example, approximately 90°. It is easily understood that, in the third stroke segment, because the first part 21 is driven by the shaft sleeve 222 to rotate, the first part 21 rotates automatically without the external force applied by the user.

In this embodiment, through matching between the limiting groove 232*h* and the limiting protrusion 222*r*, the third host housing 232 can limit motion of the first part 21. Because the third host housing 232 has a larger size (compared with the rotating shaft assembly 22), and has good structural strength, assembly reliability of the limiting groove 232*h* and the limiting protrusion 222*r* is high, thereby helping ensure matching reliability of the host 2. It may be understood that, based on an actual requirement, in another embodiment, when the third stroke segment ends, the first part 21 may stop rotating through matching between the two-step ladder of the driven member and the two-step ladder of the first shaft 221. There is no need to design the limiting protrusion 222*r* on the shaft sleeve, and there is also no need to provide the limiting groove 232*h* on the third host housing 232.

Figure 82:
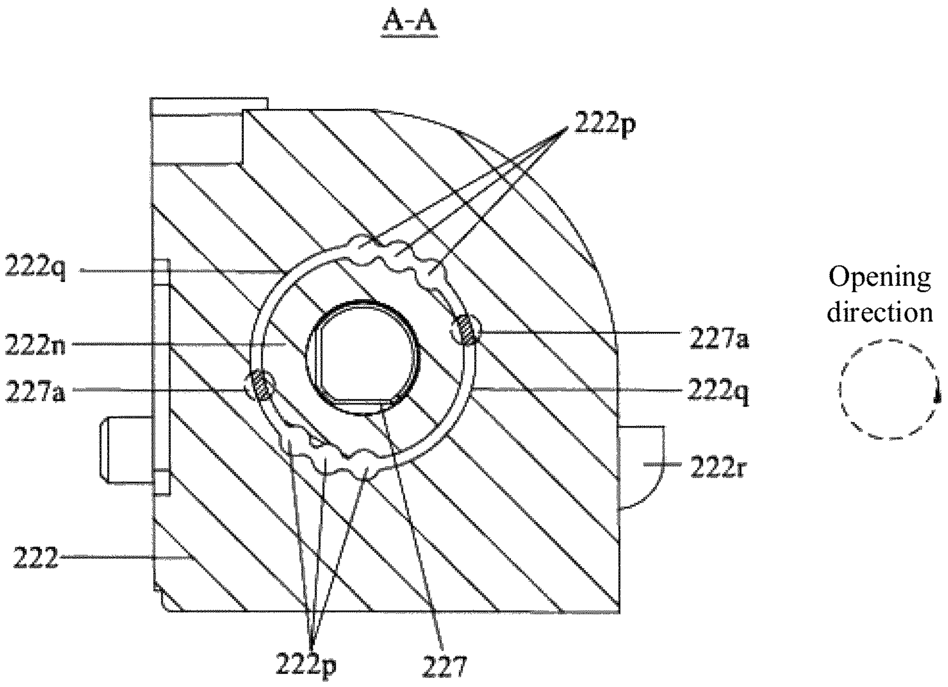
FIG. 82 is a schematic diagram of a structure showing a matching state of a shaft sleeve and a bump matching member in a rotating shaft assembly.

With reference to FIG. 80 and FIG. 82, in the third rotation stroke segment, the bumps 227*a* slide smoothly in the chute 222*q*. In this case, no displacement occurs between the bump matching member 227 and the shaft sleeve 222 in the direction of the rotating shaft of the shaft sleeve 222, and the bump matching member 227 does not impact the shaft sleeve 222. Therefore, when the user touches the first part 21, the user cannot experience the touch feeling feedback.

With reference to FIG. 73, FIG. 67, and FIG. 62, in an opening process of the first part 21, the electrical connection end 261 of the flexible circuit board 26 rotates with the first part 21, the wound part of the flexible circuit board 26 may gradually relax, and a diameter of the wound part may gradually increase.

It is easily understood from the foregoing descriptions of the opening process of the host 2 that the entire process of closing the opened first part 21 requires manual rotation of the first part 21 in a direction opposite to the opening direction until the first part 21 is locked with the open button. In a stroke in which the opening angle of the first part 21 decreases from the angle b to the angle a, because the bumps 227*a* sequentially slide into and out of the matching grooves 222*p*, the bump matching member 227 impacts the shaft sleeve 222, and therefore there is a touch feeling feedback. In another stroke, because the bumps 227*a* slide smoothly in the chute 222*q*, the bump matching member 227 does not impact the shaft sleeve 222, and therefore there is no touch feeling feedback. In addition, in the closing process of the first part 21, the electrical connection end 261 of the flexible circuit board 26 rotates with the first part 21, the wound part of the flexible circuit board 26 may be gradually tightened, and the diameter of the wound part may gradually decrease.

As can be easily understood from the foregoing descriptions, an assembly structure including the first shaft 221, the driven member 229, the elastic member 228, and the shaft sleeve 222 in the rotating shaft assembly 22 is used to construct the cam mechanism and implement opening and closing of the host 2. The second shaft 223 of the rotating shaft assembly 22 is used to mount and wrap the flexible circuit board 26. In this embodiment, the first shaft 221 and the second shaft 223 are separately designed, so that the flexible circuit board 26 is easily assembled to the second shaft 223 and the shaft sleeve 222.

Due to a manufacturing error, the first shaft 221 and the second shaft 223 may not be concentric after being assembled (an axis of the first shaft 221 does not coincide with an axis of the second shaft 223). If no corresponding measure is taken, stress is generated when the rotating shaft assembly 22 performs a mechanism motion, which may reduce reliability of the rotating shaft assembly 22 and further cause an abnormal voice. In this embodiment, the end portion 221*d* of the first shaft 221 matches the groove 223*e* of the second shaft 223, so that an assembly tolerance can be absorbed, and stress caused by eccentricity can be reduced or avoided.

Different from this embodiment, in another embodiment, the first shaft and the second shaft may not be connected, and the end portion of the second shaft may not be provided with a groove for accommodating the end portion of the first shaft. Alternatively, in another embodiment, there may be no design in which a flexible circuit board is wound around a shaft, and an integrated single shaft may be used to replace the first shaft 221 and the second shaft 223. At this time, the limiting member 226 may not be provided.

It is easily understood from the foregoing descriptions that the assembly structure including the elastic member 228, the bump matching member 227, and the shaft sleeve 222 in the rotating shaft assembly 22 is used to implement the touch feeling feedback during opening and closing of the host 2. In another embodiment, the touch feeling feedback design may be canceled. To be specific, the bump matching member 227, and the chute 222*q* and the matching grooves 222*p* on the spacer plate 222*n* of the shaft sleeve 222 may not be provided. In this case, the elastic member may directly abut against the spacer plate 222*n*.

In this embodiment, when the shaft sleeve 222 rotates, the shaft contact member 224 mounted on the shaft sleeve 222 rotates along with the shaft sleeve 222. In addition, the shaft contact member 224 is kept in contact with the first shaft 221 and the second shaft 223. In other words, the shaft contact member 224 is in sliding contact with the first shaft 221 and the second shaft 223.

Two Feeding Paths of an Antenna System of the Host 2

In this embodiment, both the first frame body 213*a* and the third host housing 232 of the host 2 may be used as antennas in the antenna system of the host 2. The following describes the two feeding paths of the antenna system of the host 2.

As shown in FIG. 70, the first frame body 213*a* may be in contact with the feeding spring 212*f* of the first host circuit board assembly 212, so that a radio frequency signal can be fed into the first frame body 213*a* by using the feeding spring 212*f*. In addition, the first frame body 213*a* may be in contact with the grounding spring 212*b*, the grounding spring 212*c*, the grounding spring 212*d*, and the grounding spring 212*e* of the first host circuit board assembly 212, so that the first frame body 213*a* can be grounded. Therefore, the first frame body 213*a* can serve as an antenna.

As described above, the first frame body 213*a* is connected to the shaft sleeve 222, the shaft contact member 224 on the shaft sleeve 222 is in contact with both the first shaft 221 and the second shaft 223, and both the first shaft 221 and the second shaft 223 are connected to the third host housing 232. Therefore, the radio frequency signal can be transmitted from the first frame body 213*a* to the third host housing 232 through the shaft sleeve 222, the shaft contact member 224, the first shaft 221, and the second shaft 223. Therefore, the third host housing 232 can also serve as an antenna.

It can be learned that, the first host circuit board assembly 212 is connected to the first frame body 213*a* and the third host housing 232 through a physical mechanical structure, to form a first feeding path of the antenna system.

When the host 2 is in the closed state, there is a small gap between the first frame body 213*a* and the third host housing 232 in an axial direction of the first frame body 213*a* (or a thickness direction of the host 2). The gap is, for example, 0.1 mm. Due to existence of the gap, the first frame body 213*a* may feed power to the third host housing 232 through coupling, so that the third host housing 232 can serve as an antenna.

It can be learned that, the first host circuit board assembly 212 is connected to the first frame body 213*a* through a physical mechanical structure, and then is electrically coupled to the third host housing 232, to form a second feeding path of the antenna system.

When the host 2 is in the closed state, the third host housing 232 in the second feeding path has high radiation. In this case, antenna performance is ensured by the host 2 together with the first frame body 213*a* and the third host housing 232. When the host 2 is in the open state, the third host housing 232 in the second feeding path has low radiation. In this case, antenna performance is ensured mainly through radiation of the first frame body 213*a*. However, compared with the closed state of the host 2, when the host 2 is in the open state, a radiation direction of the antenna system changes, which can meet a communication requirement of the host 2 in the open state. Therefore, in this embodiment, the two feeding paths of the antenna system are designed, so that different communication requirements of the host 2 in the open state and the closed state can be met, and antenna performance of the host 2 in the different states can be ensured.

It is easily understood that, in another embodiment, there may be no second feeding path. In other words, the first frame body 213*a* does not feed the third host housing 232 through coupling.

In this embodiment, the flexible circuit board 26 may cause interference to radiation performance of the first frame body 213*a* and the third host housing 232. In particular, the interference is more severe when a length of the flexible circuit board 26 is larger. As described above, the grounding portion 264*a* of the flexible circuit board 26 may be connected to the first frame body 213*a* by using a conductor. In this way, the flexible circuit board 26 can be grounded, to avoid interference of the flexible circuit board 26 to antenna radiation performance of the host 2. In another embodiment, the foregoing grounding design may not be performed on the flexible circuit board 26 based on a product requirement.

Earphones 3

In this embodiment, structures of the first earphone 31 and the second earphone 32 may be completely consistent. The following uses the first earphone 31 as an example for description.

Figure 85:
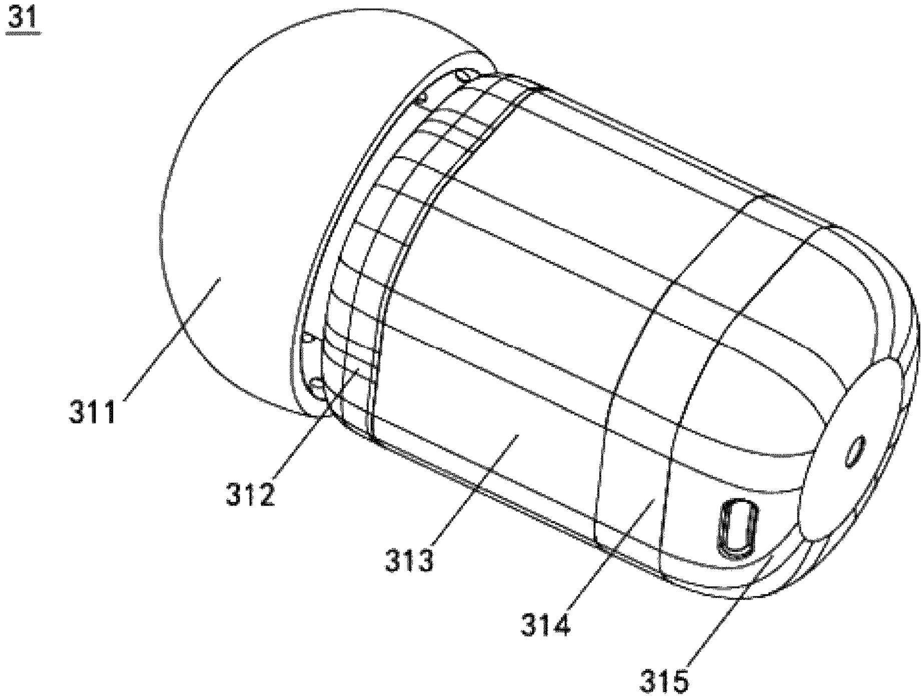
FIG. 85 is a schematic diagram of an assembly structure of a first earphone of the wearable device in FIG. 6.
Figure 86:
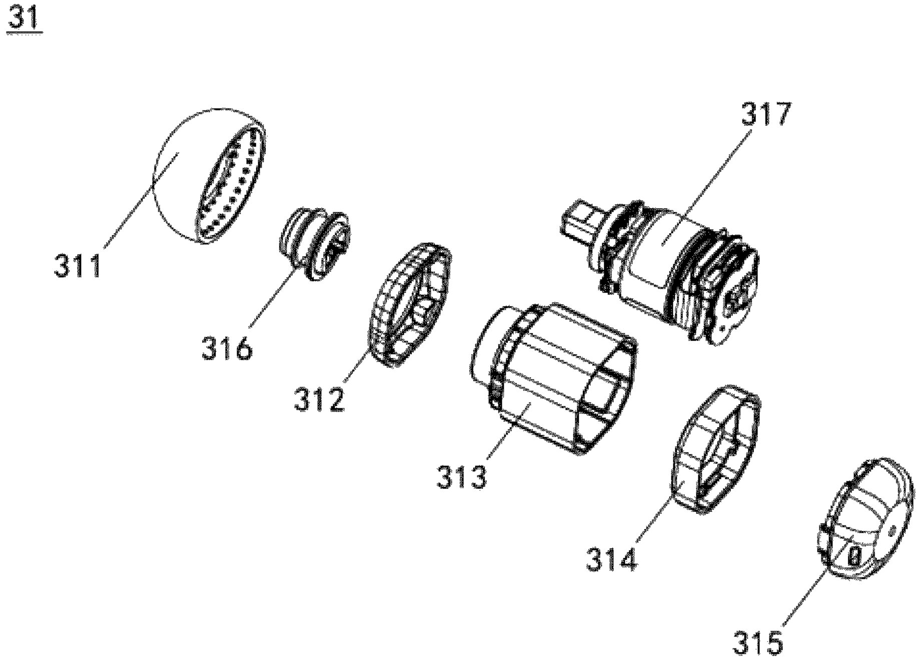
FIG. 86 is a schematic exploded view of a structure of the first earphone in FIG. 85.

As shown in FIG. 85 and FIG. 86, the first earphone 31 may include an earplug 311, an earplug support assembly 316, a first electrode 312, an earphone front-housing assembly 313, a second electrode 314, an earphone rear-housing assembly 315, and an electronic assembly 317. Both the earplug support assembly 316 and the first electrode 312 may be mounted on one end of the earphone front-housing assembly 313, and both the second electrode 314 and the earphone rear-housing assembly 315 may be mounted on the other end of the earphone front-housing assembly 313. The earplug 311 and the earplug support assembly 316 are located at a same end of the earphone front-housing assembly 313, and the earplug 311 is mounted at an end that is of the earplug support assembly 316 and that is far away from the earphone front-housing assembly 313. The electronic assembly 317 may be mounted in a space enclosed by the earplug support assembly 316, the first electrode 312, the earphone front-housing assembly 313, the second electrode 314, and the earphone rear-housing assembly 315.

The following describes structures and assembly of the earplug 311, the earplug support assembly 316, the first electrode 312, the earphone front-housing assembly 313, the second electrode 314, and the earphone rear-housing assembly 315 in the first earphone 31, and then describes a structure and assembly of the electronic assembly 317.

As shown in FIG. 85, in this embodiment, the first electrode 312, the earphone front-housing assembly 313, the second electrode 314, and the earphone rear-housing assembly 315 may roughly form an octahedron, and an outer circumferential surface of the octahedron may include a plane and a curved surface. The plane and the curved surface are connected and alternately arranged to form a circle (in other words, each plane is connected between two curved surfaces, and each curved surface is connected between two planes). The octahedron appearance of the first earphone 31 is in a centrosymmetric shape. In another embodiment, the first earphone may alternatively have another centrosymmetric appearance shape. For example, the first earphone is roughly cylindrical or tetrahedron.

In this embodiment, a radial size of the first earphone 31 may be greater than the groove depth of the first accommodation groove 213*y*. For example, the radial size of the first earphone 31 may be at least twice the groove depth of the first accommodation groove 213*y*. The radial size may be a distance between two planes that are on the first earphone 31 and that are directly opposite to each other.

Earphone Front-Housing Assembly 313

Figure 87:
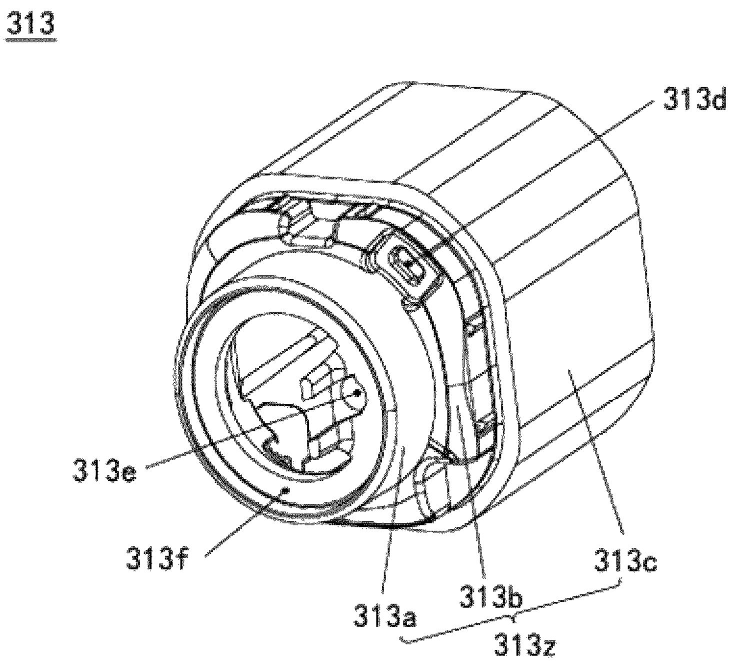
FIG. 87 is a schematic diagram of an assembly structure of an earphone front-housing assembly in a first earphone.
Figure 88:
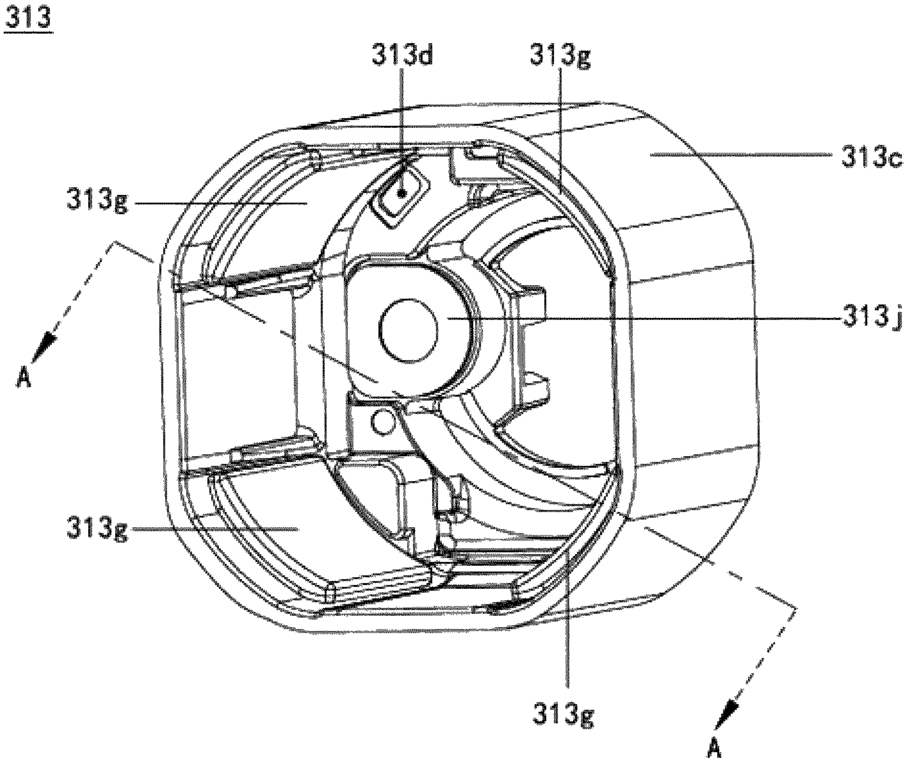
FIG. 88 is a schematic diagram of an assembly structure of an earphone front-housing assembly in a first earphone.
Figure 89:
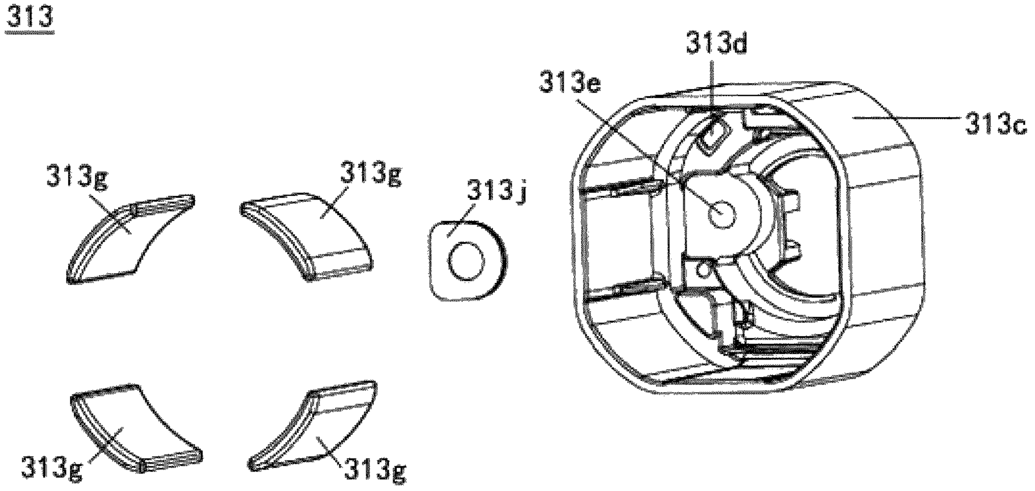
FIG. 89 is a schematic exploded view of a structure of an earphone front-housing assembly in a first earphone.

As shown in FIG. 87, FIG. 88, and FIG. 89, the earphone front-housing assembly 313 may include an earphone front housing 313*z*, a noise reduction microphone mesh 313*j*, and an earphone magnet 313*g*.

As shown in FIG. 87 and FIG. 88, the earphone front housing 313*z* may be a hollow cylindrical structure with two ends open. The earphone front housing 313*z* may include a first part 313*a*, a second part 313*b*, and a third part 313*c* that are sequentially connected. A circumferential length of the first part 313*a* may be less than that of the second part 313*b*, and the circumferential length of the second part 313*b* may be less than that of the third part 313*c*. The circumferential length is a size in a direction of a center line of the cylindrical structure that surrounds the earphone front housing 313*z*. The third part 313*c* may be roughly an octahedral cylindrical structure, and a wall of the third part 313*c* may include a flat part and an arc part. The flat part and the arc part are connected and alternately arranged to form a circle (in other words, each flat part is connected between two arc parts, and each arc part is connected between two flat parts).

Figure 90:
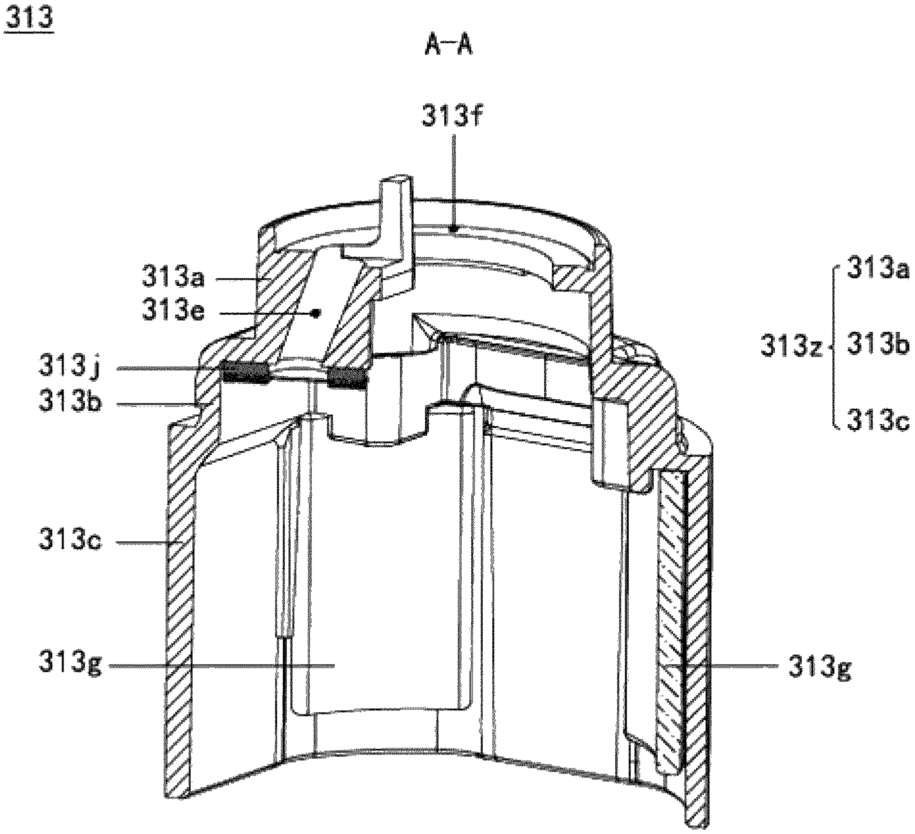
FIG. 90 is a schematic diagram of an A-A sectional structure of the earphone front-housing assembly in FIG. 88.

As shown in FIG. 87 and FIG. 90, an end that is of the first part 313*a* and that is far away from the second part 313*b* may form a mounting groove 313*f*, and the mounting groove 313*f* may enclose a circle. A voice pickup channel 313*e* may be further provided on a wall of the earphone front housing 313*z*, and the voice pickup channel 313*e* may extend roughly along a straight line. One end of the voice pickup channel 313*e* penetrates a bottom surface of the mounting slot 313*f*, and the other end of the voice pickup channel 313*e* communicates with an inner cavity of the earphone front housing 313*z*. A through hole 313*d* may be provided on the second part 313*b*, and the through hole 313*d* communicates with the inner cavity of the earphone front housing 313*z*.

Noise Reduction Microphone Mesh 313*j*

The noise reduction microphone mesh 313*j* may be roughly in a sheet shape, and may include several layers of materials, such as an acoustic mesh and an adhesive layer. As shown in FIG. 89 and FIG. 90, the noise reduction microphone mesh 313*j* may be fastened in the earphone front housing 313*z*, and an end that is of the voice pickup channel 313*e* and that is far away from the mounting groove 313*f* is sealed, so that a voice in the voice pickup channel 313*e* may pass through the noise reduction microphone mesh 313*j*.

Earphone Magnet 313*g*

As shown in FIG. 89, the earphone magnet 313*g* in this embodiment may be a single magnet. The earphone magnet 313*g* may have a single magnetic field direction. Alternatively, the earphone magnet 313*g* may have at least two magnetic field directions, and the earphone magnet 313*g* may form a Halbach array (which can be prepared by magnetizing different regions of a physical single magnet in different directions). For example, the earphone magnet 313*g* is a Halbach array having two different magnetic field directions.

In another embodiment, the earphone magnet may be formed by splicing at least two single magnets. The earphone magnet may have at least two magnetic field directions, and the earphone magnet forms a Halbach array.

As shown in FIG. 89, the earphone magnet 313*g* in this embodiment may be roughly a curved plate-like structure, and the curved plate-like structure may be bent in a direction around a center line of the first earphone 31. The earphone magnet 313*g* may match an inner wall of the third part 313*c* of the earphone front housing 313*z* in shape. The earphone magnet 313*g* may be fastened to the inner wall of the third part 313*c* of the earphone front housing 313*z*, for example, fastened to an inner wall of an arc part of the third part 313*c*.

As shown in FIG. 89, there may be four earphone magnets 313*g* in this embodiment, the four earphone magnets 313*g* may be evenly distributed on the inner wall of the third part 313*c* at an equal spacing, and an inner wall of each arc part of the third part 313*c* is provided with one earphone magnet 313*g*. Specifications of the four earphone magnets 313*g* may be the same, and magnetic field directions of the four earphone magnets 313*g* may be consistent.

In another embodiment, a quantity of earphone magnets may be designed based on a product requirement. For example, there may be only one earphone magnet, the earphone magnet may enclose a closed ring structure, and the earphone magnet may match the inner wall of the third part 313*c* in shape. The earphone magnet may form a Halbach array, and four regions in a one-to-one correspondence between the earphone magnet and the four arc parts of the third part 313*c* may have different magnetic field directions.

Alternatively, for example, there may be three earphone magnets, each earphone magnet may be a curved structure that surrounds a center line of the first earphone, and the three earphone magnets may be distributed at a spacing on an inner wall of the third part of the earphone front housing. The three earphone magnets may be evenly distributed at an equal spacing or unevenly distributed at a non-equal spacing. In this design, the third part of the earphone front housing may be roughly an octahedron cylindrical structure or a cylindrical structure.

Assembly Jig 100 and Assembly Technique of the Earphone Magnet 313*g*

Figure 91:
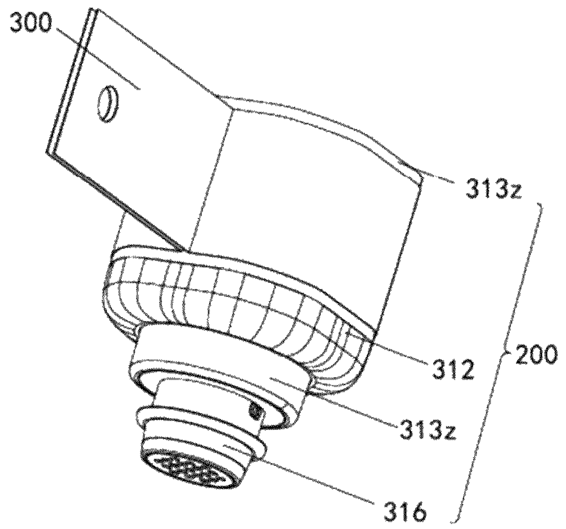
FIG. 91 is a schematic diagram of a structure in which a clamp clamps an intermediate assembly.

In this embodiment, to ensure accurate mounting of a magnet, an assembly jig may be used to assist in mounting the earphone magnet 313*g*. Based on a product assembly requirement, the earphone magnet 313*g* and the earphone front housing 313*z* may be directly assembled, and an assembly jig may be customized accordingly. Alternatively, as shown in FIG. 91, the earplug support assembly 316, the first electrode 312, and the like may be first mounted to the earphone front housing 313*z* to form an intermediate assembly 200, and then the earphone magnet 313*g* is mounted in the earphone front housing 313*z* of the intermediate assembly 200. An assembly jig can be customized accordingly. The following uses the latter assembly manner as an example for description.

Figure 92:
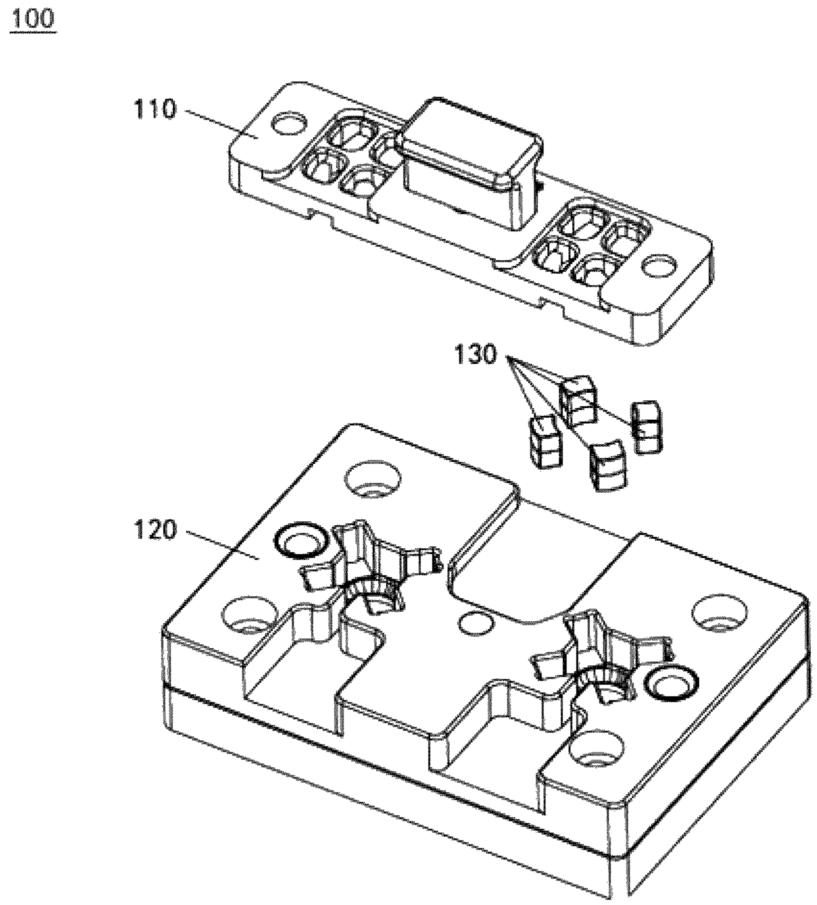
FIG. 92 is a schematic exploded view of a structure of an assembly jig according to an embodiment of this application.

As shown in FIG. 91 and FIG. 92, this embodiment provides the assembly jig 100 to assemble the intermediate assembly 200. The intermediate assembly 200 may include the earplug support assembly 316, the first electrode 312, and the earphone front housing 313*z* that are assembled in advance (an assembly structure including the earplug support assembly 316, the first electrode 312, and the earphone front housing 313*z* is described in detail below). For ease of taking, placing, and positioning the intermediate assembly 200, a clamp 300 may be sleeved on a periphery of the earphone front housing 313*z* in the intermediate assembly 200. The clamp 300 may be collar-like, and the clamp 300 wraps and clamps the earphone front housing 313*z*. The clamp 300 may also be used in another assemble process for the first earphone 31.

As shown in FIG. 92, the assembly jig 100 in this embodiment may include a base 120, a jig magnet 130, and an upper cover 110.

Figure 93:
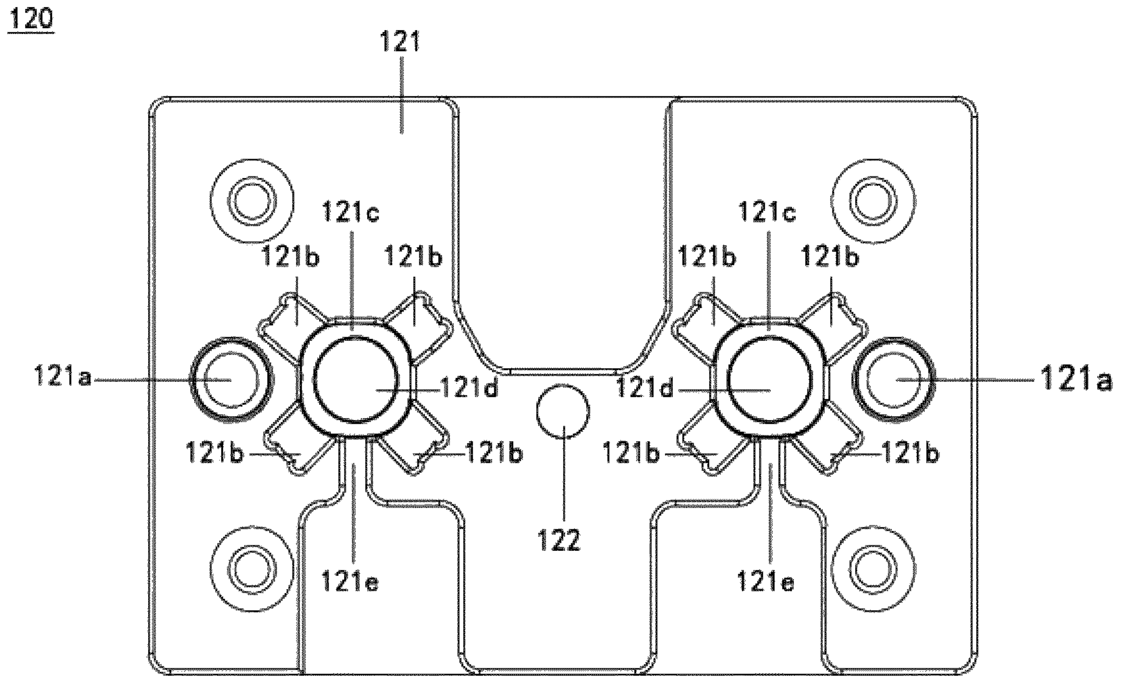
FIG. 93 is a schematic diagram of a structure of a base of an assembly jig.
Figure 94:
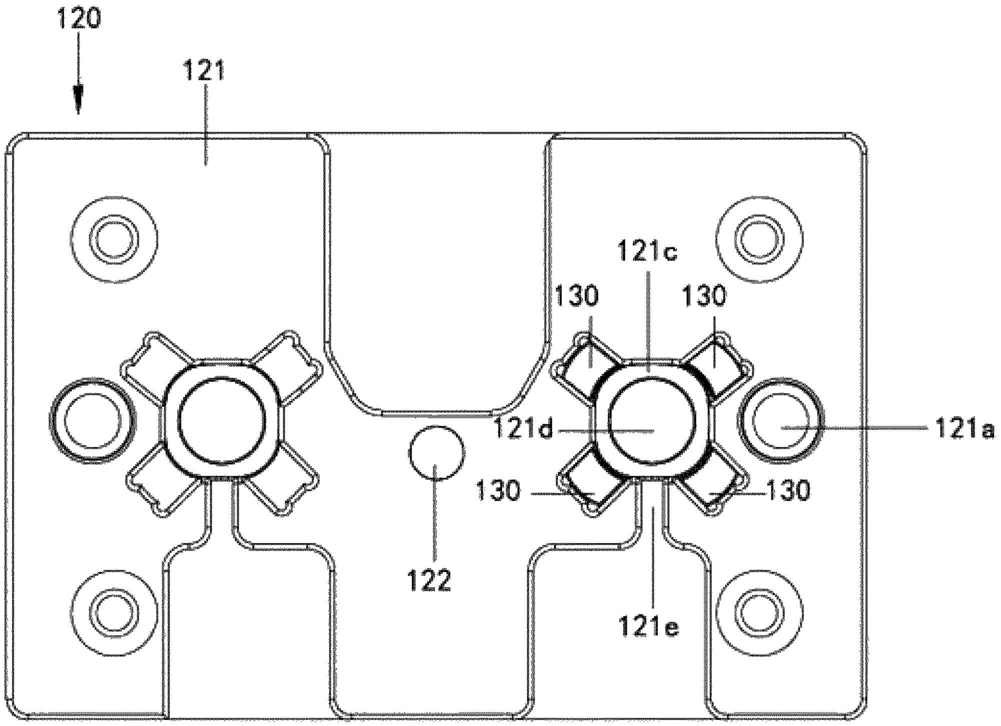
FIG. 94 is a schematic diagram of a structure of a base of an assembly jig.

As shown in FIG. 93 and FIG. 94, the base 120 may include a bottom plate 121 and a base magnet 122 fastened to the bottom plate 121. An upper cover positioning hole 121*a* may be provided on the bottom plate 121. For example, there are two upper cover positioning holes 121*a*, and the two upper cover positioning holes 121*a* are respectively located at two ends of the bottom plate 121. A workpiece positioning groove 121*c*, a jig magnet mounting groove 121*b*, and a clamp accommodation groove 121*e* may also be provided in a region (for example, a right end region from the perspective of FIG. 93) of the bottom plate 121.

As shown in FIG. 93, an inner surface of a bottom of the workpiece positioning groove 121*c* may be profiled as an outer surface of the first electrode 312. A bottom wall of the workpiece positioning groove 121*c* may be provided with a through hole 121*d*, and the through hole 121*d* is used for the earphone front housing 313*z* and the earplug support assembly 316 to pass through.

As shown in FIG. 93, the jig magnet mounting grooves 121*b* may be located on an outer side of the workpiece positioning groove 121*c*, and may be connected to the workpiece positioning groove 121*c*. It may be considered that the jig magnet mounting grooves 121*b* penetrate the side wall of the workpiece positioning groove 121*c*. A quantity of jig magnet mounting grooves 121*b* may be the same as a quantity of jig magnets 130. For example, there are four jig magnet mounting grooves 121*b*. The four jig magnet mounting grooves 121*b* may be distributed around the workpiece positioning grooves 121*c* at an equal spacing.

With reference to FIG. 92 and FIG. 94, one jig magnet 130 may be mounted in each jig magnet mounting groove 121*b*. One jig magnet 130 may include only single magnet, or may be formed by connecting at least two single magnets.

As shown in FIG. 93, the clamp accommodation groove 121*e* may be located on a periphery of the workpiece positioning groove 121*c* and may communicate with the workpiece positioning groove 121*c*. The clamp accommodation groove 121*e* may be positioned between two jig magnet mounting grooves 121*b*.

As shown in FIG. 93, a same workpiece positioning groove 121*c*, a same through hole 121*d*, a same jig magnet mounting groove 121*b*, and a same clamp accommodation groove 121*e* may also be provided in another region (for example, a left end region from the perspective of FIG. 93) of the bottom plate 121. This design allows the assembly jig 100 to assemble two intermediate assemblies 200. The positioning grooves 121*c*, the through holes 121*d*, the jig magnet mounting grooves 121*b*, and the clamp accommodation grooves 121*e* in the two regions of the bottom plate 121 may be located between the two upper cover positioning holes 121*a*.

Figure 95:
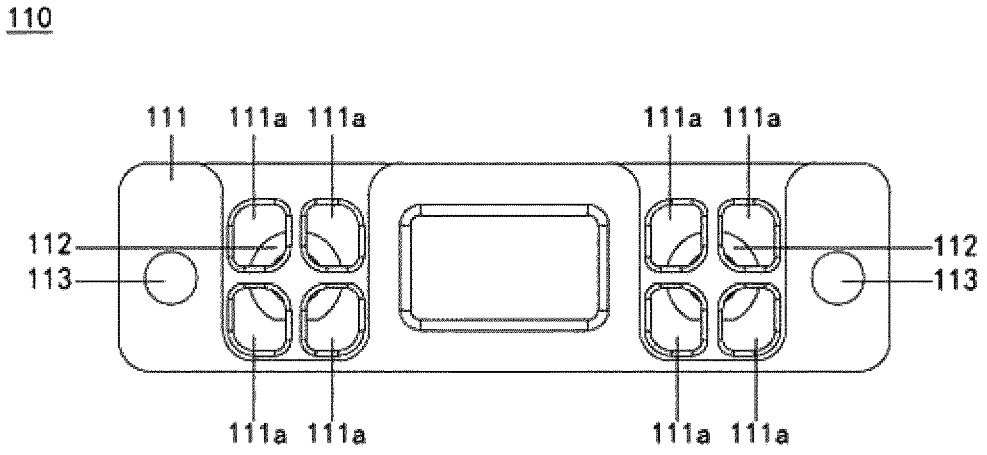
FIG. 95 is a schematic diagram of a structure of an upper cover of an assembly jig.
Figure 96:
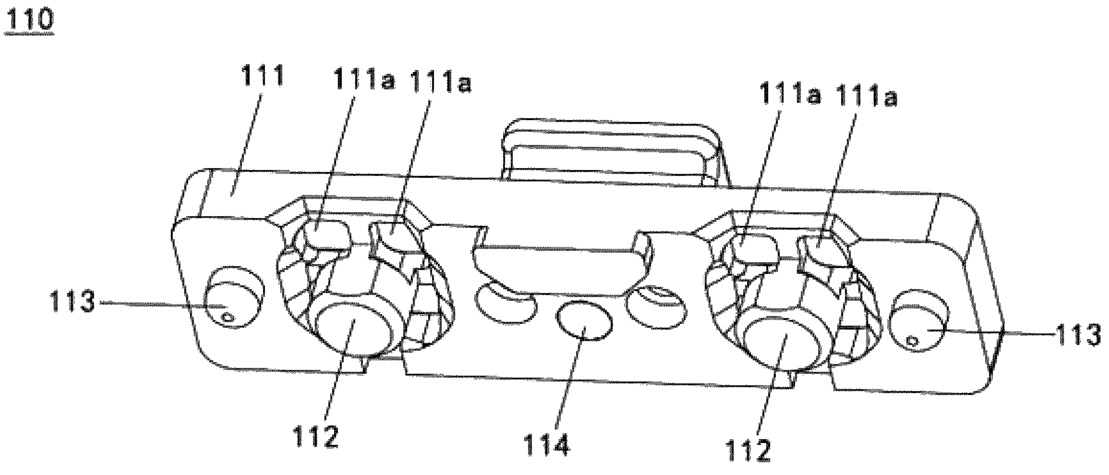
FIG. 96 is a schematic diagram of a structure of an upper cover of an assembly jig.

As shown in FIG. 95 and FIG. 96, the upper cover 110 may include a cover plate 111, an upper cover positioning post 113, an upper cover limiting post 112, and an upper cover magnet 114.

There may be two upper cover positioning posts 113, and the two upper cover positioning posts 113 are respectively located at two ends of the cover plate 111. A magnet placement through hole 111*a* may be provided in a region (for example, a right region from the perspective of FIG. 95) of the cover plate 111. A quantity of magnet placement through holes 111*a* may be consistent with a quantity of earphone magnets 313*g*. For example, there are also four magnet placement through holes 111*a*. The four magnet placement through holes 111*a* may roughly form a 2*2 matrix.

The upper cover limiting post 112 is disposed on one side in a thickness direction of the cover plate 111, and a center of the upper cover limiting post 112 may be roughly located between the four magnet placement through holes 111*a*. In addition, for each magnet placement through hole 111*a* and the upper cover limiting post 112, a part of a projection of the upper cover limiting post 112 in an axial direction of the magnet placement through hole 111*a* falls within a projection of the magnet placement through hole 111*a* in the axial direction of the magnet placement through hole 111*a*. In other words, from the perspective of FIG. 95, there is a part of the upper cover limiting post 112 in each magnet placement through hole 111*a*, and this part may be referred to as a limiting member. It is easily understood that a quantity of the members is the same as a quantity of the earphone magnets 313*g*. The upper cover limiting post 112 may match the inner cavity of the earphone front housing 313*z* in shape.

The upper cover magnet 114 may be fastened to the cover plate 111. The upper cover magnet 114 and the upper cover limiting post 112 may be located on a same side of the cover plate 111.

As shown in FIG. 95 and FIG. 96, a same magnet placement through hole 111*a* and a same upper cover limiting post 112 may also be designed for another region (for example, a left region from the perspective of FIG. 95) of the cover plate 111. This design allows the assembly jig 100 to assemble two intermediate assemblies 200. The magnet placement through holes 111*a* and the upper cover limiting posts 112 in the two regions of the cover plate 111 may be located between the two upper cover positioning posts 113.

With reference to FIG. 97 to FIG. 101, the following describes a process example of fitting the four earphone magnets 313*g* into the intermediate assembly 200 by using the assembly jig 100.

Figure 97:
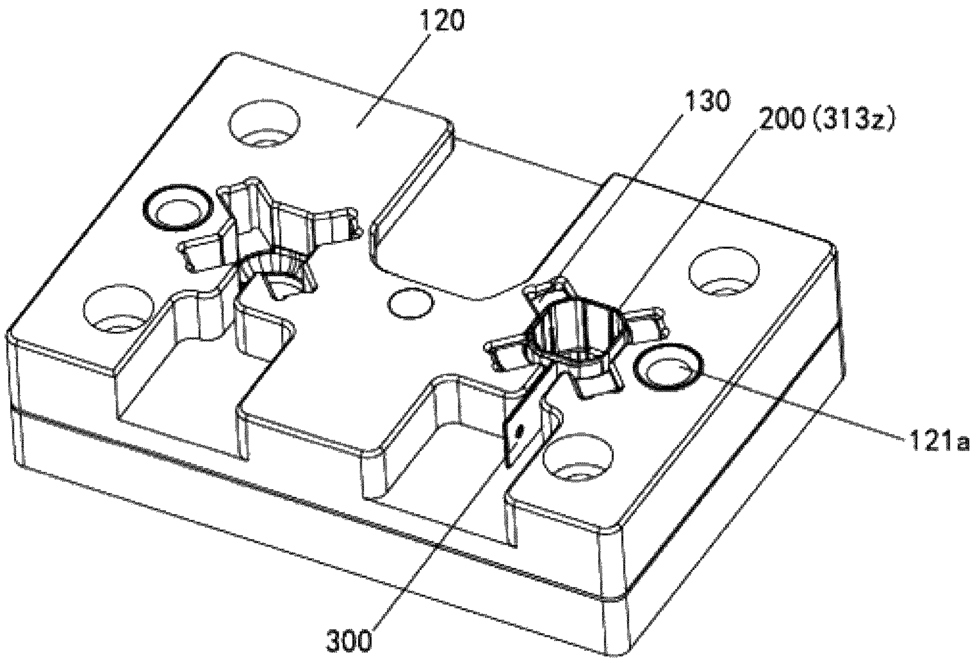
FIG. 97 is a schematic diagram of a structure in which a clamp and an intermediate assembly are placed into a base.

With reference to FIG. 91 and FIG. 97, the clamp 300 and the intermediate assembly 200 are first positioned on the base 120, so that an annular part of the clamp 300 is placed in the workpiece positioning groove 121*c*, another part of the clamp 300 is placed in the clamp accommodation groove 121*e*, the earplug support assembly 316 and the earphone front housing 313*z* enter the through hole 121*d*, the first electrode 312 enters the workpiece positioning groove 121*c*, and the outer surface of the first electrode 312 matches an inner surface of the workpiece positioning groove 121*c*. In this case, each jig magnet 130 may correspond to a mounting position for mounting the earphone magnet 313*g* in the earphone front housing 313*z*.

Figure 98:
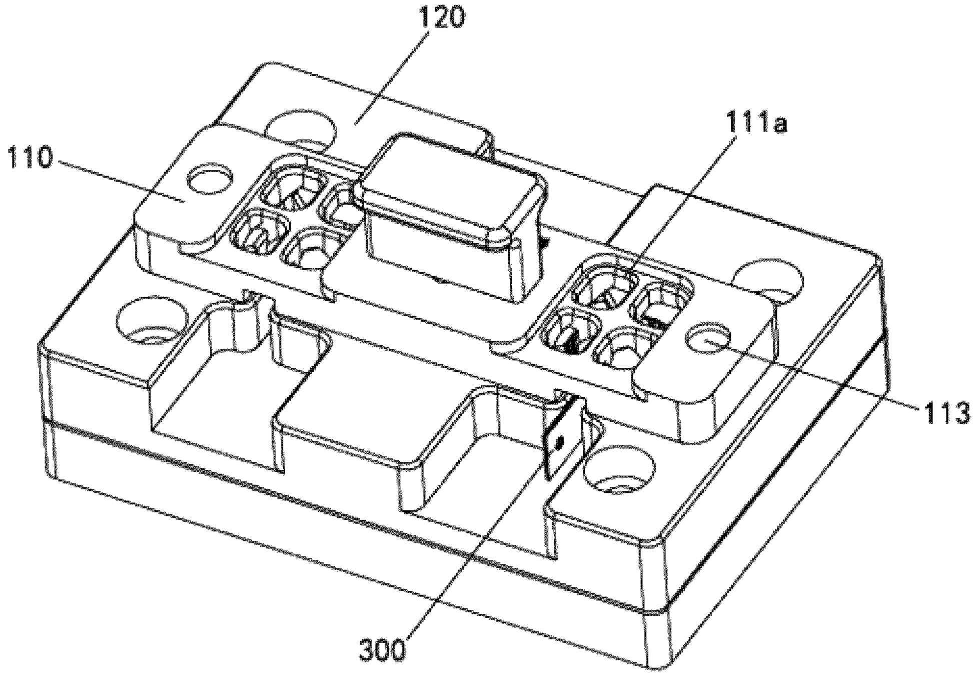
FIG. 98 is a schematic diagram of a structure in which an upper cover matches a base.
Figure 99:
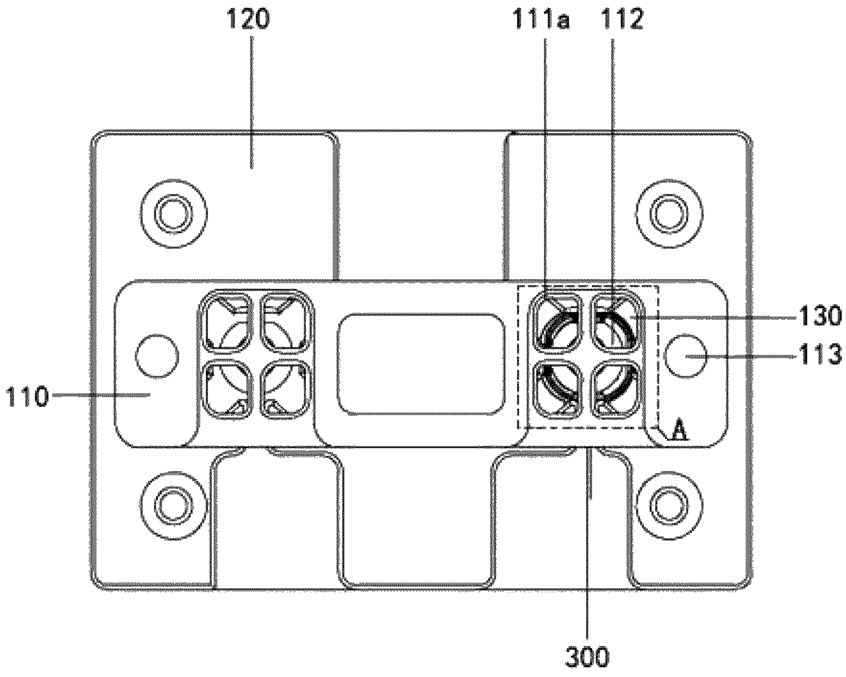
FIG. 99 is a schematic diagram of a structure in which an upper cover matches a base.
Figure 100:
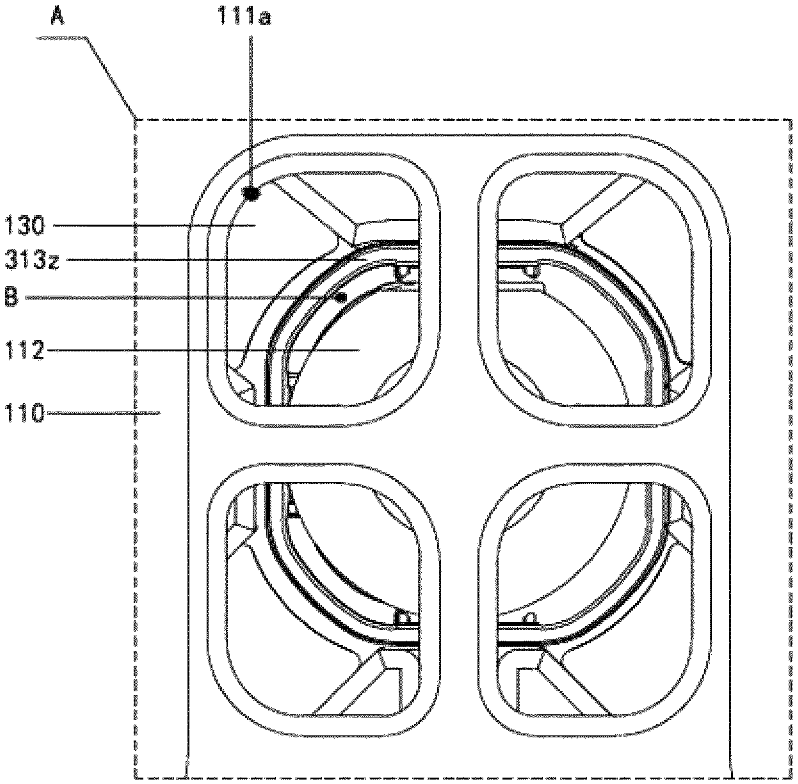
FIG. 100 is a schematic diagram of a partially enlarged structure at a position A in FIG. 99.

With reference to FIG. 98, FIG. 96, and FIG. 97, the upper cover 110 is mounted on the base 120, so that the cover plate 111 is in contact with the base 120, the upper cover positioning post 113 is inserted into the upper cover positioning hole 121*a*, and the upper cover magnet 114 is magnetically attached to the base magnet 122. With reference to FIG. 96 and FIG. 91, in this case, the upper cover limiting post 112 in the upper cover 110 is inserted into the inner cavity of the earphone front housing 313*z*. With reference to FIG. 99, FIG. 100, and FIG. 94, each magnet placement through hole 111*a* has a part of the workpiece positioning groove 121*c*. In other words, projections of different regions of the workpiece positioning groove 121*c* in the axial direction of the magnet placement through hole 111*a* respectively fall into each magnet placement through hole 111*a*. From perspectives of FIG. 99 and FIG. 100, each magnet placement through hole 111*a* of the upper cover 110 has a part of the earphone front housing 313*z*. In other words, projections of different regions of the earphone front housing 313*z* in the axial direction of the magnet placement through hole 111*a* respectively fall into each magnet placement through hole 111*a*.

In addition, as shown in FIG. 100, gaps B are formed between each of the limiting members of the upper cover limiting post 112 and an inner wall of the earphone front housing 313*z* (only one gap B is marked in the figure for brevity). Each gap B is used to accommodate one earphone magnet 313*g*. There is a jig magnet 130 near each gap B.

Figure 101:
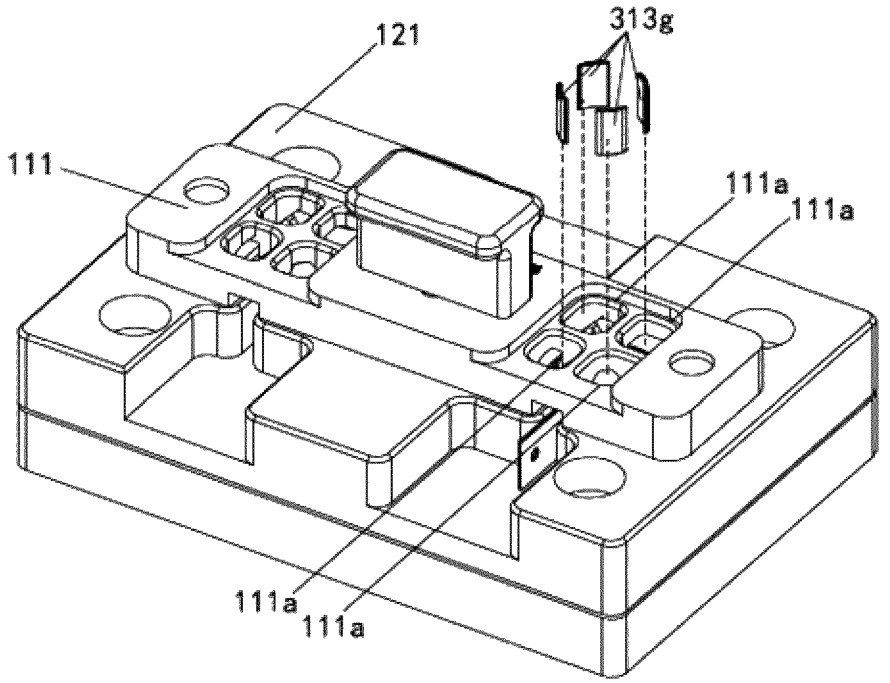
FIG. 101 is a schematic diagram of a structure in which an earphone magnet is mounted into an assembly jig.

As shown in FIG. 101, the four earphone magnets 313*g* are respectively fitted into four gaps B via the four magnet placement through holes 111*a*, so that one earphone magnet 313*g* is located in each gap B, and each earphone magnet 313*g* is positioned at the mounting position in the earphone front housing 313*z*. The jig magnet 130 near each gap B may be magnetically attached to the earphone magnet 313*g* in the gap B, so that the earphone magnet 313*g* may be maintained at the mounting position in the earphone front housing 313*z*. In this way, positioning of the earphone magnet 313*g* can be completed.

Thereafter, the upper cover 110 may be removed to expose the intermediate assembly 200 and the earphone magnet 313*g* intended to be located therein. Then, the earphone magnet 313*g* may be fastened to the inner wall of the earphone front housing 313*z* by using an appropriate technique. For example, the earphone magnet 313*g* may be bonded to the inner wall of the earphone front housing 313*z* by using a dispensing technique. An adhesive used in the dispensing technique may be, for example, a fast-drying adhesive.

It is easily understood from the foregoing descriptions that the base 120 can well position the intermediate assembly 200, and a matching structure including the upper cover 110 and the base 120 can accurately define a mounting space of the earphone magnet 313*g*. The earphone magnet 313*g* can be conveniently and reliably maintained at the mounting position in the earphone front case 313*z* by using the jig magnet 130. Therefore, assembly precision and reliability of the earphone magnet 313*g* can be greatly improved by using the assembly jig 100. In addition, an assembly technique is simple, and mass production performance is good.

First Electrode 312

Figure 102:
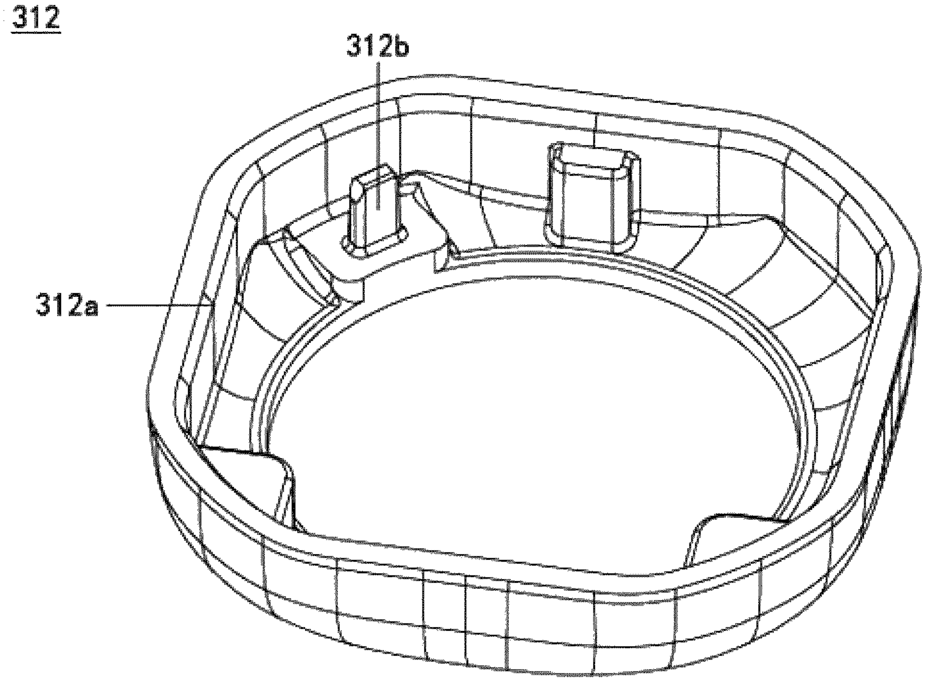
FIG. 102 is a schematic diagram of a structure of a first electrode of a first earphone.

As shown in FIG. 102, the first electrode 312 may include an electrode body 312*a* and a conduction portion 312*b*. The electrode body 312*a* may be roughly a ring structure that surrounds the center line of the first earphone 31. The conduction portion 312*b* may be roughly columnar, and the conduction portion 312*b* may be convexly disposed on an inner surface of the electrode body 312*a*. The first electrode 312 may be made of a conductive material, for example, a metal material.

With reference to FIG. 102 and FIG. 87, the first electrode 312 may be mounted on the earphone front housing 313*z*. The electrode body 312*a* of the first electrode 312 matches the second part 313*b* of the earphone front case 313*z*. The conduction portion 312*b* of the first electrode 312 may pass through the through hole 313*d* of the earphone front housing 313*z*, and is electrically connected to a circuit board (descriptions are provided below) of a first earphone circuit board assembly located in the inner cavity of the earphone front housing 313*z*, so that the first electrode 312 serves as a charging electrode. A detailed assembly structure continues to be described below.

Earplug Support Assembly 316

Figure 103:
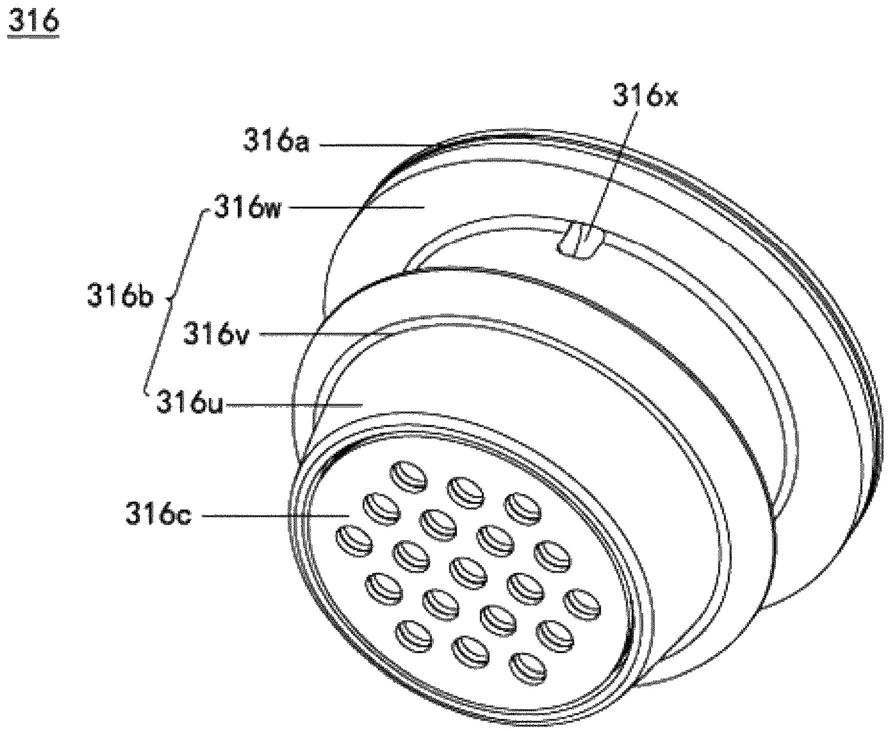
FIG. 103 is a schematic diagram of a structure of an earplug support assembly of a first earphone.
Figure 104:
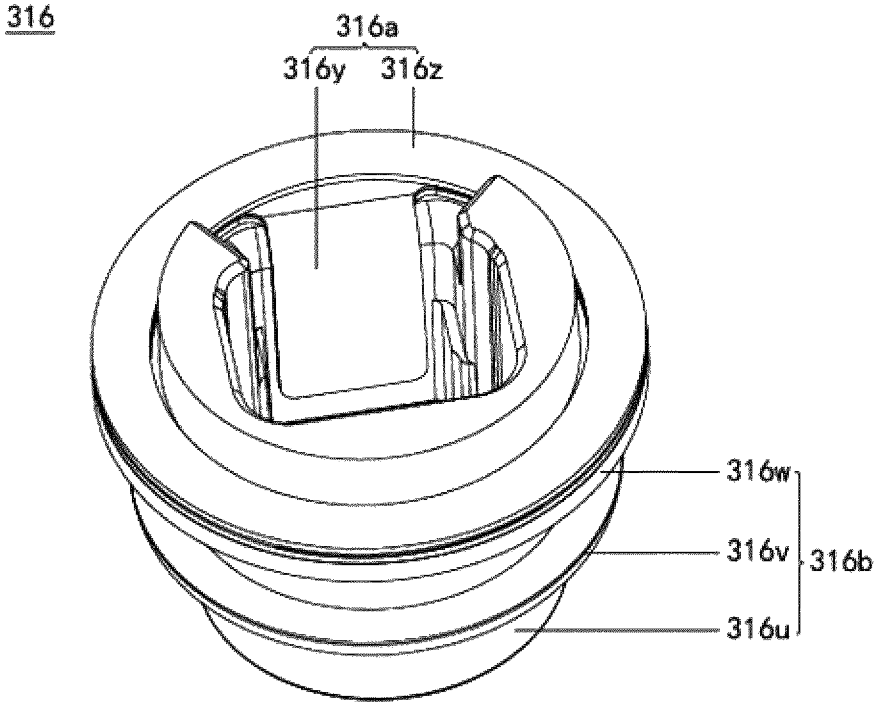
FIG. 104 is a schematic diagram of a structure of an earplug support assembly of a first earphone.
Figure 105:
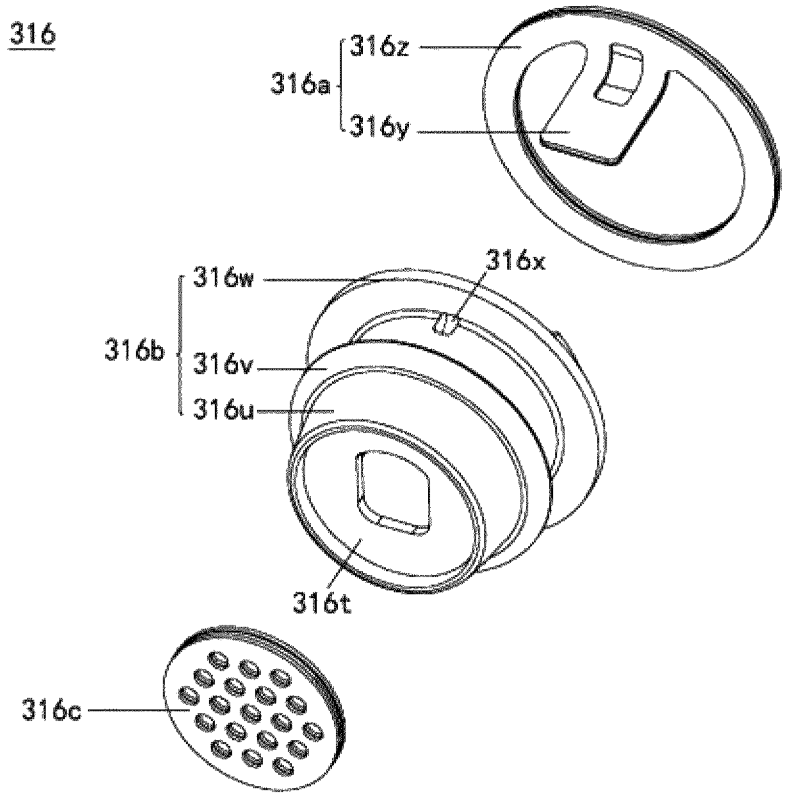
FIG. 105 is a schematic exploded view of a structure of an earplug support assembly.

As shown in FIG. 103, FIG. 104, and FIG. 105, the earplug support assembly 316 may include an earplug support 316*b*, a front vent acoustic mesh 316*a*, and a speaker mesh 316*c*.

As shown in FIG. 103 to FIG. 105, the earplug support 316*b* may include a support body 316*u*, a first skirt 316*v*, and a second skirt 316*w*. The support body 316*u* may be roughly of a hollow cylindrical structure with two ends open. Both the first skirt 316*v* and the second skirt 316*w* may be bosses convexly disposed on an outer circumferential surface of the support body 316*u*, and both the first skirt 316*v* and the second skirt 316*w* may surround the support body 316*u*. Both the first skirt 316*v* and the second skirt 316*w* may be located between the two ends of the support body 316*u*. The first skirt 316*v* is spaced from the second skirt 316*w*.

Figure 106:
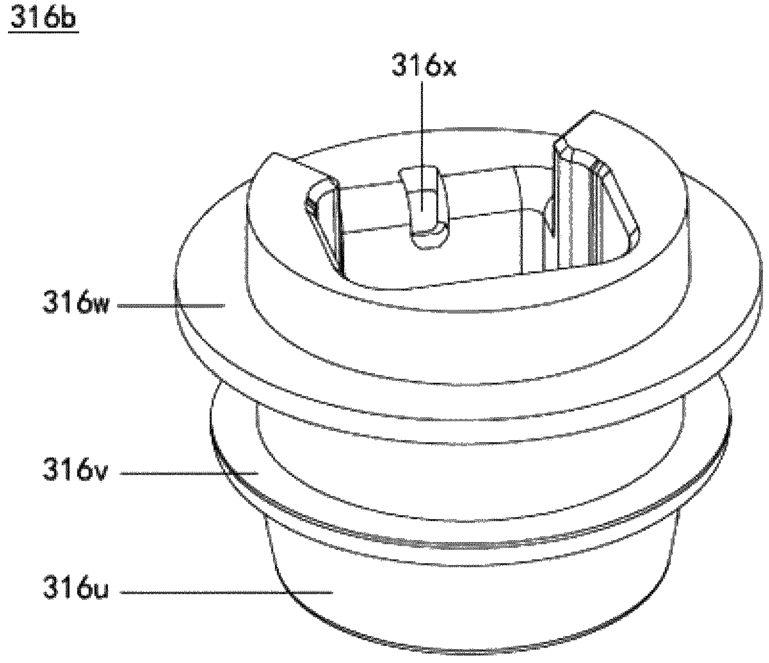
FIG. 106 is a schematic diagram of a structure of an earplug support in an earplug support assembly.

As shown in FIG. 106 and FIG. 103, a notch may be provided on an end that is of the support body 316*u* and that is near the second skirt 316*w* and roughly form a C-shaped structure. The end of the support body 316*u* may also have a front vent 316*x*, and the front vent 316*x* penetrates a wall of the support body 316*u*. An opening that is of the front vent 316*x* and that is on the outer circumferential surface of the support body 316*u* may be located on a side that is of the second skirt edge 316*w* and that faces the first skirt edge 316*v*, and the opening may be connected to the second skirt edge 316*w*.

As shown in FIG. 105, a mounting groove 316*t* may be formed at one end that is of the support body 316*u* and that is close to the first skirt 316*v*. A bottom wall of the mounting groove 316*t* is provided with a through hole, and the through hole communicates with an inner cavity of the support body 316*u*.

In this embodiment, the entire earplug support 316*b* or a part of the earplug support 316*b* may be made of a conductive material. The conductive material is, for example, metal. Because the earplug support 316*b* can accommodate a speaker (descriptions are provided below) in the electronic assembly 317, the earplug support 316*b* may also be referred to as a voice-emitting mouth.

The front vent acoustic mesh 316*a* may be roughly in a sheet shape, and may include several layers of materials, such as an acoustic mesh and an adhesive layer. The bent front vent acoustic mesh 316*a* is shown in the figure. As shown in FIG. 105, the front vent acoustic mesh 316*a* may include a fastening region 316*z* and a blocking region 316*y*. The fastening region 316*z* may be in a ring shape. The blocking region 316*y* may be in a rectangular strip shape, and the blocking region 316*y* may be connected to an inner side of the fastening region 316*z*. The blocking region 316*y* can allow air and sound waves to pass through.

As shown in FIG. 105, FIG. 104, and FIG. 106, the front vent acoustic mesh 316*a* may be mounted on the earplug support 316*b*. The fastening region 316*z* may be mounted on a side that is of the second skirt 316*w* and that is far away from the first skirt 316*v*. For example, an adhesive layer in the fastening region 316*z* may be bonded to the side of the second skirt 316*w*. The blocking region 316*y* may be bent into the inner cavity of the support body 316*u*, and is attached to an inner wall of the support body 316*u*. For example, an adhesive layer in the blocking region 316*y* may be bonded to the inner wall of the support body 316*u*. In addition, the blocking region 316*y* may block the front vent 316*x*.

With reference to FIG. 103, FIG. 104, and FIG. 87, the earplug support 316*b* may be mounted in the mounting slot 313*f* of the earphone front housing 313*z*. For example, the earplug support 316*b* may be bonded to the bottom surface of the mounting groove 313*f* through the adhesive layer in the fastening region 316*z*. A detailed assembly structure continues to be described below.

Speaker Mesh 316*c*

As shown in FIG. 105, the speaker mesh 316*c* may be roughly in a sheet shape, and may include several layers of materials, such as an acoustic mesh, an adhesive layer, and a PET sheet. A plurality of voice-emitting holes may be provided on the speaker mesh 316*c*.

As shown in FIG. 105, the speaker mesh 316*c* may be mounted in the mounting groove 316*t* of the support body 316*u*. A voice (from the speaker, descriptions are provided below) in the inner cavity of the support body 316*u* enters a human ear through the speaker mesh 316*c*.

Based on a product requirement, in another embodiment, the earplug support may further have another appropriate structure, and is not limited to the foregoing descriptions. The front vent may not be provided on the earplug support, but may be provided on the earphone front housing 313*z*. For example, the front vent is provided on the first part 313*a* of the earphone front housing 313*z*, and communicates with the voice pickup channel 313*e*. An aperture of the front vent may be small (for example, less than 0.22 mm). In this case, the front vent acoustic mesh 316*a* may be omitted.

Earplug 311

Figure 107:
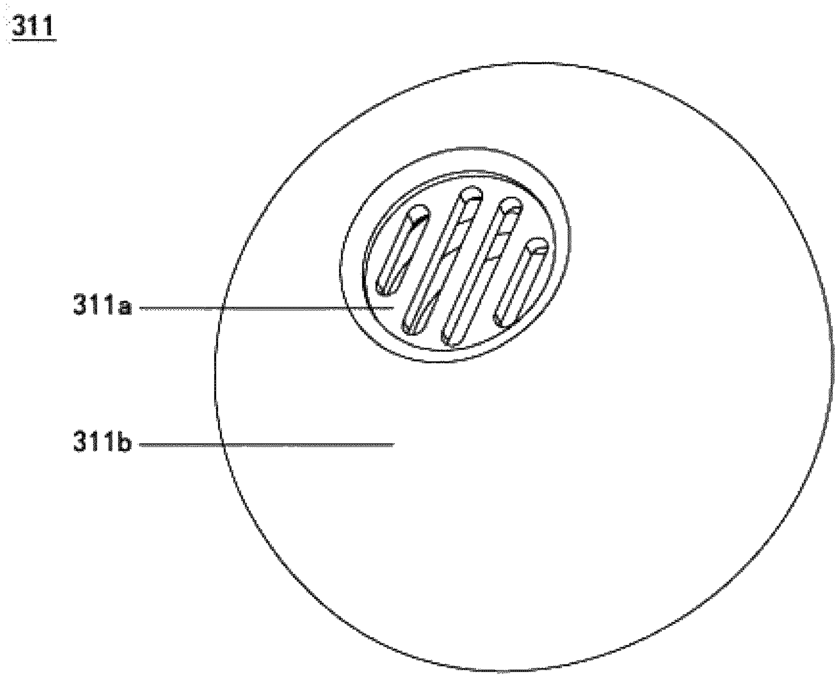
FIG. 107 is a schematic diagram of a structure of an earplug of a first earphone.
Figure 108:
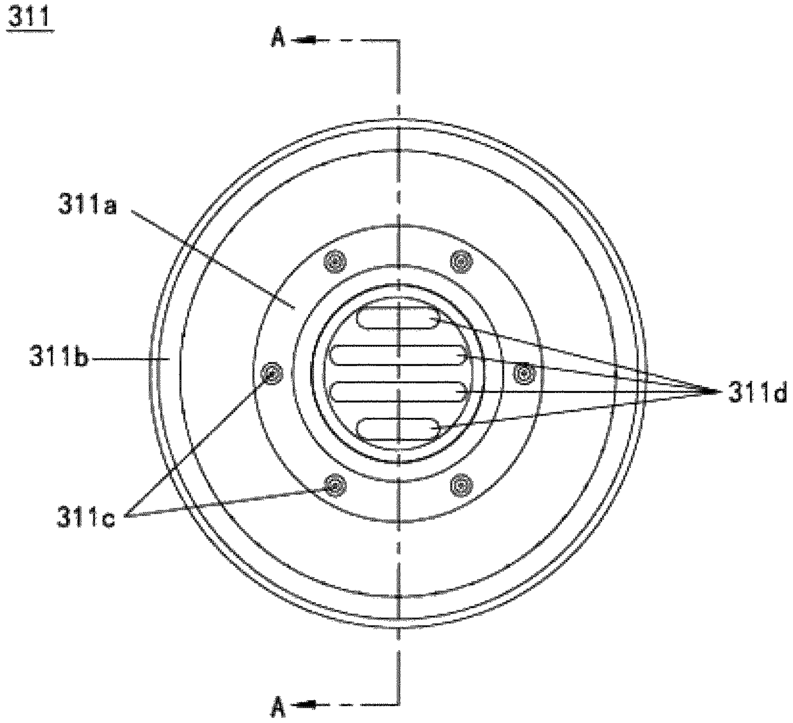
FIG. 108 is a schematic diagram of a structure of an earplug of a first earphone.
Figure 109:
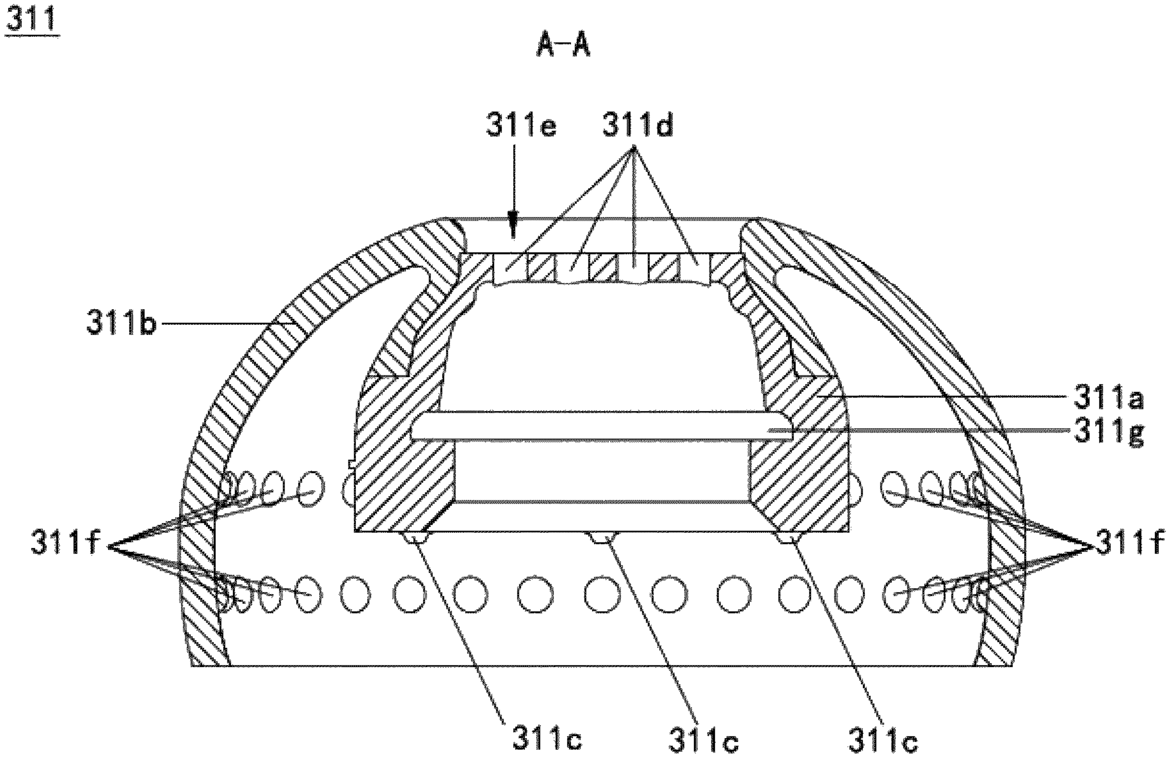
FIG. 109 is a schematic diagram of an A-A sectional structure of the earplug in FIG. 108.

As shown in FIG. 107, FIG. 108, and FIG. 109, the earplug 311 may include an earplug inner cover 311*a* and an earplug outer cover 311*b*, and the two may be fixedly connected.

As shown in FIG. 108 and FIG. 109, the earplug inner cover 311*a* may be roughly a hollow rotary structure with two ends open. Several voice-emitting through holes 311*d* may be formed at an axial end of the earplug inner cover 311*a*, and all these voice-emitting through holes 311*d* communicate with an inner cavity of the earplug inner cover 311*a*. The voice-emitting through holes 311*d* are spaced apart from each other and may be arranged according to a specific rule.

Figure 110:
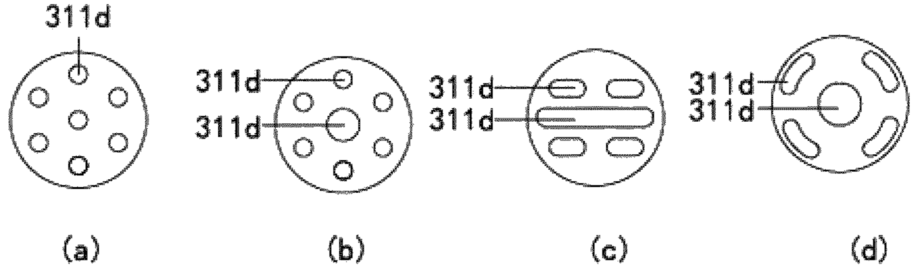
FIG. 110 is a schematic diagram of structures of several voice pickup through holes of an earplug inner cover in an earplug.

As shown in FIG. 108, in an implementation, the voice-emitting through holes 311*d* may be arranged side by side. Shapes of the voice-emitting through holes 311*d* may be the same or similar. For example, each of the voice-emitting through holes 311*d* may be a runway-shaped hole. In another implementation, shapes and an arrangement of the voice-emitting through holes 311*d* may be designed based on a product requirement. For example, FIG. 110 shows four shapes and four arrangements of the voice-emitting through holes 311*d*.

In this embodiment, a speaker is provided in the inner cavity of the earplug inner cover 311*a*, and the voice-emitting through holes 311*d* may be used for a voice from the speaker to pass through, so as to enter a human ear (descriptions are further provided below). An end that is of the earplug inner cover 311*a* and on which the voice-emitting through holes 311*d* are formed may be of an ear scale-proof structure, and the ear scale-proof structure can reduce or prevent ear scale from entering the speaker.

As shown in FIG. 109, a slot 311*g* may further be formed on an inner wall of the earplug inner cover 311*a*. The slot 311*g* encloses a circle, and the slot 311*g* may be far away from the voice-emitting through holes 311*d*. The slot 311*g* matches the first skirt 316*v* of the earplug support 316*b*, so that the earplug inner cover 311*a* is mounted on the earplug support 316*b* (a detailed assembly structure continues to be described below).

As shown in FIG. 108 and FIG. 109, several second bumps 311*c* may be provided on a surface of one end that is of the earplug inner cover 311*a* and that is far away from the voice-emitting through holes 311*d*, and these second bumps 311*c* may be spaced apart from each other and enclose a circle.

As shown in FIG. 107 to FIG. 109, the earplug outer cover 311*b* may be roughly a hollow rotary body with two ends open. An end of the earplug outer cover 311*b* in an axial direction may be fixedly connected to the end that is of the earplug inner cover 311*a* and on which the voice-emitting through holes 311*d* are formed. The earplug outer cover 311*b* may surround a periphery of the earplug inner cover 311*a*. Several first bumps 311*f* may be provided on an inner wall of the other end in the axial direction of the earplug outer cover 311*b*. The second bumps 311*c* may be spaced from each other and enclose a circle.

In this embodiment, the earplug inner cover 311*a* may be made of a material that is hard and not easily deformed, so as to form a reliable connection to the earplug support 316*b*, and have functions of accommodating and protecting the earplug support 316*b*. The earplug outer cover 311*b* may be made of a material that is soft and easily deformed, so as to fit and adapt to an ear canal.

Second Electrode 314

Figure 111:
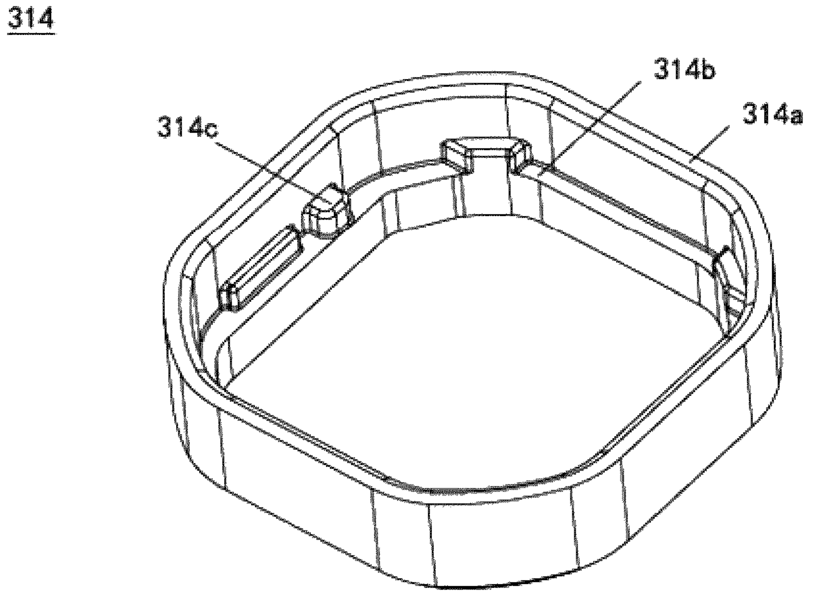
FIG. 111 is a schematic diagram of a structure of a second electrode of a first earphone.

As shown in FIG. 111, the second electrode 314 may include an electrode body 314*a*, an inner bearing platform 314*b*, and a conduction portion 314*c*. The electrode body 314*a* may be a ring structure that surrounds the center line of the first earphone 31. The inner bearing platform 314*b* is located on an inner side of the electrode body 314*a*, and the inner bearing platform 314*b* may circle around the electrode body 314*a*. The conduction portion 314*c* may be roughly columnar, and the conduction portion 314*c* may be located on the inner side of the electrode body 314*a*, and may be convexly disposed on the inner bearing platform 314*b*. The second electrode 314 may be made of a conductive material, for example, a metal material.

With reference to FIG. 111 and FIG. 88, the second electrode 314 may be connected to the earphone front housing 313*z*. The electrode body 314*a* of the second electrode 314 matches the third part 313*c* of the earphone front housing 313*z*. The conduction portion 314*c* of the second electrode 314 may be electrically connected to a circuit board (descriptions are provided below) that is located in the second electrode 314 and that is in the second earphone circuit board assembly 317*g*, so that the second electrode 314 serves as another charging electrode. A detailed assembly structure continues to be described below.

Earphone Rear-Housing Assembly 315

Figure 112:
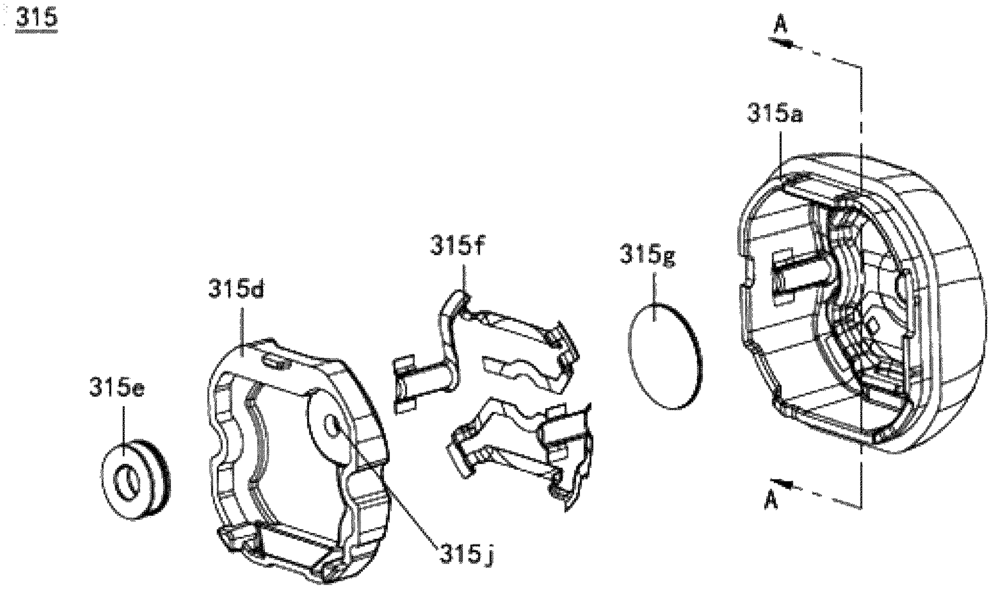
FIG. 112 is a schematic exploded view of a structure of an earphone rear-housing assembly in a first earphone.
Figure 113:
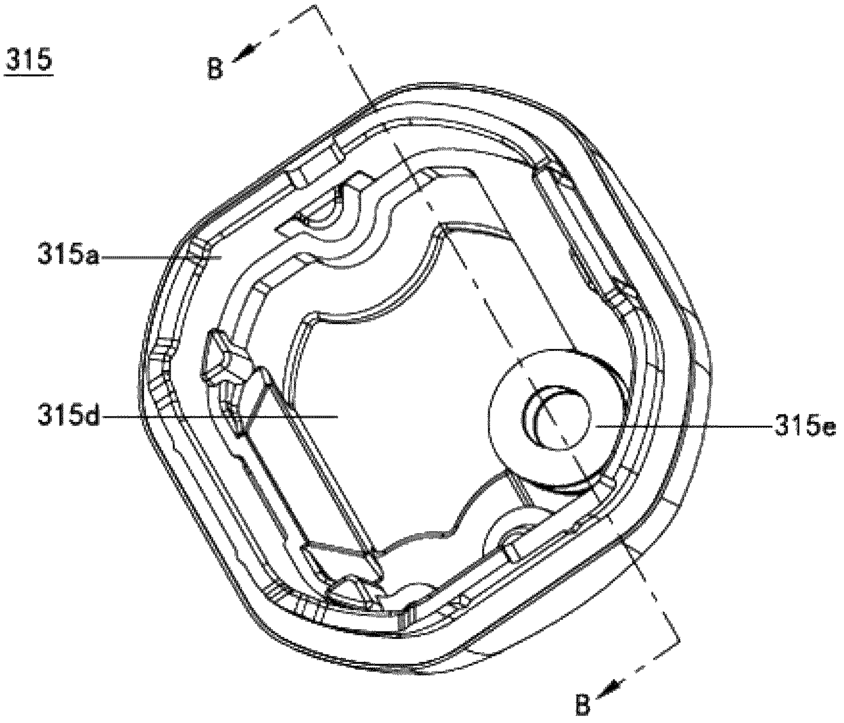
FIG. 113 is a schematic diagram of an assembly structure of an earphone rear-housing assembly.
Figure 114:
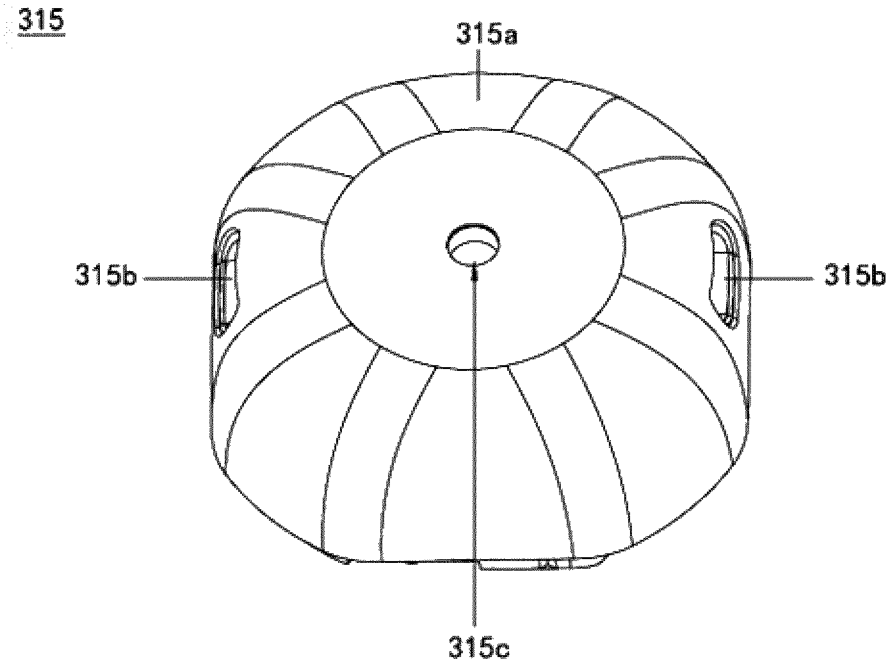
FIG. 114 is a schematic diagram of a structure of an earphone rear housing in an earphone rear-housing assembly.

As shown in FIG. 112, FIG. 113, and FIG. 114, the earphone rear-housing assembly 315 may include an earphone rear housing 315*a*, a first primary microphone mesh 315*g*, an antenna 315*f*, a rear housing support 315*d*, and a second primary microphone mesh 315*e*. The first primary microphone mesh 315*g*, the antenna 315*f*, the rear housing support 315*d*, and the second primary microphone mesh 315*e* may all be accommodated on an inner side of the earphone rear housing 315*a*.

Figure 115:
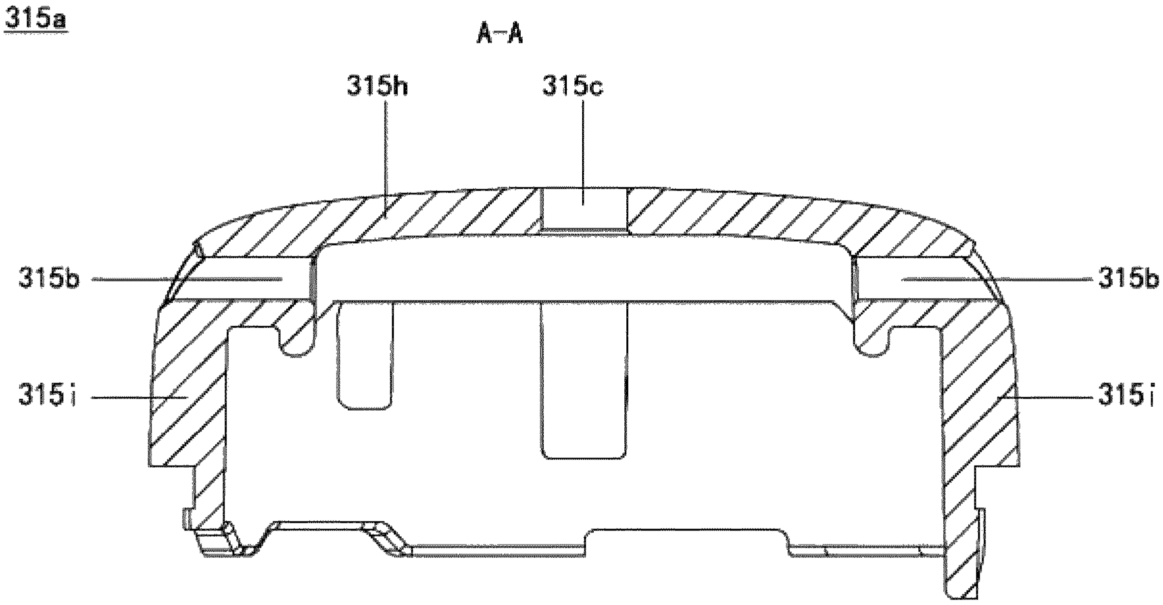
FIG. 115 is a schematic diagram of an A-A sectional structure of an earphone rear housing in FIG. 112.

As shown in FIG. 113, FIG. 114, and FIG. 115 (FIG. 115 is a schematic diagram of an A-A sectional structure of the earphone rear housing 315*a* in FIG. 112), the earphone rear housing 315*a* may be roughly in a bowl shape. The earphone rear housing 315*a* may include a bottom wall 315*h*, and a circumferential side wall 315*i* surrounding a periphery edge of the bottom wall 315*h*. The circumferential side wall 315*i* and the bottom wall 315*h* enclose an open cavity. A voice pickup through hole 315*c* may be provided on the bottom wall 315*h*, and the voice pickup through hole 315*c* communicates with an inner cavity of the earphone rear housing 315*a*. Several wind noise prevention through holes 315*b* may be provided on the circumferential side wall 315*i*, and the wind noise prevention through holes 315*b* communicate with the inner cavity of the earphone rear housing 315*a*. For example, there may be two wind noise prevention through holes 315*b*, and the two wind noise prevention through holes 315*b* may be basically symmetrically distributed on both sides of the voice pickup through hole 315*c*. Alternatively, a quantity of wind noise prevention through holes 315*b* may be greater than or equal to two, for example, three or four, and these wind noise prevention through holes 315*b* may be spaced apart from each other.

Antenna 315*f*

In this embodiment, the antenna 315*f* may be a common mode antenna, and may include two antenna stubs that are physically separated but can work in a coupling mode. The two antenna stubs are coupled, so that the antenna 315*f* works on a specified frequency band. The antenna 315*f* may be, for example, a Bluetooth antenna, and the specified frequency band may be, for example, 2.4 GHz.

Figure 116:
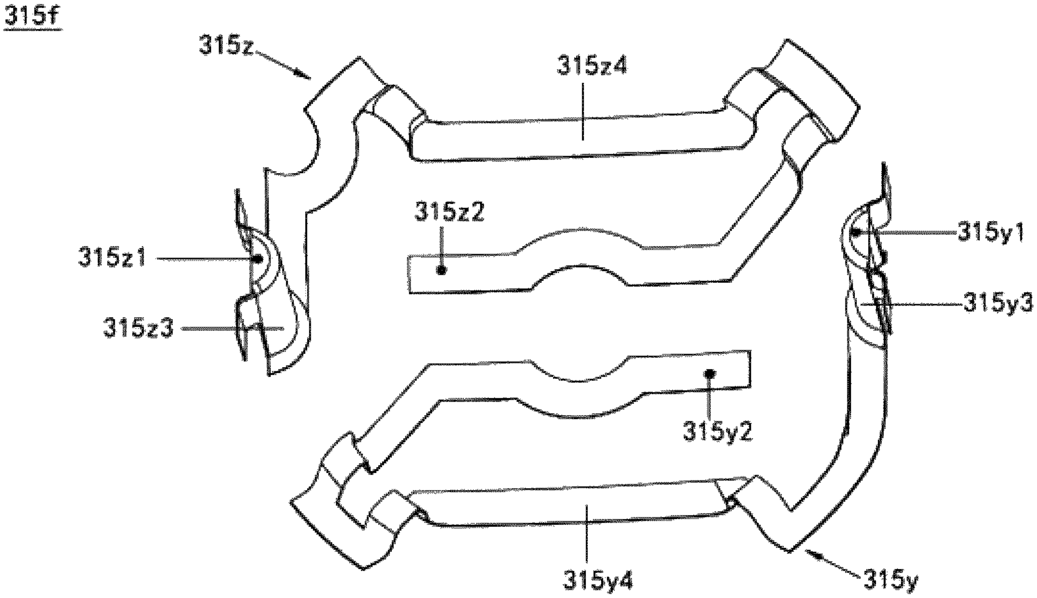
FIG. 116 is a schematic diagram of a structure of an antenna in an earphone rear-housing assembly.

As shown in FIG. 116, in the implementation 1 of this embodiment, the antenna 315*f* may include a first antenna stub 315*z* and a second antenna stub 315*y*. Both the first antenna stub 315*z* and the second antenna stub 315*y* may be roughly a bent narrow-strip structure.

As shown in FIG. 116, the first antenna stub 315*z* may include a first segment 315*z*3 and a second segment 315*z*4, and the first segment 315*z*3 and the second segment 315*z*4 are bent and connected. For example, the first segment 315*z*3 and the second segment 315*z*4 may be roughly perpendicular to each other. An end that is of the first segment 315*z*3 and that is far away from the second segment 315*z*4 is referred to as a head end 315*z*1, and an end that is of the second segment 315*z*4 and that is far away from the first segment 315*z*3 is referred to as a tail end 315*z*2. In other words, the head end 315*z*1 and the tail end 315*z*2 are respectively two opposite ends of the first antenna stub 315*z*. The first segment 315*z*3 may be roughly in a straight-line shape, and the second segment 315*z*4 may be in a bent shape.

As shown in FIG. 116, similarly, the second antenna stub 315*y* may include a third segment 315*y*3 and a fourth segment 315*y*4, and the third segment 315*y*3 and the fourth segment 315*y*4 are bent and connected. For example, the third segment 315*y*3 and the fourth segment 315*y*4 may be roughly perpendicular to each other. An end that is of the third segment 315*y*3 and that is far away from the fourth segment 315*y*4 is referred to as a head end 315*y*1, and an end that is of the fourth segment 315*y*4 and that is far away from the third segment 315*y*3 is referred to as a tail end 315*y*2. In other words, the head end 315*y*1 and the tail end 315*y*2 are respectively two opposite ends of the second antenna stub 315*y*. The third segment 315*y*3 may be roughly in a straight-line shape, and the fourth segment 315*y*4 may be in a bent shape. As shown in FIG. 116, the first antenna stub 315*z* and the second antenna stub 315*y* may be basically centrosymmetric, that is, the first antenna stub 315*z* basically overlaps the second antenna stub 315*y* after being rotated 180° around a center. For an entire region occupied by the first antenna stub 315*z* and the second antenna stub 315*y*, from the head end 315*z*1 to the tail end 315*z*2 of the first antenna stub 315*z*, the first antenna stub 315*z* is bent and extends along an outward-inward path (for example, from the perspective of FIG. 116, the first antenna stub 315*z* is bent in the clockwise direction); and from the head end 315*y*1 to the tail end 315*y*2 of the second antenna stub 315*y*, the second antenna stub 315*y* is bent and extends along an outward-inward path (for example, from the perspective of FIG. 116, the second antenna stub 315*y* is bent in the clockwise direction). The head end 315*z*1 and the head end 315*y*1 are located outside, and the head end 315*z*1 is far away from the head end 315*y*1. Both the tail end 315*z*2 and the tail end 315*y*2 are located between the head end 315*z*1 and the head end 315*y*1, the tail end 315*z*2 is close to the tail end 315*y*2, and the tail end 315*z*2 and the tail end 315*y*2 are coupled, so that the antenna 315*f* works in the 2.4G frequency band.

As described below, both the head end 315*z*1 and the head end 315*y*1 are connected to a feeding point on a circuit board of the third earphone circuit board assembly 317*h* in the electronic assembly 317, so that both the first antenna stub 315*z* and the second antenna stub 315*y* can receive and send signals. The two feeding points may be symmetrical with respect to the center line of the first earphone 31.

With reference to FIG. 116, FIG. 112, and FIG. 115, in the implementation 1, the antenna 315*f* may be disposed on an inner wall of the earphone rear housing 315*a*, both the head end 315*z*1 and the head end 315*y*1 may be located on an inner surface of the circumferential side wall 315*i* of the earphone rear housing 315*a*, and both the tail end 315*z*2 and the tail end 315*y*2 may be located on an inner surface of the bottom wall 315*h* of the earphone rear housing 315*a*. From the head end 315*z*1 to the tail end 315*z*2 of the first antenna stub 315*z*, the second segment 315*z*4 of the first antenna stub 315*z* may extend roughly in a direction from the circumferential side wall 315*i* to the bottom wall 315*h*. From the head end 315*y*1 to the tail end 315*y*2 of the second antenna stub 315*y*, the fourth segment 315*y*4 of the second antenna stub 315*y* may also extend roughly in the direction from the circumferential side wall 315*i* to the bottom wall 315*h*.

For example, the antenna 315*f* may be formed on the inner wall of the earphone rear housing 315*a* by using a laser direct structuring (laser direct structuring, LDS) technique, that is, the antenna 315*f* may be, for example, an LDS antenna.

Different wearing angles of the first earphone 31 in the ear canal may cause the first antenna stub 315*z* to be closer to the human body, or the second antenna stub 315*y* to be closer to the human body. For an antenna stub closer to the human body, antenna performance deteriorates (for example, antenna efficiency is low), and signal quality becomes poor.

Therefore, when the first earphone 31 works at different wearing angles, the first earphone 31 may detect an antenna stub with better signal quality in the antenna 315*f*, and select the antenna stub (an antenna stub further away from the human body) with better signal quality as a feeding end and another antenna stub as a grounding end. For example, a received signal strength (received signal strength indicator, RSSI) value may be detected to determine signal quality of an antenna stub. A controller and a switch circuit may be built in the first earphone 31. The controller is configured to: determine the antenna stub with good signal quality, switch the antenna stub to the feeding end by using the switch circuit, and switch an antenna stub with poor signal quality to the grounding end. For example, the controller may be disposed on a circuit board in the second earphone circuit board assembly 317*g* (descriptions are provided below). For example, the switch circuit may be disposed on a circuit board in the third earphone circuit board assembly 317*h* (descriptions are provided below). It may be understood that positions of the controller and the switch circuit may be designed as required, and are not limited to the foregoing descriptions.

For example, when the first earphone 31 is worn at a first wearing angle, the second antenna stub 315*y* is further away from the human body. In this case, the first earphone 31 may detect that the second antenna stub 315*y* has better signal quality, and select the second antenna stub 315*y* as the feeding end and the first antenna stub 315*z* as the grounding end. Alternatively, when the first earphone 31 is worn at a second wearing angle, the first antenna stub 315*z* is further away from the human body. In this case, the first earphone 31 may detect that the first antenna stub 315*z* has better signal quality, and select the first antenna stub 315*z* as the feeding end and the second antenna stub 315*y* as the grounding end.

In the antenna 315*f* in this implementation, two antenna stubs that are centrosymmetrically distributed and work in coupling mode are designed, so that when the user wears the first earphone 31 at different wearing angles, antenna performance of the first earphone 31 can be ensured, to ensure communication quality of the first earphone 31 and user experience.

Figure 117:
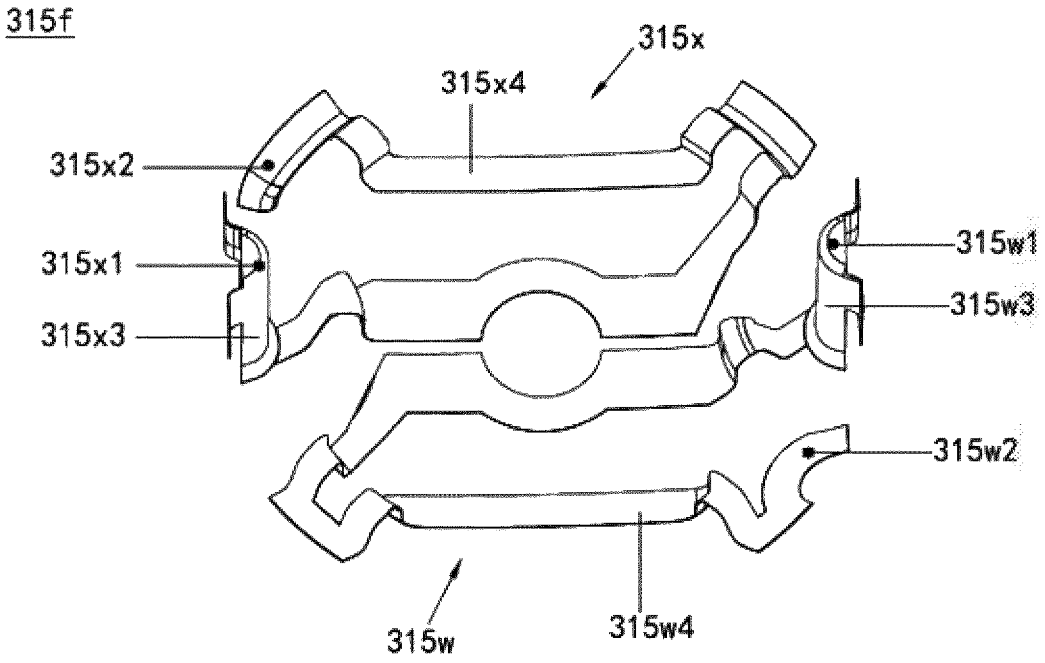
FIG. 117 is a schematic diagram of another structure of an antenna in an earphone rear-housing assembly.

As shown in FIG. 117, in an implementation 2 of this embodiment, the antenna 315*f* may include a first antenna stub 315*x* and a second antenna stub 315*w*. Both the first antenna stub 315*x* and the second antenna stub 315*w* may be roughly a bent narrow-strip structure.

As shown in FIG. 117, the first antenna stub 315*x* may include a first segment 315*x*3 and a second segment 315*x*4, and the first segment 315*x*3 and the second segment 315*x*4 are bent and connected. For example, the first segment 315*x*3 and the second segment 315*x*4 may be roughly perpendicular to each other. An end that is of the first segment 315*x*3 and that is far away from the second segment 315*x*4 is referred to as a head end 315*x*1, and an end that is of the second segment 315*x*4 and that is far away from the first segment 315*x*3 is referred to as a tail end 315*x*2. In other words, the head end 315*x*1 and the tail end 315*x*2 are respectively two opposite ends of the first antenna stub 315*x*. The first segment 315*x*3 may be roughly in a straight-line shape, and the second segment 315*x*4 may be in a bent shape.

As shown in FIG. 117, similarly, the second antenna stub 315*w* may include a third segment 315*w*3 and a fourth segment 315*w*4, and the third segment 315*w*3 and the fourth segment 315*w*4 are bent and connected. For example, the third segment 315*w*3 and the fourth segment 315*w*4 may be roughly perpendicular to each other. An end that is of the third segment 315*w*3 and that is far away from the fourth segment 315*w*4 is referred to as a head end 315*w*1, and an end that is of the fourth segment 315*w*4 and that is far away from the third segment 315*w*3 is referred to as a tail end 315*w*2. In other words, the head end 315*w*1 and the tail end 315*w*2 are respectively two opposite ends of the second antenna stub 315*w*. The third segment 315*w*3 may be roughly in a straight-line shape, and the fourth segment 315*w*4 may be in a bent shape.

As shown in FIG. 117, the first antenna stub 315*x* and the second antenna stub 315*w* may be basically centrosymmetric.

Different from those in the implementation 1, in the implementation 2, for an entire region occupied by the first antenna stub 315*x* and the second antenna stub 315*w*, from the head end 315*x*1 to the tail end 315*x*2 of the first antenna stub 315*x*, the first antenna stub 315*x* is bent and extends along an inward-outward path (for example, from the perspective of FIG. 117, the first antenna stub 315*x* is bent in a counterclockwise direction); and from the head end 315*w*1 and the tail end 315*w*2 of the second antenna stub 315*w*, the second antenna stub 315*w* is bent and extends along an inward-outward path (for example, from the perspective of FIG. 117, the second antenna stub 315*w* is bent in the counterclockwise direction). The head end 315*x*1, the tail end 315*x*2, the head end 315*w*1, and the tail end 315*w*2 are all located on an outer side. The head end 315*x*1 is close to the head end 315*w*1 and coupling is generated, so that the antenna 315*f* works on the 2.4 G frequency band.

As shown in FIG. 117, FIG. 112, and FIG. 115, in the implementation 2, the antenna 315*f* may be disposed on the inner wall of the earphone rear housing 315*a*. Both the head end 315*x*1 and the head end 315*w*1 may be located on the inner surface of the circumferential side wall 315*i* of the earphone rear housing 315*a*. Both the tail end 315*x*2 and the tail end 315*w*2 may be located on the inner surface of the bottom wall 315*h* of the earphone rear housing 315*a*, and may be close to the circumferential side wall 315*i*. Different from those in the implementation 1, in the implementation 2, from the head end 315*x*1 to the tail end 315*x*2 of the first antenna stub 315*x*, the second segment 315*x*4 of the first antenna stub 315*x* may extend roughly in a direction from the bottom wall 315*h* to the circumferential side wall 315*i*; and from the head end 315*w*1 to the tail end 315*w*2 of the second antenna stub 315*w*, the fourth segment 315*w*4 of the second antenna stub 315*w* may also extend roughly in the direction from the bottom wall 315*h* to the circumferential side wall 315*i*.

The implementation 2 provides another topology structure of the antenna 315*f*, to meet an antenna design requirement of the first earphone 31.

Figure 118:
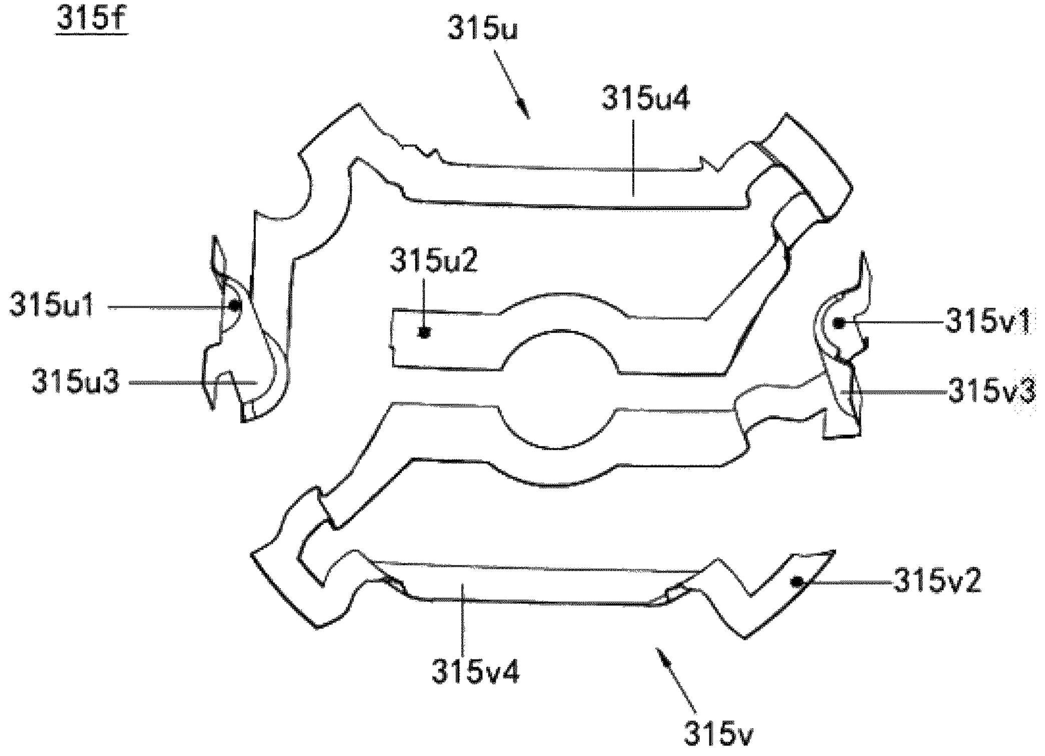
FIG. 118 is a schematic diagram of another structure of an antenna in an earphone rear-housing assembly.

As shown in FIG. 118, in the implementation 3 of this embodiment, the antenna 315*f* may include a first antenna stub 315*u* and a second antenna stub 315*v*. Both the first antenna stub 315*u* and the second antenna stub 315*v* may be roughly a bent narrow-strip structure.

As shown in FIG. 118, the first antenna stub 315*u* may include a first segment 315*u*3 and a second segment 315*u*4, and the first segment 315*u*3 and the second segment 315*u*4 are bent and connected. For example, the first segment 315*u*3 and the second segment 315*u*4 may be roughly perpendicular to each other. An end that is of the first segment 315*u*3 and that is far away from the second segment 315*u*4 is referred to as a head end 315*u*1, and an end that is of the second segment 315*u*4 and that is far away from the first segment 315*u*3 is referred to as a tail end 315*u*2. In other words, the head end 315*u*1 and the tail end 315*u*2 are respectively two opposite ends of the first antenna stub 315*u*. The first segment 315*u*3 may be roughly in a straight-line shape, and the second segment 315*u*4 may be in a bent shape.

As shown in FIG. 118, similarly, the second antenna stub 315*v* may include a third segment 315*v*3 and a fourth segment 315*v*4, and the third segment 315*v*3 and the fourth segment 315*v*4 are bent and connected. For example, the third segment 315*v*3 and the fourth segment 315*v*4 may be roughly perpendicular to each other. An end that is of the third segment 315*v*3 and that is far away from the fourth segment 315*v*4 is referred to as a head end 315*v*1, and an end that is of the fourth segment 315*v*4 and that is far away from the third segment 315*v*3 is referred to as a tail end 315*v*2. In other words, the head end 315*v*1 and the tail end 315*v*2 are respectively two opposite ends of the second antenna stub 315*v*. The third segment 315*v*3 may be roughly in a straight-line shape, and the fourth segment 315*v*4 may be in a bent shape.

Different from those in the implementation 1, in the implementation 3, from an entire region occupied by the first antenna stub 315*u* and the second antenna stub 315*v*, from the head end 315*u*1 to the tail end 315*u*2 of the first antenna stub 315*u*, the first antenna stub 315*u* is bent and extends along an outward-inward path (for example, from the perspective of FIG. 118, the first antenna stub 315*u* is bent in the clockwise direction); and from the head end 315*v*1 and the tail end 315*v*2 of the second antenna stub 315*v*, the second antenna stub 315*v* is bent and extends along an outward-inward path (for example, from the perspective of FIG. 118, the second antenna stub 315*v* is bent in the counterclockwise direction). The head end 315*u*1, the head end 315*v*1, and the tail end 315*v*2 are all located on an outer side, and the tail end 315*u*2 is located on an inner side. The tail end 315*u*2 is close to the head end 315*v*1, and coupling is generated, so that the antenna 315*f* works on the 2.4 G frequency band.

As shown in FIG. 117, FIG. 112, and FIG. 115, in the implementation 3, the antenna 315*f* may be disposed on the inner wall of the earphone rear housing 315*a*. Both the head end 315*u*1 and the head end 315*v*1 may be located on the inner surface of the circumferential side wall 315*i* of the earphone rear housing 315*a*. Both the tail end 315*u*2 and the tail end 315*v*2 may be located on the inner surface of the bottom wall 315*h* of the earphone rear housing 315*a*, and the tail end 315*v*2 may be close to the circumferential side wall 315*i*. Different from those in the implementation 1, in the implementation 3, from the head end 315*u*1 to the tail end 315*u*2 of the first antenna stub 315*u*, the second segment 315*u*4 of the first antenna stub 315*u* may extend roughly in the direction from the circumferential side wall 315*i* to the bottom wall 315*h*. From the head end 315*v*1 to the tail end 315*v*2 of the second antenna stub 315*v*, the fourth segment 315*v*4 of the second antenna stub 315*v* may also extend roughly in the direction from the bottom wall 315*h* to the circumferential side wall 315*i*.

The implementation 3 provides another topology structure of the antenna 315*f*, to meet the antenna design requirement of the first earphone 31.

The foregoing implementations enumerate three topologies and three coupling manners of the antenna 315*f*. Embodiments of this application are actually not limited thereto. Another topology structure and coupling manner of the antenna 315*f* may alternatively be designed based on a product requirement. For example, from a head end to the tail end, the second segment may extend roughly in a direction from the bottom wall 315*h* to the circumferential side wall 315*i*, and the fourth segment may extend roughly in a direction from the circumferential side wall 315*i* to the bottom wall 315*h*. The head end of the first antenna stub may be coupled to the tail end of the second antenna stub, so that the antenna 315*f* works on the specified frequency band.

The foregoing describes three example topologies of the antenna 315*f*. It may be understood that, in this embodiment, a specific structure of the antenna 315*f* may be designed based on a product requirement, and is not limited to the foregoing descriptions. For ease of description, the following uses the antenna 315*f* in the implementation 1 as an example to describe content related to the antenna 315*f*.

First Primary Microphone Mesh 315*g*

The first primary microphone mesh 315*g* may be roughly in a circular sheet shape, and may include several layers of materials, such as an acoustic mesh and an adhesive layer. With reference to FIG. 112 and FIG. 115, the first primary microphone mesh 315*g* may be fixedly connected to the bottom wall 315*h* of the earphone rear housing 315*a*. For example, an adhesive layer in the first primary microphone mesh 315*g* may be bonded to the bottom wall 315*h*. In addition, the first primary microphone mesh 315*g* covers the voice pickup through hole 315*c*, and a voice entering the voice pickup through hole 315*c* may enter the inner cavity of the earphone rear housing 315*a* through the first primary microphone mesh 315*g*.

Rear Housing Support 315*d*

Figure 119:
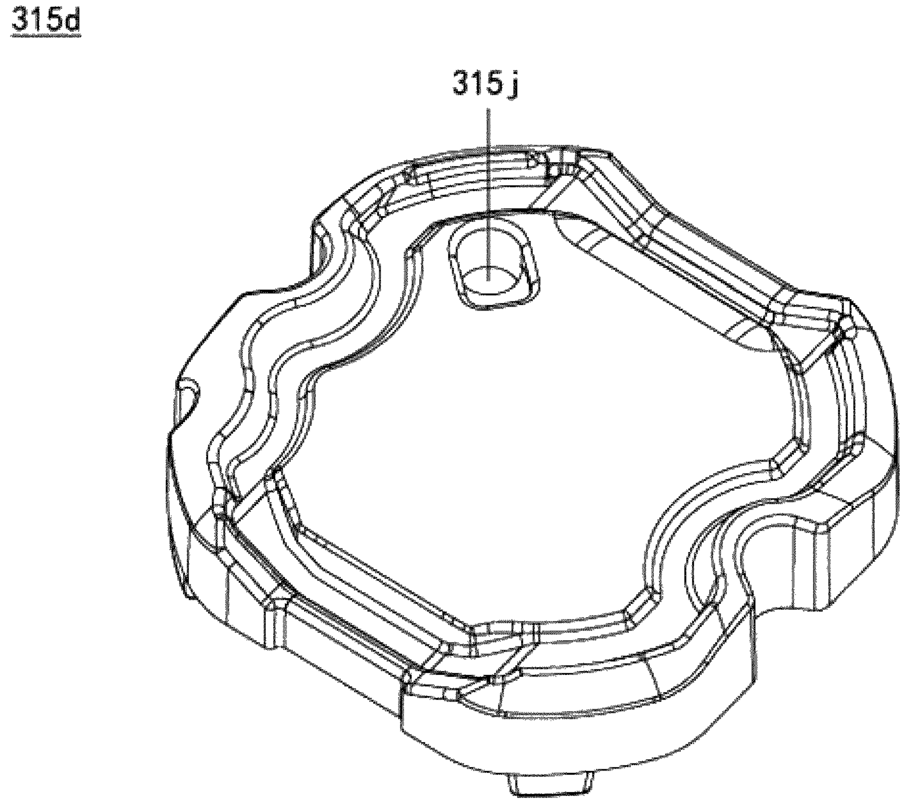
FIG. 119 is a schematic diagram of a structure of a rear housing support in an earphone rear-housing assembly.

As shown in FIG. 112 and FIG. 119, the rear housing support 315*d* may be roughly in a hood shape. A through hole 315*j* may be provided on the rear housing support 315*d*.

Second Primary Microphone Mesh 315*e*

As shown in FIG. 112, the second primary microphone mesh 315*e* may be roughly in a circular sheet shape, and may include several layers of materials, such as an acoustic mesh, foam, and an adhesive layer. With reference to FIG. 112 and FIG. 119, the second primary microphone mesh 315*e* may be fastened to one side of the rear housing support 315*d*. For example, an adhesive layer in the second primary microphone mesh 315*e* may be bonded to the side of the rear housing support 315*d*. Further, the second primary microphone mesh 315*e* covers the through hole 315*j*, and a voice entering the through hole 315*j* may pass through the second primary microphone mesh 315*e*.

Figure 120:
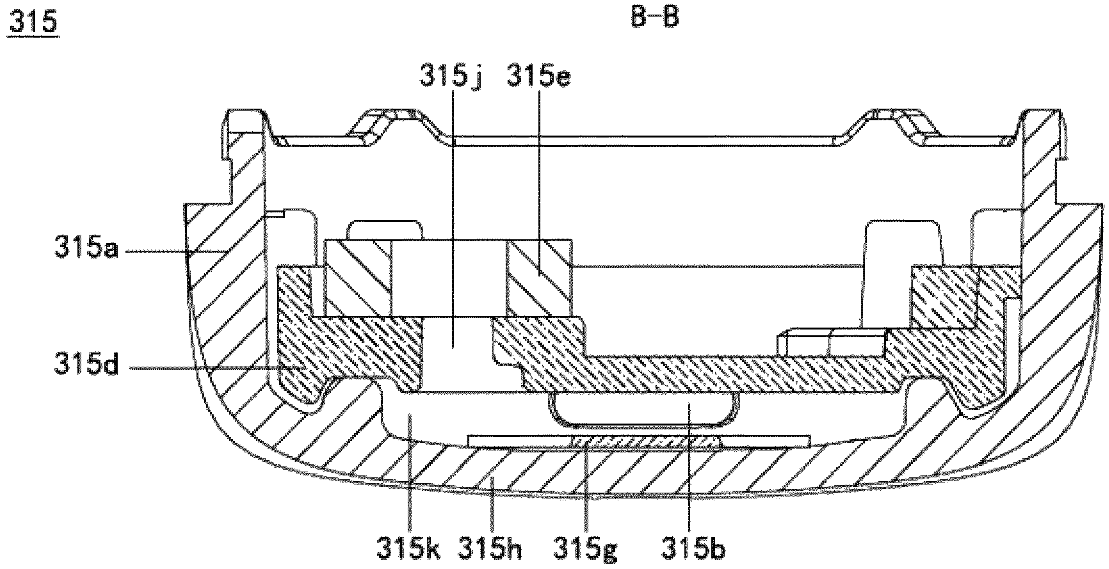

FIG. 120 is a B-B sectional view of the earphone rear-housing assembly 315 of FIG. 113. FIG. 120 may represent an assemble structure of the earphone rear-housing assembly 315. As shown in FIG. 120, the first primary microphone mesh 315*g* may be fastened to the inner surface of the bottom wall 315*h* of the earphone rear housing 315*a*. With reference to FIG. 120 and FIG. 114, the first primary microphone mesh 315*g* covers the voice pickup through hole 315*c* (the voice pickup through hole 315*c* is not displayed in FIG. 120 due to a position of a sectional surface in FIG. 113). The rear housing support 315*d* is mounted in the inner cavity of the earphone rear housing 315*a*, and the rear housing support 315*d* is spaced apart from the bottom wall 315*h* and the first primary microphone mesh 315*g*. Therefore, the rear housing support 315*d* and the earphone rear housing 315*a* enclose a wind noise prevention cavity 315*k*. The wind noise prevention through hole 315*b* communicates with the wind noise prevention cavity 315*k*.

As shown in FIG. 120, the second primary microphone mesh 315*e* is located in the inner cavity of the earphone rear housing 315*a*, the second primary microphone mesh 315*e* may be fastened to a side that is of the rear housing support 315*d* and that is far away from the bottom wall 315*h*, and the second primary microphone mesh 315*e* covers the through hole 315*j* of the rear housing support 315*d*.

The foregoing describes in detail the structures of the earplug 311, the earplug support assembly 316, the first electrode 312, the earphone front-housing assembly 313, the second electrode 314, and the earphone rear-housing assembly 315 in the first earphone 31. The following describes an overall assembly structure including the components.

Figure 121:
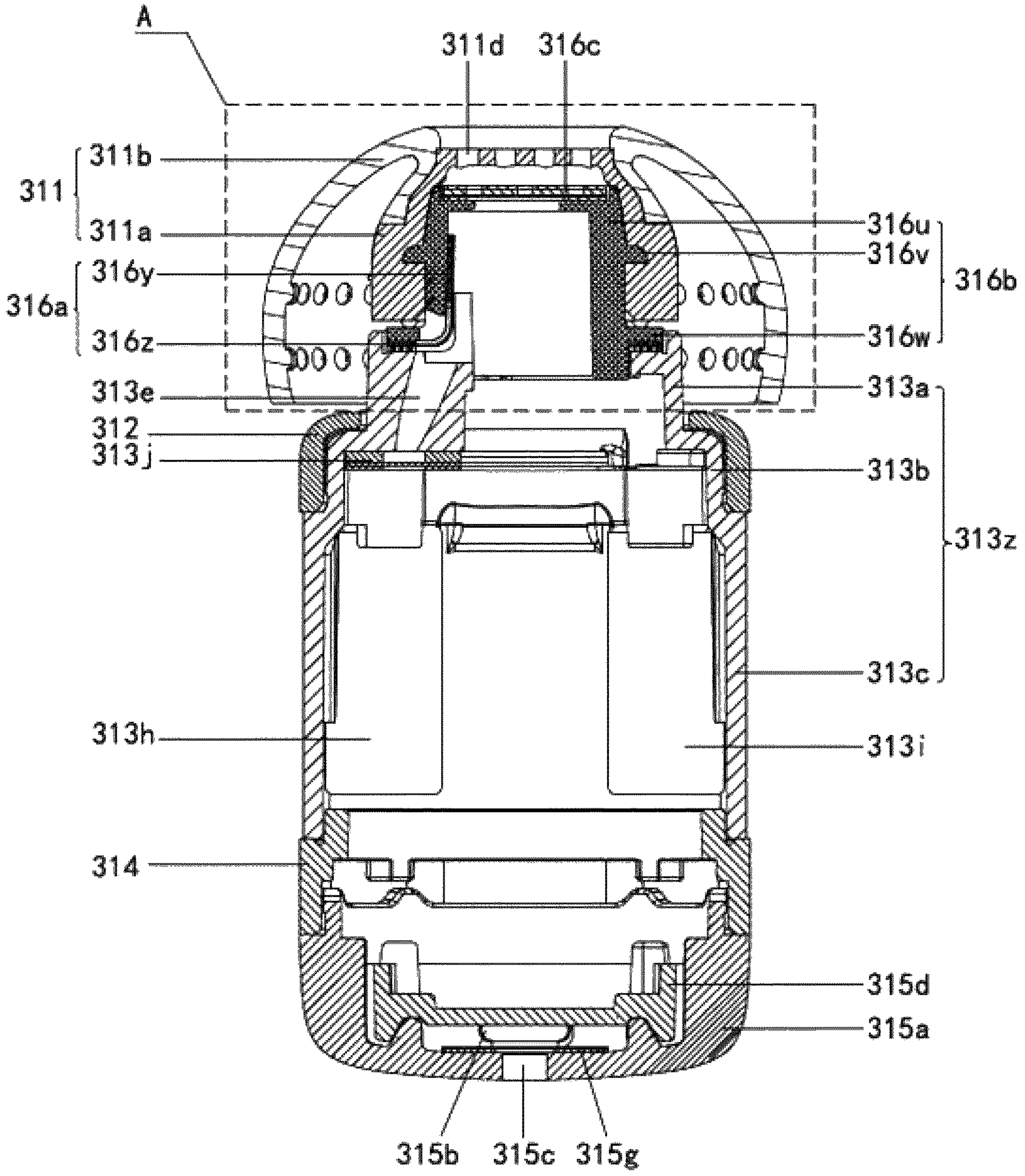
Figure 122:
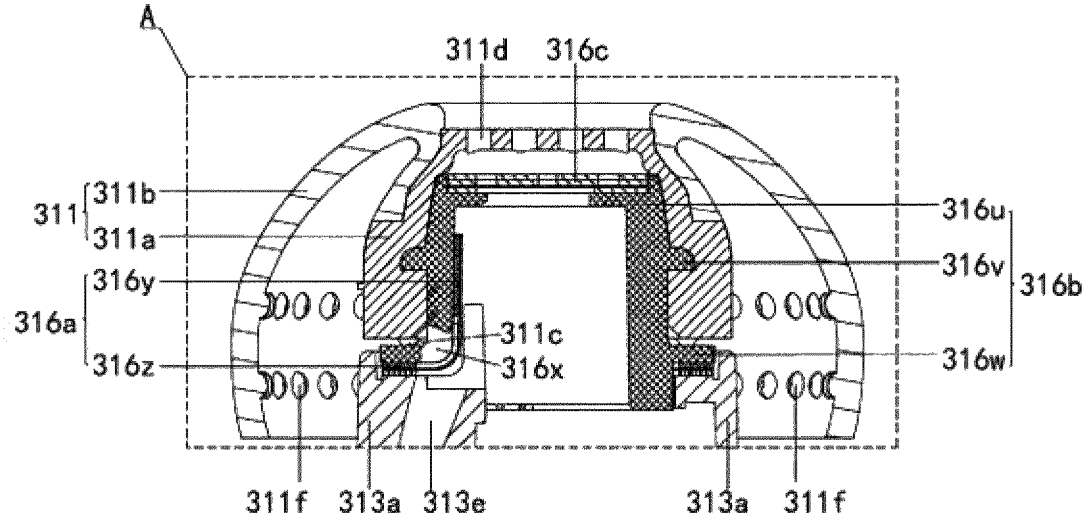

FIG. 121 is a schematic diagram of a sectional structure of the first earphone 31. Some structures are not displayed due to a position selection of a sectional section. FIG. 122 is a partially enlarged view at a position A in FIG. 121.

As shown in FIG. 121, the first electrode 312 may match with the second part 313*b* of the earphone front housing 313*z*. With reference to FIG. 102 and FIG. 87, the conduction portion 312*b* of the first electrode 312 may pass through the through hole 313*d* on the second part 313*b*, and extend into the inner cavity of the earphone front housing 313*z*.

As shown in FIG. 121 and FIG. 122, the earplug support 316*b* may match with the first part 313*a* of the earphone front housing 313*z*. With reference to FIG. 122 and FIG. 90, the second skirt 316*w* of the earplug support 316*b* may be bonded to the mounting groove 313*f* of the first part 313*a* through the fastening region 316*z* of the front vent acoustic mesh 316*a*. The support body 316*u* of the earplug support 316*b* may extend into the inner cavity of the earphone front housing 313*z*. In addition, as shown in FIG. 122, the front vent 316*x* on the earplug support 316*b* may be close to the voice pickup channel 313*e* on the earphone front housing 313*z*, and the blocking region 316*y* of the front vent acoustic mesh 316*a* is located between the front vent 316*x* and the voice pickup channel 313*e*.

As shown in FIG. 122, the earplug inner cover 311*a* may be sleeved on a periphery of the earplug support 316*b*. With reference to FIG. 109 and FIG. 122, the slot 311*g* of the earplug inner cover 311*a* may match the first skirt edge 316*v* of the earplug support 316*b*, and there may be a specific spacing between the end that is of the earplug inner cover 311*a* and on which the voice-emitting through holes 311*d* are provided and the speaker mesh 316*c* on the earplug support 316*b*. The second bumps 311*c* on the earplug inner cover 311*a* may be in contact with the second skirt 316*w* of the earplug support 316*b*, so that there is a gap between the earplug inner cover 311*a* and the second skirt 316*w*, to prevent the earplug inner cover 311*a* from blocking the front vent 316*x* near the second skirt 316*w*. It may be understood that the second bumps 311*c* may be staggered with the front vent 316*x*, to prevent the second bumps 311*c* from blocking the front vent 316*x*.

As shown in FIG. 122, the earplug outer cover 311*b* surrounds a periphery of the earplug inner cover 311*a*, a lower end of the earplug outer cover 311*b* may surround a periphery of the first part 313*a* of the earphone front housing 313*z*, and first bumps 311*f* on the inner wall of the earplug outer cover 311*b* may also surround the periphery of the first part 313*a*. Designing the first bumps 311*f* may increase structural strength of the earplug outer cover 311*b*, so that when the first earphone 31 is worn by the user, shaking or vibration of the earplug outer cover 311*b* is reduced, thereby reducing a "stethoscope effect".

As shown in FIG. 121, the second electrode 314 is connected to the third part 313*c* of the earphone front housing 313*z* and the earphone rear housing 315*a*.

In this embodiment, the earplug support assembly 316, the earphone front-housing assembly 313, the second electrode 314, and the earphone rear-housing assembly 315 may enclose the inner cavity of the first earphone 31, and the electronic assembly 317 is accommodated in the inner cavity.

In this embodiment, after the first earphone 31 is placed in position in the third accommodation groove 231*f*, the first electrode 312 may be in contact with the first charging spring 231*e* in the third accommodation groove 231*f*, and the second electrode 314 may be in contact with the second charging spring 231*c*, so that the host 2 charges the first earphone 31. Because the first electrode 312 and the second electrode 314 each are of a 360-degree closed ring structure, when the first earphone 31 is placed in the third accommodation groove 231*f* at any angle, the first electrode 312 may always be in contact with the first charging spring 231*e*, and the second electrode 314 may always be in contact with the second charging spring 231*c*, to ensure that the host 2 charges the first earphone 31. Such a structure of the first electrode 312 and the second electrode 314 enables the user to place the first earphone 31 in the third accommodation groove 231*f* at will. This improves user experience.

It is easy to understand that, in another embodiment, one of the first electrode and the second electrode has a 360-degree closed ring structure, and the other electrode is not 360-degree closed, but forms an open ring structure. In this way, it can also be ensured that, on a premise that the first earphone can be charged, the first earphone is randomly placed within a specific angle range.

Figure 123:
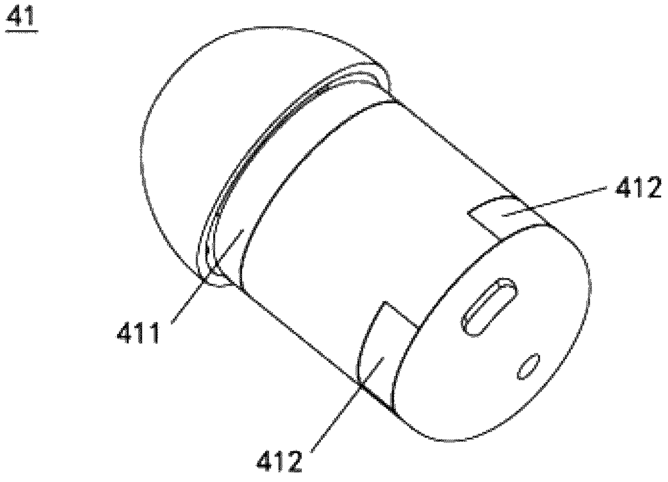

For example, for the first earphone 41 shown in FIG. 123, the first electrode 411 still has a 360-degree closed ring structure, but there are two or more second electrodes 412, the second electrodes 412 are spaced from each other, and the second electrodes 412 may be distributed on a same circle. Each second electrode 412 may be an open ring structure. Alternatively, in another embodiment, there is a single second electrode 412, and the second electrode 412 is an open ring structure with a notch. For example, a surrounding angle of the second electrode 412 may be 120 degrees, 180 degrees, 270 degrees, or the like (but less than 360 degrees).

Alternatively, in another embodiment, neither the first electrode nor the second electrode is 360-degree closed, and the first electrode and the second electrode each are a single open ring structure with a notch. Alternatively, one of the first electrode and the second electrode is a single open ring structure with a notch, and a quantity of the other electrode is at least two, where the at least two electrodes are spaced from each other and distributed on a same circle. Alternatively, there are at least two first electrodes and two second electrodes, and the first electrodes and the second electrodes are spaced from each other and distributed on a same circle. The design may also ensure that, on the premise that the first earphone can be charged, the first earphone can be randomly placed within a specific angle range.

In this embodiment, the first electrode 312 is electrically connected to the first charging spring 231*e*, or the second electrode 314 is electrically connected to the second charging spring 231*c*, and the first electrode 312 or the second electrode 314 may be further configured to implement communication between the first earphone 31 and the host 2. In other words, the first electrode 312 or the second electrode 314 may be further multiplexed as a communication electrode of the first earphone 31, to implement communication between the first earphone 31 and the host 2.

Figure 124:
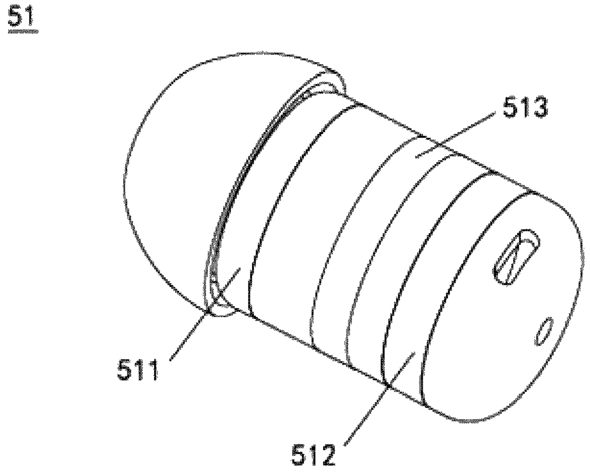

Different from this embodiment, in another embodiment, as shown in FIG. 124, the first earphone 51 may have a first electrode 512 and a second electrode 512, and the first electrode 512 and the second electrode 512 are dedicated to implementing charging of the first earphone 51 by the host. In addition, the first earphone 51 further has a communication electrode 513, and the communication electrode 513 is dedicated to communication with the host. It may be understood that the first electrode 512, the second electrode 512, and the communication electrode 513 shown in FIG. 124 each are of a 360-degree closed ring structure, and this is merely an example. Actually, structures, quantities, and distribution of first electrodes 512, second electrodes 512, and communication electrodes 513 may all be designed based on a product requirement.

Electronic Assembly 317

Figure 125:
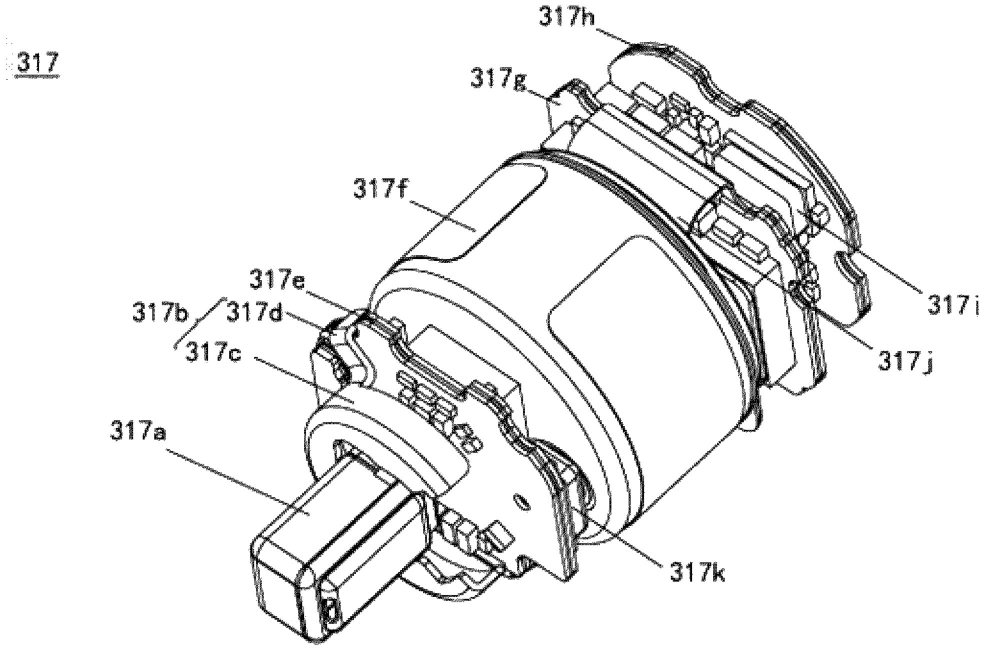
Figure 126:
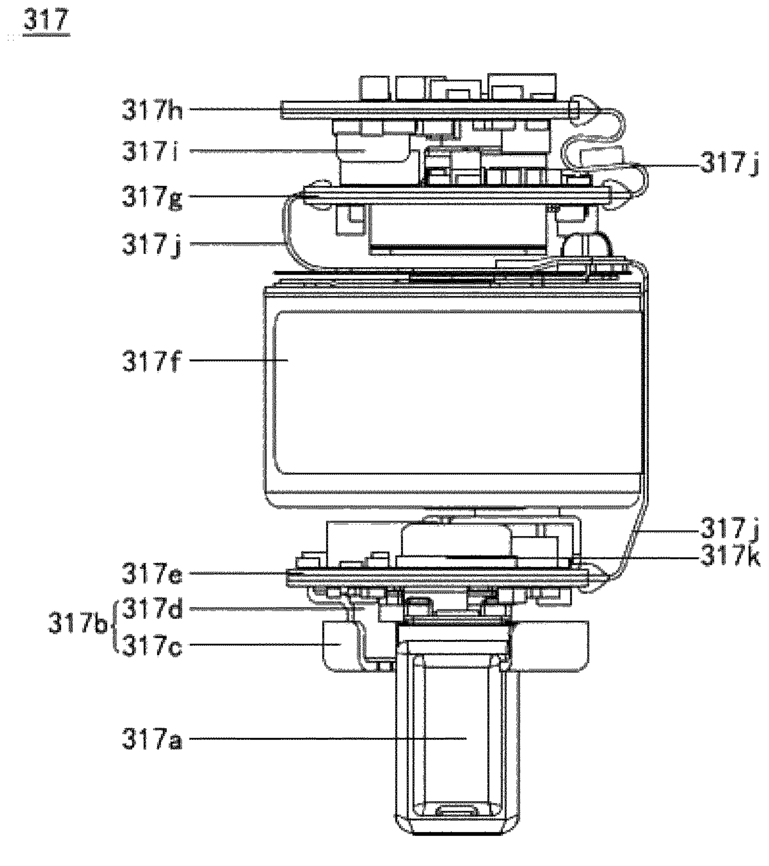

FIG. 125 and FIG. 126 each show a schematic structure of the electronic assembly 317 according to this embodiment. It may be understood that a structure of the electronic assembly 317 to be described below is merely an example, and is not intended to limit embodiments of this application.

As shown in FIG. 125 and FIG. 126, the electronic assembly 317 may include the first earphone circuit board assembly 317*e*, the second earphone circuit board assembly 317*g*, the third earphone circuit board assembly 317*h*, a flexible circuit board 317*j*, a speaker 317*a*, a wearing detection plate 317*b*, a secondary microphone 317*k*, an earphone battery 317*f*, and a primary microphone 317*i*.

First Earphone Circuit Board Assembly 317*e*, Second Earphone Circuit Board Assembly 317*g*, and Third Earphone Circuit Board Assembly 317*h*

The first earphone circuit board assembly 317*e*, the second earphone circuit board assembly 317*g*, and the third earphone circuit board assembly 317*h* are sequentially stacked and spaced from each other, and the three may be electrically connected through the flexible circuit board 317*j*. The first earphone circuit board assembly 317*e*, the second earphone circuit board assembly 317_g_, and the third earphone circuit board assembly 317_h_ each may include a circuit board and a circuit and a component disposed on the circuit board.

For example, a wearing detection sensor may be disposed on the circuit board of the first earphone circuit board assembly 317_e_, and the wearing detection sensor is configured to implement wearing detection of the first earphone 31. The wearing detection sensor may include, for example, at least one of a gravity sensor (gravity sensor, G-sensor), an inertial measurement unit (inertial measurement unit, IMU) sensor, a bone conduction sensor, an infrared (infrared radiation, IR) sensor, a voice accelerometer (voice accelerometer, VACC), a voice pickup unit (voice pickup unit, VPU), and the like. A magnetic field sensor may be further disposed on the circuit board of the first earphone circuit board assembly 317_e_, and the magnetic field sensor is configured to detect a variation of a magnetic flux of a host magnet, to implement box-in and box-out detection of the first earphone 31 (a principle of box-in and box-out detection is further described below). The magnetic field sensor is, for example, a Hall effect sensor or a magnetometer. For example, there may be two magnetic field sensors. For example, a charging circuit and a discharging circuit may be disposed on the circuit board of the second earphone circuit board assembly 317_g_. For example, a radio frequency circuit may be disposed on the circuit board of the third earphone circuit board assembly 317_h_.

Speaker 317_a_

As shown in FIG. 126, the speaker 317_a_ may be electrically connected to the circuit board of the first earphone circuit board assembly 317_e_. The speaker 317_a_ may be located on a side that is of the first earphone circuit board assembly 317_e_ and that is far away from the second earphone circuit board assembly 317_g_.

Wearing Detection Plate 317_b_

As shown in FIG. 125 and FIG. 126, the wearing detection plate 317_b_ may include a plate 317_c_ and a connection pin 317_d_ that are connected, and the connection pin 317_d_ is led out from the plate 317_c_, and may be electrically connected (for example, soldered) to the circuit board of the first earphone circuit board assembly 317_e_. The plate 317_c_ may be located on a same side of the first earphone circuit board assembly 317_e_ as the speaker 317_a_. The wearing detection plate 317_b_ can conduct electricity, for example, may be made of a metal material. When the wearing detection plate 317_b_ is close to the human body, a coupling capacitance can be generated. When a distance between the wearing detection plate 317_b_ and the human body changes, a coupling capacitance value changes. Wearing detection of the first earphone 31 may be implemented through detecting and processing of the coupling capacitance value of the wearing detection plate 317_b_.

Secondary Microphone 317_k_

As shown in FIG. 125 and FIG. 126, the secondary microphone 317_k_ is located on a side that is of the first earphone circuit board assembly 317_e_ and that is far away from the speaker 317_a_, and may be electrically connected to the circuit board of the first earphone circuit board assembly 317_e_. The secondary microphone 317_k_ may be disposed on the circuit board of the first earphone circuit board assembly 317_e_. A through hole may be provided at a part, corresponding to the secondary microphone 317_k_, on the circuit board of the first earphone circuit board assembly 317_e_, and a voice may be picked up by the secondary microphone 317_k_ through the through hole. The secondary microphone 317_k_ is configured to implement noise reduction, and may be further configured to perform wearing detection.

Earphone Battery 317_f_

As shown in FIG. 125 and FIG. 126, the earphone battery 317_f_ may be located between the first earphone circuit board assembly 317_e_ and the second earphone circuit board assembly 317_g_. An electrode pin of the earphone battery 317_f_ may be electrically connected to the circuit board of the first earphone circuit board assembly 317_e_.

Primary Microphone 317_i_

As shown in FIG. 125 and FIG. 126, the primary microphone 317_i_ may be located between the second earphone circuit board assembly 317_g_ and the third earphone circuit board assembly 317_h_, and may be electrically connected to the circuit board of the third earphone circuit board assembly 317_h_. The primary microphone 317_i_ may be disposed on the circuit board of the third earphone circuit board assembly 317_h_. A through hole may be provided at a part, corresponding to the primary microphone 317_i_, on the circuit board of the third earphone circuit board assembly 317_h_, and a human voice may be picked up by the primary microphone 317_i_ through the through hole.

Figure 127:
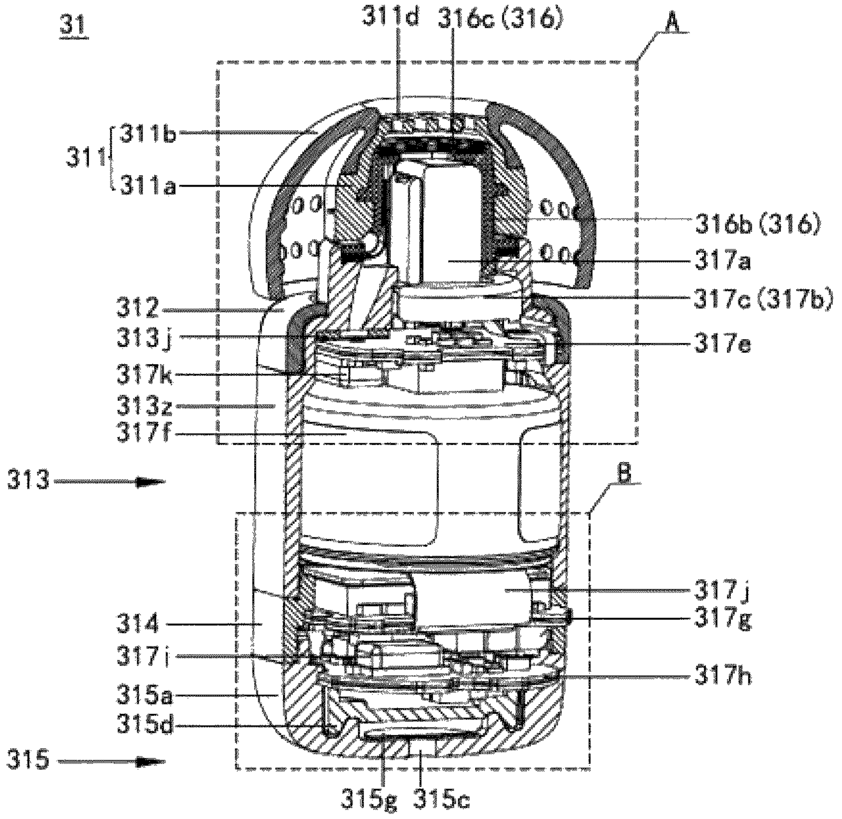
Figure 128:
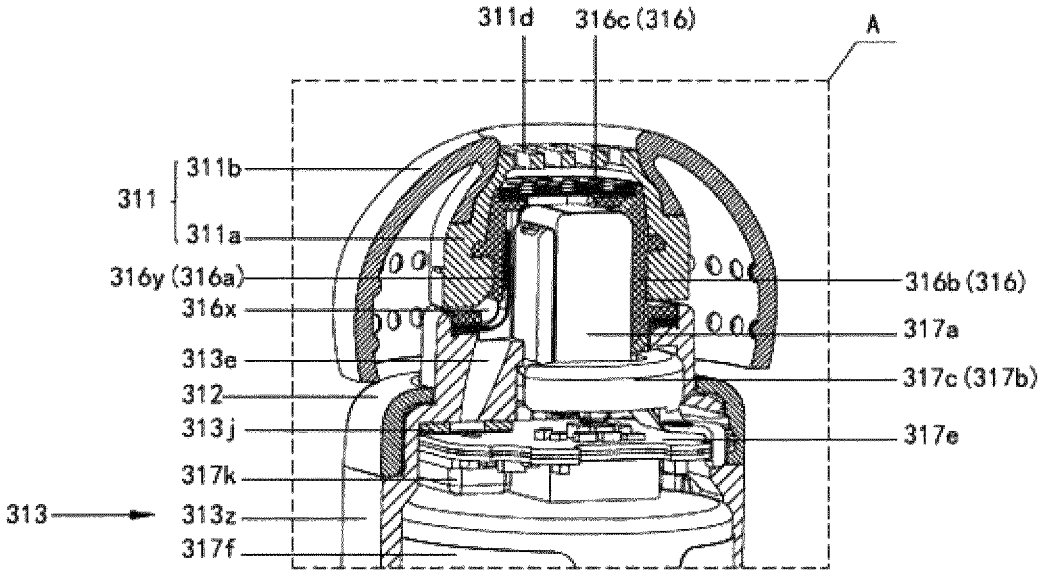
Figure 129:
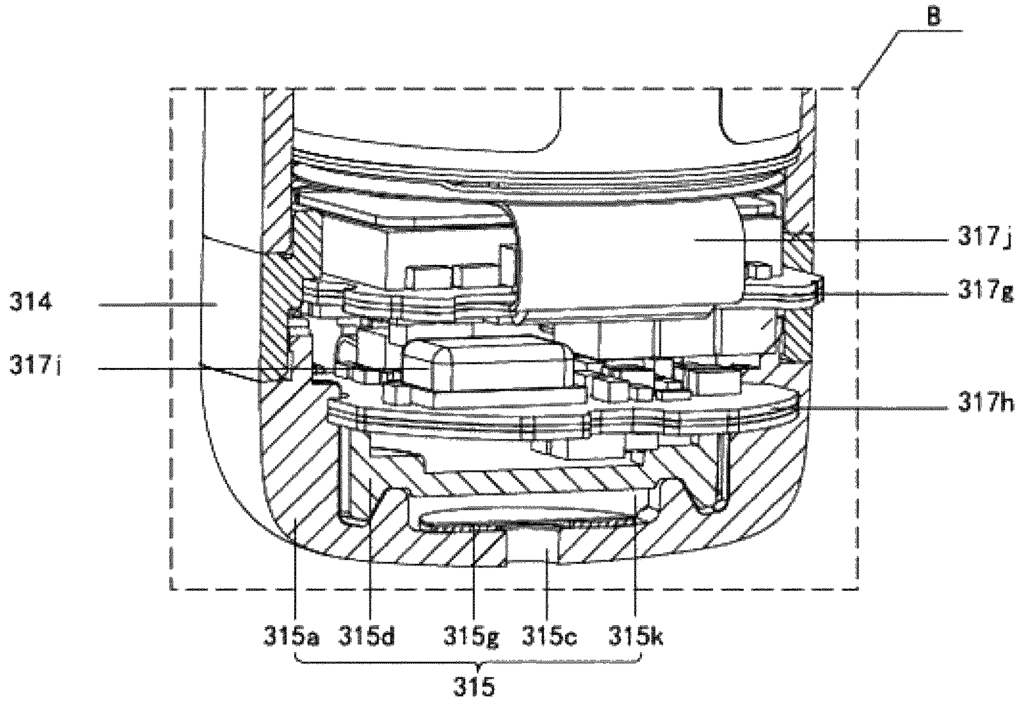

FIG. 127 shows an assembly structure including the electronic assembly 317 and another component of the first earphone 31. FIG. 128 is a partially enlarged view at a position A in FIG. 127, and FIG. 129 is a partially enlarged view at a position B in FIG. 127.

As shown in FIG. 127, the electronic assembly 317 may be accommodated in an inner cavity enclosed by the earplug support assembly 316, the earphone front-housing assembly 313, the second electrode 314, and the earphone rear-housing assembly 315.

As shown in FIG. 128, at least a part of the speaker 317_a_ may be located in an inner cavity of the earplug support 316_b_. A sound wave emitted by the speaker 317_a_ may be transmitted through the speaker mesh 316_c_ and the voice-emitting through hole 311_d_, and enter the ear canal. Because of the front vent 316_x_, atmospheric pressure in the inner cavity of the earplug support 316_b_ is balanced with external atmospheric pressure, to ensure that the speaker 317_a_ can normally work. In addition, the front vent 316_x_ can also improve a noise reduction depth of the secondary microphone 317_k_.

As shown in FIG. 128, for example, the plate 317_c_ of the wearing detection plate 317_b_ may be fixedly connected (for example, soldered) to an end that is of the earplug support 316_b_ and that is far away from the speaker mesh 316_c_, and the wearing detection plate 317_b_ and the earplug support 316_b_ may be connected to form a conductor having a large area. Therefore, both the wearing detection plate 317_b_ and the earplug support 316_b_ may generate coupling capacitances, so that the wearing detection plate 317_b_ and the earplug support 316_b_ may be used for wearing detection. In other words, in addition to providing support and accommodating functions, the earplug support 316_b_ may be further reused as a detection plate for wearing detection.

It may be understood that, based on a product requirement, the assembly structure including the wearing detection plate and the earplug support may alternatively be in another form, and is not limited to the foregoing descriptions. For example, if only a part of the earplug support is made of a conductive material, the wearing detection plate may be fixedly connected to the part of the earplug support, and the assembly structure including the wearing detection plate and the earplug support may be designed based on respective structures of the wearing detection plate and the earplug support and an inner space of the first earphone.

In this embodiment, the wearing detection plate 317*b* and the earplug support 316*b* are jointly used as a detection plate for wearing detection, so that an area of the detection plate can be increased, and consistency and reliability of wearing detection can be ensured. Because the earplug support 316*b* is closer to the inside of the ear canal than the wearing detection plate 317*b*, capacitance detection data of the earplug support 316*b* is more accurate and reliable. This helps improve overall reliability of wearing detection. In addition, when the earplug support 316*b* is reused as a detection plate for wearing detection, an overall size of the first earphone 31 is not affected, and a stacking space inside the first earphone 31 can be further reduced.

In addition, if the earplug support 316*b* is made of a material with high strength like metal, a wall thickness and an overall structural size of the earplug support 316*b* may be small on a premise that structural strength of the earplug support 316*b* meets a requirement. This can enable the earplug outer cover 311*b* to have an adequate compression deformation space, thereby helping ensure wearing comfort of the user.

In this embodiment, for example, the wearing detection sensor, the wearing detection plate 317*b*, and the earplug support 316*b* may be jointly used to implement wearing detection. This design can greatly improve consistency and reliability of wearing detection, and reduce a probability of false detection.

Based on a product requirement, in another embodiment, any one or any two of the wearing detection sensor, the wearing detection plate 317*b*, and the earplug support 316*b* may alternatively be used to implement wearing detection.

As shown in FIG. 128, the first earphone circuit board assembly 317*e* may be located in the earphone front housing 313*z*. With reference to FIG. 102, FIG. 87, FIG. 88, and FIG. 128, the conduction portion 312*b* of the first electrode 312 may pass through the through hole 313*d* of the earphone front housing 313*z*, and is electrically connected (for example, soldered) to the circuit board of the first earphone circuit board assembly 317*e*, so that the first electrode 312 serves as a charging electrode.

As shown in FIG. 128, one side of the circuit board of the first earphone circuit board assembly 317*e* may be attached to the noise reduction microphone mesh 313*j*. The secondary microphone 317*k* is located on the other side of the circuit board, and the secondary microphone 317*k* may correspond to the noise reduction microphone mesh 313*j*. Noise in the ear canal may sequentially pass through the speaker mesh 316*c*, the voice pickup channel 313*e*, the noise reduction microphone mesh 313*j*, and the through hole that is on the circuit board of the first earphone circuit board assembly 317*e* and that corresponds to the secondary microphone 317*k*, and be picked up by the secondary microphone 317*k*. The speaker 317*a* may generate a phase-inverted signal whose phase is opposite to a phase of the noise signal, and the phase-inverted signal may cancel the noise signal. In this way, the first earphone 31 can implement active noise reduction.

When the first earphone 31 works, a voice of the speaker 317*a* and the noise in the ear canal may pass through the front vent acoustic mesh 316*a*, and leak to the outside through the front vent 316*x*. In this way, pressure inside and outside the ear canal can be balanced, to improve wearing comfort of the user. The front vent acoustic mesh 316*a* that blocks the front vent 316*x* may alternatively be removed. In this case, the front vent 316*x* may be made smaller. For example, a diameter of the front vent 316*x* is less than 0.22 mm.

In addition, the secondary microphone 317*k* may also be used for wearing detection, and a principle is that the speaker 317*a* may send a sound wave signal of a specific frequency. If the first earphone 31 is not worn by the user, a large quantity of sound wave signals may be leaked to the outside through the front vent 316*x*, and signal strength of the sound wave signals picked up by the secondary microphone 317*k* is low. If the first earphone 31 is worn by the user, because the front vent 316*x* is blocked to an extent or completely, the secondary microphone 317*k* can pick up more sound wave signals, and signal strength of the sound wave signals picked up by the secondary microphone 317*k* is high. Therefore, whether the first earphone 31 is worn by the user may be determined through detection on signal strength of a signal picked up by the secondary microphone 317*k*.

As shown in FIG. 129, the second earphone circuit board assembly 317*g* may be located on an inner side of the second electrode 314. With reference to FIG. 111 and FIG. 129, the conduction portion 314*c* of the second electrode 314 may be electrically connected (for example, soldered) to the circuit board of the second earphone circuit board assembly 317*g*, so that the second electrode 314 serves as a charging electrode.

As shown in FIG. 129, the third earphone circuit board assembly 317*h* may be carried on the rear housing support 315*d*. With reference to FIG. 129 and FIG. 120, a side that is of the third earphone circuit board assembly 317*h* and that is far away from the primary microphone 317*i* may be attached to the second primary microphone mesh 315*e*. The primary microphone 317*i* may correspond to the second primary microphone mesh 315*e*. A voice emitted by the user may sequentially pass through the voice pickup through hole 315*c*, the first primary microphone mesh 315*g*, the through hole 315*j* on the rear housing support 315*d*, the second primary microphone mesh 315*e*, and the through hole that is on the circuit board of the third earphone circuit board assembly 317*h* and that corresponds to the primary microphone 317*i*, and be picked up by the primary microphone 317*i*.

With reference to FIG. 129 and FIG. 120, after entering a wind noise prevention cavity 315*k* from one wind noise prevention through hole 315*b*, an external airflow may flow out of the wind noise prevention cavity 315*k* from another wind noise prevention through hole 315*b*. In this way, wind noise caused by the external airflow can be reduced or prevented from being picked up by the primary microphone 317*i*.

With reference to FIG. 116 and FIG. 129, the head end 315*z*1 and the head end 315*y*1 of the antenna 315*f* each are connected to, for example, soldered, a feeding point on the circuit board of the third earphone circuit board assembly 317*h*. The two feeding points may be symmetrical with respect to the center line of the first earphone 31. In this way, the antenna 315*f* can radiate and receive signals.

Features and Functions of the Wearable Device 1

In this embodiment, because the wearable device 1 includes the host 2 and the earphone, the wearable device 1 may have the following features and functions. For some features or functions that the host 2 and the earphone both have, because the first earphone (for example, the first earphone 31, the first earphone 41, and the first earphone 51) is completely the same as the second earphone, for brevity, the first earphone 31 is mainly used as an example for description.

1. When the Host 2 is Opened, the First Earphone 31 is Attached to the First Part 21 of the Host 2.

With reference to FIG. 1 and FIG. 4, in this embodiment, when the host 2 is in the closed state, the first earphone 31 is accommodated in a space enclosed by the first accommodation groove 213*y* of the first part 21 and the third accommodation groove 231*f* of the second part 23.

Figure 130:
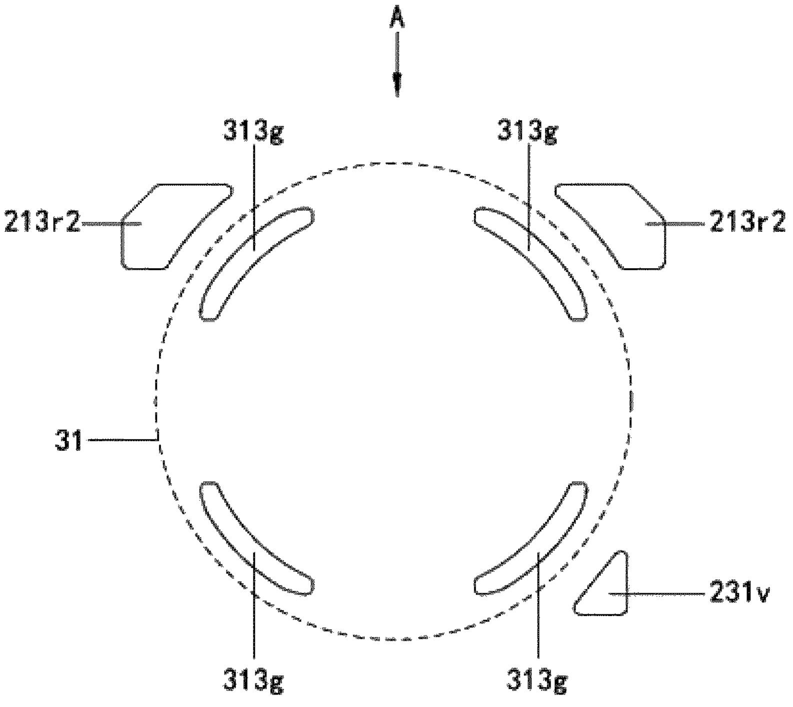

FIG. 130 shows, from a side-view perspective, a position relationship between the first host attachment magnet 213*r*2 in the first part 21, the second host attachment magnet 231*v* in the second part 23, and the earphone magnet 313*g* in the first earphone 31 when the host 2 is in the closed state. As shown in FIG. 130, the first host attachment magnet 213*r*2 and the second host attachment magnet 231*v* each are magnetically attached to the earphone magnet 313*g*.

In this embodiment, a magnetic field of the first host attachment magnet 213*r*2 is strong, and a magnetic attraction force between the first host attachment magnet 213*r*2 and the earphone magnet 313*g* is large; and a magnetic field of the second host attachment magnet 231*v* is weak, and a magnetic attraction force between the second host attachment magnet 231*v* and the earphone magnet 313*g* is small. As shown in FIG. 1 to FIG. 4, when the host 2 is gradually opened from the closed state, because the magnetic attraction force of the first host attachment magnet 213*r*2 is greater than the magnetic attraction force of the second host attachment magnet 231*v*, the first earphone 31 is attached to the first part 21, and rotates with the first part 21 relative to the second part 23.

In this embodiment, an appropriate magnet design may be performed, to enable a strong magnetic attraction force between the first host attachment magnet 213*r*2 and the earphone magnet 313*g*.

Figure 131:
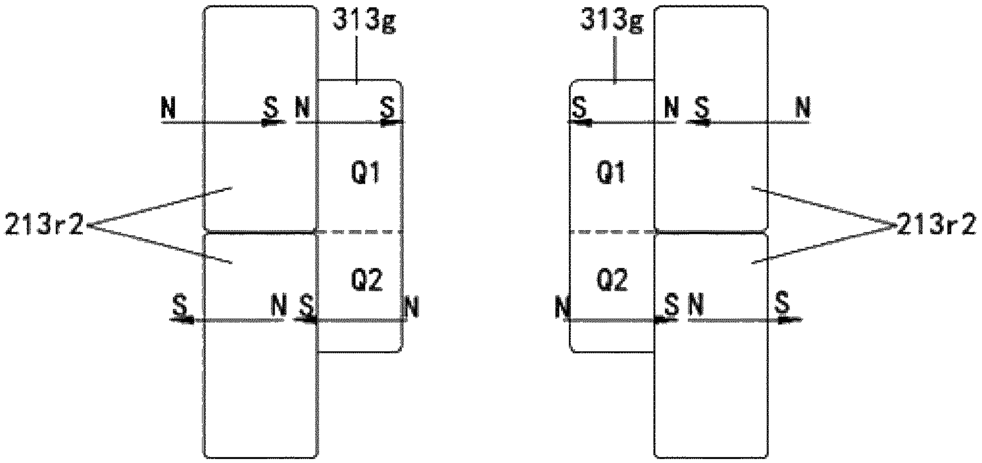

As shown in FIG. 131, in the implementation 1 of this embodiment, each first host attachment magnet 213*r*2 is a Halbach array formed by splicing two single magnets, and magnetic field directions (represented by using arrows pointing from N to S) of the two single magnets are different, so that each first host attachment magnet 213*r*2 has two magnetic field directions. With reference to FIG. 131 and FIG. 130, schematically, in each first host attachment magnet 213*r*2, a magnetic field direction of one single magnet (for example, a single magnet in an upper part in FIG. 131) roughly points from a radial outer side of the first earphone 31 to a radial inner side, and a magnetic field direction of the other single magnet (for example, a single magnet in a lower part in FIG. 131) roughly points from the radial inner side of the first earphone 31 to the radial outer side.

As shown in FIG. 131, each earphone magnet 313*g* may be a Halbach array formed by a single magnet, and different parts of each earphone magnet 313*g* may have different magnetic field directions. With reference to FIG. 131 and FIG. 130, schematically, a magnetic field direction of a part Q1 of each earphone magnet 313*g* roughly points from the radial outer side of the first earphone 31 to the radial inner side, and a magnetic field direction of the other part Q2 roughly points from the radial inner side of the first earphone 31 to the radial outer side. A design in which each earphone magnet 313*g* is a single magnet can reduce assembly difficulty of the earphone magnet 313*g*. In another implementation, each earphone magnet 313*g* may alternatively be formed by splicing several (for example, two) single magnets.

The design of the first host attachment magnet 213*r*2 and the earphone magnet 313*g* enables the first host attachment magnet 213*r*2 and the earphone magnet 313*g* to be magnetically attached. In addition, through product verification, this design enables a large magnetic attraction force between the first host attachment magnet 213*r*2 and the earphone magnet 313*g*.

Different from that in the implementation 1, as shown in FIG. 132, in the implementation 2 of this embodiment, each first host attachment magnet 213*r*2 is a Halbach array having four magnetic field directions. Each first host attachment magnet 213*r*2 may be formed by splicing four single magnets, or may be a single magnet having four magnetic field directions. The magnet design in the implementation 2 can meet a design requirement that the first earphone 31 is magnetically attached to the first part 21.

Different from that in the implementation 1, as shown in FIG. 133, in the implementation 3 of this embodiment, each first host attachment magnet 213*r*2 is a single magnet having a single magnetic field direction. For example, the magnetic field direction of each first host attachment magnet 213*r*2 may roughly point from the radial inner side of the first earphone 31 to the radial outer side. Each earphone magnet 313*g* is a single magnet having a single magnetic field direction. For example, the magnetic field direction of each earphone magnet 313*g* may roughly point from the radial inner side of the first earphone 31 to the radial outer side. The magnet design in the implementation 3 can meet a design requirement that the first earphone 31 is magnetically attached to the first part 21.

Different from that in the implementation 1, as shown in FIG. 134, in an implementation 4 of this embodiment, each first host attachment magnet 213*r*2 is a Halbach array having three magnetic field directions. Each first host attachment magnet 213*r*2 may be formed by splicing three single magnets, or may be a single magnet having three magnetic field directions. Each earphone magnet 313*g* may have a single magnetic field direction. In addition, the first electrode 312 and the second electrode 314 may be made of a material that can be magnetically attached by the first host attachment magnet 213*r*2, for example, a magnetic conductive material (for example, steel plate cold common (steel plate cold common, SPCC) or SUS430). Both the first electrode 312 and the second electrode 314 may be magnetically attached to the first host attachment magnet 213*r*2. The magnet design in the implementation 4 can not only meet a design requirement that the first earphone 31 is magnetically attached to the first part 21, but also has a simple design structure, is easy to be manufactured, and has low costs.

Alternatively, different from that in the implementations, in an implementation 5, the first earphone 31 may not need to have a built-in earphone magnet. The first electrode 312 and the second electrode 314 may be made of a material that can be magnetically attached by the first host attachment magnet 213*r*2, for example, a magnetic conductive material (for example, SPCC or SUS430). As shown in FIG. 135, both the first electrode 312 and the second electrode 314 may be magnetically attached to the first host attachment magnet 213*r*2. In the implementation 5, the first host attachment magnet 213*r*2 may be flexibly designed based on a requirement, and may have a single magnetic field direction or several magnetic field directions. The magnet design in the implementation 5 can not only meet a design requirement that the first earphone 31 is magnetically attached to the first part 21, but also has a simple design structure, is easy to be manufactured, and has low costs.

In this embodiment, as shown in FIG. 136, because the radial size of the first earphone 31 may be at least twice the groove depth of the first accommodation groove 213*y*, a majority of the first earphone 31 is exposed outside the first accommodation groove 213*y*. This design is convenient for the user to directly take the first earphone 31 from the first part 21 after the host 2 is opened.

In the foregoing implementations, the magnet design of the first host attachment magnet 213*r*2 and the earphone magnet 313*g* is described. Actually, a magnet design may also be performed on the second host attachment magnet 231*v* and the earphone magnet 313*g* with reference to the foregoing principle, provided that magnetic field strength of the second host attachment magnet 231*v* is less than magnetic field strength of the first host attachment magnet 213*r*2.

It may be understood from the foregoing descriptions that, based on a product requirement, in another embodiment, magnetic field strength of the first host attachment magnet 213*r*2 may alternatively be less than magnetic field strength of the second host attachment magnet 231*v*, so that after the host 2 is opened, the first earphone 31 is not sucked up by the first part 21, but is still accommodated in the second part 23. Alternatively, no first accommodation groove is provided on the first part of the host, and the first earphone may be attached to the first part after the host is opened.

2. When the First Earphone 31 is Placed on the First Part 21, the First Earphone 31 May be Automatically Placed in Position.

As shown in FIG. 137, FIG. 138, and FIG. 139, after the host 2 is opened and the first earphone 31 is taken out from the host 2, the user may pick up the first earphone 31 and enable the first earphone 31 to be in a posture roughly matching the first accommodation groove 213*y* (to be specific, the earplug 311 of the first earphone 31 roughly faces an end that is of the first accommodation groove 213*y* and that is used to accommodate the earplug 311, the earphone rear-housing assembly 315 of the first earphone 31 roughly faces an end that is of the first accommodation groove 213*y* and that is used to accommodate the earphone rear-housing assembly 315, and the first earphone 31 may rotate around the center line of the first accommodation groove 213*y* at any angle), and then put the first earphone 31 close to the first accommodation groove 213*y*. Under an effect of the magnetic attraction force of the first host attachment magnet 213*r*2 in the first part 21 on the earphone magnet 313*g* in the first earphone 31, the first earphone 31 is corrected to a posture matching the first accommodation groove 213*y*, and is automatically attached in the first accommodation groove 213*y*, so that the first earphone 31 can be accurately and appropriately placed in the first accommodation groove 213*y*.

According to the automatic in-position design in this embodiment, the user can conveniently place the first earphone 31 on the host 2, and the placement can be completed without precise alignment, thereby improving user experience.

3. When the First Earphone 31 is Placed in the Second Part 23, and the First Earphone 31 is not Easy to be Separated from the Second Part 23.

If the user places the first earphone 31 in the third accommodation groove 231*f* of the second part 23, the first earphone 31 is attached in the third accommodation groove 231*f* under an effect of the magnetic attraction force of the second host attachment magnet 231*v* in the second part 23 on the earphone magnet 313*g* in the first earphone 31. Even if the host 2 is turned over, the first earphone 31 is not detached from the third accommodation groove 231*f*.

In addition, both the second charging spring 231*c* and the first charging spring 231*e* in the third accommodation groove 231*f* may apply specific extrusion pressure to the first earphone 31, and the extrusion pressure can increase friction between the first earphone 31 and the second host housing 231 in the second part 23, so that it is more difficult for the first earphone 31 to be detached from the third accommodation groove 231*f*.

4. The First Earphone 31 May be Placed in the Accommodation Groove at a Random Angle.

In this embodiment, the first earphone 31 can overlap the first earphone 31 each time the first earphone 31 is rotated around the center line of the first earphone 31 by a specific angle. Therefore, the rotated first earphone 31 can always be accurately accommodated in the first accommodation groove 213*y* or the third accommodation groove 231*f*, and adapt to the inner wall of the first accommodation groove 213*y* or the third accommodation groove 231*f*. This enables the user to place the first earphone 31 into the first accommodation groove 213*y* or the third accommodation groove 231*f* without holding the first earphone 31 at a fixed angle.

For example, for the first earphone 31 that is roughly an octahedron, the first earphone 31 can overlap the first earphone 31 each time the first earphone 31 is rotated around the center line of the first earphone 31 by 90°. Even if the user rotates the first earphone 31 by 90°, 180°, 270°, or the like, the first earphone 31 can still adapt to the inner wall of the first accommodation groove 213*y* or the third accommodation groove 231*f*. Therefore, the first earphone 31 can be smoothly and accurately placed in the first accommodation groove 213*y* or the third accommodation groove 231*f*. In addition, as shown in FIG. 137 to FIG. 139, when the first earphone 31 is placed in the first accommodation groove 213*y*, because the magnetic force of the first host attachment magnet 213*r*2 has an angle correction function, even if the user rotates the first earphone 31 randomly (for example, rotates by 10°, 35°, or 55°), the magnetic force of the first host attachment magnet 213*r*2 can correct an angle of the first earphone 31 to a normal angle. In this way, the first earphone 31 can be smoothly and accurately placed in the first accommodation groove 213*y*, and adapt to the inner wall of the first accommodation groove 213*y*.

For example, for the first earphone 31 that is roughly cylindrical, the first earphone 31 can overlap the first earphone 31 after being rotated around the center line of the first earphone 31 by any angle. Therefore, even if the user rotates the first earphone 31 by any angle, the first earphone 31 can still adapt to the inner wall of the first accommodation groove or the third accommodation groove. Therefore, the first earphone 31 can be smoothly and accurately placed in the first accommodation groove or the third accommodation groove.

5. Detection of the Open/Closed State of the Host 2

As shown in FIG. 140, the first part 21 of the host 2 has a magnetic field sensor 212*g* (which may be referred to as a first magnetic field sensor), and the magnetic field sensor 212*g* may be, for example, disposed on the circuit board 212*a* in the first part 21. The magnetic field sensor 212*g* is configured to detect a magnetic flux of the status detection magnet 231*x* in the second part 23 of the host 2. The magnetic flux of the status detection magnet 231*x* detected by the magnetic field sensor 212*g* may be in direct proportion to a spacing between the magnetic field sensor 212*g* and the status detection magnet 231*x*. When the host 2 is in the closed state, the magnetic flux detected by the magnetic field sensor 212*g* is the largest. When the host 2 is completely opened, the magnetic flux detected by the magnetic field sensor 212*g* is the smallest.

In this embodiment, the magnetic field sensor 212*g* may be, for example, a Hall effect sensor or a magnetometer. The Hall effect sensor can detect a change of the magnetic flux.

When the Hall effect sensor detects that the magnetic flux exceeds a hardware threshold of the Hall effect sensor, the Hall effect sensor can generate a corresponding signal and report the signal to a processor of the host 2. The processor of the host 2 may perform corresponding processing based on the signal of the Hall effect sensor. Different from the Hall effect sensor, the magnetometer can detect a value of the magnetic flux and report the value to the processor of the host 2. The processor of the host 2 may determine whether the magnetic flux detected by the magnetometer exceeds a software threshold built in the processor, and perform corresponding processing based on a determining result. The following uses an example in which the magnetic field sensor 212*g* is a Hall effect sensor for description.

As shown in FIG. 140, after the user presses the cap 251, the host 2 is gradually opened from the closed state, the spacing between the magnetic field sensor 212*g* and the status detection magnet 231*x* gradually increases, and the magnetic flux of the status detection magnet 231*x* detected by the magnetic field sensor 212*g* tends to decrease. When the magnetic flux detected by the magnetic field sensor 212*g* is less than a first threshold, a first signal may be generated. The processor of the host 2 determines, based on the first signal, that the host 2 is in the open state.

On the contrary, when the host 2 is gradually closed from the open state, the spacing between the magnetic field sensor 212*g* and the status detection magnet 231*x* gradually decreases, and the magnetic flux of the status detection magnet 231*x* detected by the magnetic field sensor 212*g* tends to increase. When the magnetic flux detected by the magnetic field sensor 212*g* is greater than a second threshold, a second signal may be generated. The processor of the host 2 determines, based on the second signal, that the host 2 is in the closed state.

In this embodiment, when the processor of the host 2 determines that the host 2 is in the open state, the processor controls the display 211 to perform corresponding interface display.

In this embodiment, when it is determined that the host 2 is in the open state and the first earphone 31 is in the third accommodation groove 231*f* (the following describes how to detect whether the first earphone 31 is located in the third accommodation groove 231*f*), the communication electrode of the host 2 may send a signal to the communication electrode of the first earphone 31, to wake up the first earphone 31. When it is determined that the host 2 is in the closed state and the first earphone 31 is located in the host 2, the host 2 may start foreign matter detection, and after determining that no foreign matter enters, start charging the first earphone 31. In another embodiment, positions of the magnetic field sensor 212*g* and the status detection magnet 231*x* may be exchanged. To be specific, the magnetic field sensor 212*g* may be in the second part 23, and the status detection magnet 231*x* may be in the first part 21.

6. Detection of an In-Box/Out-Box State of the First Earphone 31

The in-box/out-box state of the first earphone 31 is a relative position relationship between the first earphone 31 and the first accommodation groove 213*y* and a relative position relationship between the first earphone 31 and the third accommodation groove 231*f*, and includes: The first earphone 31 is in the first accommodation groove 213*y* and in the third accommodation groove 231*f* (the host 2 is closed and the first earphone 31 is in the host 2); the first earphone 31 is located in the first accommodation groove 213*y* and outside the third accommodation groove 231*f* (the host 2 is opened and the first earphone 31 is attached to the first part 21); or the first earphone 31 is located in the third accommodation groove 231*f* and outside the first accommodation groove 213*y* (the host 2 is opened and the first earphone 31 is attached to the second part 23).

In this embodiment, both the host 2 and the first earphone 31 may detect the in-box/out-box state of the first earphone 31. Descriptions are sequentially provided below.

(1) The Host 2 Detects the In-Box/Out-Box State of the First Earphone 31.

As shown in FIG. 141, the second part 23 of the host 2 has a magnetic field sensor 237 and a magnetic field sensor 238 (both may be referred to as second magnetic field sensors, as shown in dashed boxes). The magnetic field sensor 237 may be close to an outer surface of the groove wall of the third accommodation groove 231*f*, and the magnetic field sensor 238 may be close to an outer surface of the groove wall of the fourth accommodation groove 231*g*. The magnetic field sensor 237 and the magnetic field sensor 238 each may be, for example, a single-axis Hall effect sensor or a magnetometer. The following uses an example in which the magnetic field sensor 237 and the magnetic field sensor 238 each are a Hall effect sensor for description.

The magnetic field sensor 237 is configured to detect a change of a magnetic flux of the earphone magnet 313*g* in the first earphone 31. The magnetic flux of the earphone magnet 313*g* detected by the magnetic field sensor 237 may be in direct proportion to a distance between the magnetic field sensor 237 and the earphone magnet 313*g*. When the first earphone 31 is located in the third accommodation groove 231*f* (which may be that the host 2 is closed and the first earphone 31 is in the host 2, or the host 2 is opened and the first earphone 31 is attached to the second part 23), the magnetic flux detected by the magnetic field sensor 237 is large. When the first earphone 31 leaves the third accommodation groove 231*f* and is attached to the first part 21, the magnetic flux detected by the magnetic field sensor 237 is small.

In this embodiment, when the magnetic flux detected by the magnetic field sensor 237 is greater than or equal to a third threshold, a third signal may be generated. The processor of the host 2 determines, based on the third signal, that the first earphone 31 is located in the third accommodation groove 231*f*.

In this embodiment, the processor of the host 2 may determine the in-box/out-box state of the first earphone 31 by combining the third signal sent by the magnetic field sensor 237 and the first signal or the second signal sent by the magnetic field sensor 212*g*. For example, when the processor receives the third signal and the first signal, the processor determines that the host 2 is opened and the first earphone 31 is attached to the second part 23. When the processor receives the third signal and the second signal, the processor determines that the host 2 is closed and the first earphone 31 is in the host 2.

When the magnetic flux detected by the magnetic field sensor 237 is less than the third threshold but is greater than or equal to a fourth threshold, a fourth signal may be generated. The processor of the host 2 determines, based on the fourth signal, that the first earphone 31 leaves the third accommodation groove 231*f* and is attached to the first part 21 (as shown in FIG. 141).

Similarly, the magnetic field sensor 238 is configured to detect a change of a magnetic flux of the earphone magnet in the second earphone 32. As described above, the host 2 may determine an in-box/out-box state of the second earphone 32 by using a signal sent by the magnetic field sensor 238 or by combining signals sent by the magnetic field sensor 238 and the magnetic field sensor 212g.

In conclusion, it is easily understood that the magnetic field sensor 237 located in the second part 23 is configured to determine whether the first earphone 31 is in the third accommodation groove 231f or outside the third accommodation groove 231f. Similarly, the magnetic field sensor 238 located in the second part 23 is configured to detect whether the second earphone 32 is in the fourth accommodation groove 231g or outside the fourth accommodation groove 231g.

In another embodiment, at least one of the magnetic field sensor 237 and the magnetic field sensor 238 may alternatively be located in the first part 21 of the host 2. For example, the magnetic field sensor 237 may be located in the first part 21 (for example, close to the outer surface of the groove wall of the first accommodation groove 213y). The change of the magnetic flux of the earphone magnet 313g in the first earphone 31 may be detected through the magnetic field sensor 237, to determine whether the first earphone 31 is in the first accommodation groove 213y or outside the first accommodation groove 213y. A specific principle is the same as that described above. Details are not described herein again.

In this embodiment, when the host 2 determines that the first earphone 31 is in the third accommodation groove 231f and the host 2 is in the open state, the communication electrode of the host 2 may send a signal to the communication electrode of the first earphone 31, to wake up the first earphone 31. The host 2 may further charge the first earphone 31 through the first charging spring 231e and the second charging spring 231c. In addition, the host 2 may further start a charging overheat protection mechanism (descriptions are provided below). Based on a product requirement, alternatively, the first earphone 31 may not need to be charged and the charging overheat protection mechanism may not be started.

In this embodiment, when the host 2 determines that the first earphone 31 is in the host 2 and the host 2 is in the closed state, the host 2 may start a foreign matter detection mechanism (descriptions are provided below), and may further charge the first earphone 31 and start the charging overheat protection mechanism. Based on a product requirement, alternatively, the first earphone 31 may not need to be charged and the charging overheat protection mechanism may not be started.

In another embodiment, when the host 2 determines that the first earphone 31 is in the first accommodation groove 213y and the host 2 is in the open state, the first earphone 31 is woken up (a principle is described below).

(2) The First Earphone 31 Detects the In-Box/Out-Box State of the First Earphone 31.

As shown in FIG. 142, the first earphone 31 may have a magnetic field sensor 317z (which may be referred to as a third magnetic field sensor, as represented by a dashed box), and the magnetic field sensor 317z may be, for example, disposed on the circuit board of the third earphone circuit board assembly 317h. The magnetic field sensor 317z may be, for example, a Hall effect sensor or a magnetometer. The following uses an example in which the magnetic field sensor 317z is a Hall effect sensor for description.

The magnetic field sensor 317z is configured to detect a change of a magnetic flux of the status detection magnet 231x in the second part 23 of the host 2. The magnetic flux of the status detection magnet 231x detected by the magnetic field sensor 317z may be in direct proportion to a spacing between the magnetic field sensor 317z and the status detection magnet 231x. When the first earphone 31 is located in the third accommodation groove 231f (which may be that the host 2 is closed and the first earphone 31 is in the host 2, or the host 2 is opened and the first earphone 31 is attached to the second part 23), the magnetic flux detected by the magnetic field sensor 317z is large. When the first earphone 31 leaves the third accommodation groove 231f and is attached to the first part 21, the magnetic flux detected by the magnetic field sensor 317z is small.

In this embodiment, when the magnetic flux detected by the magnetic field sensor 317z is greater than or equal to a fifth threshold, a sixth signal may be generated. A controller of the first earphone 31 determines, based on the sixth signal, that the first earphone 31 is located in the third accommodation groove 231f.

In this embodiment, the controller (which may be a central processing unit or a microcontroller unit (microcontroller unit, MCU)) of the first earphone 31 may determine the in-box/out-box state of the first earphone 31 by combining the sixth signal sent by the magnetic field sensor 317z and the first signal or the second signal (the first signal and the second signal may be transmitted through the communication electrode of the host 2 and the communication electrode of the first earphone 31) sent by the magnetic field sensor 212g. For example, when the controller receives the sixth signal and the first signal, the controller determines that the host 2 is opened and the first earphone 31 is attached to the second part 23. When the controller receives the sixth signal and the second signal, the controller determines that the host 2 is closed and the first earphone 31 is in the host 2.

When the magnetic flux detected by the magnetic field sensor 317z is less than the fifth threshold but is greater than or equal to the sixth threshold, a seventh signal may be generated. The controller of the first earphone 31 determines, based on the seventh signal, that the first earphone 31 leaves the third accommodation groove 231f and is attached to the first part 21.

As shown in FIG. 142, the second earphone 32 may also have a magnetic field sensor 327z (represented by a dashed box), and the magnetic field sensor 327z is configured to detect a change of a magnetic flux of the magnet 231w in the second part 23. The magnetic field sensor 327z may be, for example, a single-axis Hall effect sensor. As described above, the second earphone 32 may determine the in-box/out-box state of the second earphone 32 by using a signal sent by the magnetic field sensor 327z or by combining signals sent by the magnetic field sensor 327z and the magnetic field sensor 212g.

In this embodiment, the first earphone 31 detects the in-box/out-box state of the first earphone 31, so that the first earphone 31 performs a corresponding operation.

If the host 2 is in the closed state, and the first earphone 31 detects that the first earphone 31 is located in the third accommodation groove 231f, the first earphone 31 may be in a sleep state.

If the host 2 is in the open state, and the first earphone 31 detects that the first earphone 31 is located in the third accommodation groove 231f, the first earphone 31 may be woken up by the host 2. For example, the communication electrode of the host 2 may send a signal to the communication electrode of the first earphone 31, to wake up the first earphone 31.

If the host 2 is in the open state, and the first earphone 31 detects that the first earphone 31 is attached to the first part 21, a detection signal of the magnetic field sensor 317z triggers the controller of the first earphone 31 to work, to wake up the first earphone 31.

In this embodiment, both the host 2 and the first earphone 31 can detect the in-box/out-box state of the first earphone 31, so that a risk that may be caused by detection performed only by the host 2 or the first earphone 31 can be avoided (for example, if detection is performed only by the host 2, the in-box/out-box state of the first earphone 31 cannot be accurately detected if power of the host 2 is exhausted), and reliability of detection of the in-box/out-box state of the first earphone 31 can be ensured.

7. Foreign Matter Detection Mechanism

In this embodiment, if foreign matter (for example, a liquid or a solid or semi-solid dirt) enters the third accommodation groove 231*f* of the host 2, surfaces of the host 2 and the first earphone 31 may be contaminated, corroded, and rusted, and even a function abnormality may be caused, thereby affecting reliability and a service life of the product. In particular, if the second charging spring 231*c* and the first charging spring 231*e* in the third accommodation groove 231*f* are in contact with a large quantity of foreign matter, a charging abnormality (or a communication abnormality) may be caused.

In view of this, as shown in FIG. 143, the foreign matter detection spring 231*d* is further disposed in the third accommodation groove 231*f*, and is configured to implement foreign matter detection. A detection principle may be as follows:

When at least one of the foreign matter detection spring 231*d*, the first charging spring 231*e*, and the second charging spring 231*c* is in contact with the foreign matter, a waveform of a charging signal of the host 2 changes. For example, after the foreign matter detection spring 231*d* and the first charging spring 231*e* are in contact with the foreign matter, or after the foreign matter detection spring 231*d* and the second charging spring 231*c* are in contact with the foreign matter, or after the foreign matter detection spring 231*d*, the first charging spring 231*e*, and the second charging spring 231*c* are in contact with the foreign matter, the waveform of the charging signal of the charging circuit of the host 2 changes. Such a charging signal whose waveform changes may be referred to as an abnormal charging signal. If at least one of the first charging spring 231*e* and the second charging spring 231*c* is in contact with the foreign matter, the waveform of the charging signal of the host 2 does not change. Such a charging signal whose waveform does not change may be referred to as a normal charging signal.

If only one of the first charging spring 231*e*, the second charging spring 231*c*, and the foreign matter detection spring 231*d* is in contact with the foreign matter or none of the first charging spring 231*e*, the second charging spring 231*c*, and the foreign matter detection spring 231*d* is in contact with the foreign matter, the waveform of the charging signal of the host 2 does not change. In other words, the charging circuit generates the normal charging signal.

Therefore, the processor of the host 2 may determine, based on a type of the charging signal, whether there is foreign matter entering the third accommodation groove 231*f*. For example, when determining that the charging signal is an abnormal charging signal, the processor determines that there is foreign matter entering the third accommodation groove 231*f*. On the contrary, when determining that the charging signal is a normal charging signal, the processor determines that no foreign matter enters the third accommodation groove 231*f*.

In this embodiment, when the host 2 determines that there is foreign matter entering the third accommodation groove 231*f*, the processor of the host 2 may control the charging circuit in the host 2 to be turned off. Therefore, when the first earphone 31 is accommodated in the third accommodation groove 231*f*, there is no charging current between the first charging spring 231*e* and the first electrode of the first earphone 31, and there is no charging current between the second charging spring 231*c* and the second electrode of the first earphone 31. In this way, a charging abnormality (for example, a short circuit) can be prevented.

In this embodiment, when the host 2 determines that there is foreign matter entering the third accommodation groove 231*f*, the processor of the host 2 may further control an alarm module in the host 2 to send an alarm, so as to send a warning to the user. The alarm module may be, for example, a speaker, a buzzer, or a motor in the host 2. It may be understood that, based on a product requirement, an alarm mechanism is not necessary.

In this embodiment, when the host 2 determines that no foreign matter enters the third accommodation groove 231*f*, the processor of the host 2 may control the charging circuit in the host 2 to be turned on. Therefore, when the first earphone 31 is accommodated in the third accommodation groove 231*f*, the host 2 normally charges the first earphone 31.

In another embodiment, based on a product requirement, the host may not have the foreign matter detection mechanism.

8. The Host 2 Charges the First Earphone 31.

With reference to the foregoing descriptions, because of structure designs of the first electrode and the second electrode in the first earphone 31, after the first earphone 31 is placed in the third accommodation groove 231*f* at a plurality of rotation angles, the first charging spring 231*e* can be in contact with the first electrode 312, and the second charging spring 231*c* can be in contact with the second electrode 314, to ensure that the host 2 normally charges the first earphone 31. This design can simplify user operations and improve user experience.

9. Charging Overheat Protection Mechanism of the Host 2

In this embodiment, when the host 2 charges the first earphone 31, heat is generated. This may cause an excessively high temperature rise of the host 2 or the first earphone 31. For example, due to improper use of the user or a short circuit of an internal circuit, a charging current of the host 2 is excessively large, and in this case, a temperature rise is easily excessively high. An excessively high temperature affects safety, a service life, and reliability of the product, and may affect user experience.

In view of this, the host 2 may have a temperature detection module, and the temperature detection module may be disposed, for example, near the first accommodation groove 213*y* and/or the third accommodation groove 231*f*. The temperature detection module may be, for example, a thermistor. The temperature detection module is configured to detect a temperature at a mounting position of the temperature detection module, and report the temperature to the processor of the host 2. The processor may determine, based on detection information of the temperature detection module, whether a temperature rise exceeds a threshold. When the temperature rise is greater than or equal to the threshold, the processor may control the charging circuit of the host 2 to be turned off, so that the host 2 may not charge the first earphone 31, to suppress the temperature rise. If the temperature rise is less than the threshold, the processor may control the charging circuit of the host 2 to be turned on, so that the host 2 can charge the first earphone 31. This charging overheat protection mechanism can improve the safety, a service life, and reliability of the product, and ensure user experience.

In this embodiment, when the processor of the host 2 determines that the temperature rise is excessively high, the processor may further control an alarm module in the host 2 to send an alarm, so as to send a warning to the user. The alarm module may be, for example, a speaker, a buzzer, or a motor in the host 2. It may be understood that, based on a product requirement, an alarm mechanism is not necessary.

In another embodiment, based on a product requirement, the host may not have the charging overheat protection mechanism.

The foregoing descriptions are merely specific implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. A wearable device, comprising:

an earphone; and a host, wherein:

the earphone includes an earphone magnet;

the host comprises a first part and a second part, the first part being configured to rotate relative to the second part and to be opened relative to the second part to move the host between an open and a closed position, the first part including a first accommodation groove and the second part including a third accommodation groove and arranged such that when the host is closed, the first accommodation groove and the third accommodation groove enclose an accommodation space, the first part including a first host attachment magnet and arranged such that when the host is closed, the earphone is accommodated in the accommodation space, and the earphone magnet is magnetically attached to the first host attachment magnet, and when the first part is opened relative to the second part, the earphone can be attached in the first accommodation groove and move with the first part;

when the earphone is accommodated in the first accommodation groove, a maximum distance between a part of the earphone located in the first accommodation groove and a plane on which an opening of the first accommodation groove is located is a first distance, and a maximum distance between the part of the earphone located outside the first accommodation groove and the plane on which the opening of the first accommodation groove is located is a second distance, wherein the first distance is less than the second distance; and wherein:

one of the first part or the second part comprises a second magnetic field sensor configured to detect a magnetic flux of the earphone magnet; and the host comprises a processor configured to execute program instructions that enable determination of whether the earphone is located in the first accommodation groove based on a detection signal of the second magnetic field sensor of the first part or whether the earphone is located in the third accommodation groove based on a detection signal of the second magnetic field sensor of the second part.

2. The wearable device according to claim 1, wherein;

the first host attachment magnet is a Halbach array, and the earphone magnet is a single magnet or a Halbach array.

3. The wearable device according to claim 1, wherein:

the first host attachment magnet is a Halbach array, the first host attachment magnet comprises two connected single magnets, and magnetic field directions of the two single magnets are different; and the earphone magnet comprises one single Halbach array magnet having two different magnetic field directions.

4. The wearable device according to claim 1, wherein:

the second part includes a second host attachment magnet; and when the earphone is accommodated in the accommodation space, the earphone magnet is magnetically attached to both the first host attachment magnet and the second host attachment magnet, and a magnetic force between the earphone magnet and the first host attachment magnet is greater than a magnetic force between the earphone magnet and the second host attachment magnet.

5. The wearable device according to claim 1, wherein a groove is provided along a circumferential edge of the first part, the first part including a sealing member provided with a plurality of protrusions along a surface of the sealing member, the plurality of protrusions being spaced in pairs, the sealing member being secured within the groove of the first part, the plurality of protrusions being connected to a bottom surface of the groove of the first part, a side of the sealing member positioned away from the protrusions of the sealing member being exposed outside the groove of the first part, and when the host is closed, a part of the sealing member that is exposed outside the groove of the first part physically engages the second part to seal a gap between the first part and the second part; or a groove is provided along a circumferential edge of the second part, the second part including a sealing member provided with a plurality of protrusions along a surface of the sealing member, the plurality of protrusions being spaced in pairs, the sealing member being secured within the groove of the second part, the plurality of protrusions of the sealing member being connected to a bottom surface of the groove of the second part, a side of the sealing member positioned away from the protrusions of the sealing member being exposed outside the groove of the second part, and when the host is closed, a part of the sealing member that is exposed outside the groove of the second part physically engages the first part to seal a gap between the first part and the second part.

6. The wearable device according to claim 1, wherein:

the second part is provided with a first charging spring and a second charging spring;

the earphone is provided with a centrosymmetric shape and comprises a first electrode and a second electrode, both the first electrode and the second electrode being located along an outer side of the earphone in the form of ring-shaped structures that surround a center line of the earphone, the first electrode and the second electrode being spaced from each other such that, when the earphone is received in the second part, the first electrode is in contact with the first charging spring and the second electrode is in contact with the second charging spring; and the host comprises a charging circuit configured to charge the earphone by using the first charging spring and the second charging spring.

7. The wearable device according to claim 6, wherein:

the second part includes a foreign matter detection spring; and the host comprises a processor configured to execute program instructions that enable control of the charging circuit based on an abnormal charging to turn off the charging circuit and control the charging circuit based on a normal charging signal wherein:

the charging circuit generates an abnormal charging signal after the foreign matter detection spring and at least one of the first charging spring and the second charging spring contacts foreign matter; or the charging circuit generates a normal charging signal after at least one of the first charging spring and the second charging spring contacts foreign matter or when only one or none of the first charging spring, the second charging spring, and the foreign object detection spring contacts foreign matter.

8. The wearable device according to claim 6, wherein:

the first part or the second part comprises a temperature detection module; and the host comprises a processor configured to execute program instructions that enable to determine, based on a detection result of the temperature detection module that a detected temperature is greater than or equal to a threshold, control the charging circuit to be turned off and based on the detection result of the temperature detection module that the detected temperature is less than the threshold, control the charging circuit to be operational.

9. The wearable device according to claim 1, wherein:

the second part comprises a status detection magnet and the first part comprises a first magnetic field sensor configured to detect a magnetic flux of the status detection magnet; and the host comprises a processor configured to execute program instructions that enable determination of whether the host is in an open state or a closed state based on a detection signal of the first magnetic field sensor.

10. The wearable device according to claim 1, wherein:

the second part comprises the status detection magnet, the earphone comprises a third magnetic field sensor, and the third magnetic field sensor is configured to detect the magnetic flux of the status detection magnet; and the earphone comprises a controller configured to determine, based on a detection signal of the third magnetic field sensor, whether the earphone is located in the third accommodation groove.

11. The wearable device according to claim 1, wherein:

the host comprises a rotating shaft assembly comprising a shaft sleeve, a driven member, an elastic member, and a first shaft;

the shaft sleeve comprises an inner cavity, and an outer side of the shaft sleeve is fixedly connected to the first part of the host;

the driven member comprises a shaft matching surface and a through hole, the through hole extending at least partially through the shaft matching surface, the driven member being positioned in the inner cavity and configured to slide along a surface of the inner cavity but not rotate relative to the shaft sleeve;

the elastic member is located in the inner cavity and presses against a surface of the driven member positioned away from the shaft matching surface;

one part of the first shaft is positioned in the inner cavity and is rotatably connected to the shaft sleeve the part of the first shaft positioned in the inner cavity passes through the through hole of the driven member and fits with the shaft matching surface of the driven member to form a cam mechanism, the other part of the first shaft being positioned outside the inner cavity and fixedly connected to the second part; and the first part is rotatable relative to the second part through the rotating shaft assembly where, in a process in which the host is switched from a closed state to an open state, a rotation stroke of the first part sequentially comprises a first stroke segment, a second stroke segment, and a third stroke segment.

12. The wearable device according to claim 11, wherein:

the shaft matching surface comprises a first slope, a plane, and a second slope that are sequentially connected, the first slope and the plane forming an obtuse angle, the plane and the second slope forming an obtuse angle, and the first slope, the plane, and the second slope forming a two-step ladder;

in the first stroke segment, the first slope is in sliding contact with the part of the first shaft that is positioned in the inner cavity;

in the second stroke segment, the plane is in sliding contact with the part of the first shaft and that is positioned in the inner cavity; and in the third stroke segment, the second slope is in sliding contact with the part of the first shaft and that is positioned in the inner cavity.

13. The wearable device according to claim 12, wherein:

the first part comprises a first host circuit board assembly that comprises a circuit board including a grounding point and a feeding point; and the first part comprises a first host housing fixedly connected to the outer side of the shaft sleeve, the first host circuit board assembly is fastened to a side that is of the first host housing positioned away from the shaft sleeve, the first host housing is electrically connected to both the grounding point and the feeding point, and the first host housing is an antenna of the host.

14. The wearable device according to claim 13, wherein:

the rotating shaft assembly comprises the shaft sleeve, a second shaft and a shaft contact member fastened in the shaft sleeve and in sliding contact with the part of the second shaft positioned within the inner cavity; and the second part comprises a third host housing fixedly connected to the part of the second shaft positioned outside the inner cavity, and the third host housing is a second antenna of the host.

15. The wearable device according to claim 14, wherein:

when the host is closed, there is a gap between the first host housing and the third host housing, and the first host housing and a second host housing are coupled.

16. The wearable device according to claim 1, wherein:

the first part is one of a cover of the host and a body of the host, and the second part is the other one of the cover and the body;

the host comprises an open button, and the open button comprises a cap, an elastic member, and a touch-sensitive spring;

a first cap part of the cap is positioned in the second part, and a second cap part is positioned outside the second part, the cap is movably connected to the second part, and the cap includes a protrusion positioned in the second part;

the elastic member is mounted in the second part to provide a rebound force for the cap;

the touch-sensitive spring is positioned in the second part and spaced opposite to the cap protrusion; and when the host is closed, the cap and the first part form a buckle connection to latch the first part and the second part; and when being pressed, the cap can move into the second part so that the buckle connection is released, and the cap protrusion presses against the touch-sensitive spring.

17. The wearable device according to claim 1, wherein:

the earphone and the first accommodation groove match in shape, and/or the earphone and the third accommodation groove match in shape.

18. The wearable device according to claim 6, wherein:

the earphone comprises an earplug, the first electrode, an earphone front housing, the second electrode, and an earphone rear housing;

the first electrode is positioned between the earplug and the earphone front housing;

the earphone front housing is connected to the first electrode and the second electrode; and the second electrode is connected to the earphone front housing and to the earphone rear housing; and when the earphone is accommodated in the first accommodation groove or the third accommodation groove, the earplug faces the rotating shaft assembly, and the earphone rear housing is positioned away from the rotating shaft assembly.

19. The wearable device according to claim 11, wherein:

in the first stroke segment, the driven member is displaceable along the first shaft under driving of an elastic force of the elastic member, and the driven member is rotatable around the first shaft under a joint action of the cam mechanism and the elastic member to drive the shaft sleeve to rotate around the first shaft so that the shaft sleeve drives the first part to rotate relative to the second part;

in the second stroke segment, the first part is rotatable relative to the second part under driving of an external force to drive the shaft sleeve and the driven member to rotate around the first shaft; and in the third stroke segment, the driven member is displaceable along the first shaft under driving of the elastic force of the elastic member, and the driven member is rotatable around the first shaft under the joint action of the cam mechanism and the elastic member to drive the shaft sleeve to rotate around the first shaft so that the shaft sleeve drives the first part to rotate relative to the second part.

* * * * *